(12) United States Patent
Everson et al.

(10) Patent No.: US 8,586,857 B2
(45) Date of Patent: Nov. 19, 2013

(54) COMBINED DIODE, LEAD ASSEMBLY INCORPORATING AN EXPANSION JOINT

(75) Inventors: Shawn Everson, Fremont, CA (US); Steven T. Croft, Menlo Park, CA (US); Whitfield G. Halstead, Palo Alto, CA (US); Jason S. Corneille, San Jose, CA (US)

(73) Assignee: Miasole, Santa Clara, CA (US)

( * ) Notice: Subject to any disclaimer, the term of this patent is extended or adjusted under 35 U.S.C. 154(b) by 976 days.

(21) Appl. No.: 12/264,712

(22) Filed: Nov. 4, 2008

(65) Prior Publication Data
US 2010/0108122 A1    May 6, 2010

(51) Int. Cl.
*H01L 31/05* (2006.01)

(52) U.S. Cl.
USPC ........... 136/246; 136/244; 136/256; 136/293; 257/676; 257/692; 257/696; 257/712; 257/773; 257/779; 257/459; 257/443; 257/E23.023; 257/E23.043; 257/E23.047; 257/E23.051; 257/E23.101; 257/E23.07; 257/734; 174/126.1; 174/137 R; 228/141.1; 228/179.1

(58) Field of Classification Search
USPC .......... 136/246, 244, 256, 293; 257/676, 692, 257/696, 712, 773, 779, 459, 443, E23.023, 257/E23.043, E23.047, E23.051, E23.101, 257/E23.07; 174/126.1, 137 R; 228/141.1, 228/179.1
See application file for complete search history.

(56) References Cited

U.S. PATENT DOCUMENTS

| | | | |
|---|---|---|---|
| 3,553,030 A | 1/1971 | Lebrun | |
| 4,577,051 A | 3/1986 | Hartman | |
| 4,609,770 A | 9/1986 | Nishiura et al. | |
| 4,694,117 A | 9/1987 | Friedrich et al. | |
| 5,330,583 A | 7/1994 | Asai et al. | |
| 5,389,159 A | 2/1995 | Kataoka et al. | |
| 5,391,235 A * | 2/1995 | Inoue | 136/244 |

(Continued)

FOREIGN PATENT DOCUMENTS

| | | |
|---|---|---|
| EP | 0177300 | 4/1986 |
| EP | 2345072 | 7/2011 |

(Continued)

OTHER PUBLICATIONS

WO patent application No. PCT/US2009/062016, International Search Report and Written Opinion mailed May 20, 2010.

(Continued)

*Primary Examiner* — Golam Mowla
(74) *Attorney, Agent, or Firm* — Weaver Austin Villeneuve & Sampson LLP

(57) ABSTRACT

A combined diode, lead assembly incorporating two expansion joints. The combined diode, lead assembly incorporating two expansion joints includes a diode having a first diode terminal and a second diode terminal, a first conductor and a second conductor. The first conductor includes a first terminal that is electrically coupled to the diode at the first diode terminal and a second terminal that is configured as a first expansion joint, which is configured to electrically couple to a first interconnecting-conductor and is configured to reduce a stress applied to the diode by the first conductor. The second conductor includes a first terminal that is electrically coupled to the diode at the second diode terminal and a second terminal that is configured as a second expansion joint, which is configured to electrically couple to a second interconnecting-conductor and is configured to reduce a stress applied to the diode by the second conductor.

48 Claims, 44 Drawing Sheets

(56) References Cited

U.S. PATENT DOCUMENTS

| | | | |
|---|---|---|---|
| 5,457,057 A | 10/1995 | Nath et al. | |
| 5,567,248 A | 10/1996 | Chung | |
| 5,620,528 A | 4/1997 | Schade et al. | |
| 5,626,688 A | 5/1997 | Probst et al. | |
| 5,814,195 A | 9/1998 | Lehan et al. | |
| 5,990,415 A | 11/1999 | Green et al. | |
| 6,058,020 A | 5/2000 | Winterer et al. | |
| 6,114,046 A | 9/2000 | Hanoka | |
| 6,121,542 A | 9/2000 | Shiotsuka et al. | |
| 6,218,606 B1 | 4/2001 | Morizane | |
| 6,231,732 B1 | 5/2001 | Hollars et al. | |
| 6,274,804 B1 | 8/2001 | Psyk et al. | |
| 6,307,755 B1 * | 10/2001 | Williams et al. | 361/813 |
| 6,313,396 B1 | 11/2001 | Glenn | |
| 6,359,210 B2 | 3/2002 | Ho et al. | |
| 6,365,010 B1 | 4/2002 | Hollars | |
| 6,372,538 B1 | 4/2002 | Wendt et al. | |
| 6,384,313 B2 | 5/2002 | Nakagawa et al. | |
| 6,388,336 B1 | 5/2002 | Venkateshwaran et al. | |
| 6,479,744 B1 | 11/2002 | Tsuzuki et al. | |
| 6,488,824 B1 | 12/2002 | Hollars et al. | |
| 6,545,211 B1 | 4/2003 | Mimura | |
| 6,600,100 B2 | 7/2003 | Ho et al. | |
| 6,728,097 B2 | 4/2004 | Wada et al. | |
| 6,974,976 B2 | 12/2005 | Hollars | |
| 7,563,647 B2 | 7/2009 | Bathan et al. | |
| 7,675,148 B2 | 3/2010 | Lim et al. | |
| 7,901,996 B2 | 3/2011 | Bathan et al. | |
| 7,906,837 B2 | 3/2011 | Cabahug et al. | |
| 2004/0069340 A1 | 4/2004 | Luch | |
| 2005/0072461 A1 | 4/2005 | Kuchinski et al. | |
| 2005/0109392 A1 | 5/2005 | Hollars | |
| 2005/0133083 A1 | 6/2005 | Matsushita et al. | |
| 2005/0156295 A1 | 7/2005 | Corisis et al. | |
| 2005/0176270 A1 | 8/2005 | Luch | |
| 2005/0241692 A1 | 11/2005 | Rubin et al. | |
| 2006/0032752 A1 | 2/2006 | Luch | |
| 2006/0180195 A1 | 8/2006 | Luch | |
| 2007/0052076 A1 | 3/2007 | Ramos et al. | |
| 2007/0132073 A1 | 6/2007 | Tiong et al. | |
| 2007/0283996 A1 | 12/2007 | Hachtmann et al. | |
| 2007/0283997 A1 | 12/2007 | Hachtmann et al. | |
| 2008/0135990 A1 | 6/2008 | Coyle et al. | |
| 2008/0203549 A1 | 8/2008 | Chow et al. | |
| 2008/0314432 A1 | 12/2008 | Paulson et al. | |
| 2009/0014049 A1 | 1/2009 | Gur et al. | |
| 2009/0014057 A1 | 1/2009 | Croft et al. | |
| 2009/0014058 A1 | 1/2009 | Croft et al. | |
| 2009/0038683 A1 | 2/2009 | Walter et al. | |
| 2009/0283137 A1 | 11/2009 | Croft et al. | |
| 2010/0193922 A1 | 8/2010 | Kastner et al. | |
| 2011/0074007 A1 | 3/2011 | Lopez et al. | |
| 2011/0121441 A1 | 5/2011 | Halstead et al. | |
| 2011/0146778 A1 | 6/2011 | Croft et al. | |
| 2011/0192448 A1 | 8/2011 | Croft et al. | |
| 2011/0284052 A1 | 11/2011 | Croft et al. | |

FOREIGN PATENT DOCUMENTS

| | | |
|---|---|---|
| JP | 06-252333 | 9/1994 |
| JP | 07-302923 | 11/1995 |
| JP | 2000-216421 | 8/2000 |
| JP | 2000-277785 | 10/2000 |
| JP | 2001-298134 | 10/2001 |
| JP | 2001-339087 | 12/2001 |
| JP | 2002/026195 | 1/2002 |
| JP | 2002/151554 | 5/2002 |
| JP | 2002-158324 | 5/2002 |
| JP | 2003/110077 | 4/2003 |
| JP | 2003/197828 | 7/2003 |
| JP | 2004-253475 | 9/2004 |
| JP | 2005-129773 | 5/2005 |
| WO | 2008/156755 | 12/2008 |
| WO | 2009/140521 | 11/2009 |
| WO | 2010/053730 | 5/2010 |
| WO | 2011/066178 | 6/2011 |
| WO | 2011/087749 | 7/2011 |

OTHER PUBLICATIONS

U.S. Appl. No. 12/121,602, "Solar-cell module with in-laminate diodes and external-connection mechanisms mounted to respective edge regions", Croft et al., filed May 15, 2008.
U.S. Appl. No. 12/121,602, Office Action mailed Mar. 26, 2010.
U.S. Appl. No. 12/626,281, "Diode leadframe for solar module assembly", Halstead et al., filed Nov. 25, 2009.
U.S. Appl. No. 12/644,324, "Diode rail system for photovoltaic modules", Andrew J. Zeiner, filed Dec. 22, 2009.
U.S. Appl. No. 12/644,360, "Shielding of interior diode assemblies from compression forces in thin-film photovoltaic modules", Croft et al., filed Dec. 22, 2009.
WO patent application No. PCT/US2009/043989, International Search Report and Written Opinion mailed Dec. 2, 2009.
U.S. Appl. No. 12/121,602, "Solar-cell module wilth in-laminate diodes and external-connection mechanisms mounted to respective edge regions", Croft et al., filed May 15, 2008.
U.S. Appl. No. 12/121,602, Advisory Action mailed Sep. 29, 2010.
U.S. Appl. No. 12/121,602, Examiner Interview Summary mailed Oct. 14, 2010.
International Preliminary Report on Patentability mailed Nov. 25, 2010, issued in WO application No. PCT/US2009/043989.
International Preliminary Report on Patentability mailed May 19, 2011, issued in WO application No. PCT/US2009/062016.
International Search Report and Written Opinion mailed Jul. 29, 2011, from WO application No. PCT/US2010/057327.
U.S. Appl. No. 13/204,552, "Integrated diode assemblies for photovoltaic modules", Croft et al., filed Aug. 5, 2011.
U.S. Appl. No. 11/812,515, Office Action mailed Oct. 12, 2010.
U.S. Appl. No. 11/812,515, Office Action mailed Apr. 14, 2011.
WO patent application No. PCT/US2008/007531, International Search Report and Written Opinion mailed Dec. 31, 2008.
WO patent application No. PCT/US2008/007531, Preliminary Report on Patentability mailed Dec. 22, 2009.
Richards et al., "Enhancing the efficiency of production CdS/CdTe PV modules by overcoming poor spectral response at short wavelengths via luminescence down-shifting," 2006 IEEE $4^{th}$ World Conference on Photovoltaic Energy Conversion, May 7-12, 2006, 4 pages.
Untila et al., "19.2% Efficient Bifacial ITO-($P^+Nn^+$)Si-ITO Laminated Grid Cell," 16th European Photovoltaic Solar Energy Conference, May 1-5, 2000, Glasgow, UK, pp. 1489-1491.
U.S. Appl. No. 12/626,281, Office Action mailed May 12, 2011.
U.S. Appl. No. 12/626,281, Office Action mailed Dec. 7, 2011.
U.S. Appl. No. 12/626,281, Notice of Allowance mailed Feb. 21, 2012.
U.S. Appl. No. 12/626,281, Allowed Claims, Feb. 21, 2012.
U.S. Appl. No. 12/121,602, Office Action mailed Aug. 6, 2010.

* cited by examiner

US 8,586,857 B2

COMBINED DIODE, LEAD ASSEMBLY INCORPORATING AN EXPANSION JOINT

TECHNICAL FIELD

Embodiments of the present invention relate generally to the field of photovoltaic technology.

BACKGROUND

In the quest for renewable sources of energy, photovoltaic technology has assumed a preeminent position as a cheap renewable source of clean energy. In particular, solar cells based on the compound semiconductor copper indium gallium diselenide (CIGS) used as an absorber layer offer great promise for thin-film solar cells having high efficiency and low cost. Of comparable importance to the technology used to fabricate thin-film solar cells themselves, is the technology used to collect current from solar cells, solar-cell modules and solar-cell arrays, and to collect current from these without power loss in a highly reliable manner.

By-pass diodes have been used to overcome the impact of shunt defects that cause power loss in solar cells. Maintaining the reliability of by-pass diodes utilized in solar-cell current-collection and interconnection schemes is critical for maintaining the reliability and efficiency of solar-cells protected by such by-pass diodes. Consequently, maintaining the reliability of by-pass diodes determines the useful life and performance of solar-cells, and the solar-cell modules and solar-cell arrays that depend upon them.

SUMMARY

Embodiments of the present invention include a combined diode, lead assembly incorporating two expansion joints. The combined diode, lead assembly incorporating two expansion joints includes a diode having a first diode terminal and a second diode terminal. The combined diode, lead assembly incorporating two expansion joints also includes a first conductor and a second conductor. The first conductor includes a first terminal and a second terminal. The first terminal of the first conductor is electrically coupled to the diode at the first diode terminal. The second terminal of the first conductor is configured as a first expansion joint. The first expansion joint is configured to electrically couple to a first interconnecting-conductor and is configured to reduce a stress applied to the diode by the first conductor. The second conductor includes a first terminal and a second terminal. The first terminal of the second conductor is electrically coupled to the diode at the second diode terminal. The second terminal of the second conductor may be configured as a second expansion joint. The second expansion joint is configured to electrically couple to a second interconnecting-conductor and is configured to reduce a stress applied to the diode by the second conductor.

DESCRIPTION OF THE DRAWINGS

The accompanying drawings, which are incorporated in and form a part of this specification, illustrate embodiments of the invention and, together with the description, serve to explain the embodiments of the invention.

The drawings referred to in this description should not be understood as being drawn to scale except if specifically noted.

DESCRIPTION OF EMBODIMENTS

Reference will now be made in detail to the various embodiments of the present invention. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be appreciated that embodiments of the present invention may be practiced without these specific details. In other instances, well known methods, procedures, and components have not been described in detail as not to unnecessarily obscure embodiments of the present invention.

Overview

Section I describes in detail various embodiments of the present invention for an interconnect assembly (Sub-Section A), methods of fabricating the same (Sub-Section B), methods of interconnecting solar-cells (Sub-Section C), as well as a trace used in solar cells (Sub-Section D). Various embodiments of the present invention described in Section I may be incorporated as elements of a solar cell and a solar-cell module combined with a combined diode, lead assembly incorporating an expansion joint, in accordance with embodiments of the present invention. Also, various embodiments of the present invention described in Section I may be incorporated as elements of a solar cell and a solar-cell module combined with an electrically-insulating-laminate strip that is cut with a cutting pattern that allows folding cut portions of the electrically-insulating-laminate strip over a side opposite to a side of a conductor that is electrically coupled with a solar cell, in accordance with embodiments of the present invention. The embodiments of the present invention described in Section I are illustrated in FIGS. 1-9.

Figure 10:
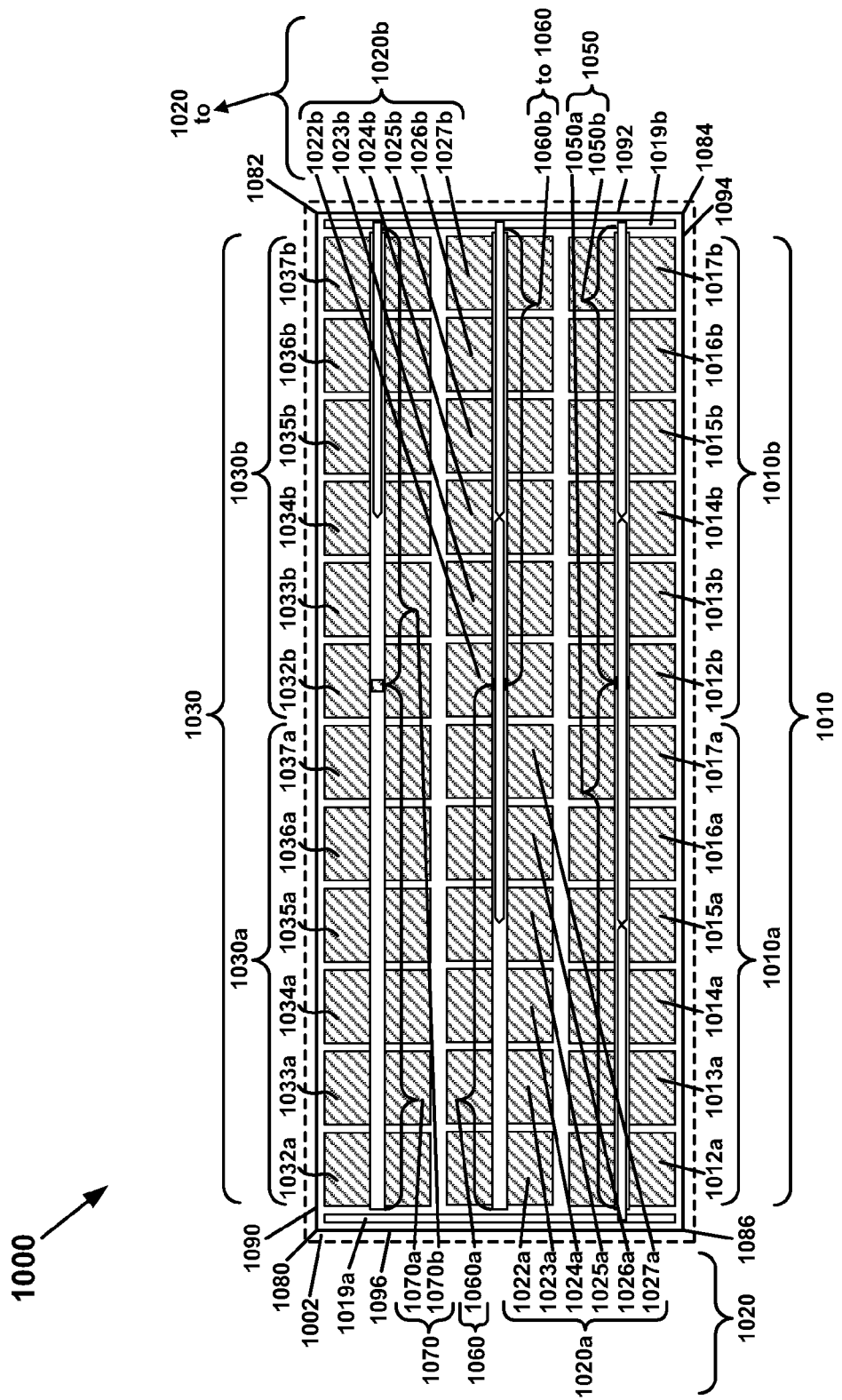
FIG. 10 is a plan view of a solar-cell module combined with external-connection mechanism mounted to respective edge regions and in-laminate-diode assembly, in accordance with an embodiment of the present invention.

Section II provides a detailed description of various embodiments of the present invention for the solar-cell module combined with in-laminate diodes and external-connection mechanisms mounted to respective edge regions that are incorporated as elements of a solar-cell module and a solar-cell array combined with the combined diode, lead assembly incorporating an expansion joint, as well as the electrically-insulating-laminate strip that is cut with the cutting pattern described above. FIGS. 10-15 illustrate detailed arrangements of element combinations for the solar-cell module combined with in-laminate diodes and external-connection mechanisms mounted to respective edge regions that are incorporated as elements of a solar-cell module and a solar-cell array that may be combined with a combined diode, lead assembly incorporating an expansion joint, or an electrically-insulating-laminate strip that is cut with the cutting pattern described above, in accordance with embodiments of the present invention. FIGS. 10-13 and 15 illustrate specific embodiments of the present invention for an in-laminate-diode assembly so incorporated as an element of the solar-cell module that may include at least one in-laminate-diode sub-assembly including a combined diode, lead assembly incorporating an expansion joint, or an electrically-insulating-laminate strip that is cut with the cutting pattern described above. In particular, FIGS. 10, 12 and 13 illustrate specific embodiments of the present invention for the protection of a solar cell and solar cells in the solar-cell module by an in-laminate-diode assembly that may include at least one in-laminate-diode sub-assembly including a combined diode, lead assembly incorporating an expansion joint, or an electrically-insulating-laminate strip that is cut with the cutting pattern described above.

Figure 16:
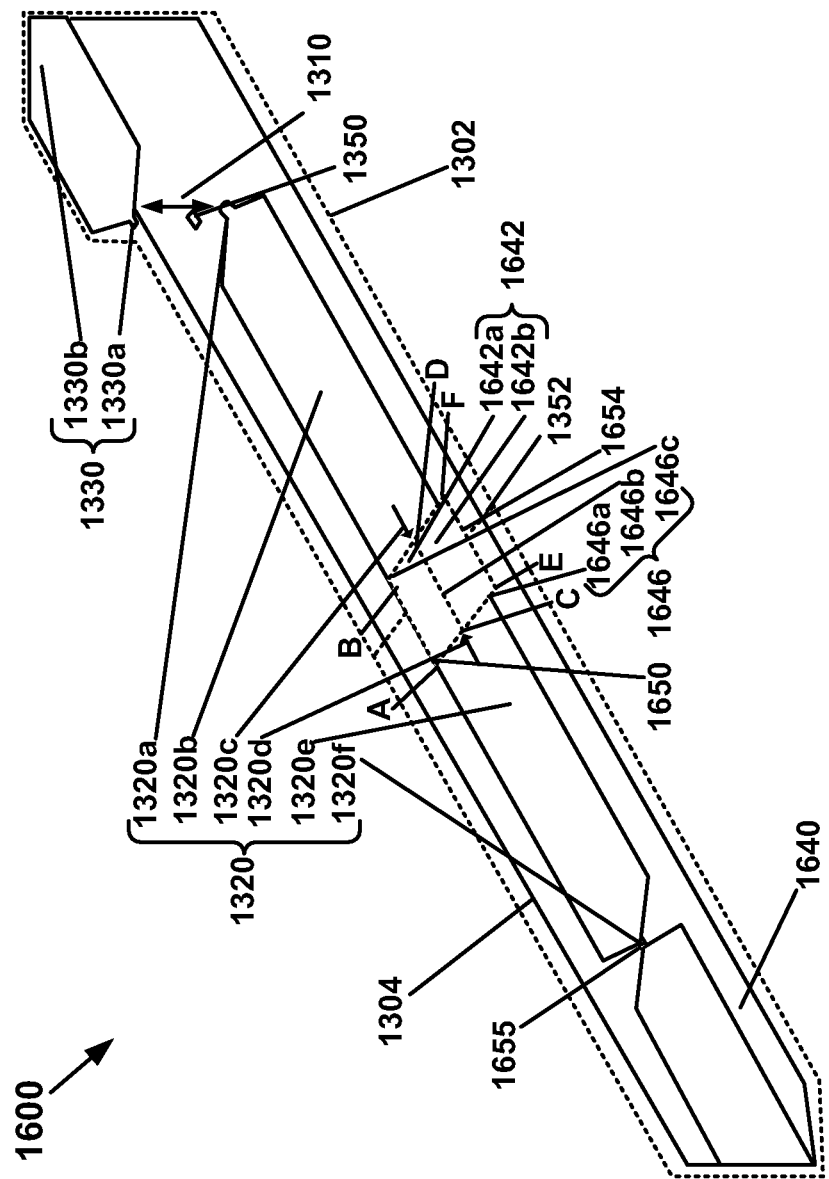
FIG. 16 is a combined perspective-plan and expanded view of in-laminate-diode sub-assemblies showing an arrangement of an electrically-insulating-laminate strip that is cut with a cutting pattern that allows folding cut portions of the electrically-insulating-laminate strip over a side opposite to a side of a conductor that is electrically coupled with a solar cell of a plurality of solar cells of a solar-cell module, in accordance with an embodiment of the present invention.
Figure 17A:
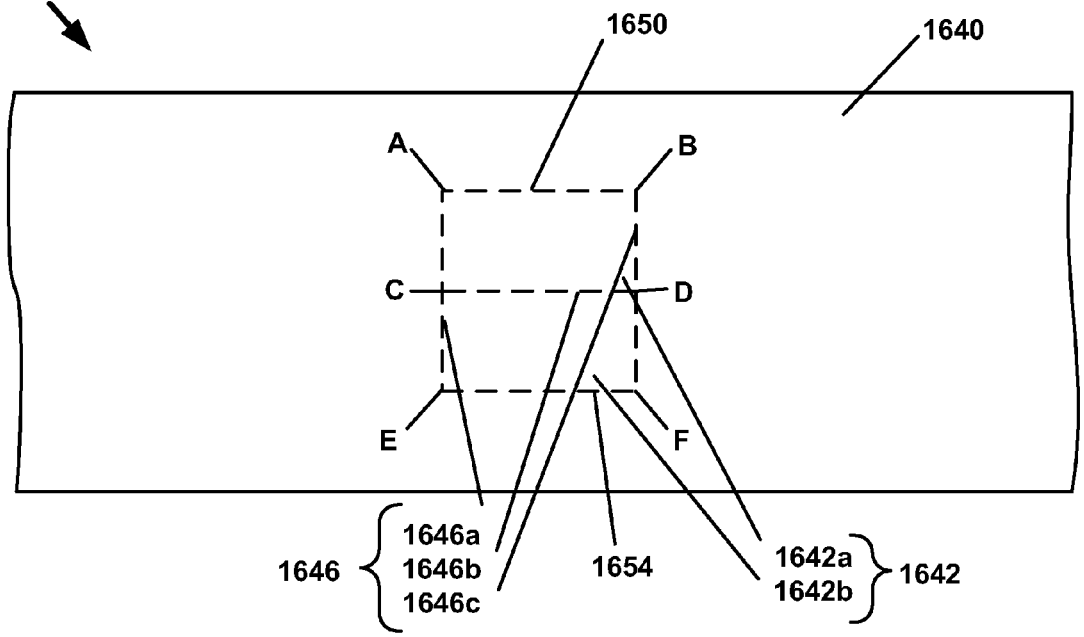
FIG. 17A is a plan view of the electrically-insulating-laminate strip shown in FIG. 16 showing a detail of the arrangement of an example cutting pattern, an "H-cut," in the electrically-insulating-laminate strip configured to allow access of a conductor to a solar cell of a plurality of solar cells of a solar-cell module, in accordance with an embodiment of the present invention.
Figure 17B:
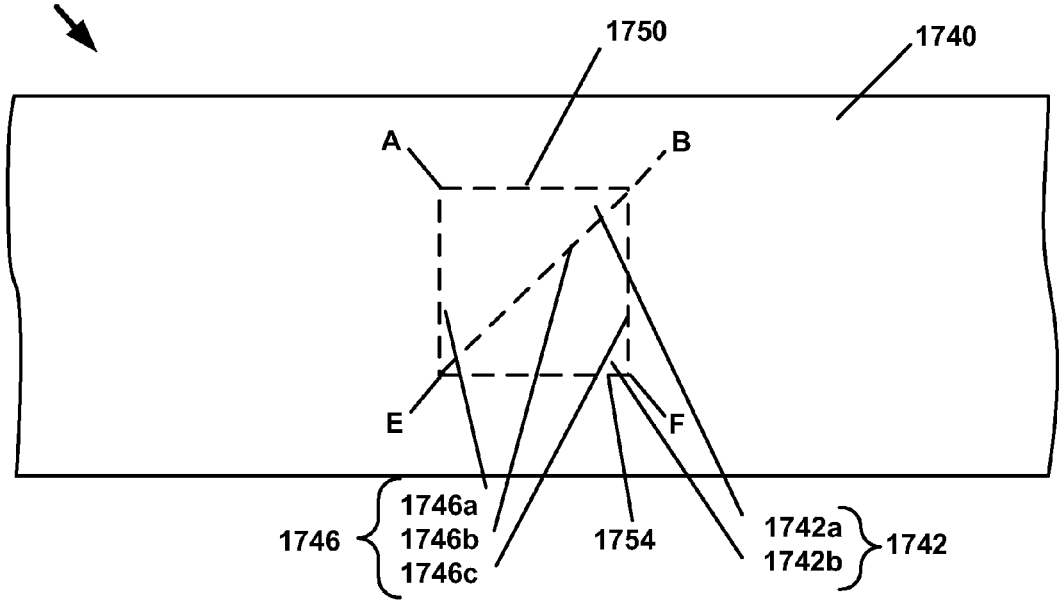
FIG. 17B is a plan view of an electrically-insulating-laminate strip showing a detail of the arrangement of an alternative example cutting pattern, a "Z-cut," in the electrically-insulating-laminate strip configured to allow access of a conductor to a solar cell of a plurality of solar cells of a solar-cell module, in accordance with an embodiment of the present invention.

Section III provides a detailed description of various embodiments of the present invention for an electrically-insulating-laminate strip that is cut with a cutting pattern that allows folding cut portions of the electrically-insulating-laminate strip over a side opposite to a side of a conductor that is electrically coupled with an electrical device, for example, a solar cell, and a solar-cell module utilizing such an electrically-insulating-laminate strip. FIGS. 16, 17A and 17B of Section III and FIG. 20 of Section IV illustrate detailed arrangements of element combinations for such an electrically-insulating-laminate strip, and a solar-cell module utilizing such an electrically-insulating-laminate strip, in accordance with embodiments of the present invention.

Figure 21A:
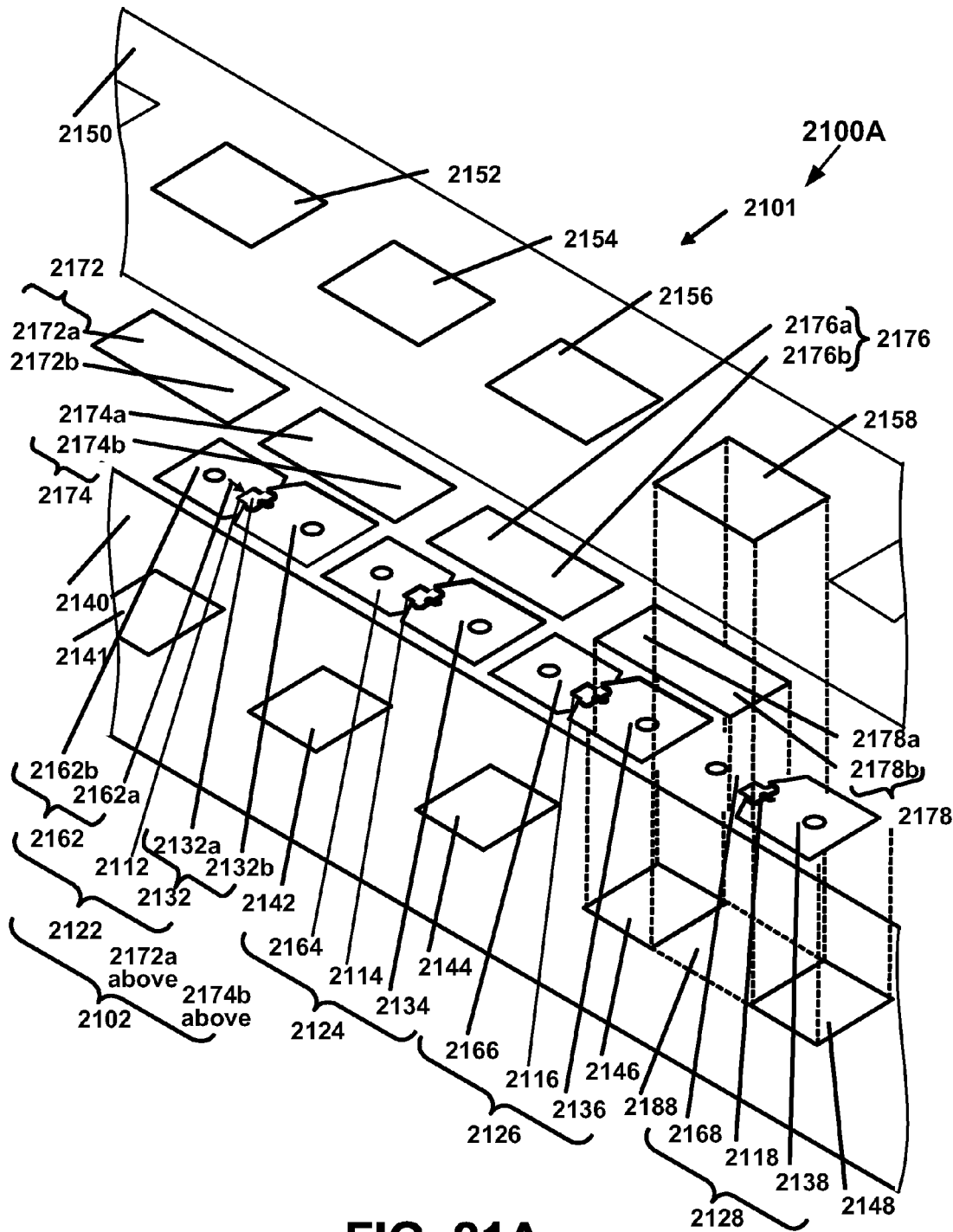
FIG. 21A is a perspective-plan and expanded view of alternative example in-laminate-diode assembly including a combined diode, lead assembly incorporating at least one expansion joint, a first electrically-insulating-laminate strip including a plurality of via-hole cutouts, and a second electrically-insulating-laminate strip including a plurality of complementary cutouts congruent with the shapes of gap regions lying between via-hole cutouts of the first electrically-insulating-laminate strip that shows an arrangement of component parts of the alternative example in-laminate-diode assembly, in accordance with an embodiment of the present invention.
Figure 22:
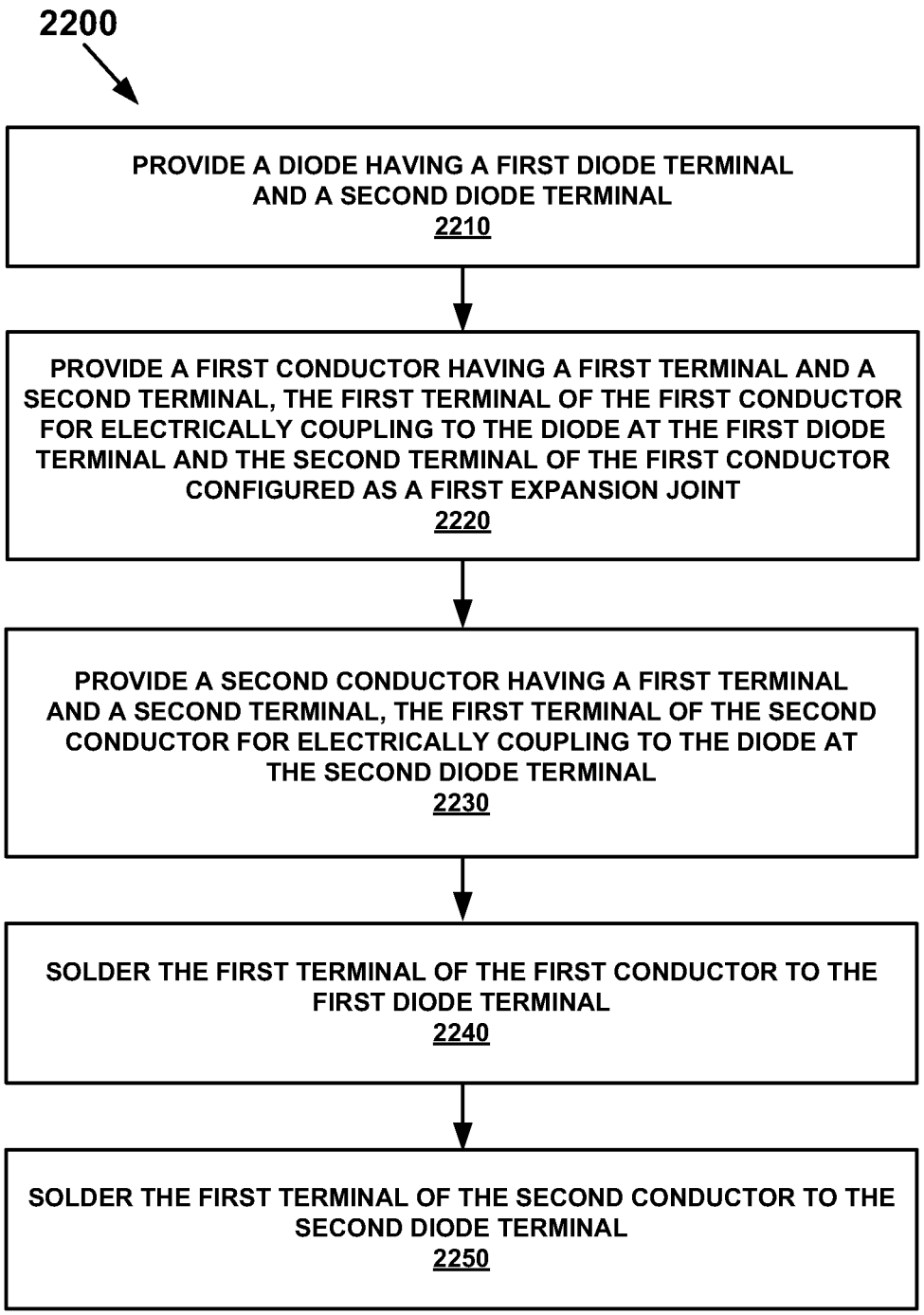
FIG. 22 is flow chart illustrating a method for fabricating a combined diode, lead assembly incorporating an expansion joint, in accordance with an embodiment of the present invention.
Figure 23:
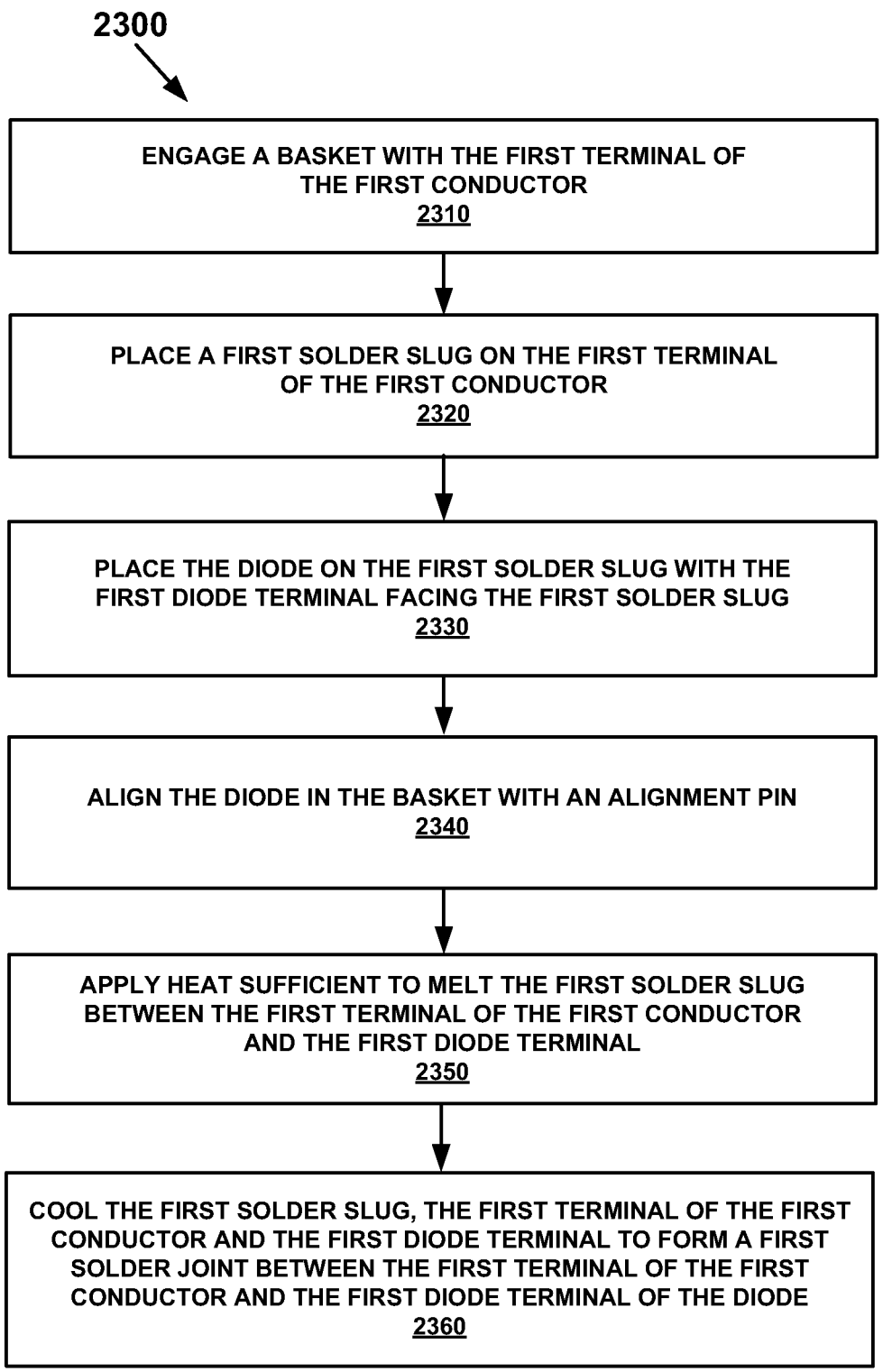
FIG. 23 is flow chart illustrating a method for soldering a first terminal of a first conductor to a first diode terminal of the method for fabricating a combined diode, lead assembly incorporating an expansion join of FIG. 22, in accordance with an embodiment of the present invention.
Figure 24:
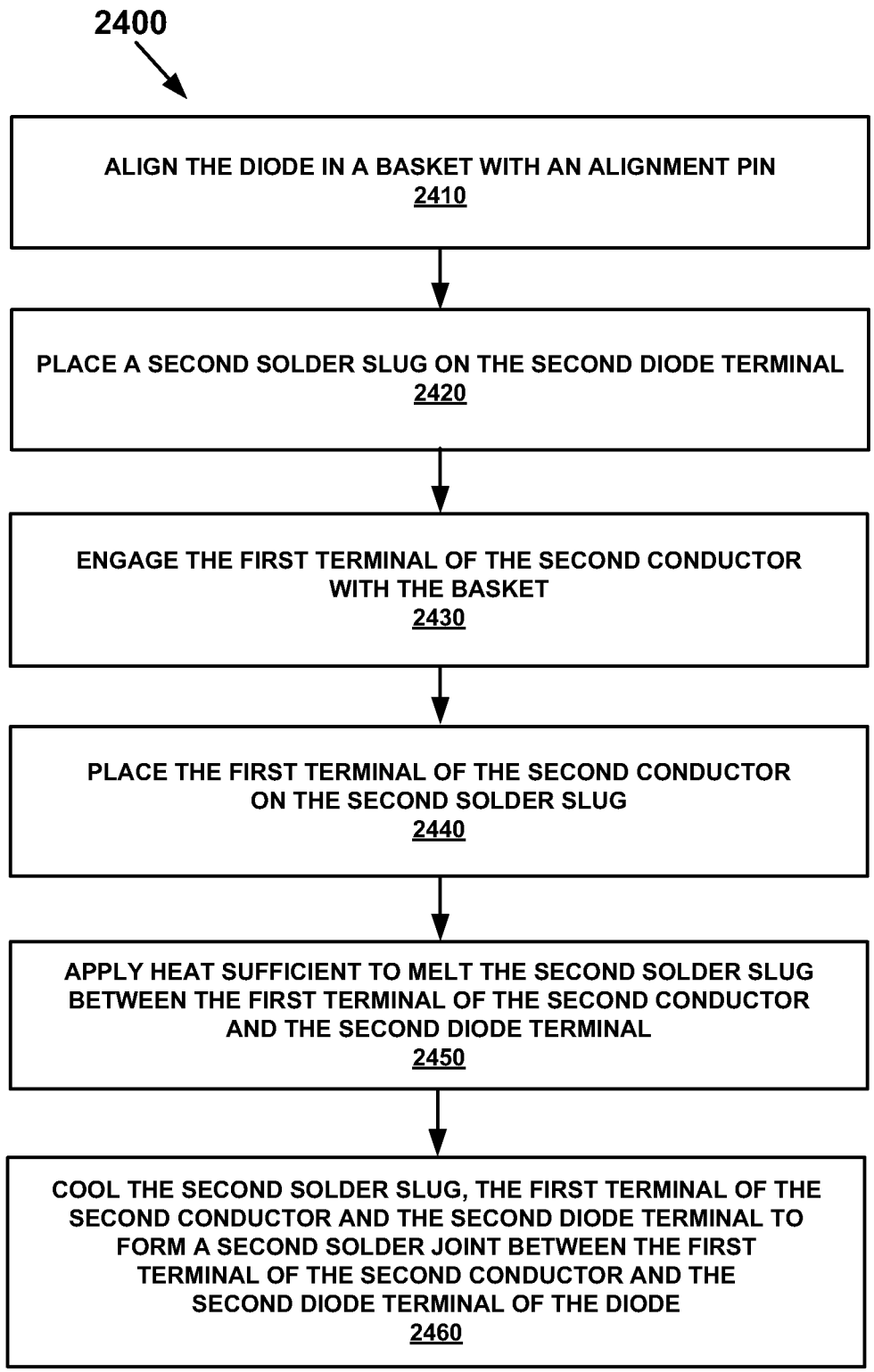
FIG. 24 is flow chart illustrating a method for soldering a first terminal of a second conductor to a second diode terminal of the method for fabricating a combined diode, lead assembly incorporating an expansion join of FIG. 22, in accordance with an embodiment of the present invention.
Figure 25A:
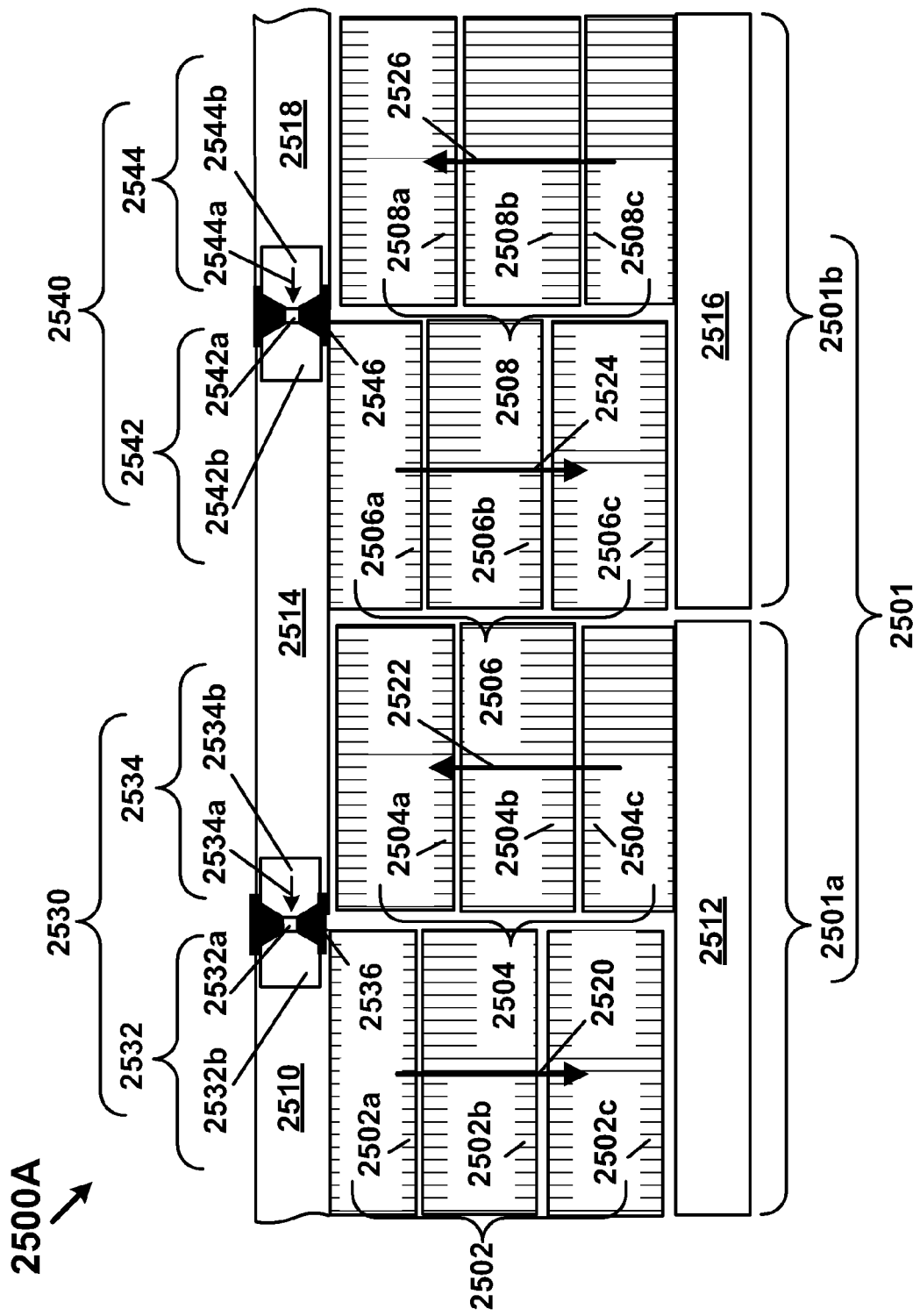
FIG. 25A is a plan view of a solar-cell module including busbars configured as interconnecting-conductors and a combined diode, lead assembly incorporating two expansion joints, in accordance with an embodiment of the present invention.
Figure 25B:
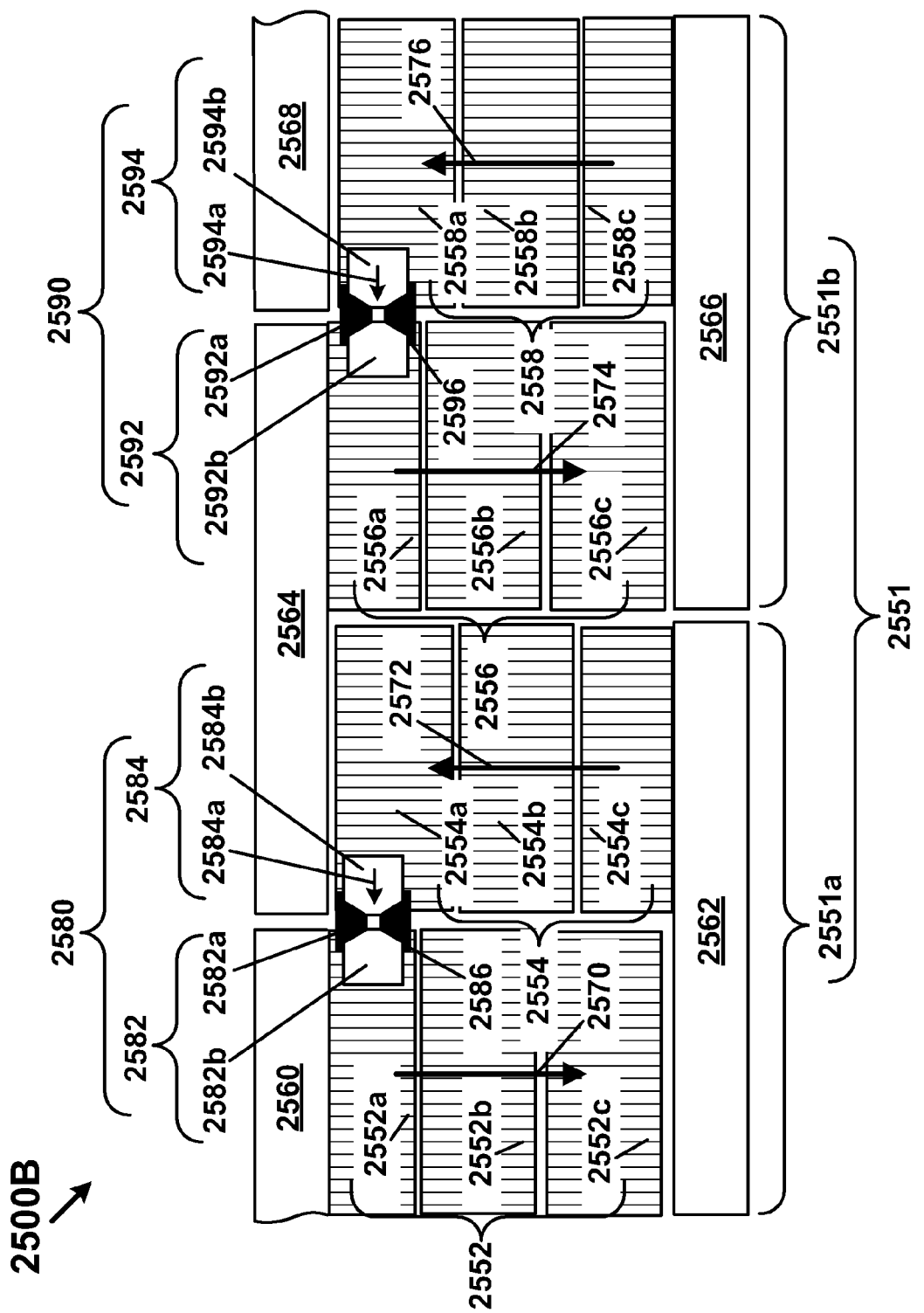
FIG. 25B is a plan view of a solar-cell module including interconnect assemblies configured as interconnecting-conductors and a combined diode, lead assembly incorporating two expansion joints, in accordance with an embodiment of the present invention.

Section IV provides a detailed description of various embodiments of the present invention for: a combined diode, lead assembly incorporating an expansion joint (Sub-Section A), an alternative in-laminate-diode assembly including a combined diode, lead assembly incorporating an expansion joint (Sub-Section B), a method for fabricating a combined diode, lead assembly incorporating an expansion joint (Sub-Section C), a solar-cell module including alternative interconnecting-conductors and a combined diode, lead assembly incorporating two expansion joints (Sub-Section D), and a solar-cell module including a combined diode, lead assembly incorporating an expansion joint and an integrated interconnecting-conductor (Sub-Section E). FIGS. 18A-18E, 19A, 19B and 20 illustrate detailed arrangements of element combinations of a combined diode, lead assembly incorporating an expansion joint, in accordance with embodiments of the present invention. FIGS. 21A-21E illustrate detailed arrangements of element combinations of an alternative in-laminate-diode assembly including a combined diode, lead assembly incorporating an expansion joint, in accordance with embodiments of the present invention. FIGS. 22, 23 and 24, in accordance with embodiments of the present invention provide flow charts illustrating a method for fabricating a combined diode, lead assembly incorporating an expansion joint. FIGS. 25A and 25B illustrate detailed arrangements of element combinations of a solar-cell module including alternative interconnecting-conductors and a combined diode, lead assembly incorporating two expansion joints, in accordance with embodiments of the present invention. FIGS. 26A-26D illustrate detailed arrangements of element combinations of a solar-cell module including a combined diode, lead assembly incorporating an expansion joint and an integrated interconnecting-conductor, in accordance with embodiments of the present invention.

Section I:

Sub-Section A: Physical Description of Embodiments of the Present Invention for an Interconnect Assembly With reference to FIG. 1A, in accordance with an embodiment of the present invention, a cross-sectional elevation view of a layer structure of a solar cell 100A is shown. The solar cell 100A includes a metallic substrate 104. In accordance with an embodiment of the present invention, an absorber layer 112 is disposed on the metallic substrate 104; the absorber layer 112 may include a layer of the material copper indium gallium diselenide (CIGS) having the chemical formula $Cu(In_{1-x}Ga_x)Se_2$, where x may be a decimal less than one but greater than zero that determines the relative amounts of the constituents, indium, In, and gallium, Ga. Alternatively, semiconductors having the chalcopyrite crystal structure, for example, chemically homologous compounds with the compound CIGS having the chalcopyrite crystal structure, in which alternative elemental constituents are substituted for Cu, In, Ga, and/or Se, may be used as the absorber layer 112. Moreover, in embodiments of the present invention, it should be noted that semiconductors, such as silicon and cadmium telluride, as well as other semiconductors, may be used as the absorber layer 112.

As shown, the absorber layer 112 includes a p-type portion 112a and an n-type portion 112b. As a result, a pn homojunction 112c is produced in the absorber layer 112 that serves to separate charge carriers that are created by light incident on the absorber layer 112. To facilitate the efficient conversion of light energy to charge carriers in the absorber layer 112, the composition of the p-type portion 112a of the absorber layer 112 may vary with depth to produce a graded band gap of the absorber layer 112. Alternatively, the absorber layer 112 may include only a p-type chalcopyrite semiconductor layer, such as a CIGS material layer, and a pn heterojunction may be produced between the absorber layer 112 and an n-type layer, such as a metal oxide, metal sulfide or metal selenide, disposed on its top surface in place of the n-type portion 112b shown in FIG. 1A. However, embodiments of the present invention are not limited to pn junctions fabricated in the manner described above, but rather a generic pn junction produced either as a homojunction in a single semiconductor material, or alternatively a heterojunction between two different semiconductor materials, is within the spirit and scope of embodiments of the present invention. Moreover, in embodiments of the present invention, it should be noted that semiconductors, such as silicon and cadmium telluride, as well as other semiconductors, may be used as the absorber layer 112.

In accordance with an embodiment of the present invention, on the surface of the n-type portion 112b of the absorber layer 112, one or more transparent electrically conductive oxide (TCO) layers 116 are disposed, for example, to provide a means for collection of current from the absorber layer 112 for conduction to an external load. As used herein, it should be noted that the phrase "collection of current" refers to collecting current carriers of either sign, whether they be positively charged holes or negatively charged electrons; for the structure shown in FIG. 1A in which the TCO layer is disposed on the n-type portion 112b, the current carriers collected under normal operating conditions are negatively charged electrons; but, embodiments of the present invention apply, without limitation thereto, to solar cell configurations where a p-type layer is disposed on an n-type absorber layer, in which case the current carriers collected may be positively charged holes. The TCO layer 116 may include zinc oxide, ZnO, or alternatively a doped conductive oxide, such as aluminum zinc oxide (AZO), $Al_xZn_{1-x}O_y$, and indium tin oxide (ITO), $In_xSn_{1-x}O_y$, where the subscripts x and y indicate that the relative amount of the constituents may be varied. Alternatively, the TCO layer 116 may be composed of a plurality of conductive oxide layers. These TCO layer materials may be sputtered directly from an oxide target, or alternatively the TCO layer may be reactively sputtered in an oxygen atmosphere from a metallic target, such as zinc, Zn, Al—Zn alloy, or In—Sn alloy targets. For example, the zinc oxide may be deposited on the absorber layer 112 by sputtering from a zinc-oxide-containing target; alternatively, the zinc oxide may be deposited from a zinc-containing target in a reactive oxygen atmosphere in a reactive-sputtering process. The reactive-sputtering process may provide a means for doping the absorber layer 112 with an n-type dopant, such as zinc, Zn, or indium, In, to create a thin n-type portion 112b, if the partial pressure of oxygen is initially reduced during the initial stages of sputtering a metallic target, such as zinc, Zn, or indium, In, and the layer structure of the solar cell 100A is subsequently annealed to allow interdiffusion of the zinc, Zn, or indium, In, with CIGS material used as the absorber layer 112. Alternatively, sputtering a compound target, such as a metal oxide, metal sulfide or metal selenide, may also be used to provide the n-type layer, as described above, on the p-type portion 112a of the absorber layer 112.

Figure 1A:
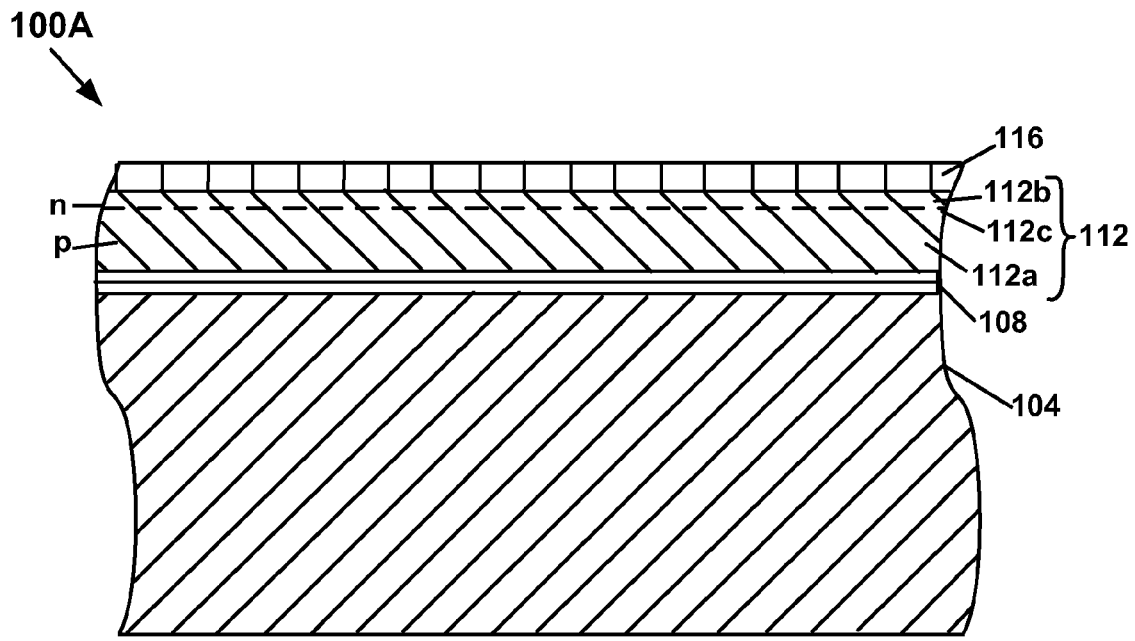
FIG. 1A is a cross-sectional elevation view of a layer structure of a solar cell, in accordance with an embodiment of the present invention.

With further reference to FIG. 1A, in accordance with the embodiment of the present invention, a conductive backing layer 108 may be disposed between the absorber layer 112 and the metallic substrate 104 to provide a diffusion barrier between the absorber layer 112 and the metallic substrate 104. The conductive backing layer 108 may include molybdenum, Mo, or other suitable metallic layer having a low propensity for interdiffusion with an absorber layer 112, such as one composed of CIGS material, as well as a low diffusion coefficient for constituents of the substrate. Moreover, the conductive backing layer 108 may provide other functions in addition to, or independent of, the diffusion-barrier function, for example, a light-reflecting function, for example, as a light-reflecting layer, to enhance the efficiency of the solar cell, as well as other functions. The embodiments recited above for the conductive backing layer 108 should not be construed as limiting the function of the conductive backing layer 108 to only those recited, as other functions of the conductive backing layer 108 are within the spirit and scope of embodiments of the present invention, as well.

Figure 1B:
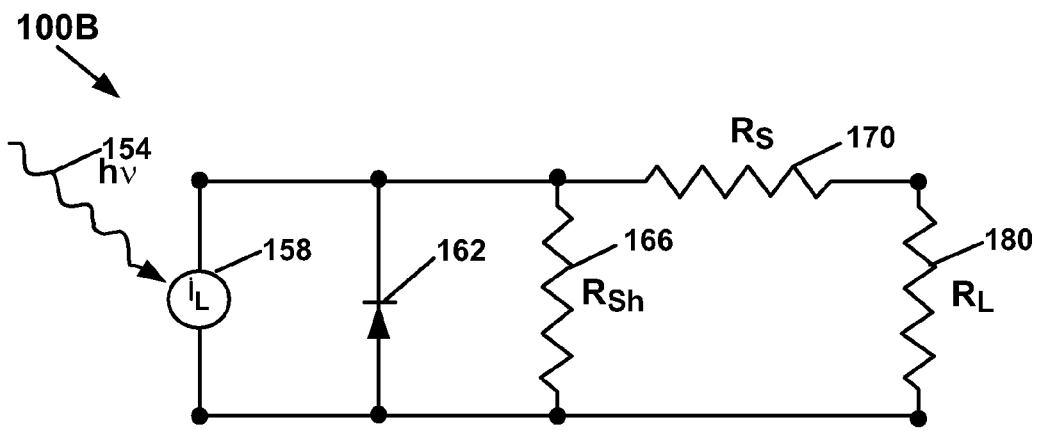
FIG. 1B is a schematic diagram of a model circuit of a solar cell, electrically connected to a load, in accordance with an embodiment of the present invention.

With reference now to FIG. 1B, in accordance with an embodiment of the present invention, a schematic diagram of a model circuit 100B of a solar cell that is electrically connected to a load is shown. The model circuit 100B of the solar cell includes a current source 158 that generates a photocurrent, $i_L$. As shown in FIG. 1A, the current source 158 is such as to produce counterclockwise electrical current, or equivalently an clockwise electron-flow, flowing around each of the loops of the circuit shown; embodiments of the present invention also apply, without limitation thereto, to solar-cell circuits in which the electrical current flows in a clockwise direction, or equivalently electrons flow in a counterclockwise direction. The photocurrent, $i_L$, is produced when a plurality of incident photons, light particles, of which one example photon 154 with energy, hν, is shown, produce electron-hole pairs in the absorber layer 112 and these electron-hole pairs are separated by the pn homojunction 112c, or in the alternative, by a pn heterojunction as described above. It should be appreciated that the energy, hν, of each incident photon of the plurality of photons should exceed the band-gap energy, $E_g$, that separates the valence band from the conduction band of the absorber layer 112 to produce such electron-hole pairs, which result in the photocurrent, $i_L$.

The model circuit 100B of the solar cell further includes a diode 162, which corresponds to recombination currents, primarily at the pn homojunction 112c, that are shunted away from the connected load. As shown in FIG. 1B, the diode is shown having a polarity consistent with electrical current flowing counterclockwise, or equivalently electron-flow clockwise, around the loops of the circuit shown; embodiments of the present invention apply, without limitation thereto, to a solar cell in which the diode of the model circuit has the opposite polarity in which electrical current flows clockwise, or equivalently electron-flow flows counterclockwise, around the loops of the circuit shown. In addition, the model circuit 100B of the solar cell includes two parasitic resistances corresponding to a shunt resistor 166 with shunt resistance, $R_{Sh}$, and to a series resistor 170 with series resistance, $R_S$. The solar cell may be connected to a load represented by a load resistor 180 with load resistance, $R_L$. Thus, the circuit elements of the solar cell include the current source 158, the diode 162 and the shunt resistor 166 connected across the current source 158, and the series resistor 170 connected in series with the load resistor 180 across the current source 158, as shown. As the shunt resistor 166, like the diode 162, are connected across the current source 158, these two circuit elements are associated with internal electrical currents within the solar cell shunted away from useful application to the load. As the series resistor 170 connected in series with the load resistor 180 are connected across the current source 158, the series resistor 170 is associated with internal resistance of the solar cell that limits the electrical current to the load.

With further reference to FIG. 1B, it should be recognized that the shunt resistance may be associated with surface leakage currents that follow paths at free surfaces that cross the pn homojunction 112c; free surfaces are usually found at the edges of the solar cell along the side walls of the device that define its lateral dimensions; such free surfaces may also be found at discontinuities in the absorber layer 112 that extend past the pn homojunction 112c. The shunt resistance may also be associated with shunt defects which may be present that shunt electrical current away from the load. A small value of the shunt resistance, $R_{Sh}$, is undesirable as it lowers the open circuit voltage, $V_{OC}$, of the solar cell, which directly affects the efficiency of the solar cell. Moreover, it should also be recognized that the series resistance, $R_S$, is associated with: the contact resistance between the p-type portion 112a and the conductive backing layer 108, the bulk resistance of the p-type portion 112a, the bulk resistance of the n-type portion 112b, the contact resistance between the n-type portion 112b and TCO layer 116, and other components, such as conductive leads, and connections in series with the load. These latter sources of series resistance, conductive leads, and connections in series with the load, are germane to embodiments of the present invention as interconnect assemblies, which is subsequently described. A large value of the series resistance, $R_S$, is undesirable as it lowers the short circuit current, $I_{SC}$, of the solar cell, which also directly affects the efficiency of the solar cell.

Figure 2:
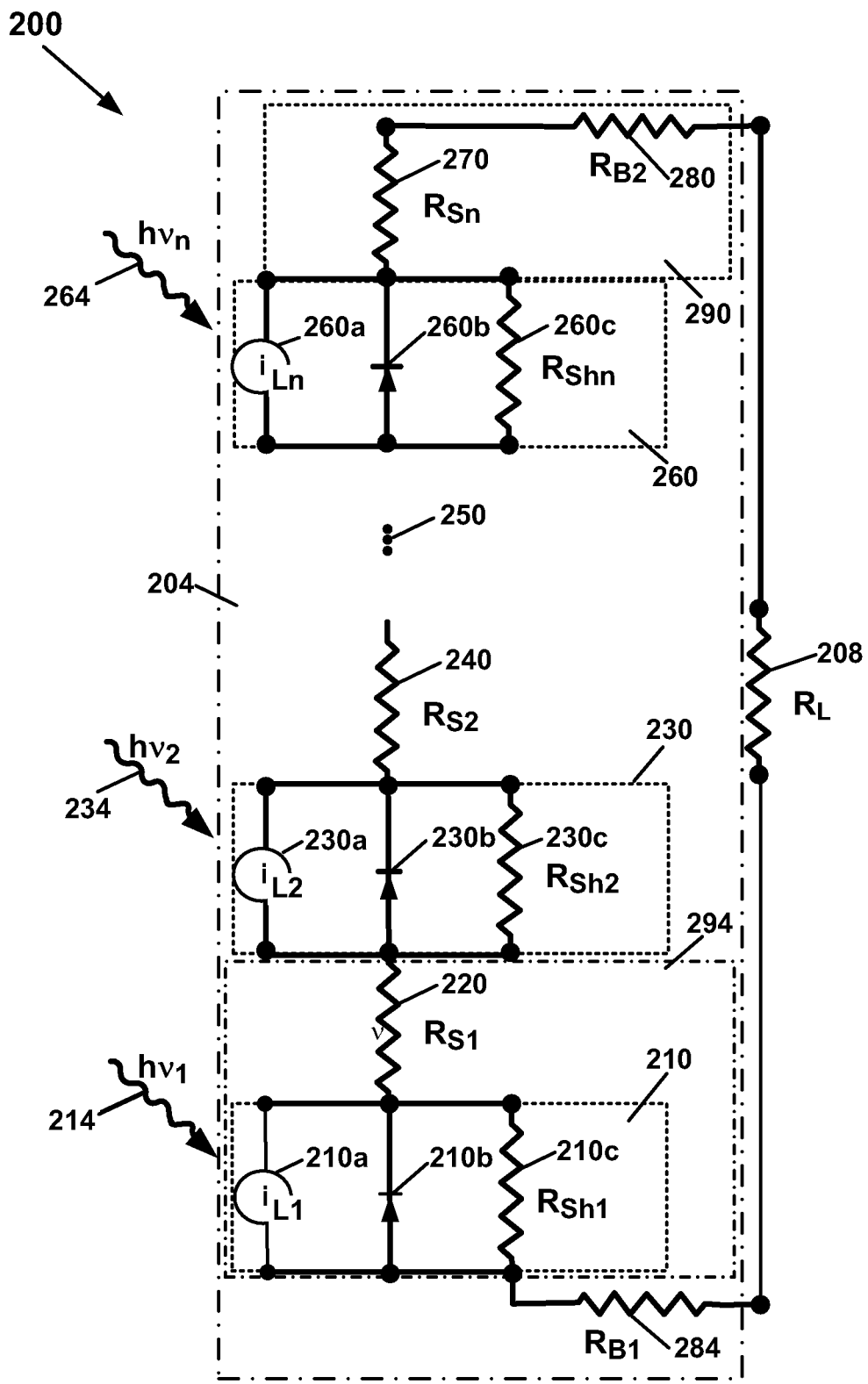
FIG. 2 is a schematic diagram of a model circuit of a solar-cell module, electrically connected to a load, that shows the interconnection of solar cells in the solar-cell module, in accordance with an embodiment of the present invention.

With reference now to FIG. 2, in accordance with an embodiment of the present invention, a schematic diagram of a model circuit 200 of a solar-cell module 204 that is coupled to a load is shown. The load is represented by a load resistor 208 with load resistance, $R_L$, as shown. The solar-cell module 204 of the model circuit 200 includes a plurality of solar cells: a first solar cell 210 including a current source 210a that generates a photocurrent, $i_{L1}$, produced by example photon 214 with energy, $hv_1$, a diode 210b and a shunt resistor 210c with shunt resistance, $R_{Sh1}$; a second solar cell 230 including a current source 230a that generates a photocurrent, $i_{L2}$, produced by example photon 234 with energy, $hv_2$, a diode 230b and a shunt resistor 230c with shunt resistance, $R_{Sh2}$; and, a terminating solar cell 260 including a current source 260a that generates a photocurrent, $i_{L3}$, produced by example photon 264 with energy, $hv_n$, a diode 260b and a shunt resistor 260c with shunt resistance, $R_{Shn}$. Parasitic series internal resistances of the respective solar cells 210, 230 and 260 have been omitted from the schematic diagram to simplify the discussion. Instead, series resistors with series resistances, $R_{S1}$, $R_{S2}$ and $R_{Sn}$ are shown disposed in the solar-cell module 204 of the model circuit 200 connected in series with the solar cells 210, 230 and 260 and the load resistor 208.

Figure 3:
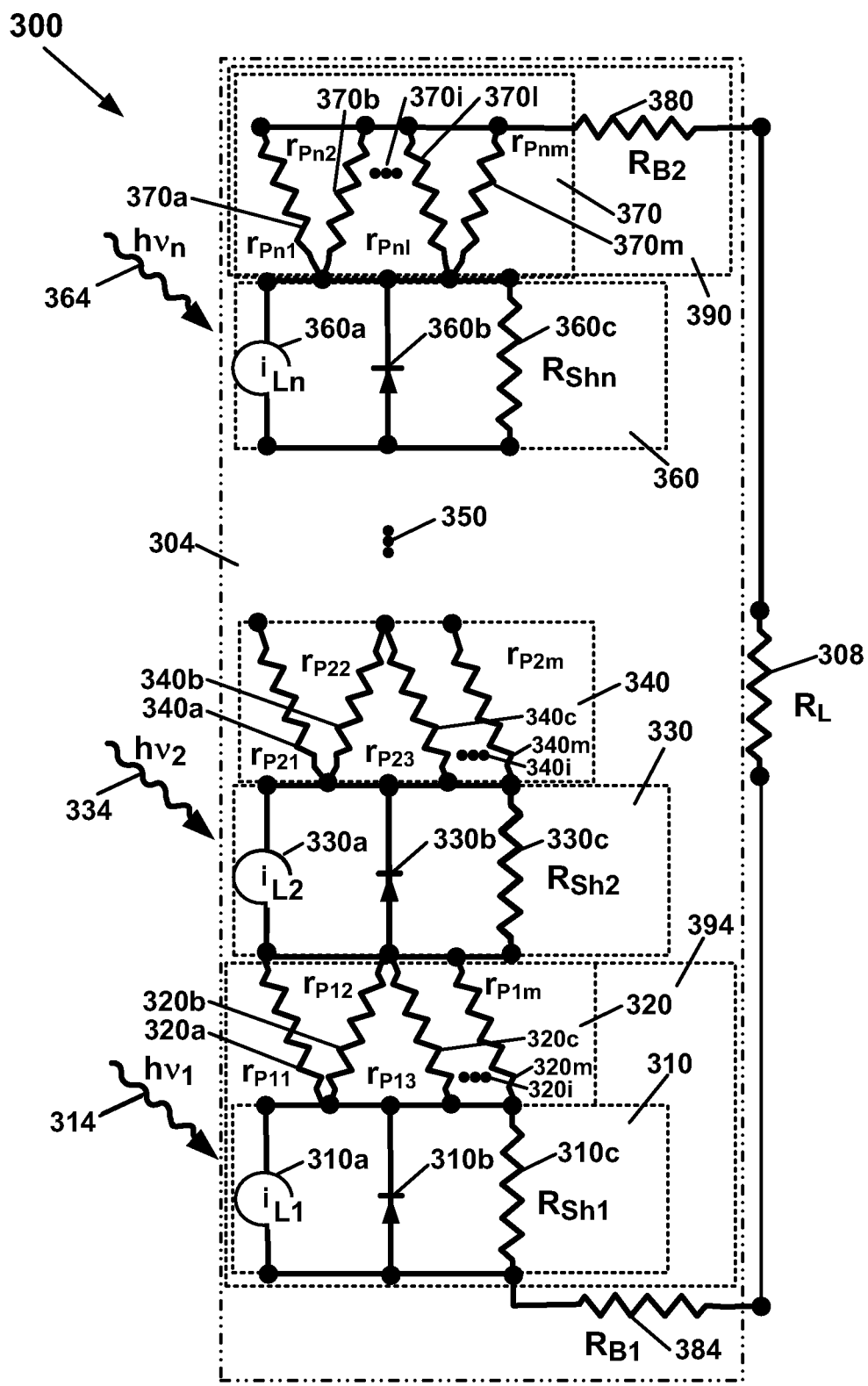
FIG. 3 is a schematic diagram of a model circuit of a solar-cell module, electrically connected to a load, that details model circuits of interconnect assemblies, in accordance with an embodiment of the present invention.

As shown in FIGS. 2 and 3, the current sources are such as to produce counterclockwise electrical current, or equivalently an clockwise electron-flow, flowing around each of the loops of the circuit shown; embodiments of the present invention also apply, without limitation thereto, to solar-cell circuits in which the electrical current flows in a clockwise direction, or equivalently electrons flow in a counterclockwise direction. Similarly, as shown in FIGS. 2 and 3, the diode is shown having a polarity consistent with electrical current flowing counterclockwise, or equivalently electron-flow clockwise, around the loops of the circuit shown; embodiments of the present invention apply, without limitation thereto, to a solar cell in which the diode of the model circuit has the opposite polarity in which electrical current flows clockwise, or equivalently electron-flow flows counterclockwise, around the loops of the circuit shown.

With further reference to FIG. 2, in accordance with an embodiment of the present invention, the series resistors with series resistances $R_{S1}$ and $R_{S2}$ correspond to interconnect assemblies 220 and 240, respectively. Series resistor with series resistance, $R_{S1}$, corresponding to interconnect assembly 220 is shown configured both to collect current from the first solar cell 210 and to interconnect electrically to the second solar cell 230. Series resistor with series resistance, $R_{Sn}$, corresponds to an integrated solar-cell, current collector 270. The ellipsis 250 indicates additional solar cells and interconnect assemblies (not shown) coupled in alternating pairs in series in model circuit 200 that make up the solar-cell module 204. Also, in series with the solar cells 210, 230 and 260 are a first busbar 284 and a terminating busbar 280 with series resistances $R_{B1}$ and $R_{B2}$, respectively, that carry the electrical current generated by solar-cell module 204 to the load resistor 208. The series resistor with resistance $R_{Sn}$, corresponding to the integrated solar-cell, current collector 270, and $R_{B2}$, corresponding to the terminating busbar 280, in combination correspond to a integrated busbar-solar-cell-current collector 290 coupling the terminating solar cell 260 with the load resistor 208. In addition, series resistor with resistance $R_{S1}$, corresponding to interconnect assembly 220, and first solar cell 210 in combination correspond to a combined solar-cell, interconnect assembly 294.

As shown in FIG. 2 and as used herein, it should be noted that the phrases "to collect current," "collecting current" and "current collector" refer to collecting, transferring, and/or transmitting current carriers of either sign, whether they be positively charged holes or negatively charged electrons; for the structures shown in FIGS. 1A-B, 2, 3, 4A-F, 5A-C and 6A-B, in which an interconnect assembly is disposed above and electrically coupled to an n-type portion of the solar cell, the current carriers collected under normal operating conditions are negatively charged electrons. Moreover, embodiments of the present invention apply, without limitation thereto, to solar cell configurations where a p-type layer is disposed on an n-type absorber layer, in which case the current carriers collected may be positively charged holes, as would be the case for solar cells modeled by diodes and current sources of opposite polarity to those of FIGS. 1A-B, 2, 3, 4A-F, 5A-C and 6A-B. Therefore, in accordance with embodiments of the present invention, a current collector and associated interconnect assembly that collects current may, without limitation thereto, collect, transfer, and/or transmit charges associated with an electrical current, and/or charges associated with an electron-flow, as for either polarity of the diodes and current sources described herein, and thus for either configuration of a solar cell with an n-type layer disposed on and electrically coupled to a p-type absorber layer or a p-type layer disposed on and electrically coupled to an n-type absorber layer, as well as other solar cell configurations.

With further reference to FIG. 2, in accordance with an embodiment of the present invention, the series resistances of the interconnect assemblies 220 and 240, integrated solar-cell, current collector 270, and the interconnect assemblies included in ellipsis 250 can have a substantial net series resistance in the model circuit 200 of the solar-cell module 204, unless the series resistances of the interconnect assemblies 220 and 240, integrated solar-cell, current collector 270, and the interconnect assemblies included in ellipsis 250 are made small. If a large plurality of solar cells are connected in series, the short circuit current of the solar-cell module, $I_{SCM}$, may be reduced, which also directly affects the solar-cell-module efficiency analogous to the manner in which solar-cell efficiency is reduced by a parasitic series resistance, $R_S$, as described above with reference to FIG. 1. Embodiments of the present invention provide for diminishing the series resistances of the interconnect assemblies 220 and 240, integrated solar-cell, current collector 270, and the interconnect assemblies included in ellipsis 250.

With reference now to FIG. 3, in accordance with embodiments of the present invention, a schematic diagram of a model circuit 300 of a solar-cell module 304 is shown that illustrates embodiments of the present invention such that the series resistances of the interconnect assemblies 320 and 340, integrated solar-cell, current collector 370, and the interconnect assemblies included in ellipsis 350 are made small. The solar-cell module 304 is coupled to a load represented by a load resistor 308 with load resistance, $R_L$, as shown. The solar-cell module 304 of the model circuit 300 includes a plurality of solar cells: a first solar cell 310 including a current source 310a that generates a photocurrent, $i_{L1}$, produced by example photon 314 with energy, $hv_1$, a diode 310b and a shunt resistor 310c with shunt resistance, $R_{Sh1}$; a second solar cell 330 including a current source 330a that generates a photocurrent, $i_{L2}$, produced by example photon 334 with energy, $hv_2$, a diode 330b and a shunt resistor 330c with shunt resistance, $R_{Sh2}$; and, a terminating solar cell 360 including a current source 360a that generates a photocurrent, $i_{L3}$, produced by example photon 364 with energy, $hv_n$, a diode 360b and a shunt resistor 360c with shunt resistance, $R_{Shn}$.

With further reference to FIG. 3, in accordance with an embodiment of the present invention, the interconnect assemblies 320 and 340 and the integrated solar-cell, current collector 370, with respective equivalent series resistances $R_{S1}$, $R_{S2}$ and $R_{Sn}$ are shown disposed in the solar-cell module 304 of the model circuit 300 connected in series with the solar cells 310, 330 and 360 and the load resistor 308. The ellipsis 350 indicates additional solar cells and interconnect assemblies (not shown) coupled in alternating pairs in series in model circuit 300 that make up the solar-cell module 304. Also, in series with the solar cells 310, 330 and 360 are a first busbar 384 and a terminating busbar 380 with series resistances $R_{B1}$ and $R_{B2}$, respectively, that carry the electrical current generated by solar-cell module 304 to the load resistor 308. The integrated solar-cell, current collector 370 with resistance $R_{Sn}$, and the series resistor with series resistance $R_{B2}$, corresponding to the terminating busbar 380, in combination correspond to an integrated busbar-solar-cell-current collector 390 coupling the terminating solar cell 360 with the load resistor 308. In addition, interconnect assembly 320 with resistance, $R_{S2}$, and solar cell 310 in combination correspond to a combined solar-cell, interconnect assembly 394.

With further reference to FIG. 3, in accordance with embodiments of the present invention, the interconnect assembly 320 includes a trace including a plurality of electrically conductive portions, identified with resistors 320a, 320b, 320c, and 320m with respective resistances, $r_{P11}$, $r_{P12}$, $r_{P13}$ and $r_{P1m}$, and the ellipsis 320i indicating additional resistors (not shown). It should be noted that although the plurality of electrically conductive portions of the trace are modeled here as discrete resistors the interconnection with solar cell 330 is considerably more complicated involving the distributed resistance in the TCO layer of the solar cell, which has been omitted for the sake of elucidating functional features of embodiments of the present invention. Therefore, it should be understood that embodiments of the present invention may also include, without limitation thereto, the effects of such distributed resistances on the trace. The plurality of electrically conductive portions, without limitation thereto, identified with resistors 320a, 320b, 320c, 320i, and 320m, are configured both to collect current from the first solar cell 310 and to interconnect electrically to the second solar cell 330. The plurality of electrically conductive portions, identified with resistors 320a, 320b, 320c, 320i, and 320m, are configured such that upon interconnecting the first solar cell 310 and the second solar cell 330 the plurality of electrically conductive portions are connected electrically in parallel between the first solar cell 310 and the second solar cell 330.

Thus, in accordance with embodiments of the present invention, the plurality of electrically conductive portions is configured such that equivalent series resistance, $R_{S1}$, of the interconnect assembly 320 including the parallel network of resistors 320a, 320b, 320c, 320i, and 320m, is less than the resistance of any one resistor in the parallel network. Therefore, upon interconnecting the first solar cell 310 with the second solar cell 330, the equivalent series resistance, $R_{S1}$, of the interconnect assembly 320, is given approximately, omitting the effects of distributed resistances at the interconnects with the first and second solar cells 310 and 330, by the formula for a plurality of resistors connected electrically in parallel, viz. $R_{S1}=1/[\Sigma(1/r_{P1i})]$, where $r_{P1i}$ is the resistance of the ith resistor in the parallel-resistor network, and the sum, $\Sigma$, is taken over all of the resistors in the network from i=1 to m. Hence, by connecting the first solar cell 310 to the second solar cell 330, with the interconnect assembly 320, the series resistance, $R_{S1}$, of the interconnect assembly 320 can be reduced lowering the effective series resistance between solar cells in the solar-cell module 304 improving the solar-cell-module efficiency.

Moreover, in accordance with embodiments of the present invention, the configuration of the plurality of electrically conductive portions due to this parallel arrangement of electrically conductive portions between the first solar cell 310 and the second solar cell 330 provides a redundancy of electrical current carrying capacity between interconnected solar cells should one of the plurality of electrically conductive portions become damaged, or its reliability become impaired. Thus, embodiments of the present invention provide that the plurality of electrically conductive portions is configured such that solar-cell efficiency is substantially undiminished in an event that any one of the plurality of electrically conductive portions is conductively impaired, because the loss of electrical current through any one electrically conductive portion will be compensated for by the plurality of other parallel electrically conductive portions coupling the first solar cell 310 with the second solar cell 330. It should be noted that as used herein the phrase, "substantially undiminished," with respect to solar-cell efficiency means that the solar-cell efficiency is not reduced below an acceptable level of productive performance.

With further reference to FIG. 3, in accordance with embodiments of the present invention, the interconnect assembly 340 includes a trace including a plurality of electrically conductive portions identified with resistors 340a, 340b, 340c, and 340m with respective resistances, $r_{P21}$, $r_{P22}$, $r_{P23}$ and $r_{P2m}$, and the ellipsis 340i indicating additional resistors (not shown). The plurality of electrically conductive portions, without limitation thereto, identified with resistors 340a, 340b, 340c, 340i, and 340m, are configured both to collect current from a first solar cell 330 and to interconnect electrically to a second solar cell, in this case a next adjacent one of the plurality of solar cells represented by ellipsis 350. From this example, it should be clear that for embodiments of the present invention a first solar cell and a second solar cell refer, without limitation thereto, to just two adjacent solar cells configured in series in the solar-cell module, and need not be limited to a solar cell located first in line of a series of solar cells in a solar-cell module, nor a solar cell located second in line of a series of solar cells in a solar-cell module. The resistors 340a, 340b, 340c, 340i, and 340m, are configured such that upon interconnecting the first solar cell 330 and the second solar cell, in this case the next adjacent solar cell of the plurality of solar cells represented by ellipsis 350, the resistors 340a, 340b, 340c, 340i, and 340m, are coupled electrically in parallel between the first solar cell 330 and the second solar cell, the next adjacent solar cell of the plurality of solar cells represented by ellipsis 350.

Thus, in accordance with embodiments of the present invention, the plurality of electrically conductive portions is configured such that series resistance, $R_{S2}$, of the interconnect assembly 340 including the parallel network of resistors 340a, 340b, 340c, 340i, and 340m, is less than the resistance of any one resistor in the network. Hence, the series resistance, $R_{S2}$, of the interconnect assembly 340 can be reduced lowering the effective series resistance between solar cells in the solar-cell module improving the solar-cell-module efficiency of the solar-cell module 304. Moreover, the plurality of electrically conductive portions, identified with resistors 340a, 340b, 340c, 340i, and 340m, may be configured such that solar-cell efficiency is substantially undiminished in an event that any one of the plurality of electrically conductive portions is conductively impaired.

With further reference to FIG. 3, in accordance with embodiments of the present invention, the combined solar-cell, interconnect assembly 394 includes the first solar cell 310 and the interconnect assembly 320; the interconnect assembly 320 includes a trace disposed above a light-facing side of the first solar cell 310, the trace further including a plurality of electrically conductive portions, identified with resistors 320a, 320b, 320c, and 320m with respective resistances, $r_{P21}$, $r_{P22}$, $r_{P23}$ and $r_{P2m}$, and the ellipsis 320i indicating additional resistors (not shown). All electrically conductive portions of the plurality of electrically conductive portions, without limitation thereto, identified with resistors 320a, 320b, 320c, 320i, and 320m, are configured to collect current from the first solar cell 310 and to interconnect electrically to the second solar cell 330. In addition, the plurality of electrically conductive portions, identified with resistors 320a, 320b, 320c, 320i, and 320m, may be configured such that solar-cell efficiency is substantially undiminished in an event that any one of the plurality of electrically conductive portions is conductively impaired. Also, any of the plurality of electrically conductive portions, identified with resistors 320a, 320b, 320c, 320i, and 320m, may be configured to interconnect electrically to the second solar cell 330.

With further reference to FIG. 3, in accordance with embodiments of the present invention, the integrated busbar-solar-cell-current collector 390 includes the terminating busbar 380 and the integrated solar-cell, current collector 370. The integrated solar-cell, current collector 370 includes a trace including a plurality of electrically conductive portions, identified with resistors 370a, 370b, 370l, and 370m with respective resistances, $r_{Pn1}$, $r_{Pn2}$, $r_{Pnl}$ and $r_{Pnm}$, and the ellipsis 370i indicating additional resistors (not shown). The plurality of electrically conductive portions, without limitation thereto, identified with resistors 370a, 370b, 370i, 370l and 370m, are configured both to collect current from the first solar cell 310 and to interconnect electrically to the terminating busbar 380. The resistors 370a, 370b, 370i, 370l and 370m, are coupled electrically in parallel between the terminating solar cell 360 and the terminating busbar 380 series resistor with series resistance, $R_{B2}$. Thus, the plurality of electrically conductive portions is configured such that series resistance, $R_{Sn}$, of the interconnect assembly 340 including the parallel network of resistors 370a, 370b, 370i, 370l and 370m, is less than the resistance of any one resistor in the network.

In accordance with embodiments of the present invention, the integrated solar-cell, current collector 370 includes a plurality of integrated pairs of electrically conductive, electrically parallel trace portions. Resistors 370a, 370b, 370l and 370m with respective resistances, $r_{Pn1}$, $r_{Pn2}$, $r_{Pnl}$ and $r_{Pnm}$, and the ellipsis 370i indicating additional resistors (not shown) form such a plurality of integrated pairs of electrically conductive, electrically parallel trace portions when suitably paired as adjacent pair units connected electrically together as an integral unit over the terminating solar cell 360. For example, one such pair of the plurality of integrated pairs of electrically conductive, electrically parallel trace portions is pair of resistors 370a and 370b connected electrically together as an integral unit over the terminating solar cell 360, as shown. The plurality of integrated pairs of electrically conductive, electrically parallel trace portions are configured both to collect current from the terminating solar cell 360 and to interconnect electrically to the terminating busbar 380. Moreover, the plurality of integrated pairs of electrically conductive, electrically parallel trace portions is configured such that solar-cell efficiency is substantially undiminished in an event that any one electrically conductive, electrically parallel trace portion, for example, either one, but not both, of the resistors 370a and 370b of the integral pair, of the plurality of integrated pairs of electrically conductive, electrically parallel trace portions is conductively impaired.

With further reference to FIG. 3, in accordance with embodiments of the present invention, the solar-cell module 304 includes the first solar cell 310, at least the second solar cell 330 and the interconnect assembly 320 disposed above a light-facing side of an absorber layer of the first solar cell 310. The interconnect assembly 320 includes a trace including a plurality of electrically conductive portions, identified with resistors 320a, 320b, 320c, and 320m with respective resistances, $r_{P11}$, $r_{P12}$, $r_{P13}$ and $r_{P1m}$, and the ellipsis 320i indicating additional resistors (not shown). The plurality of electrically conductive portions is configured both to collect current from the first solar cell 310 and to interconnect electrically to the second solar cell 330. The plurality of electrically conductive portions is configured such that solar-cell efficiency is substantially undiminished in an event that any one of the plurality of electrically conductive portions is conductively impaired.

Figure 4A:
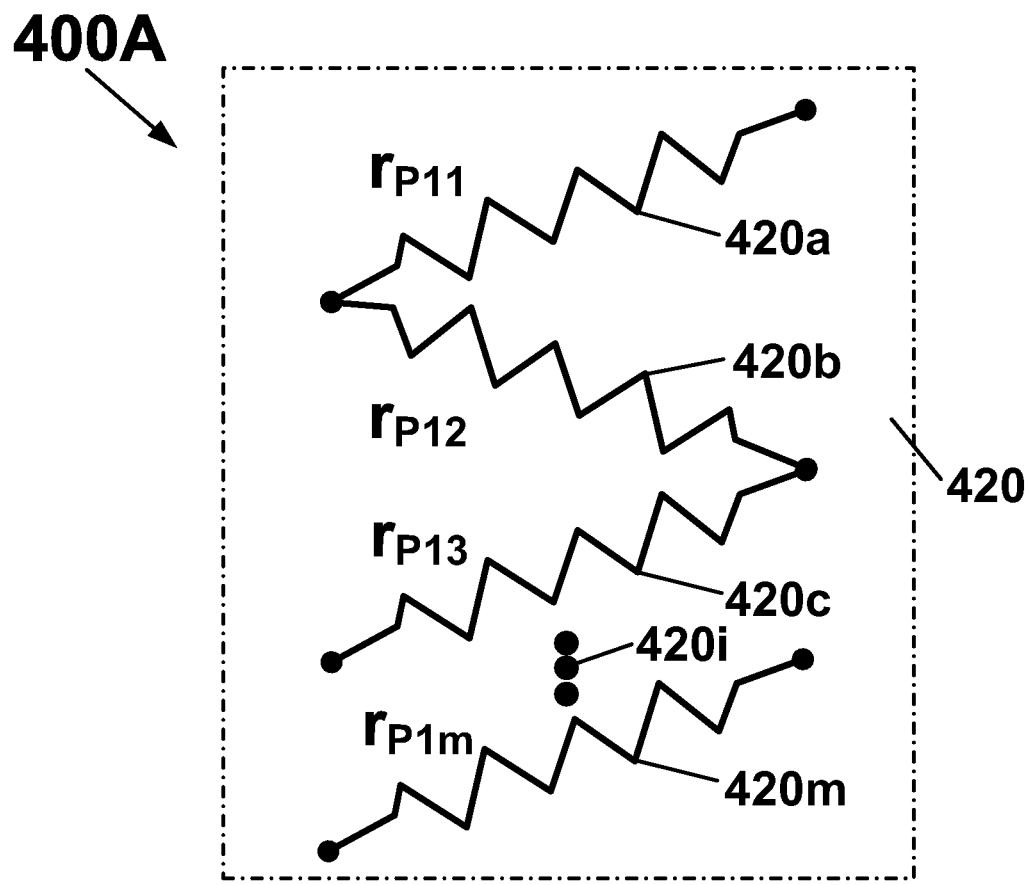
FIG. 4A is a schematic diagram of a model circuit of an interconnect assembly for connecting two solar cells of a solar-cell module, in accordance with an embodiment of the present invention.
Figures 4B, 4C:
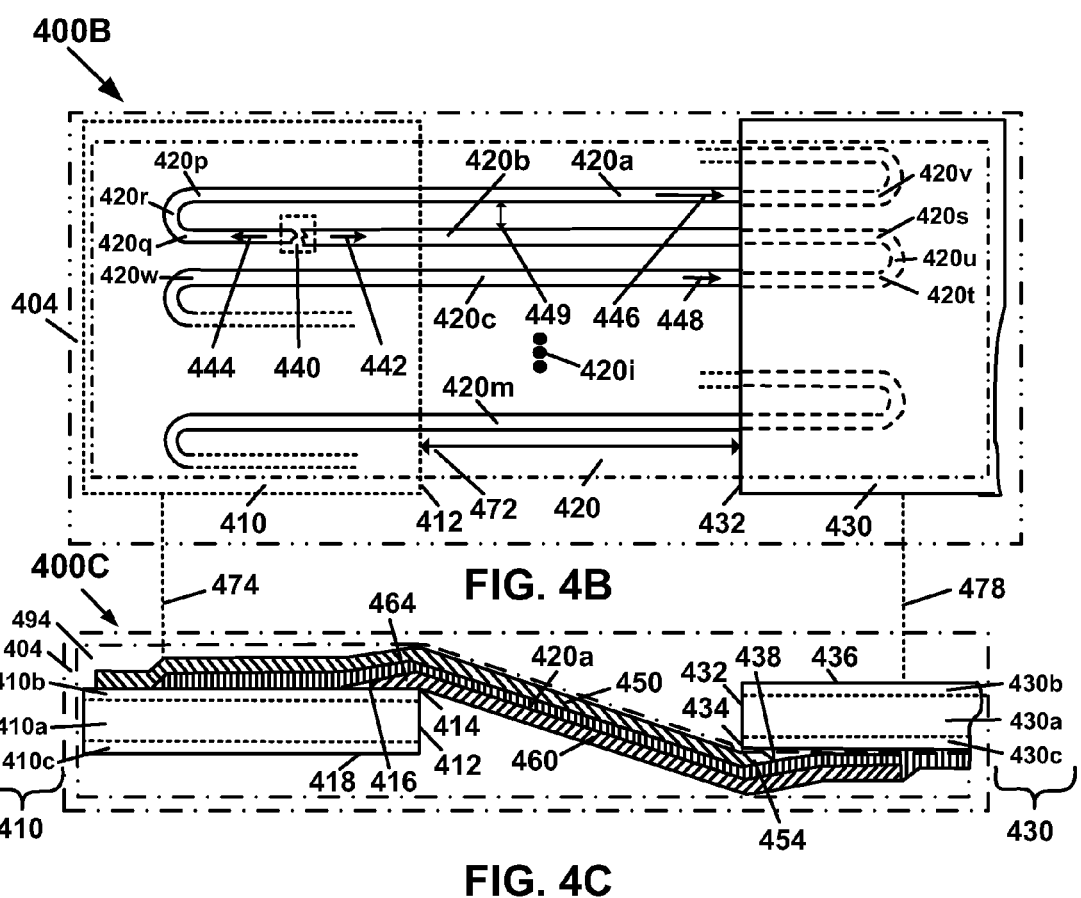
FIG. 4B is a plan view of the interconnect assembly of FIG. 4A that shows the physical interconnection of two solar cells in the solar-cell module, in accordance with an embodiment of the present invention.
FIG. 4C is a cross-sectional, elevation view of the interconnect assembly of FIG. 4B that shows the physical interconnection of two solar cells in the solar-cell module, in accordance with an embodiment of the present invention.

With reference now to FIGS. 4A, 4B and 4C, in accordance with embodiments of the present invention, a schematic diagram of a model circuit 400A of an interconnect assembly 420 connecting a first solar cell 410 to a second solar cell 430 of a solar-cell module 404 is shown. The interconnect assembly 420 includes a trace including a plurality of electrically conductive portions, identified with resistors 420a, 420b, 420c, and 420m with respective resistances, $r_{P11}$, $r_{P12}$, $r_{P13}$ and $r_{P1m}$, and the ellipsis 420i indicating additional resistors (not shown). The plurality of electrically conductive portions, without limitation thereto, identified with resistors 420a, 420b, 420c, 420i, and 420m, are configured both to collect current from the first solar cell 410 and to interconnect electrically to the second solar cell 430. The plurality of electrically conductive portions, identified with resistors 420a, 420b, 420c, 420i, and 420m, are configured such that, upon interconnecting the first solar cell 410 and the second solar cell 430, the plurality of electrically conductive portions are connected electrically in parallel between the first solar cell 410 and the second solar cell 430. The plurality of electrically conductive portions is configured such that equivalent series resistance, $R_{S1}$, of the interconnect assembly 420 including the parallel network of resistors 420a, 420b, 420c, 420i, and 420m, is less than the resistance of any one resistor in the parallel network. Therefore, by connecting the first solar cell 410 to the second solar cell 430, with the interconnect assembly 420, the series resistance, $R_{S1}$, of the interconnect assembly 420 can be reduced lowering the effective series resistance between solar cells in the solar-cell module 404 improving the solar-cell-module efficiency.

Moreover, in accordance with embodiments of the present invention, the configuration of the plurality of electrically conductive portions due to this parallel arrangement of electrically conductive portions between the first solar cell 410 and the second solar cell 430 provides a redundancy of electrical current carrying capacity between interconnected solar cells should any one of the plurality of electrically conductive portions become damaged, or its reliability become impaired. Thus, embodiments of the present invention provide that the plurality of electrically conductive portions is configured such that solar-cell efficiency is substantially undiminished in an event that any one of the plurality of electrically conductive portions is conductively impaired, because the loss of electrical current through any one electrically conductive portion will be compensated for by the plurality of the unimpaired parallel electrically conductive portions coupling the first solar cell 410 with the second solar cell 430. It should be noted that as used herein the phrase, "substantially undiminished," with respect to solar-cell efficiency means that the solar-cell efficiency is not reduced below an acceptable level of productive performance. In addition, in accordance with embodiments of the present invention, the plurality of electrically conductive portions may be configured in pairs of electrically conductive portions, for example, identified with resistors 420a and 420b. Thus, the plurality of electrically conductive portions may be configured such that solar-cell efficiency is substantially undiminished even in an event that, in every pair of electrically conductive portions of the plurality of electrically conductive portions, one electrically conductive portion of the pair is conductively impaired. In accordance with embodiments of the present invention, each member of a pair of electrically conductive portions may be electrically equivalent to the other member of the pair, but need not be electrically equivalent to the other member of the pair, it only being necessary that in an event one member, a first member, of the pair becomes conductively impaired the other member, a second member, is configured such that solar-cell efficiency is substantially undiminished.

With further reference to FIGS. 4B and 4C, in accordance with embodiments of the present invention, a plan view 400B of the interconnect assembly 420 of FIG. 4A is shown that details the physical interconnection of two solar cells 410 and 430 in the solar-cell module 404. The solar-cell module 404 includes the first solar cell 410, at least the second solar cell 430 and the interconnect assembly 420 disposed above a light-facing side 416 of the absorber layer of the first solar cell 410. The interconnect assembly 420 includes a trace including a plurality of electrically conductive portions 420a, 420b, 420c, 420i and 420m, previously identified herein with the resistors 420a, 420b, 420c, 420i and 420m described in FIG. 4A, where the ellipsis of 420i indicates additional electrically conductive portions (not shown). The plurality of electrically conductive portions 420a, 420b, 420c, 420i and 420m is configured both to collect current from the first solar cell 410 and to interconnect electrically to the second solar cell 430. The plurality of electrically conductive portions 420a, 420b, 420c, 420i and 420m is configured such that solar-cell efficiency is substantially undiminished in an event that any one of the plurality of electrically conductive portions 420a, 420b, 420c, 420i and 420m is conductively impaired.

With further reference to FIG. 4B, in accordance with embodiments of the present invention, the detailed configuration of the plurality of electrically conductive portions 420a, 420b, 420c, 420i and 420m is shown. The plurality of electrically conductive portions 420a, 420b, 420c, 420i and 420m further includes a first portion 420a of the plurality of electrically conductive portions 420a, 420b, 420c, 420i and 420m configured both to collect current from the first solar cell 410 and to interconnect electrically to the second solar cell 430 and a second portion 420b of the plurality of electrically conductive portions 420a, 420b, 420c, 420i and 420m configured both to collect current from the first solar cell 410 and to interconnect electrically to the second solar cell 430. The first portion 420a includes a first end 420p distal from the second solar cell 430. Also, the second portion 420b includes a second end 420q distal from the second solar cell 430. The second portion 420b is disposed proximately to the first portion 420a and electrically connected to the first portion 420a such that the first distal end 420p is electrically connected to the second distal end 420q, for example, at first junction 420r, or by a linking portion, such that the second portion 420b is configured electrically in parallel to the first portion 420a when configured to interconnect to the second solar cell 430.

With further reference to FIG. 4B, in accordance with embodiments of the present invention, the plurality of electrically conductive portions 420a, 420b, 420c, 420i and 420m may further include the second portion 420b including a third end 420s distal from the first solar cell 410 and a third portion 420c of the plurality of electrically conductive portions 420a, 420b, 420c, 420i and 420m configured both to collect current from the first solar cell 410 and to interconnect electrically to the second solar cell 430. The third portion 420c includes a fourth end 420t distal from the first solar cell 410. The third portion 420c is disposed proximately to the second portion 420b and electrically connected to the second portion 420b such that the third distal end 420s is electrically connected to the fourth distal end 420t, for example, at second junction 420u, or by a linking portion, such that the third portion 420c is configured electrically in parallel to the second portion 420b when configured to interconnect with the first solar cell 430.

With further reference to FIGS. 4B and 4C, in accordance with embodiments of the present invention, it should be noted that the nature of the parallel connection between electrically conductive portions interconnecting a first solar cell and a second solar cell is such that, for distal ends of electrically conductive portions not directly joined together, without limitation thereto, the metallic substrate of a second solar cell and a TCO layer of the first solar cell may provide the necessary electrical coupling. For example, distal ends 420v and 420s are electrically coupled through a low resistance connection through a metallic substrate 430c of second solar cell 430. Similarly, for example, distal ends 420w and 420q are electrically coupled through the low resistance connection through the TCO layer 410b of first solar cell 410.

With further reference to FIG. 4B, in accordance with embodiments of the present invention, an open-circuit defect 440 is shown such that second portion 420b is conductively impaired. FIG. 4B illustrates the manner in which the plurality of electrically conductive portions 420a, 420b, 420c, 420i and 420m is configured such that solar-cell efficiency is substantially undiminished in an event that any one of the plurality of electrically conductive portions 420a, 420b, 420c, 420i and 420m is conductively impaired, for example, second portion 420b. An arrow 448 indicates the nominal electron-flow through a third portion 420c of the plurality of electrically conductive portions 420a, 420b, 420c, 420i and 420m essentially unaffected by open-circuit defect 440. In the absence of open-circuit defect 440, an electron-flow indicated by arrow 448 would normally flow through any one electrically conductive portion of the plurality of electrically conductive portions 420a, 420b, 420c, 420i and 420m, in particular, second portion 420b. However, when the open-circuit defect 440 is present, this electron-flow divides into two portions shown by arrows 442 and 444: arrow 442 corresponding to that portion of the normal electron-flow flowing to the right along the second portion 420b to the second solar cell 430, and arrow 444 corresponding to that portion of the normal electron-flow flowing to the left along the second portion 420b to the first portion 420a and then to the right along the first portion 420a to the second solar cell 430. Thus, the net electron-flow represented by arrow 446 flowing to the right along the first portion 420a is consequently larger than what would normally flow to the right along the first portion 420a to the second solar cell 430 in the absence of the open-circuit defect 440.

It should be noted that open-circuit defect 440 is for illustration purposes only and that embodiments of the present invention compensate for other types of defects in an electrically conductive portion, in general, such as, without limitation to: a delamination of an electrically conductive portion from the first solar cell 410, corrosion of an electrically conductive portion, and even complete loss of an electrically conductive portion. In accordance with embodiments of the present invention, in the event a defect completely conductively impairs an electrically conductive portion, the physical spacing between adjacent electrically conductive portions, identified with double-headed arrow 449, may be chosen such that solar-cell efficiency is substantially undiminished. Nevertheless, embodiments of the present invention embrace, without limitation thereto, other physical spacings between adjacent electrically conductive portions in the event defects are less severe than those causing a complete loss of one of the electrically conductive portions.

With further reference to FIG. 4B, in accordance with embodiments of the present invention, the plurality of electrically conductive portions 420a, 420b, 420c, 420i and 420m may be connected electrically in series to form a single continuous electrically conductive line. Moreover, the trace that includes the plurality of electrically conductive portions 420a, 420b, 420c, 420i and 420m may be disposed in a serpentine pattern such that the interconnect assembly 420 is configured to collect current from the first solar cell 410 and to interconnect electrically to the second solar cell 430, as shown.

With further reference to FIG. 4C, in accordance with embodiments of the present invention, a cross-sectional, elevation view 400C of the interconnect assembly 420 is shown that further details the physical interconnection of two solar cells 410 and 430 in the solar-cell module 404. Projections 474 and 478 of planes orthogonal to both of the views in FIGS. 4B and 4C, and coincident with the ends of the plurality of electrically conductive portions 420a, 420b, 420c, 420i and 420m show the correspondence between features of the plan view 400B of FIG. 4B and features in the cross-sectional, elevation view 400C of FIG. 4C. Also, it should be noted that although the solar-cell module 404 is shown with separation 472 between the first solar cell 410 and the second solar cell 430, there need not be such separation 472 between the first solar cell 410 and the second solar cell 430. As shown in FIGS. 4B and 4C, a combined solar-cell, interconnect assembly 494 includes the first solar cell 410 and the interconnect assembly 420. The interconnect assembly 420 includes the trace disposed above the light-facing side 416 of the first solar cell 410, the trace further including the plurality of electrically conductive portions 420a, 420b, 420c, 420i and 420m. All electrically conductive portions of the plurality of electrically conductive portions 420a, 420b, 420c, 420i and 420m are configured to collect current from the first solar cell 410 and to interconnect electrically to the second solar cell 430. In addition, the plurality of electrically conductive portions 420a, 420b, 420c, 420i and 420m may be configured such that solar-cell efficiency is substantially undiminished in an event that any one of the plurality of electrically conductive portions 420a, 420b, 420c, 420i and 420m is conductively impaired. Also, any of the plurality of electrically conductive portions 420a, 420b, 420c, 420i and 420m may be configured to interconnect electrically to the second solar cell 430. The first solar cell 410 of the combined solar-cell, interconnect assembly 494 may include a metallic substrate 410c and an absorber layer 410a. The absorber layer 410a of the first solar cell 410 may include copper indium gallium diselenide (CIGS). Alternatively, other semiconductors having the chalcopyrite crystal structure, for example, chemically homologous compounds with the compound CIGS having the chalcopyrite crystal structure, in which alternative elemental constituents are substituted for Cu, In, Ga, and/or Se, may be used as the absorber layer 410a. Moreover, in embodiments of the present invention, it should be noted that semiconductors, such as silicon and cadmium telluride, as well as other semiconductors, may be used as the absorber layer 410a.

With further reference to FIG. 4C, in accordance with embodiments of the present invention, the plurality of electrically conductive portions 420a, 420b, 420c, 420i and 420m of the combined solar-cell, interconnect assembly 494 further includes the first portion 420a of the plurality of electrically conductive portions 420a, 420b, 420c, 420i and 420m configured to collect current from the first solar cell 410 and the second portion 420b of the plurality of electrically conductive portions 420a, 420b, 420c, 420i and 420m configured to collect current from the first solar cell 410. The first portion 420a includes the first end 420p distal from an edge 414 of the first solar cell 410. The second portion 420b includes the second end 420q distal from the edge 414 of the first solar cell 410. The second portion 420b is disposed proximately to the first portion 420a and electrically connected to the first portion 420a such that the first distal end 420p is electrically connected to the second distal end 420q such that the second portion 420b is configured electrically in parallel to the first portion 420a when configured to interconnect to the second solar cell 430.

Figure 6A:
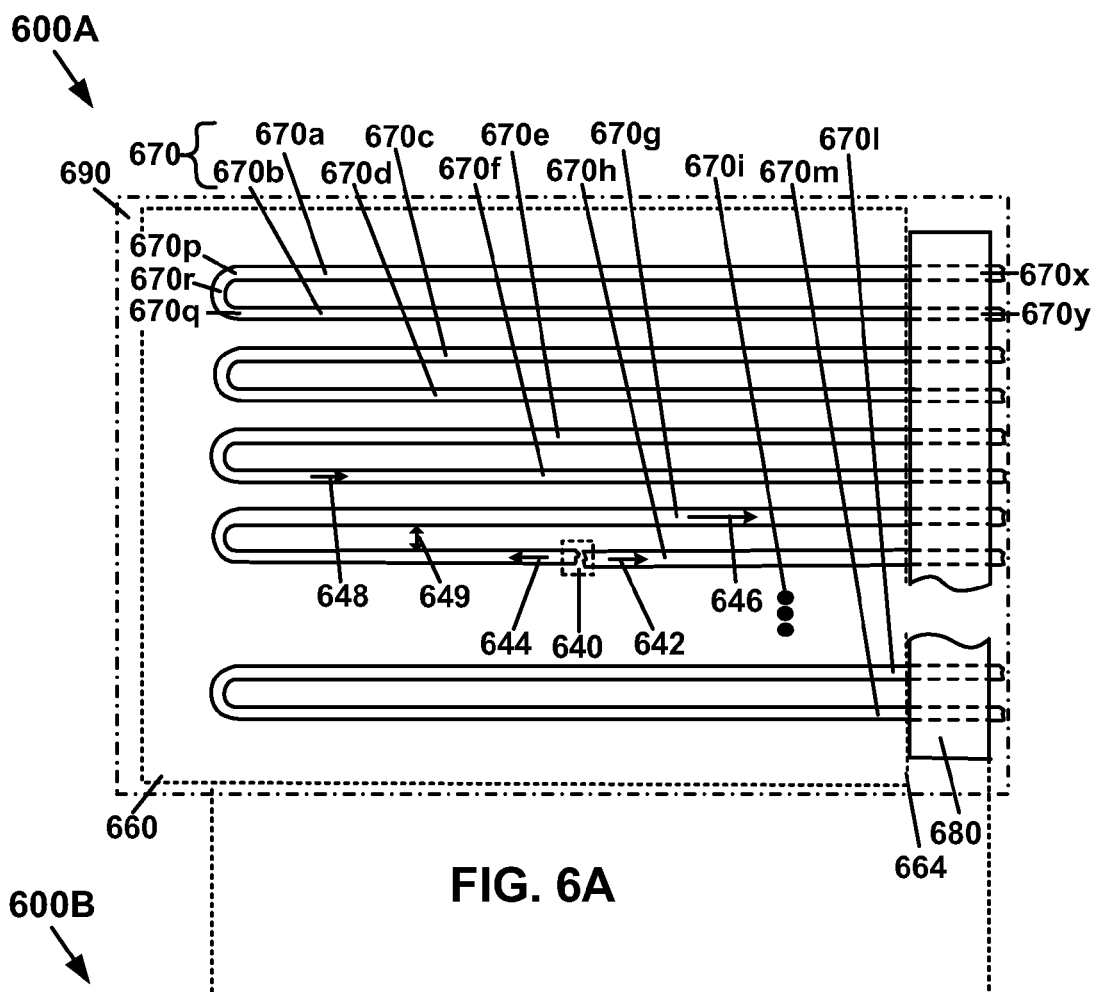
FIG. 6A is a plan view of an integrated busbar-solar-cell-current collector that shows the physical interconnection of a terminating solar cell with a terminating busbar in the integrated busbar-solar-cell-current collector, in accordance with an embodiment of the present invention.
Figure 6B:
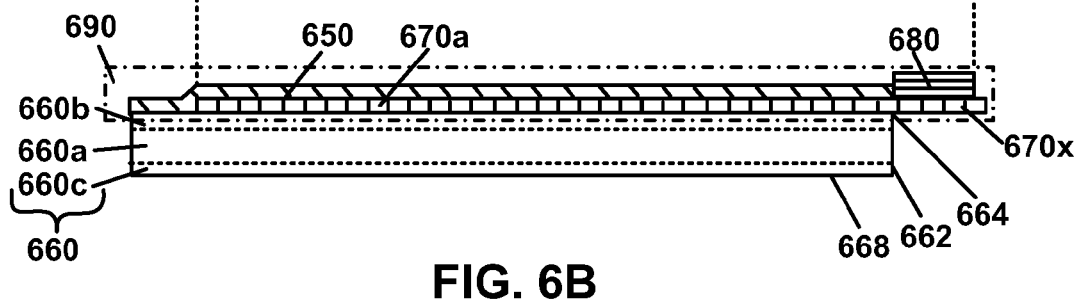
FIG. 6B is a cross-sectional, elevation view of the integrated busbar-solar-cell-current collector of FIG. 6A that shows the physical interconnection of the terminating solar cell with the terminating busbar in the integrated busbar-solar-cell-current collector, in accordance with an embodiment of the present invention.

With further reference to FIG. 4C, in accordance with embodiments of the present invention, the interconnect assembly 420 further includes a top carrier film 450. The top carrier film 450 includes a first substantially transparent, electrically insulating layer coupled to the trace and disposed above a top portion of the trace. The first substantially transparent, electrically insulating layer allows for forming a short-circuit-preventing portion 454 at an edge 434 of the second solar cell 430. The first substantially transparent, electrically insulating layer allows for forming the short-circuit-preventing portion 454 at the edge 434 of the second solar cell 430 to prevent the first portion 420a from short circuiting an absorber layer 430a of the second solar cell 430 in the event that the first portion 420a buckles and rides up a side 432 of second solar cell 430. The edge 434 is located at the intersection of the side 432 of the second solar cell 430 and a back side 438 of the second solar cell 430 that couples with the plurality of electrically conductive portions 420a, 420b, 420c, 420i and 420m, for example, first portion 420a as shown. The second solar cell 430 may include the absorber layer 430a, a TCO layer 430b, and the metallic substrate 430c; a backing layer (not shown) may also be disposed between the absorber layer 430a and the metallic substrate 430c. Above a light-facing side 436 of the second solar cell 430, an integrated busbar-solar-cell-current collector (not shown in FIG. 4C, but which is shown in FIGS. 6A and 6B) may be disposed and coupled to the second solar cell 430 to provide interconnection with a load (not shown). Alternatively, above the light-facing side 436 of the second solar cell 430, another interconnect assembly (not shown) may be disposed and coupled to the second solar cell 430 to provide interconnection with additional solar-cells (not shown) in the solar-cell module 404.

With further reference to FIG. 4C, in accordance with embodiments of the present invention, the interconnect assembly 420 further includes a bottom carrier film 460. The bottom carrier film 460 may include a second electrically insulating layer coupled to the trace and disposed below a bottom portion of the trace. Alternatively, The bottom carrier film 460 may include a carrier film selected from a group consisting of a second electrically insulating layer, a structural plastic layer, and a metallic layer, and is coupled to the trace and is disposed below a bottom portion of the trace. The second electrically insulating layer allows for forming an edge-protecting portion 464 at the edge 414 of the first solar cell 410. Alternatively, a supplementary isolation strip (not shown) of a third electrically insulating layer may be disposed between the bottom carrier film 460 and the first portion 420a of the plurality of electrically conductive portions 420a, 420b, 420c, 420i and 420m, or alternatively between the bottom carrier film 460 and the edge 414, to provide additional protection at the edge 414. The supplementary isolation strip may be as wide as 5 millimeters (mm) in the direction of the double-headed arrow showing the separation 472, and may extend along the full length of a side 412 of the first solar cell 410. The edge 414 is located at the intersection of the side 412 of the first solar cell 410 and a light-facing side 416 of the first solar cell 410 that couples with the plurality of electrically conductive portions 420a, 420b, 420c, 420i and 420m, for example, first portion 420a as shown. The first solar cell 410 may include the absorber layer 410a, the TCO layer 410b, and the metallic substrate 410c; a backing layer (not shown) may also be disposed between the absorber layer 410a and the metallic substrate 410c. Below a back side 418 of the first solar cell 410, a first busbar (not shown) may be disposed and coupled to the first solar cell 410 to provide interconnection with a load (not shown). Alternatively, below the back side 418 of the first solar cell 410, another interconnect assembly (not shown) may be disposed and coupled to the first solar cell 410 to provide interconnection with additional solar-cells (not shown) in the solar-cell module 404.

Figure 4D:
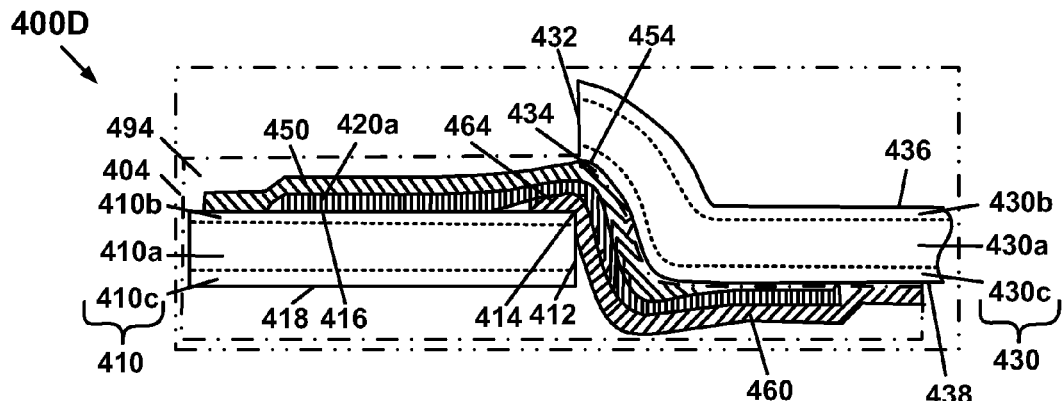
FIG. 4D is a cross-sectional, elevation view of an alternative interconnect assembly for FIG. 4B that shows an edge-conforming interconnect assembly for the physical interconnection of two solar cells in the solar-cell module, in accordance with an embodiment of the present invention.
Figure 4E:
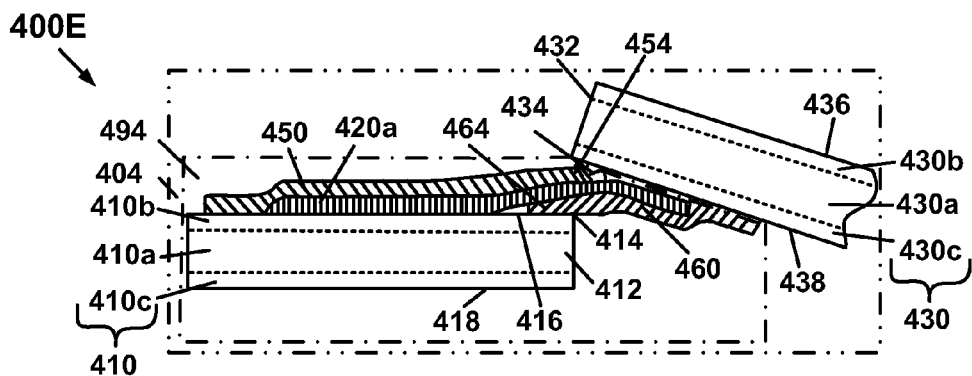
FIG. 4E is a cross-sectional, elevation view of an alternative interconnect assembly for FIG. 4B that shows a shingled-solar-cell arrangement for the physical interconnection of two solar cells in the solar-cell module, in accordance with an embodiment of the present invention.

With reference now to FIGS. 4D and 4E, in accordance with embodiments of the present invention, cross-sectional, elevation views 400D and 400E, respectively, of two alternative interconnect assemblies that minimize the separation 472 (see FIG. 4B) between the first solar cell 410 and the second solar cell 430 to improve the solar-cell-module efficiency of the solar-cell module 404 are shown. In both examples shown in FIGS. 4D and 4E, the side 412 of the first solar cell 410 essentially coincides with the side 432 of the second solar cell 430. It should be noted that as used herein the phrase, "essentially coincides," with respect to the side 412 of the first solar cell 410 and the side 432 of the second solar cell 430 means that there is little or no separation 472 between the first solar cell 410 and the second solar cell 430, and little or no overlap of the first solar cell 410 with the second solar cell 430 so that there is less wasted space and open area between the solar cells 410 and 430, which improves the solar-collection efficiency of the solar-cell module 404 resulting in improved solar-cell-module efficiency. FIG. 4D shows an edge-conforming interconnect assembly for the physical interconnection of the two solar cells 410 and 430 in the solar-cell module 404. FIG. 4E shows a shingled-solar-cell arrangement for the physical interconnection of the two solar cells 410 and 430 in the solar-cell module 404. For both the edge-conforming interconnect assembly of FIG. 4D and the shingled-solar-cell arrangement of FIG. 4E, the interconnect assembly 420 further includes the bottom carrier film 460. The bottom carrier film 460 includes a second electrically insulating layer coupled to the trace and disposed below a bottom portion of the trace. Alternatively, The bottom carrier film 460 may include a carrier film selected from a group consisting of a second electrically insulating layer, a structural plastic layer, and a metallic layer, and is coupled to the trace and is disposed below a bottom portion of the trace. The second electrically insulating layer allows for forming the edge-protecting portion 464 at the edge 414 of the first solar cell 410. In the case of the edge-conforming interconnect assembly shown in FIG. 4D, the bottom carrier film 460 and the first portion 420a of the interconnect assembly 420 may be relatively flexible and compliant allowing them to wrap around the edge 414 and down the side 412 of the first solar cell 410, as shown. The edge 414 is located at the intersection of the side 412 of the first solar cell 410 and the light-facing side 416 of the first solar cell 410 that couples with the plurality of electrically conductive portions 420a, 420b, 420c, 420i and 420m, for example, first portion 420a as shown. The first solar cell 410 may include the absorber layer 410a, a TCO layer 410b, and the metallic substrate 410c; a backing layer (not shown) may also be disposed between the absorber layer 410a and the metallic substrate 410c. Below the back side 418 of the first solar cell 410, another interconnect assembly (not shown) or first busbar (not shown) may be disposed and coupled to the first solar cell 410 as described above for FIG. 4C. If an additional solar cell (not shown) is interconnected to the back side 418 of the first solar cell 410 as in the shingled-solar-cell arrangement of FIG. 4E, the first solar cell 410 would be pitched upward at its left-hand side and interconnected to another interconnect assembly similar to the manner in which the second solar cell 430 is shown interconnected with solar cell 410 at side 412 in FIG. 4E.

With further reference to FIGS. 4D and 4E, in accordance with embodiments of the present invention, the interconnect assembly 420 further includes the top carrier film 450. The top carrier film 450 includes a first substantially transparent, electrically insulating layer coupled to the trace and disposed above a top portion of the trace. The first substantially transparent, electrically insulating layer allows for forming the short-circuit-preventing portion 454 at the edge 434 of the second solar cell 430 to prevent the first portion 420a from short circuiting the absorber layer 430a of the second solar cell 430 in the event that the first portion 420a rides up the side 432 of second solar cell 430. The edge 434 is located at the intersection of the side 432 of the second solar cell 430 and the back side 438 of the second solar cell 430 that couples with the plurality of electrically conductive portions 420a, 420b, 420c, 420i and 420m, for example, first portion 420a as shown. In the case of the edge-conforming interconnect assembly shown in FIG. 4D, the top carrier film 450 may be relatively flexible and compliant allowing it to follow the conformation of the bottom carrier film 460 and the first portion 420a of the interconnect assembly 420 underlying it that wrap around the edge 414 and down the side 412 of the first solar cell 410, as shown. The second solar cell 430 may include the absorber layer 430a, the TCO layer 430b, and the metallic substrate 430c; a backing layer (not shown) may also be disposed between the absorber layer 430a and the metallic substrate 430c. Also, in the case of the edge-conforming interconnect assembly, the absorber layer 430a, TCO layer 430b, and metallic substrate 430c of the second solar cell 430 may be relatively flexible and compliant allowing them to follow the conformation of the underlying interconnect assembly 420 that wraps around the edge 414 and down the side 412 of the first solar cell 410. Above the light-facing side 436 of the second solar cell 430, an integrated busbar-solar-cell-current collector (not shown in FIG. 4C, but which is shown in FIGS. 6A and 6B), or alternatively another interconnect assembly (not shown), may be disposed on and coupled to the second solar cell 430, as described above for FIG. 4C.

Figure 4F:
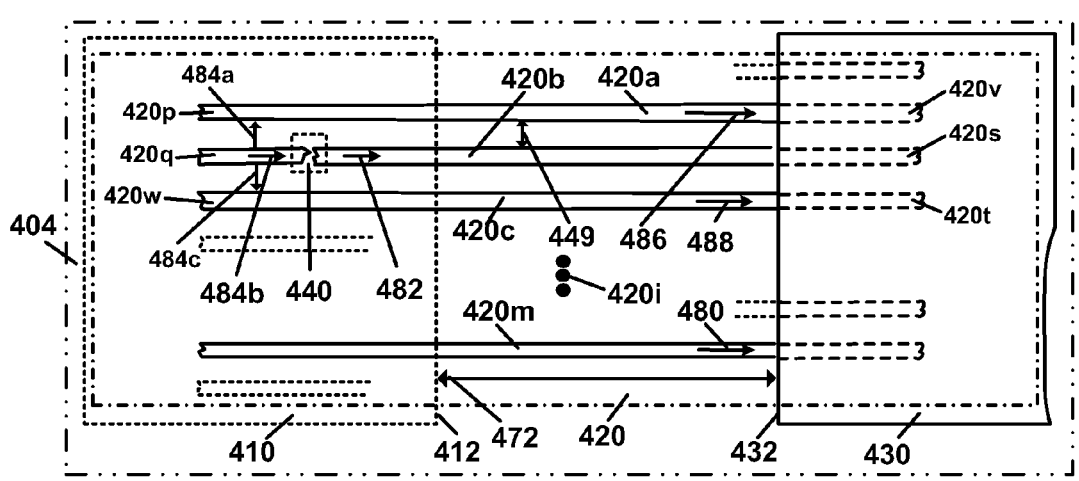
FIG. 4F is a plan view of an alternative interconnect assembly for FIG. 4A that shows the physical interconnection of two solar cells in the solar-cell module, in accordance with an embodiment of the present invention.

With reference now to FIG. 4F, in accordance with embodiments of the present invention, a plan view 400F of an alternative interconnect assembly for the interconnect assembly 420 of FIG. 4A is shown that details the physical interconnection of two solar cells 410 and 430 in the solar-cell module 404. The solar-cell module 404 includes the first solar cell 410, at least the second solar cell 430 and the interconnect assembly 420 disposed above the light-facing side 416 of the absorber layer of the first solar cell 410. The edges 414 and 434 of the solar cells 410 and 430 may be separated by the separation 472 as shown in FIG. 4F; or alternatively, the edges 414 and 434 of the solar cells 410 and 430 may essentially coincide as discussed above for FIGS. 4D and 4E. The interconnect assembly 420 includes a trace including a plurality of electrically conductive portions 420a, 420b, 420c, 420i and 420m, previously identified herein with the resistors 420a, 420b, 420c, 420i and 420m described in FIG. 4A, where the ellipsis of 420i indicates additional electrically conductive portions (not shown). The plurality of electrically conductive portions 420a, 420b, 420c, 420i and 420m is configured both to collect current from the first solar cell 410 and to interconnect electrically to the second solar cell 430. The plurality of electrically conductive portions 420a, 420b, 420c, 420i and 420m is configured such that solar-cell efficiency is substantially undiminished in an event that any one of the plurality of electrically conductive portions 420a, 420b, 420c, 420i and 420m is conductively impaired.

With further reference to FIG. 4F, in accordance with embodiments of the present invention, the detailed configuration of the plurality of electrically conductive portions 420a, 420b, 420c, 420i and 420m is shown without electrically connecting trace portions, for example, junctions formed in the trace or linking portions of the trace. For example, in the case where electrically connecting trace portions of the trace have been cut away, removed, or are otherwise absent, from the distal ends of the plurality of electrically conductive portions 420a, 420b, 420c, 420i and 420m, as shown in FIG. 4F. The plurality of electrically conductive portions 420a, 420b, 420c, 420i and 420m may be linked together instead indirectly by the TCO layer 410b of the first solar cell 410 at distal ends of the trace disposed over the first solar cell 410, for example, first distal end 420p of first portion 420a and second distal end 420q of second portion 420b by portions of the TCO layer 410b of the first solar cell 410 that lie in between the distal ends 420p and 420q. In like fashion, the distal ends 420w and 420q are electrically coupled through the low resistance connection through the TCO layer 410b of first solar cell 410. Similarly, the plurality of electrically conductive portions 420a, 420b, 420c, 420i and 420m may be linked together instead indirectly by the metallic substrate 430c, or intervening backing layer (not shown), of the first solar cell 430 at distal ends of the trace disposed under the second solar cell 430, for example, third distal end 420s of second portion 420b and fourth distal end 420t of third portion 420c by portions of the metallic substrate 430c of the second solar cell 430 that lie in between the distal ends 420s and 420t. In like fashion, the distal ends 420v and 420s are electrically coupled through a low resistance connection through the metallic substrate 430c of second solar cell 430.

With further reference to FIG. 4F, in accordance with embodiments of the present invention, the open-circuit defect 440 is shown such that second portion 420b is conductively impaired. FIG. 4F illustrates the manner in which the plurality of electrically conductive portions 420a, 420b, 420c, 420i and 420m is configured such that solar-cell efficiency is substantially undiminished in an event that any one of the plurality of electrically conductive portions 420a, 420b, 420c, 420i and 420m is conductively impaired, for example, second portion 420b. An arrow 480 indicates the nominal electron-flow through an m-th portion 420m of the plurality of electrically conductive portions 420a, 420b, 420c, 420i and 420m essentially unaffected by open-circuit defect 440. In the absence of open-circuit defect 440, an electron-flow indicated by arrow 480 would normally flow through any one electrically conductive portion of the plurality of electrically conductive portions 420a, 420b, 420c, 420i and 420m, in particular, second portion 420b. However, when the open-circuit defect 440 is present, portions of this electron-flow are lost to adjacent electrically conductive portions 420a and 420c shown by arrows 484a and 484c; arrow 482 corresponds to that portion of the normal electron-flow flowing to the right along the second portion 420b to the second solar cell 430, and arrow 484b corresponds to that portion of the normal electron-flow that would bridge the open-circuit defect 440 by flowing through the higher resistance path of the TCO layer 410b bridging across the two portions of second portion 420b on either side of the open-circuit defect 440. Thus, the net electron-flow represented by arrow 486 flowing to the right along the first portion 420a is consequently larger than what would normally flow to the right along the first portion 420a to the second solar cell 430 in the absence of the open-circuit defect 440; and, the net electron-flow represented by arrow 488 flowing to the right along the third portion 420c is consequently larger than what would normally flow to the right along the third portion 420c to the second solar cell 430 in the absence of the open-circuit defect 440.

Moreover, in the case of the alternative interconnect assembly depicted in FIG. 4F, as stated before for the interconnect assembly depicted in FIG. 4B, it should again be noted that open-circuit defect 440 is for illustration purposes only and that embodiments of the present invention compensate for other types of defects in an electrically conductive portion, in general, such as, without limitation to: a delamination of an electrically conductive portion from the first solar cell 410, corrosion of an electrically conductive portion, and even complete loss of an electrically conductive portion. In accordance with embodiments of the present invention, in the event a defect completely conductively impairs an electrically conductive portion, the physical spacing between adjacent electrically conductive portions, identified with double-headed arrow 449, may be chosen such that solar-cell efficiency is substantially undiminished. Nevertheless, embodiments of the present invention embrace, without limitation thereto, other physical spacings between adjacent electrically conductive portions in the event defects are less severe than those causing a complete loss of one of the electrically conductive portions.

Figure 5A:
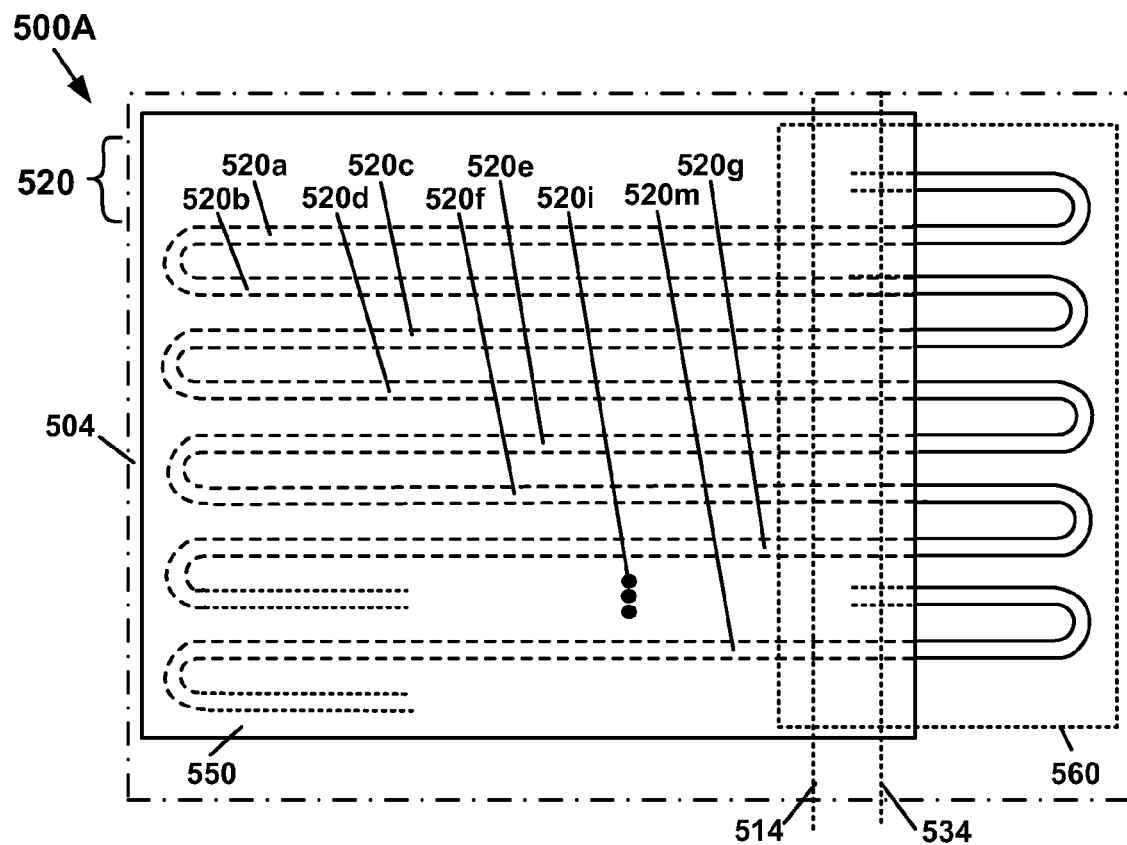
FIG. 5A is a plan view of the combined applicable carrier film, interconnect assembly that shows the physical arrangement of a trace with respect to a top carrier film and a bottom carrier film in the combined applicable carrier film, interconnect assembly, in accordance with an embodiment of the present invention.

With reference now to FIG. 5A, in accordance with embodiments of the present invention, a plan view 500A of the combined applicable carrier film, interconnect assembly 504 is shown. FIG. 5A shows the physical arrangement of a trace 520 with respect to a top carrier film 550 and a bottom carrier film 560 in the combined applicable carrier film, interconnect assembly 504. The combined applicable carrier film, interconnect assembly 504 includes the top carrier film 550 and the trace 520 including a plurality of electrically conductive portions 520a, 520b, 520c, 520d, 520e, 520f, 520g, 520m and 520i, the latter corresponding to the ellipsis indicating additional electrically conductive portions (not shown). The plurality of electrically conductive portions 520a through 520m is configured both to collect current from a first solar cell 510 (shown in FIG. 5C) and to interconnect electrically to a second solar cell (not shown). As shown in FIG. 5A, the plurality of electrically conductive portions 520a through 520m run over the top of the first solar cell 510 on the left and over an edge 514 of the first solar cell 510 to the right under an edge 534 of, and underneath, the second solar cell (not shown). The top carrier film 550 includes a first substantially transparent, electrically insulating layer 550A (shown in FIG. 5B). The plurality of electrically conductive portions 520a through 520m is configured such that solar-cell efficiency is substantially undiminished in an event that any one of the plurality of electrically conductive portions 520a through 520m is conductively impaired. It should be noted that as used herein the phrase, "substantially transparent," with respect to a substantially transparent, electrically insulating layer means that light passes through the substantially transparent, electrically insulating layer with negligible absorption. The first substantially transparent, electrically insulating layer 550a is coupled to the trace 520 and disposed above a top portion of the trace 520 (shown in FIG. 5B) as indicated by the dashed portions of the trace 520 on the left of FIG. 5A.

Figure 5B:
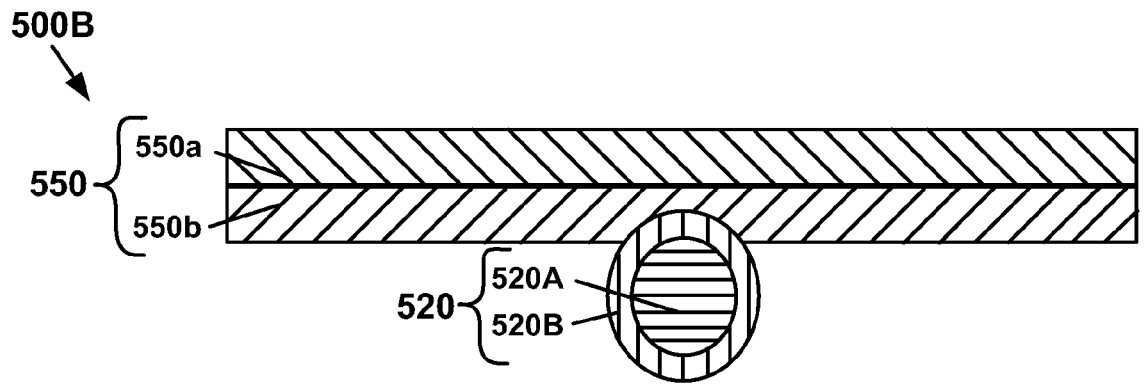
FIG. 5B is a cross-sectional, elevation view of the combined applicable carrier film, interconnect assembly of FIG. 5A that shows the physical arrangement of a trace with respect to a top carrier film in the combined applicable carrier film, interconnect assembly prior to disposition on a solar cell, in accordance with an embodiment of the present invention.
Figure 5C:
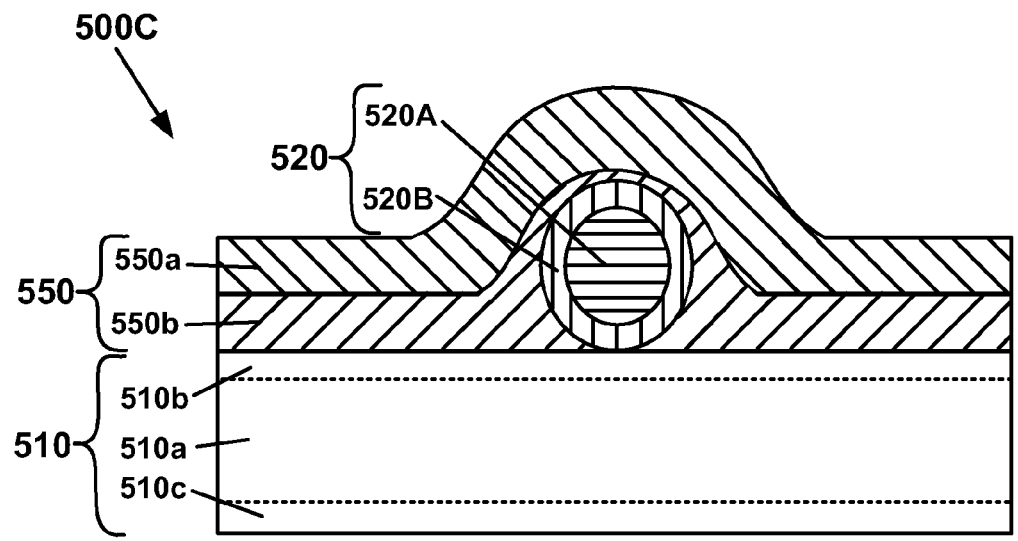
FIG. 5C is a cross-sectional, elevation view of the interconnect assembly of FIG. 5B that shows the physical arrangement of a trace with respect to a top carrier film in the combined applicable carrier film, interconnect assembly after disposition on a solar cell, in accordance with an embodiment of the present invention.

With reference now to FIGS. 5B and 5C, in accordance with embodiments of the present invention, a cross-sectional, elevation view of the combined applicable carrier film, interconnect assembly 504 of FIG. 5A is shown. As shown in FIGS. 5B and 5C, the cross-section of the view is taken along a cut parallel to the edge 514 of the first solar cell 510. The cross-sectional, elevation view of FIG. 5B shows the physical arrangement of the trace 520 with respect to the top carrier film 550 in the combined applicable carrier film, interconnect assembly 504 prior to disposition on the first solar cell 510. On the other hand, the cross-sectional, elevation view of FIG. 5C shows the physical arrangement of the trace 520 with respect to the top carrier film 550 and the first solar cell 510 of the combined applicable carrier film, interconnect assembly 504 after it couples with the first solar cell 510. The top carrier film 550 and the trace 520 are configured for applying to a light-facing side of the first solar cell 510 both to collect current from the first solar cell 510 and to interconnect electrically to the second solar cell (not shown). The first solar cell 510 may include an absorber layer 510a, a TCO layer 510b, and a metallic substrate 510c; the backing layer (not shown) may also be disposed between the absorber layer 510a and the metallic substrate 510c. The first substantially transparent, electrically insulating layer 550a holds the trace 520 down in contact with the first solar cell 510 and allows for forming a short-circuit-preventing portion at an edge of the second solar cell (not shown). The top carrier film 550 further includes a first substantially transparent, adhesive medium 550b coupling the trace 520 to the substantially transparent, electrically insulating layer 550a. As shown in FIG. 5B, prior to disposition on the first solar cell 510, the top carrier film 550 lies relatively flat across the top portion of the trace 520, for example, as for the conformational state of the top carrier film 550 immediately after roll-to-roll fabrication of the combined applicable carrier film, interconnect assembly 504. In contrast, after disposition on the first solar cell 510, the top carrier film 550 conforms to the top portion of the trace 520, as shown in FIG. 5B. The first substantially transparent, adhesive medium 550b allows for coupling the trace 520 to the first solar cell 510 without requiring solder. The first substantially transparent, electrically insulating layer 550a may include a structural plastic material, such as polyethylene terephthalate (PET). In accordance with embodiments of the present invention, a first substantially transparent, adhesive medium such as first substantially transparent, adhesive medium 550b may be included, without limitation thereto, in a top carrier film of: the combined applicable carrier film, interconnect assembly 504, the interconnect assembly 320, the integrated busbar-solar-cell-current collector 690 (see FIG. 6B), the combined solar-cell, interconnect assembly 494, or the interconnect assembly 420 of the solar-cell module 404.

With further reference to FIGS. 5A, 5B and 5C, in accordance with embodiments of the present invention, the combined applicable carrier film, interconnect assembly 504 further includes the bottom carrier film 560. The bottom carrier film 560 includes a second electrically insulating layer, like 550a, coupled to the trace 520 and disposed below a bottom portion of the trace 520, as indicated by the solid-line portions of the trace 520 on the right of FIG. 5A. Alternatively, the bottom carrier film 560 may include a carrier film selected from a group consisting of a second electrically insulating layer, a structural plastic layer, and a metallic layer, and is coupled to the trace 520 and is disposed below a bottom portion of the trace 520. The second electrically insulating layer, like 550a, holds the trace 520 down in contact with a back side of the second solar cell (not shown) and allows for forming an edge-protecting portion at the edge 514 of the first solar cell 510. The bottom carrier film 560 further includes a second adhesive medium, like 550b, coupling the trace to the second electrically insulating layer, like 550a. The second adhesive medium, like 550b, allows for coupling the trace 520 to the back side of the second solar cell (not shown) without requiring solder. The second electrically insulating layer, like 550a, includes a structural plastic material, such as PET. In accordance with embodiments of the present invention, a second adhesive medium, like 550b, may be included, without limitation thereto, in a bottom carrier film of: the combined applicable carrier film, interconnect assembly 504, the interconnect assembly 320, the combined solar-cell, interconnect assembly 494, or the interconnect assembly 420 of the solar-cell module 404.

With further reference to FIG. 5A, in accordance with embodiments of the present invention, the trace 520 may be disposed in a serpentine pattern that allows for collecting current from the first solar cell 510 (shown in FIG. 5C) and electrically interconnecting to the second solar cell (not shown). It should be noted that neither the first solar cell 510 nor the second solar cell (not shown) are shown in FIG. 5A so as not to obscure the structure of the combined applicable carrier film, interconnect assembly 504. As shown in FIG. 5A, the combined applicable carrier film, interconnect assembly 504 includes the trace 520 including the plurality of electrically conductive portions 520a through 520m that may run in a serpentine pattern back and forth between the first solar cell 510 and the second solar cell (not shown). The serpentine pattern is such that adjacent electrically conductive portions of the plurality of electrically conductive portions 520a through 520m are configured in pairs of adjacent electrically conductive portions: 520a and 520b, 520c and 520d, 520e and 520f, etc. The pairs of adjacent electrically conductive portions may be configured in a regular repeating pattern of equally spaced adjacent electrically conductive portions. The trace 520 including the plurality of electrically conductive portions 520a through 520m is disposed between the top carrier film 550 disposed above a top portion of the trace 520 and the bottom carrier film 560 disposed below a bottom portion of the trace 520. The first substantially transparent, electrically insulating layer 550a of top carrier film 550 and the second electrically insulating layer, or alternatively, structural plastic layer or metallic layer, of bottom carrier film 560 are coupled to the trace 520 with a first substantially transparent, adhesive medium 550b and second adhesive medium which also serve to couple the trace 520 to the first solar cell 510, which may be located on the left, and the second solar cell, which may be located on the right. In the space between the two solar cells, between the edge 514 of the first solar cell and the edge 534 of the second solar cell, the trace is sandwiched between the two carrier films 550 and 560; the overlapping region of the two carrier films 550 and 560 extends somewhat beyond the respective edges 514 and 534 of the first and second solar cells so as to form, respectively, an edge-protecting portion at the edge 514 of the first solar cell, and a short-circuit-preventing portion at the edge 534 of the second solar cell, from the trace 520 that crosses the edges 514 and 534.

With further reference to FIGS. 5B and 5C, in accordance with embodiments of the present invention, the trace 520 may further include an electrically conductive line including a conductive core 520A with at least one overlying layer 520B. In one embodiment of the present invention, the electrically conductive line may include the conductive core 520A including a material having greater conductivity than nickel, for example, copper, with an overlying nickel layer 520B. In another embodiment of the present invention, electrically conductive line may include the conductive core 520A including nickel without the overlying layer 520B. The electrically conductive line may also be selected from a group consisting of a copper conductive core clad with a silver cladding, a copper conductive core clad with a nickel coating further clad with a silver cladding and an aluminum conductive core clad with a silver cladding.

With further reference to FIGS. 5B and 5C, in accordance with embodiments of the present invention, the trace 520 for collecting current from a solar cell, for example, the first solar cell 510, may include an electrically conductive line including the conductive core 520A, and the overlying layer 520B that limits current flow to a proximate shunt defect (not shown) in the solar cell. The proximate shunt defect may be proximately located in the vicinity of an electrical contact between the overlying layer 520B of the electrically conductive line and the TCO layer 510b of the solar cell, for example, first solar cell 510. The overlying layer 520B of the electrically conductive line of the trace 520 may further include an overlying layer 520B composed of nickel. The conductive core 520A of the electrically conductive line of the trace 520 may further include nickel. The conductive core 520A may also include a material selected from a group consisting of copper, silver, aluminum, and elemental constituents and alloys having high electrical conductivity, which may be greater than the electrical conductivity of nickel. The TCO layer 510b of the solar cell, for example, first solar cell 510, may include a conductive oxide selected from a group consisting of zinc oxide, aluminum zinc oxide and indium tin oxide. In addition, the absorber layer 510a, for example, absorber layer 112 of FIG. 1A, of the solar cell, for example, first solar cell 510, may include copper indium gallium diselenide (CIGS). Alternatively, in embodiments of the present invention, it should be noted that semiconductors, such as silicon, cadmium telluride, and chalcopyrite semiconductors, as well as other semiconductors, may be used as the absorber layer 510a. Moreover, an n-type layer, for example, n-type portion 112b of absorber layer 112 of FIG. 1A, of the solar cell, for example, first solar cell 510, may be disposed on and electrically coupled to a p-type absorber layer, for example, absorber layer 112 of FIG. 1A, of the solar cell, for example, first solar cell 510, and the n-type layer, for example, n-type portion 112b of absorber layer 112 of FIG. 1A, may be selected from a group consisting of a metal oxide, a metal sulfide and a metal selenide.

Although the trace 520 is shown as having a circular cross-section having a point-like contact with a solar cell, for example, with the TCO layer 510b, or, without limitation thereto, to a top surface, of the first solar cell 510, embodiments of the present inventions include, without limitation thereto, other cross-sectional profiles of the trace 520, such as a profile including a flattened top portion and a flattened bottom portion, so as to increase the contact area between the trace 520 and a solar cell with which it makes contact. For example, a flattened bottom portion of trace 520 increases the contact area with the light-facing side of the first solar cell 510; on the other hand, a flattened top portion of trace 520 increases the contact area with a back side of an adjacent solar cell to which the plurality of electrically conductive portions 520a through 520m of the trace 520 interconnects. In accordance with embodiments of the present invention, a trace, such as trace 520, may be included, without limitation thereto, in: the combined applicable carrier film, interconnect assembly 504, the interconnect assembly 320, the integrated busbar-solar-cell-current collector 690 (see FIG. 6B), the combined solar-cell, interconnect assembly 494, or the interconnect assembly 420 of the solar-cell module 404.

With reference now to FIG. 6A, in accordance with embodiments of the present invention, a plan view 600A of an integrated busbar-solar-cell-current collector 690 is shown. FIG. 6A shows the physical interconnection of a terminating solar cell 660 with a terminating busbar 680 of the integrated busbar-solar-cell-current collector 690. The integrated busbar-solar-cell-current collector 690 includes the terminating busbar 680 and an integrated solar-cell, current collector 670. The integrated solar-cell, current collector 670 includes a plurality of integrated pairs 670a&b, 670c&d, 670e&f, 670g&h, and 670l&m and 670i, the ellipsis indicating additional integrated pairs (not shown), of electrically conductive, electrically parallel trace portions 670a-m. Throughout the following, the respective integrated pairs: 670a and 670b, 670c and 670d, 670e and 670f, 670g and 670h, and 670l and 670m, are referred to respectively as: 670a&b, 670c&d, 670e&f, 670g&h, and 670l&m; and the electrically conductive, electrically parallel trace portions: 670a, 670b, 670c, 670d, 670e, 670f, 670g, 670h, 670l and 670m, are referred to as 670a-m. The plurality of integrated pairs 670a&b, 670c&c, 670e&f, 670g&h, 670i and 670l&m of electrically conductive, electrically parallel trace portions 670a-m is configured both to collect current from the terminating solar cell 660 and to interconnect electrically to the terminating busbar 680. The plurality of integrated pairs 670a&b, 670c&c, 670e&f, 670g&h, 670i and 670l&m of electrically conductive, electrically parallel trace portions 670a-m is configured such that solar-cell efficiency is substantially undiminished in an event that any one electrically conductive, electrically parallel trace portion, for example, 670h, of the plurality of integrated pairs 670a&b, 670c&c, 670e&f, 670g&h, 670i and 670l&m of electrically conductive, electrically parallel trace portions 670a-m is conductively impaired.

With further reference to FIGS. 6A and 6B, in accordance with embodiments of the present invention, the plurality of integrated pairs 670a&b, 670c&c, 670e&f, 670g&h, 670i and 670l&m of electrically conductive, electrically parallel trace portions 670*a-m* further includes a first electrically conductive, electrically parallel trace portion 670*a* of a first integrated pair 670*a*&*b* of the electrically conductive, electrically parallel trace portions 670*a-m* configured both to collect current from the terminating solar cell 660 and to interconnect electrically to the terminating busbar 680, and a second electrically conductive, electrically parallel trace portion 670*b* of the first integrated pair 670*a*&*b* of the electrically conductive, electrically parallel trace portions 670*a-m* configured both to collect current from the terminating solar cell 660 and to interconnect electrically to the terminating busbar 680. The first electrically conductive, electrically parallel trace portion 670*a* includes a first end 670*p* distal from the terminating busbar 680 located parallel to a side 662 of the terminating solar cell 660. The second electrically conductive, electrically parallel trace portion 670*b* includes a second end 670*q* distal from the terminating busbar 680. The second electrically conductive, electrically parallel trace portion 670*b* is disposed proximately to the first electrically conductive, electrically parallel trace portion 670*a* and electrically connected to the first electrically conductive, electrically parallel trace portion 670*a* such that the first distal end 670*p* is electrically connected to the second distal end 670*q*, for example, at first junction 670*r*, or by a linking portion, such that the second electrically conductive, electrically parallel trace portion 670*b* is configured electrically in parallel to the first electrically conductive, electrically parallel trace portion 670*a* when configured to interconnect to the terminating busbar 680. In addition, in accordance with embodiments of the present invention, the terminating busbar 680 may be disposed above and connected electrically to extended portions, for example, 670*x* and 670*y*, of the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m* configured such that the terminating busbar 680 is configured to reduce shadowing of the terminating solar cell 660.

With further reference to FIG. 6A, in accordance with embodiments of the present invention, an open-circuit defect 640 is shown such that eighth electrically conductive, electrically parallel trace portion 670*h* is conductively impaired. FIG. 6A illustrates the manner in which the plurality of integrated pairs 670*a*&*b*, 670*c*&*c*, 670*e*&*f*, 670*g*&*h* and 670*l*&*m* of electrically conductive, electrically parallel trace portions 670*a-m* is configured such that solar-cell efficiency is substantially undiminished in an event that any one electrically conductive, electrically parallel trace portion, for example, eighth electrically conductive, electrically parallel trace portion 670*h*, of the plurality of integrated pairs 670*a*&*b*, 670*c*&*c*, 670*e*&*f*, 670*g*&*h* and 670*l*&*m* of electrically conductive, electrically parallel trace portions 670*a-m* is conductively impaired. The arrow 648 indicates the nominal electron-flow through a sixth electrically conductive, electrically parallel trace portion 670*f* of the plurality of integrated pairs 670*a*&*b*, 670*c*&*c*, 670*e*&*f*, 670*g*&*h* and 670*l*&*m* of electrically conductive, electrically parallel trace portions 670*a-m* essentially unaffected by open-circuit defect 640. In the absence of open-circuit defect 640, an electron-flow indicated by arrow 648 would normally flow through any one electrically conductive, electrically parallel trace portion of the plurality of integrated pairs 670*a*&*b*, 670*c*&*c*, 670*e*&*f*, 670*g*&*h* and 670*l*&*m* of electrically conductive, electrically parallel trace portions 670*a-m*, in particular, eighth electrically conductive, electrically parallel trace portion 670*h*. However, when the open-circuit defect 640 is present, this electron-flow divides into two portions shown by arrows 642 and 644: arrow 642 corresponding to that portion of the normal electron-flow flowing to the right along the eighth electrically conductive, electrically parallel trace portion 670*h* to the terminating busbar 680, and arrow 644 corresponding to that portion of the normal electron-flow flowing to the left along the eighth electrically conductive, electrically parallel trace portion 670*h* to the seventh electrically conductive, electrically parallel trace portion 670*g* and then to the right along the seventh electrically conductive, electrically parallel trace portion 670*g* to the terminating busbar 680. Thus, the net electron-flow represented by arrow 646 flowing to the right along the seventh electrically conductive, electrically parallel trace portion 670*g* is consequently larger than what would normally flow to the right along the seventh electrically conductive, electrically parallel trace portion 670*g* to the terminating busbar 680 in the absence of the open-circuit defect 640. It should be noted that open-circuit defect 640 is for illustration purposes only and that embodiments of the present invention compensate for other types of defects in an electrically conductive, electrically parallel trace portion, in general, such as, without limitation to: a delamination of an electrically conductive, electrically parallel trace portion from the terminating solar cell 660, corrosion of an electrically conductive, electrically parallel trace portion, and even complete loss of an electrically conductive, electrically parallel trace portion. In accordance with embodiments of the present invention, in the event a defect completely conductively impairs an electrically conductive, electrically parallel trace portion, the physical spacing between adjacent electrically conductive, electrically parallel trace portions, identified with double-headed arrow 649, may be chosen such that solar-cell efficiency is substantially undiminished. Nevertheless, embodiments of the present invention embrace, without limitation thereto, other physical spacings between adjacent electrically conductive, electrically parallel trace portions in the event defects are less severe than those causing a complete loss of one of the electrically conductive, electrically parallel trace portions.

With reference now to FIG. 6B and further reference to FIG. 6A, in accordance with embodiments of the present invention, a cross-sectional, elevation view 600B of the integrated busbar-solar-cell-current collector 690 of FIG. 6A is shown. FIG. 6B shows the physical interconnection of the terminating solar cell 660 with the terminating busbar 680 in the integrated busbar-solar-cell-current collector 690. In accordance with embodiments of the present invention, the interconnection approach employing a carrier film is also conducive to coupling the integrated busbar-solar-cell-current collector 690 directly to the terminating busbar 680 without requiring solder. Thus, the integrated busbar-solar-cell-current collector 690 further includes a top carrier film 650. The top carrier film 650 includes a first substantially transparent, electrically insulating layer (not shown, but like 550*a* of FIG. 5B) coupled to the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m*, for example, electrically conductive, electrically parallel trace portion 670*a*, and disposed above a top portion of the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m*.

With further reference to FIGS. 6A and 6B, in accordance with embodiments of the present invention, the top carrier film 650 further includes a first adhesive medium (not shown, but like 550*b* of FIGS. 5B and 5C) coupling the plurality of integrated pairs 670*a*&*b*, 670*c*&*c*, 670*e*&*f*, 670*g*&*h*, 670*i* and 670*l*&*m* of electrically conductive, electrically parallel trace portions 670*a-m* to the electrically insulating layer (like 550*a* of FIG. 5B). The first adhesive medium (like 550b of FIGS. 5B and 5C) allows for coupling the plurality of integrated pairs 670a&b, 670c&c, 670e&f, 670g&h, 670i and 670l&m of electrically conductive, electrically parallel trace portions 670a-m to the terminating solar cell 660 without requiring solder. The terminating solar cell 660 may include an absorber layer 660a, a TCO layer 660b, and a metallic substrate 660c; a backing layer (not shown) may also be disposed between the absorber layer 660a and the metallic substrate 660c. The plurality of integrated pairs of electrically conductive, electrically parallel trace portions 670a-m may be connected electrically in series to form a single continuous electrically conductive line (not shown). The single continuous electrically conductive line may be disposed in a serpentine pattern (not shown, but like the pattern of trace 520 in FIG. 5A) such that the integrated busbar-solar-cell-current collector 690 is configured to collect current from the terminating solar cell 660 and to interconnect electrically to the terminating busbar 680. The plurality of integrated pairs 670a&b, 670c&c, 670e&f, 670g&h, 670i and 670l&m of electrically conductive, electrically parallel trace portions 670a-m may further include a plurality of electrically conductive lines (not shown, but like trace 520 of FIGS. 5B and 5C), any electrically conductive line of the plurality of electrically conductive lines selected from a group consisting of a copper conductive core clad with a silver cladding, a copper conductive core clad with a nickel coating further clad with a silver cladding and an aluminum conductive core clad with a silver cladding.

Figure 7A:
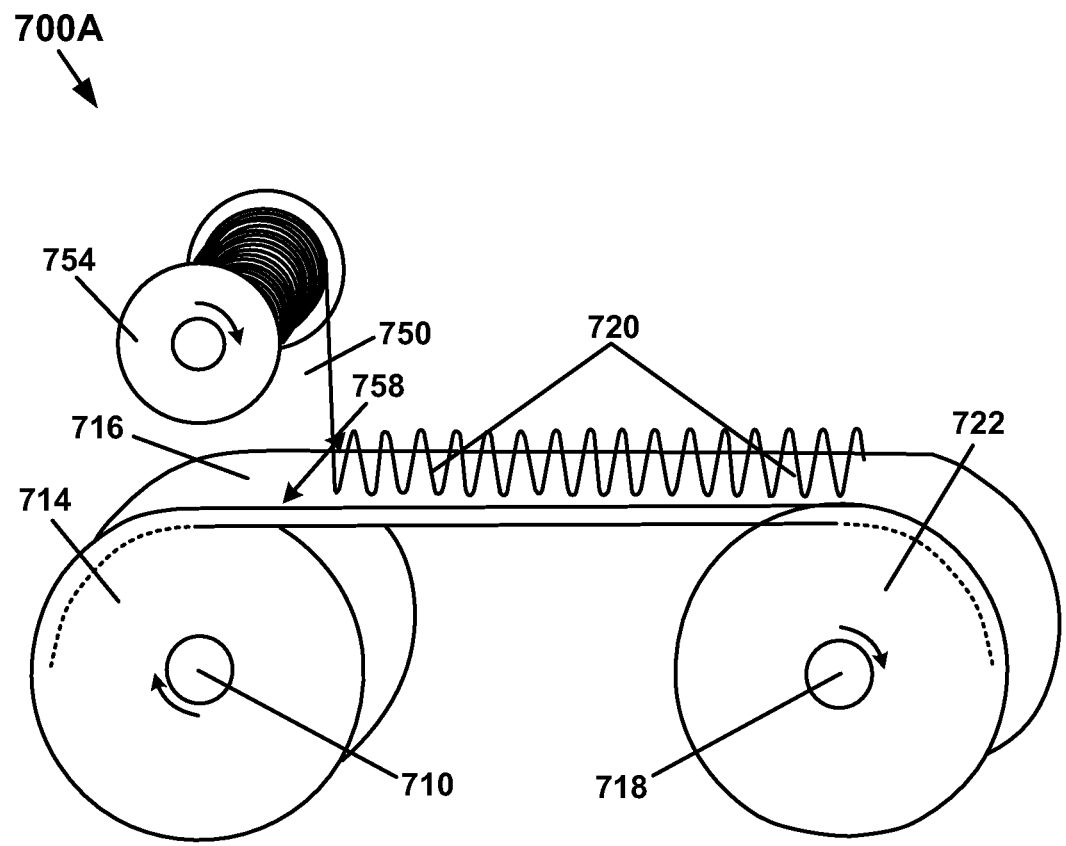
FIG. 7A is a combined cross-sectional elevation and perspective view of a roll-to-roll, interconnect-assembly fabricator for fabricating the interconnect assembly from a first roll of top carrier film and from a dispenser of conductive-trace material, in accordance with an embodiment of the present invention.

With further reference to FIGS. 6A and 6B, in accordance with embodiments of the present invention, integrated busbar-solar-cell-current collector 690 may include a supplementary isolation strip (not shown) at an edge 664 of the terminating solar cell 660 and running along the length of the side 662 to provide additional protection at the edge 664 and side 662 of the terminating solar cell 660 from the extended portions, for example, 670x and 670y, of the plurality of integrated pairs 670a&b, 670c&c, 670e&f, 670g&h, 670i and 670l&m of electrically conductive, electrically parallel trace portions 670a-m. In another embodiment of the present invention, the extended portions, for example, 670x and 670y, may be configured (not shown) to provide stress relief and to allow folding the terminating busbar 680 along edge 664 under a back side 668 and at the side 662 of terminating solar cell 660, so that there is less wasted space and open area between the terminating solar cell 660 of one module and the initial solar cell (not shown) of an adjacent module. Moreover, integrated busbar-solar-cell-current collector 690 may include a supplementary carrier-film strip (not shown) at the edge 664 of the terminating solar cell 660 and running along the length of the side 662 disposed above and coupled to top carrier film 650 and the terminating busbar 680 to affix the terminating busbar 680 to the extended portions, for example, 670x and 670y. Alternatively, the integrated busbar-solar-cell-current collector 690 may include the top carrier film 650 extending over the top of the terminating busbar 680 and extended portions, for example, 670x and 670y, to affix the terminating busbar 680 to these extended portions. Thus, these latter two embodiments of the present invention provide a laminate including the terminating busbar 680 disposed between top carrier film 650, or alternatively the supplementary carrier-film strip, and the supplementary isolation strip (not shown) along the edge 664 and side 662 of the terminating solar cell 660. Moreover, the top carrier film 650, or the supplementary carrier-film strip, is conducive to connecting the terminating busbar 680 without requiring solder to the plurality, itself, or to the extended portions, for example, 670x and 670y, of the plurality of integrated pairs 670a&b, 670c&c, 670e&f, 670g&h, 670i and 670l&m of electrically conductive, electrically parallel trace portions 670a-m With reference now to FIG. 7A, in accordance with embodiments of the present invention, a combined cross-sectional elevation and perspective view of a roll-to-roll, interconnect-assembly fabricator 700A is shown. FIG. 7A shows the roll-to-roll, interconnect-assembly fabricator 700A operationally configured to fabricate an interconnect assembly 720. A top carrier film 716 including an electrically insulating layer, for example, a first substantially transparent, electrically insulating layer, is provided to roll-to-roll, interconnect-assembly fabricator 700A in roll form from a first roll of material 714. The roll-to-roll, interconnect-assembly fabricator 700A includes an first unwinding spool 710 upon which the first roll of material 714 of the top carrier film 716 including the electrically insulating layer is mounted. As shown, a portion of the first roll of material 714 is unrolled. The unrolled portion of the top carrier film 716 including the electrically insulating layer passes to the right and is taken up on a take-up spool 718 upon which it is rewound as a third roll 722 of interconnect assembly 720, after conductive-trace material 750 is provided from a dispenser 754 and is laid down onto the unrolled portion of the top carrier film 716 including the electrically insulating layer. The dispenser 754 of conductive-trace material 750 may be a spool of wire, or some other container providing conductive-trace material. The conductive-trace material 750 may be laid down onto the unrolled portion of the top carrier film 716 including the electrically insulating layer in an oscillatory motion, but without limitation to a strictly oscillatory motion, indicated by double-headed arrow 758, to create a first plurality of electrically conductive portions configured both to collect current from a first solar cell and to interconnect electrically to a second solar cell such that solar-cell efficiency is substantially undiminished in an event that any one of the first plurality of electrically conductive portions is conductively impaired. As shown in FIG. 7A, a portion of the electrically conductive portions overhang one side of the top carrier film 716 to allow the electrically conductive portions of the trace to interconnect electrically to the second solar cell on the exposed top side of the trace, while the exposed bottom side of the trace, here shown as facing upward on the top carrier film 716, allows the electrically conductive portions of the trace in contact with the top carrier film 716 to interconnect electrically to the first solar cell. Moreover, the conductive-trace material 750 may be disposed in a serpentine pattern to create the plurality of electrically conductive portions configured both to collect current from the first solar cell and to interconnect electrically to the second solar cell. The arrows adjacent to the first unwinding spool 710, and the take-up spool 718 indicate that these are rotating components of the roll-to-roll, interconnect-assembly fabricator 700A; the first unwinding spool 710, and the take-up spool 718 are shown rotating in clockwise direction, as indicated by the arrowheads on the respective arrows adjacent to these components, to transport the unrolled portion of the first roll of material 714 from the first unwinding spool 710 on the left to the take-up spool 718 on the right.

Figure 7B:
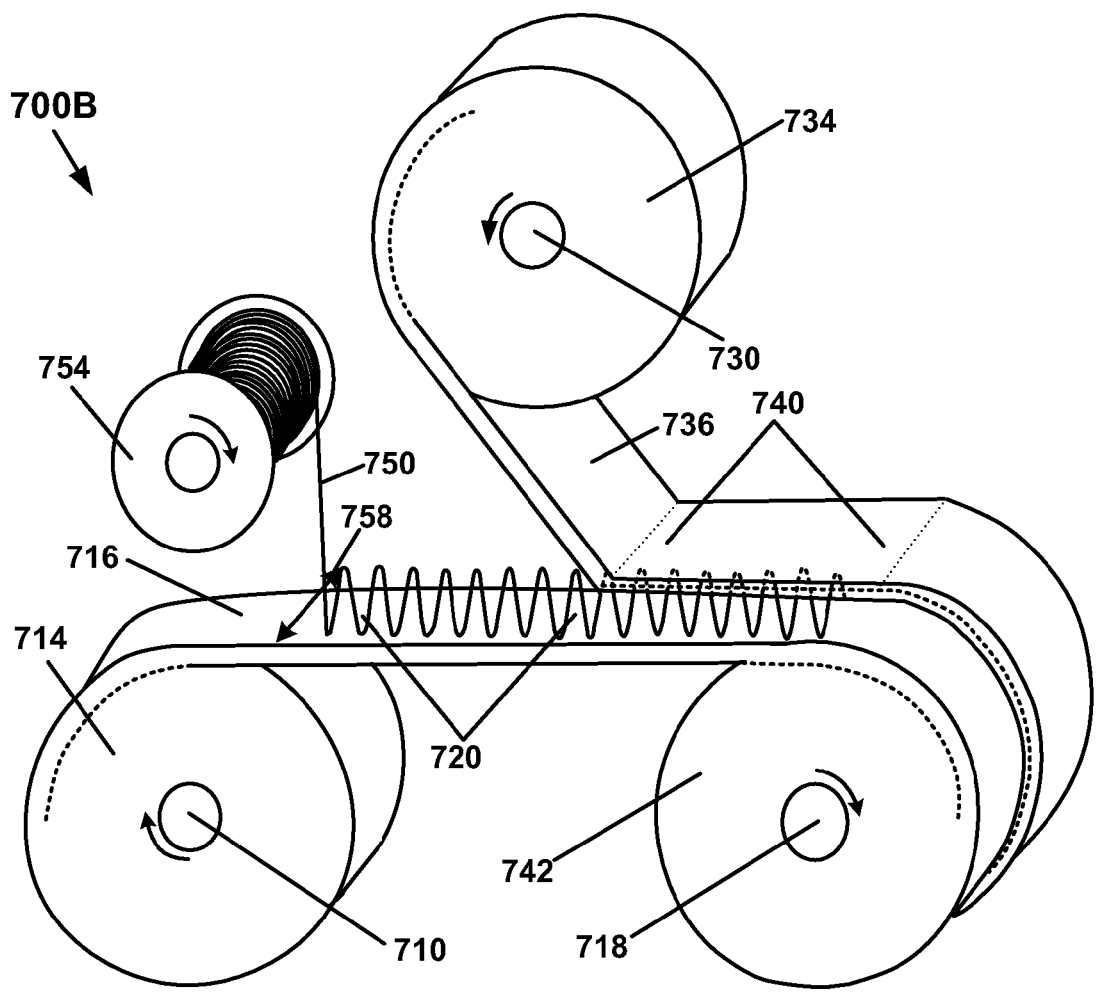
FIG. 7B is a combined cross-sectional elevation and perspective view of a roll-to-roll, laminated-interconnect-assembly fabricator for fabricating a laminated-interconnect assembly from the first roll of top carrier film, from a second roll of bottom carrier film and from the dispenser of conductive-trace material, in accordance with an embodiment of the present invention.
Figure 8:
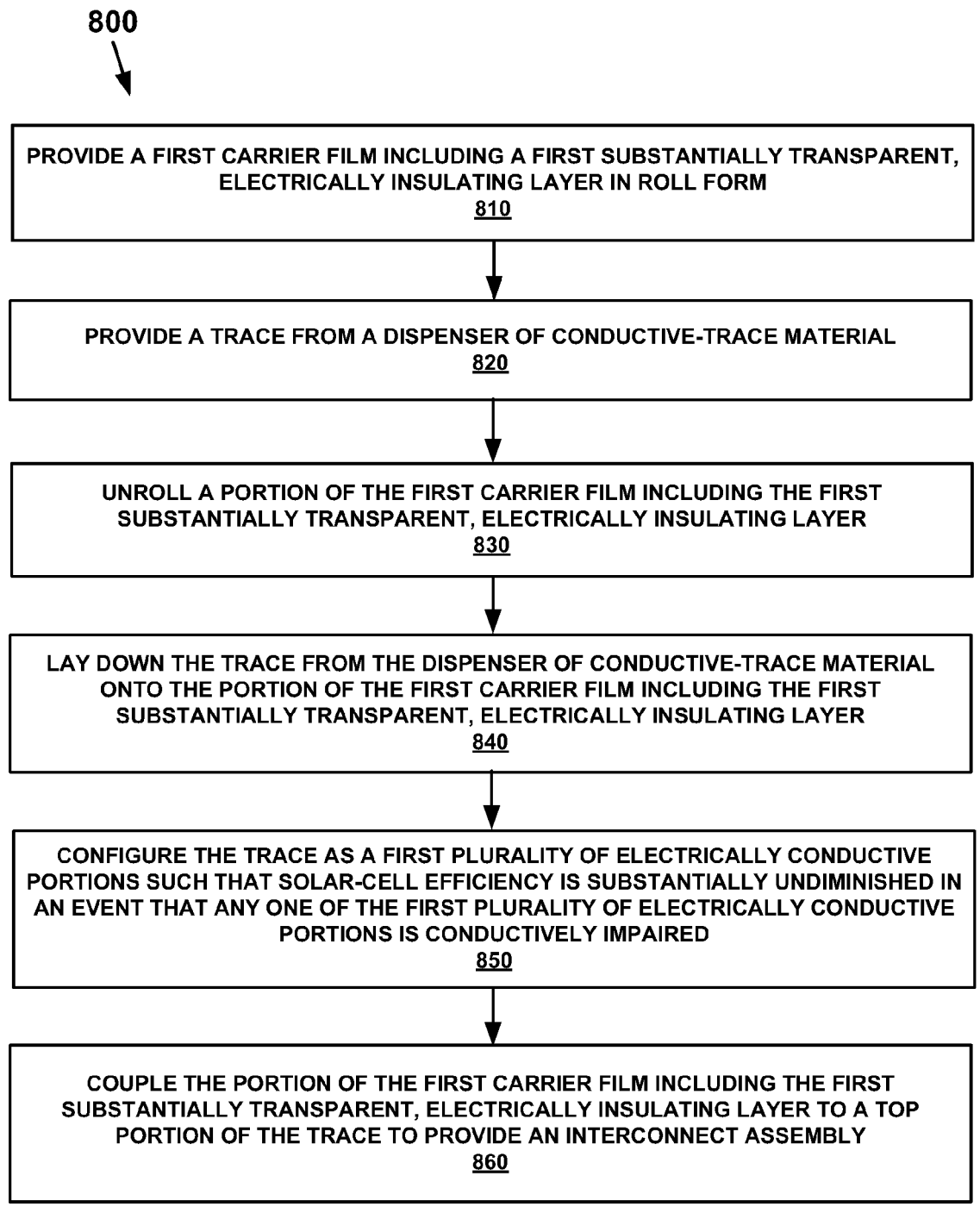
FIG. 8 is flow chart illustrating a method for roll-to-roll fabrication of an interconnect assembly, in accordance with an embodiment of the present invention.
Figure 9:
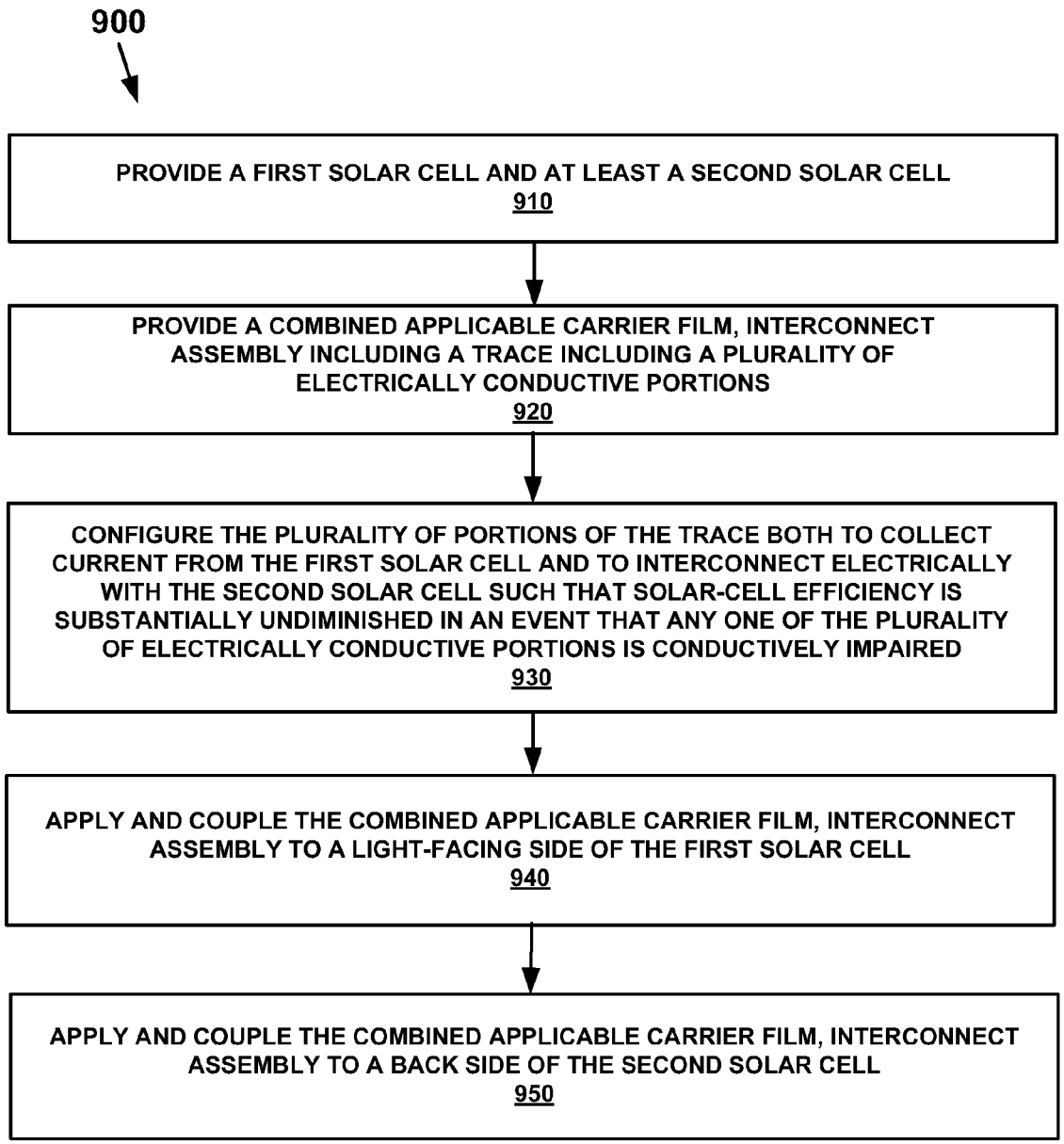
FIG. 9 is flow chart illustrating a method for interconnecting two solar cells, in accordance with an embodiment of the present invention.

With reference now to FIG. 7B, in accordance with embodiments of the present invention, a combined cross-sectional elevation and perspective view of a roll-to-roll, laminated-interconnect-assembly fabricator 700B is shown. FIG. 7A shows the roll-to-roll, laminated-interconnect-assembly fabricator 700B operationally configured to fabricate a laminated-interconnect assembly 740. The roll-to-roll, laminated-interconnect-assembly fabricator 700B first fabricates the interconnect assembly 720 shown on the left-hand side of FIG. 7B from the first roll of material 714 of the top carrier film 716 including the electrically insulating layer and from conductive-trace material 750 provided from dispenser 754. Then, the roll-to-roll, laminated-interconnect-assembly fabricator 700B continues fabrication of the laminated-interconnect assembly 740 by applying a bottom carrier film 736 from a second roll 734. The bottom carrier film 736 includes a carrier film selected from a group consisting of a second electrically insulating layer, a structural plastic layer, and a metallic layer, and is coupled to the conductive-trace material 750 and is disposed below a bottom portion of the conductive-trace material 750. If a metallic layer is used for the bottom carrier film 736, a supplementary isolation strip (not shown) of a third electrically insulating layer is added to the laminated-interconnect assembly 740 configured to allow interposition of the third electrically insulating layer between the bottom carrier film 736 and a top surface of the first solar cell to provide additional protection at an edge of the first solar cell and to prevent shorting out the solar cell in the event that the bottom carrier film 736 including the metallic layer should ride down the side of the first solar cell. The laminated-interconnect assembly 740 passes to the right-hand side of FIG. 7B and is taken up on the take-up spool 718 upon which it is wound as a fourth roll 742 of laminated-interconnect assembly 740. The arrows adjacent to the first unwinding spool 710, a second unwinding spool 730 and the take-up spool 718 indicate that these are rotating components of the roll-to-roll, laminated-interconnect-assembly fabricator 700B; the first unwinding spool 710, and the take-up spool 718 are shown rotating in clockwise direction, as indicated by the arrow-heads on the respective arrows adjacent to these components, to transport the unrolled portion of the first roll of material 714 from the first unwinding spool 710 on the left to the take-up spool 718 on the right. The second unwinding spool 730, and the dispenser 754 are shown rotating in a counterclockwise direction and a clockwise direction, respectively, as indicated by the arrow-heads on the respective arrows adjacent to these components, as they release the bottom carrier layer 736 and the conductive-trace material 750, respectively, in fabrication of the laminated-interconnect assembly 740. The double-headed arrow 758 indicates the motion imparted to the conductive trace material by the roll-to-roll, laminated-interconnect-assembly fabricator 700B creates a first plurality of electrically conductive portions configured both to collect current from a first solar cell and to interconnect electrically to a second solar cell such that solar-cell efficiency is substantially undiminished in an event that any one of the first plurality of electrically conductive portions is conductively impaired.

Sub-Section B: Description of Embodiments of the Present Invention for a Method for Roll-to-Roll Fabrication of an Interconnect Assembly With reference now to FIG. 8, a flow chart illustrates an embodiment of the present invention for a method for roll-to-roll fabrication of an interconnect assembly. At 810, a first carrier film including a first substantially transparent, electrically insulating layer is provided in roll form. At 820, a trace is provided from a dispenser of conductive-trace material. The dispenser may be a spool of wire or other container of conductive-trace material. At 830, a portion of the first carrier film including the first substantially transparent, electrically insulating layer is unrolled. At 840, the trace from the dispenser of conductive-trace material is laid down onto the portion of the first carrier film including the first substantially transparent, electrically insulating layer. At 850, the trace is configured as a first plurality of electrically conductive portions such that solar-cell efficiency is substantially undiminished in an event that any one of the first plurality of electrically conductive portions is conductively impaired. At 860, the portion of the first the first carrier film including the substantially transparent, electrically insulating layer is coupled to a top portion of the trace to provide an interconnect assembly.

In an embodiment of the present invention, configuring the trace also includes: configuring the trace as a second plurality of paired trace portions; configuring a first portion of a paired portion of the second plurality of paired trace portions to allow both collecting current from a first solar cell and electrically interconnecting the first solar cell with a second solar cell; disposing proximately to the first portion, a second portion of the paired portion; and configuring the second portion to allow both collecting current from the first solar cell and electrically interconnecting the first solar cell with the second solar cell. Alternatively, configuring the trace may include disposing the trace in a serpentine pattern that allows for collecting current from the first solar cell and electrically interconnecting to the second solar cell. In an embodiment of the present invention, the method may also include: providing a second carrier film including a second electrically insulating layer; coupling the second carrier film including the second electrically insulating layer to a bottom portion of the trace; and configuring the second electrically insulating layer to allow forming an edge-protecting portion at an edge of the first solar cell. Moreover, the method may include configuring the first substantially transparent, electrically insulating layer to allow forming a short-circuit-preventing portion at an edge of the second solar cell.

Sub-Section C: Description of Embodiments of the Present Invention for a Method of Interconnecting Two Solar Cells With reference now to FIG. 9, a flow chart illustrates an embodiment of the present invention for a method of interconnecting two solar cells. At 910, a first solar cell and at least a second solar cell are provided. At 920, a combined applicable carrier film, interconnect assembly including a trace including a plurality of electrically conductive portions is provided. At 930, the plurality of electrically conductive portions of the trace is configured both to collect current from the first solar cell and to interconnect electrically with the second solar cell such that solar-cell efficiency is substantially undiminished in an event that any one of the plurality of electrically conductive portions is conductively impaired. At 940, the combined applicable carrier film, interconnect assembly is applied and coupled to a light-facing side of the first solar cell. At 950, the combined applicable carrier film, interconnect assembly is applied and coupled to a back side of the second solar cell.

In an embodiment of the present invention, the method also includes applying and coupling the combined applicable carrier film, interconnect assembly to the light-facing side of the first solar cell without requiring solder. In addition, the method may include applying and coupling the combined applicable carrier film, interconnect assembly to the back side of the second solar cell without requiring solder. Moreover, the method includes applying and coupling the combined applicable carrier film, interconnect assembly to the light-facing side of the first solar cell such that a second electrically insulating layer of the applicable carrier film, interconnect assembly forms an edge-protecting portion at an edge of the first solar cell. The method also includes applying and coupling the combined applicable carrier film, interconnect assembly to the back side of the second solar cell such that a first substantially transparent, electrically insulating layer of the applicable carrier film, interconnect assembly forms a short-circuit-preventing portion at an edge of the second solar cell. The method may also include configuring the trace in a serpentine pattern that allows for collecting current from the first solar cell and electrically interconnecting to the second solar cell.

Sub-Section D: Physical Description of Embodiments of the Present Invention for a Trace In accordance with other embodiments of the present invention, the trace does not need to be used in conjunction with the afore-mentioned serpentine interconnect assembly approach, but could be used for other current collection and/or interconnection approaches used in solar cell technology. A trace including a conductive core with an overlying layer of nickel provides the unexpected result that when placed in contact with the TCO layer of a solar cell it suppresses current in the vicinity of short-circuit defects in the solar cell that might occur in the vicinity of the contact of the nickel layer of the trace with the TCO layer. The nickel increases local contact resistance which improves the ability of the solar cell to survive in the event of the formation of a defect, such as a shunt or a near shunt, located in the adjacent vicinity of the contact of the nickel layer of the trace with the TCO layer. If there is such a defect in the vicinity of the contact of the nickel layer of the trace with the TCO layer, the nickel reduces the tendency of the solar cell to pass increased current through the site of the defect, such as a shunt or a near shunt. Thus, the nickel acts as a localized resistor preventing run-away currents and high current densities in the small localized area associated with the site of the defect, such as a shunt or a near shunt. The current-limiting ability of nickel is in contrast, for example, to a low resistivity material such as silver, where the current density becomes so high at the location of the defect due to the high conductivity of silver that nearly almost all the current of the cell would be passed at the location of the defect causing a hot spot that would result in the melting of the silver with the formation of a hole in the solar cell filling with the silver migrating to the site of the defect to form a super-shunt. In contrast, nickel does not readily migrate nor melt in the presence of elevated localized temperatures associated with the site of increased currents attending formation of the defect, such as a shunt or a near shunt. Moreover, in contrast to silver, copper and tin, which tend to electromigrate, migrate or diffuse at elevated temperatures, nickel tends to stay put so that if the site of a shunt occurs in the vicinity of a nickel coated or nickel trace, the nickel has less tendency to move to the location of the shunt thereby further exacerbating the drop of resistance at the shunt site. In addition, experimental results of the present invention indicate that a nickel trace, or a trace including a nickel layer, may actually increase its resistance due the possible formation of a nickel oxide such that the nickel trace, or the trace including the nickel layer, acts like a localized fuse limiting the current flow in the vicinity of the shunt site. In some cases, the efficiency of the solar cell has actually been observed to increase after formation of the shunt defect when the nickel trace, or the trace including the nickel layer, is used in contact with the TCO layer.

With further reference to FIGS. 5B and 5C, in accordance with other embodiments of the present invention, the trace 520 for collecting current from a solar cell, for example, first solar cell 510, includes an electrically conductive line including the conductive core 520A, and the overlying layer 520B that limits current flow to a proximate shunt defect (not shown) in the solar cell, for example, first solar cell 510. The proximate shunt defect may be proximately located in the vicinity of an electrical contact between the overlying layer 520B of the electrically conductive line and the TCO layer 510b of the solar cell, for example, first solar cell 510. The overlying layer 520B of the electrically conductive line of the trace 520 may further include an overlying layer 520B composed of nickel. The conductive core 520A of the electrically conductive line of the trace 520 may further include nickel. The conductive core 520A may also include a material selected from a group consisting of copper, silver, aluminum, and elemental constituents and alloys having high electrical conductivity, which may be greater than the electrical conductivity of nickel. The TCO layer 510b of the solar cell, for example, first solar cell 510, may include a conductive oxide selected from a group consisting of zinc oxide, aluminum zinc oxide and indium tin oxide. In addition, the absorber layer 510a, for example, absorber layer 112 of FIG. 1A, of the solar cell, for example, first solar cell 510, may include copper indium gallium diselenide (CIGS). Alternatively, in embodiments of the present invention, it should be noted that semiconductors, such as silicon, cadmium telluride, and chalcopyrite semiconductors, as well as other semiconductors, may be used as the absorber layer 510a. Moreover, an n-type layer, for example, n-type portion 112b of absorber layer 112 of FIG. 1A, of the solar cell, for example, first solar cell 510, may be disposed on and electrically coupled to a p-type absorber layer, for example, absorber layer 112 of FIG. 1A, of the solar cell, for example, first solar cell 510, and the n-type layer, for example, n-type portion 112b of absorber layer 112 of FIG. 1A, may be selected from a group consisting of a metal oxide, a metal sulfide and a metal selenide.

Figure 14:
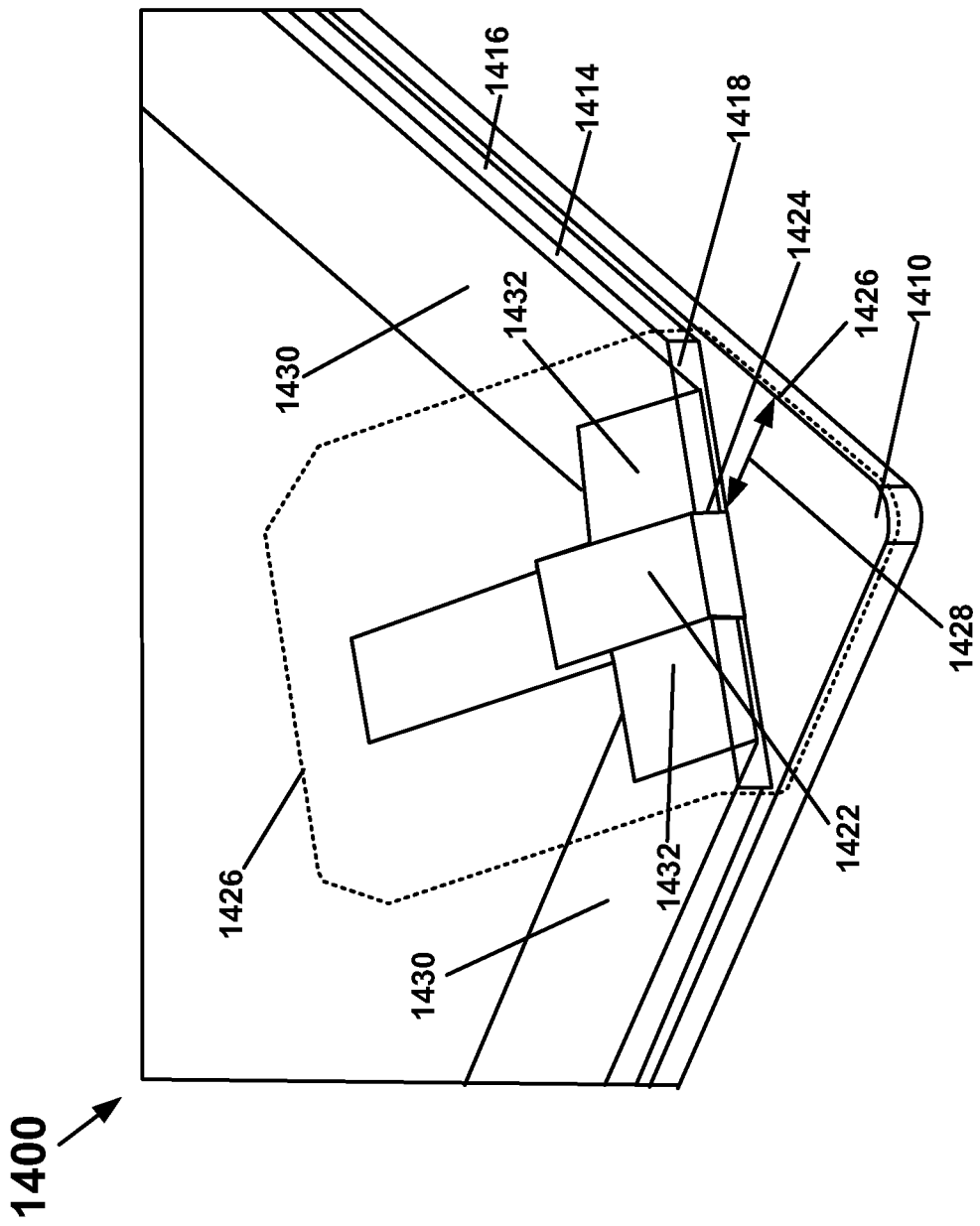
FIG. 14 is a combined plan and perspective view of a lead at a cut corner of a back glass of a solar-cell module, in accordance with an embodiment of the present invention.

Section II:

Physical Description of Embodiments of the Present Invention for a Solar-Cell Module Combined with in-Laminate Diodes and External-Connection Mechanisms Mounted to Respective Edge Regions With reference now to FIG. 10, in accordance with embodiments of the present invention, a plan view 1000 is shown of a solar-cell module 1002 combined with external-connection mechanisms (not shown) mounted to respective edge regions and in-laminate-diode assembly 1050. FIG. 10 shows the physical arrangement of the solar-cell module 1002 combined with in-laminate-diode assembly 1050 and external-connection mechanisms mounted to respective edge regions, which may be located at edges 1090, 1092, 1094 and 1096, or at corners 1080, 1082, 1084 and 1086. The solar-cell module 1002 includes a plurality 1010 of solar cells electrically coupled together, for example, solar cells 1012a-1017a and 1012b-1017b, which may be disposed in at least one solar-cell sub-module, for example, solar-cell sub-modules 1010a and 1010b, respectively. (Throughout the following, solar cells: 1012a, 1013a, 1014a, 1015a, 1016a and 1017a; 1012b, 1013b, 1014b, 1015b, 1016b and 1017b; 1022a, 1023a, 1024a, 1025a, 1026a and 1027a; 1022b, 1023b, 1024b, 1025b, 1026b and 1027b; 1032a, 1033a, 1034a, 1035a, 1036a and 1037a; and, 1032b, 1033b, 1034b, 1035b, 1036b and 1037b; are referred to in aggregate as: 1012a-1017a, 1012b-1017b, 1022a-1027a, 1022b-1027b, 1032a-1037a and 1032b-1037b, respectively. Solar-cell sub-modules: 1010a and 1010b, 1020a and 1020b and 1030a and 1030b, are referred to as: 1010a-1010b, 1020a-1020b and 1030a-1030b, respectively.) The plurality 1010 of solar cells 1012a-1017a and 1012b-1017b is electrically interconnected with one another through interconnect assemblies (not shown) similar to those discussed in Section I in FIGS. 4A through 4F. The solar-cell module 1002 also includes the in-laminate-diode assembly 1050 electrically coupled with the plurality 1010 of solar cells 1012a-1017a and 1012b-1017b. The in-laminate-diode assembly 1050 is configured to prevent power loss in the solar-cell module 1002, which can result, from amongst other causes, from shading of a particular solar cell, for example, solar cell 1012a. In addition, the solar-cell module 1002 includes a protective structure (not shown in FIG. 10, but in FIG. 14) at least partially encapsulating the plurality 1010 of solar cells 1012a-1017a and 1012b-1017b. As shown in FIG. 14, the protective structure may include a front glass 1410, which is disposed over a light-facing side of the solar cells 1012a-1017a and 1012b-1017b, and a back glass 1414 that encapsulate the plurality 1010 of solar cells 1012a-1017a and 1012b-1017b. The solar-cell module 1002 also includes a plurality of external-connection mechanisms mounted to a respective plurality of edge regions of the protective structure. An external-connection mechanism of the plurality of external-connection mechanisms is configured to enable collection of current from the plurality 1010 of solar cells 1012a-1017a and 1012b-1017b and to allow interconnection with at least one other external device (not shown). The external device may be selected from the group consisting of a solar-cell module, an inverter, a battery charger, an external load, and an electrical-power-distribution system.

With further reference to FIG. 10, in accordance with embodiments of the present invention, it should be noted that: a photovoltaic-convertor means for converting radiant power into electrical power may be a solar cell; a photovoltaic-convertor module may be a solar-cell module; a photovoltaic-convertor sub-module may be a solar-cell sub-module; an current-shunting means for by-passing current flow may be a diode; an in-laminate, current-shunting assembly means for by-passing current flow may be an in-laminate-diode assembly; an in-laminate, current-shunting sub-assembly means for by-passing current flow may be an in-laminate-diode sub-assembly; and a junction-enclosure means for protecting and electrically isolating electrical connections may be an external-connection mechanism. Moreover, it should be noted that a photovoltaic-convertor array may be a solar-cell array. With the preceding identifications of terms of art, it should be noted that embodiments of the present invention recited herein with respect to a solar cell, a solar-cell module, a solar-cell sub-module, a diode, an in-laminate-diode assembly, an in-laminate-diode sub-assembly, and an external-connection mechanism apply to a photovoltaic-convertor means for converting radiant power into electrical power, a photovoltaic-convertor module, a photovoltaic-convertor sub-module, an in-laminate, current-shunting means for by-passing current flow, an in-laminate, current-shunting assembly means for by-passing current flow, an in-laminate, current-shunting sub-assembly means for by-passing current flow, and a junction-enclosure means for protecting and electrically isolating electrical connections, respectively. Therefore, it should be noted that the preceding identifications of terms of art do not preclude, nor limit embodiments described herein, which are within the spirit and scope of embodiments of the present invention.

Figure 12A:
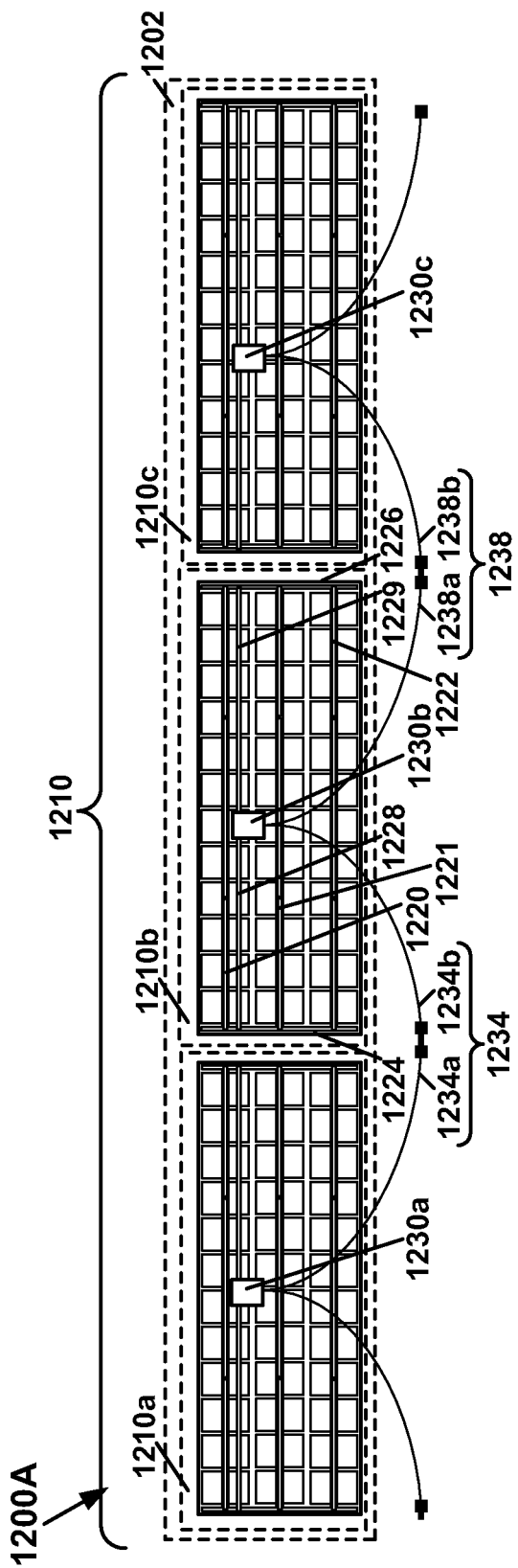
FIG. 12A is a plan view of a solar-cell array including a plurality of solar-cell modules combined with centrally-mounted junction boxes and in-laminate-diode assemblies, in accordance with an embodiment of the present invention.
Figure 12B:
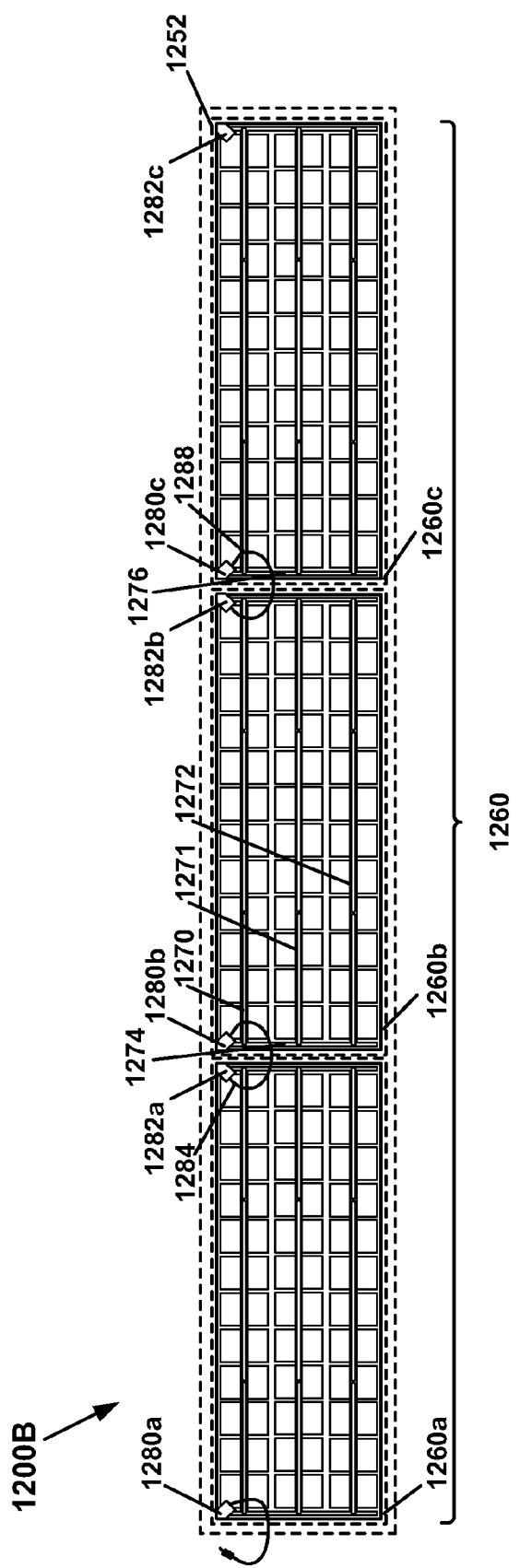
FIG. 12B is a plan view of a solar-cell array including a plurality of solar-cell modules combined with external-connection mechanism mounted to respective edge regions and in-laminate-diode assemblies, in accordance with an embodiment of the present invention.
Figure 13:
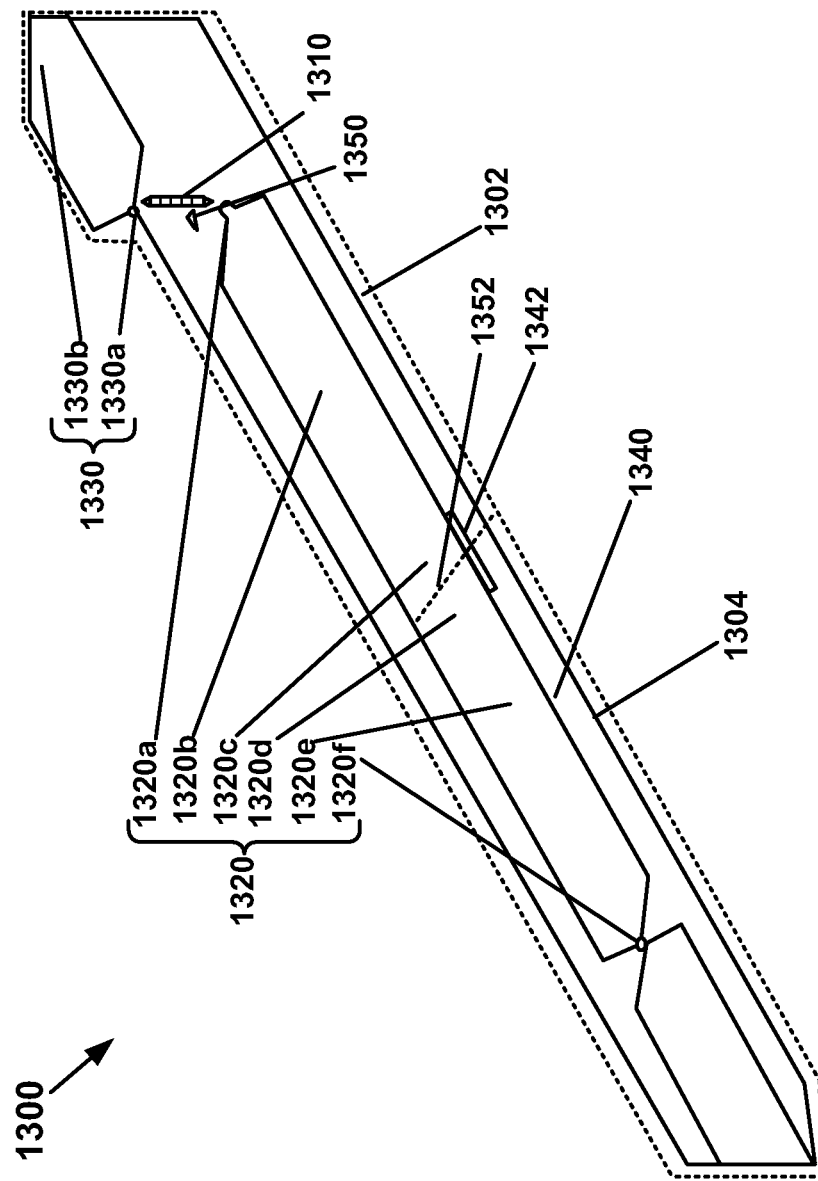
FIG. 13 is a combined perspective-plan and expanded view of in-laminate-diode sub-assemblies showing an arrangement of a diode therein, in accordance with an embodiment of the present invention.

With further reference to FIG. 10, in accordance with embodiments of the present invention, the solar-cell module 1002, identified with solar-cell module 1260b, may be a component of a solar-cell array, for example, solar-cell array 1252 as shown in FIG. 12B. Embodiments of the present invention also encompass the solar-cell array 1252, or alternatively a photovoltaic-convertor array, that may include a plurality of electrically coupled solar-cell modules, for example, solar-cell modules 1260a, 1260b and 1260c. The solar-cell module, for example, solar-cell modules 1260b, of a plurality 1260 of electrically coupled solar-cell modules 1260a, 1260b and 1260c may include a plurality of solar cells, at least one solar-cell sub-module, an in-laminate-diode assembly, a protective structure and a plurality of external-connection mechanisms as for embodiments of the present invention described herein.

With further reference to FIG. 10, in accordance with embodiments of the present invention, the in-laminate-diode assembly 1050 may include at least one in-laminate-diode sub-assembly 1050a, for example, from a plurality of in-laminate-diode sub-assemblies 1050a-1050b without limitation thereto. As shown in FIG. 10, the in-laminate-diode sub-assemblies 1050a-1050b are electrically coupled in parallel with the plurality 1010 of solar cells 1012a-1017a and 1012b-1017b, which may be disposed in solar-cell sub-modules, for example, solar-cell sub-modules 1010a and 1010b, respectively, as shown. (Throughout the following, in-laminate-diode sub-assemblies: 1050a and 1050b, 1060a and 1060b and 1070a and 1070b, are referred to as: 1050a-1050b, 1060a-1060b and 1070a-1070b, respectively.) At least one in-laminate-diode sub-assembly, for example, in-laminate-diode sub-assembly 1050a, includes at least one diode (not shown) and is configured to by-pass current flow around the solar-cell sub-module, for example, solar-cell sub-module 1010a, in an event at least one solar cell, for example, solar cell 1012a, of the plurality of solar cells 1012a-1017a develops high resistance to passage of solar-cell-module current, as may occur in case of shading of a solar-cell. As used herein, an in-laminate diode is a diode included in an in-laminate diode assembly or in-laminate-diode sub-assembly, where the term of art "in-laminate" refers to the disposition of the diode within such an assembly or sub-assembly rather than any inherent functionality of the diode itself. In addition, the solar-cell module 1002 may include a plurality of external-connection mechanisms mounted to respective edge regions, for example, external-connection mechanisms 1280b and 1282b mounted to respective edge regions, for example, corners as shown in FIG. 12B. At least one external-connection mechanism 1282b mounted to respective edge regions of the plurality of external-connection mechanisms 1280b and 1282b may be disposed at a cut corner of a back glass of the solar-cell module, for example, the solar-cell module 1260b. The external-connection mechanism 1280b and 1282b mounted to respective edge regions of the plurality of external-connection mechanisms 280b and 1282b are configured to collect current from the solar-cell module 1260b and to allow interconnection with at least one other external device, for example, the solar-cell module 1260c.

With further reference to FIG. 10, in accordance with embodiments of the present invention, the solar-cell module 1002 may include a second plurality 1020 of solar cells 1022a-1027a and 1022b-1027b. The second plurality 1020 of solar cells 1022a-1027a and 1022b-1027b is electrically interconnected with one another through interconnect assemblies (not shown) similar to those discussed in Section I in FIGS. 4A through 4F. Solar cells may be electrically coupled together in at least one solar-cell sub-module, for example, solar-cell sub-module 1020a may include solar cells 1022a-1027a, and solar-cell sub-module 1020b may include solar cells 1022b-1027b. The solar-cell module 1002 may also include a second in-laminate-diode assembly 1060 including a second plurality of in-laminate-diode sub-assemblies 1060a-1060b such that the in-laminate-diode sub-assemblies 1060a-1060b are electrically coupled in parallel with the second plurality 1020 of solar cells 1022a-1027a and 1022b-1027b, and which may be electrically coupled in parallel with solar-cell sub-modules 1020a-1020b. At least one in-laminate-diode sub-assembly, for example, in-laminate-diode sub-assembly 1060a, includes at least one diode (not shown) and is configured to by-pass current flow around the solar-cell sub-module, for example, solar-cell sub-module 1020a, in an event at least one solar cell, for example, solar cell 1022a, of the plurality 1020 of solar cells including solar cells 1022a-1027a develops high resistance to passage of solar-cell-module current. As shown in FIG. 10, the in-laminate-diode sub-assembly 1060a is also shown with some of its component conductors removed to reveal disposition of a portion of an electrically-insulating-laminate strip with respect to the second in-laminate-diode assembly 1060 and a portion of the second plurality 1020 of solar cells 1022a-1025a, which will be discussed below in greater detail in the description of FIG. 13.

With further reference to FIG. 10, in accordance with embodiments of the present invention, the solar-cell module 1002 may include a third plurality 1030 of solar cells 1032a-1037a and 1032b-1037b. The third plurality 1030 of solar cells 1032a-1037a and 1032b-1037b is electrically interconnected with one another through interconnect assemblies (not shown) similar to those discussed in Section I in FIGS. 4A through 4F. Solar cells may be electrically coupled together in at least one solar-cell sub-module, for example, solar-cell sub-module 1030a may include solar cells 1032a-1037a, and solar-cell sub-module 1030b may include solar cells 1032b-1037b. The solar-cell module 1002 may also include a third in-laminate-diode assembly 1070 including a third plurality of in-laminate-diode sub-assemblies 1070a-1070b such that the in-laminate-diode sub-assemblies 1070a-1070b are electrically coupled in parallel with the third plurality 1030 of solar cells 1032a-1037a and 1032b-1037b, and which may be electrically coupled in parallel with solar-cell sub-modules 1030a-1030b. At least one in-laminate-diode sub-assembly, for example, in-laminate-diode sub-assembly 1070a, includes at least one diode (not shown) and is configured to by-pass current flow around the solar-cell sub-module, for example, solar-cell sub-module 1030a, in an event at least one solar cell, for example, solar cell 1032a, of the third plurality 1030 of solar cells including solar cells 1032a-1037a develops high resistance to passage of solar-cell-module current. As shown in FIG. 10, the in-laminate-diode sub-assemblies 1070a and 1070b are also shown with some of their component conductors removed to reveal disposition of respective electrically-insulating-laminate strips with respect to the third in-laminate-diode assembly 1070 and a portion of the third plurality 1030 of solar cells 1032a-1037a and 1032b-1034b, which will also be discussed below in greater detail in the description of FIG. 13.

With further reference to FIG. 10, in accordance with embodiments of the present invention, a solar-cell sub-module 1010a includes at least one solar cell 1012a. Alternatively, the solar-cell sub-module 1010a may include a plurality of solar cells 1012a-1017a, as shown. A portion 1012a-1017a of the plurality 1010 of solar cells 1012a-1017a and 1012b-1017b of the solar-cell sub-module 1010a is electrically coupled in series. The in-laminate-diode assembly 1050 includes a plurality of in-laminate-diode sub-assemblies 1050a-1050b. At least one in-laminate-diode sub-assembly 1050a includes at least one diode (not shown) is configured to by-pass current flow around the solar-cell sub-module 1010a to prevent power loss in the solar-cell module 1002. The in-laminate-diode sub-assembly 1050a is configured to by-pass current flow around the solar-cell sub-module 1010a such that the diode (not shown) of the in-laminate-diode assembly 1050a is electrically coupled in parallel with the solar-cell sub-module 1010a with reverse polarity to polarities of the portion 1012a-1017a of the plurality 1010 of solar cells 1012a-1017a and 1012b-1017b of the solar-cell sub-module 1010a. The plurality of solar-cell sub-modules 1010a-1010b is electrically coupled in series. In addition, the plurality of in-laminate-diode sub-assemblies 1050a-1050b is electrically coupled in series.

Figure 11A:
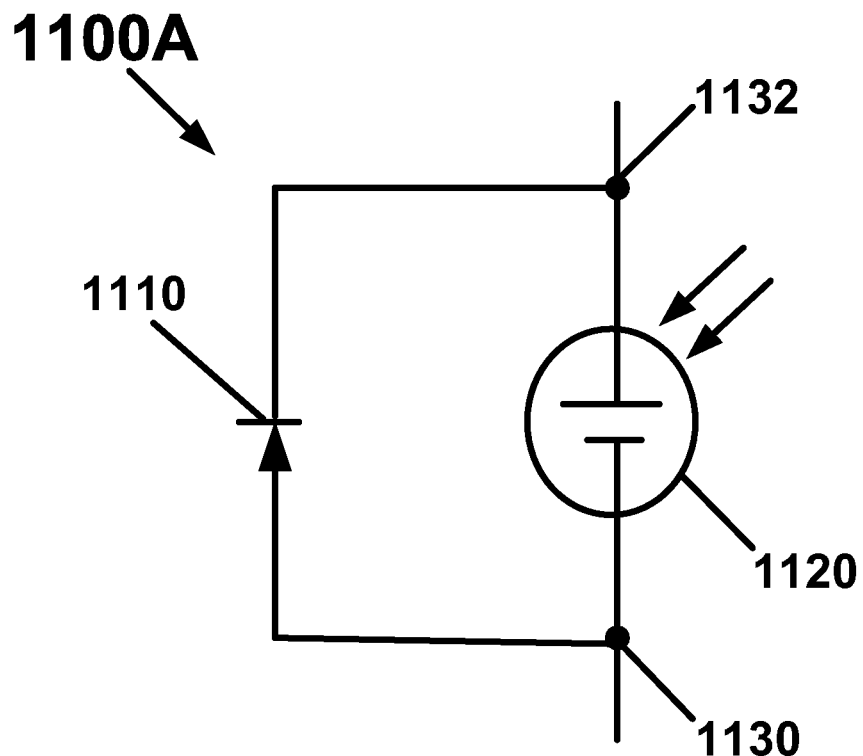
FIG. 11A is a schematic diagram of a diode used to by-pass current around a solar cell and electrically coupled in parallel with the solar cell, in accordance with an embodiment of the present invention.
Figure 11B:
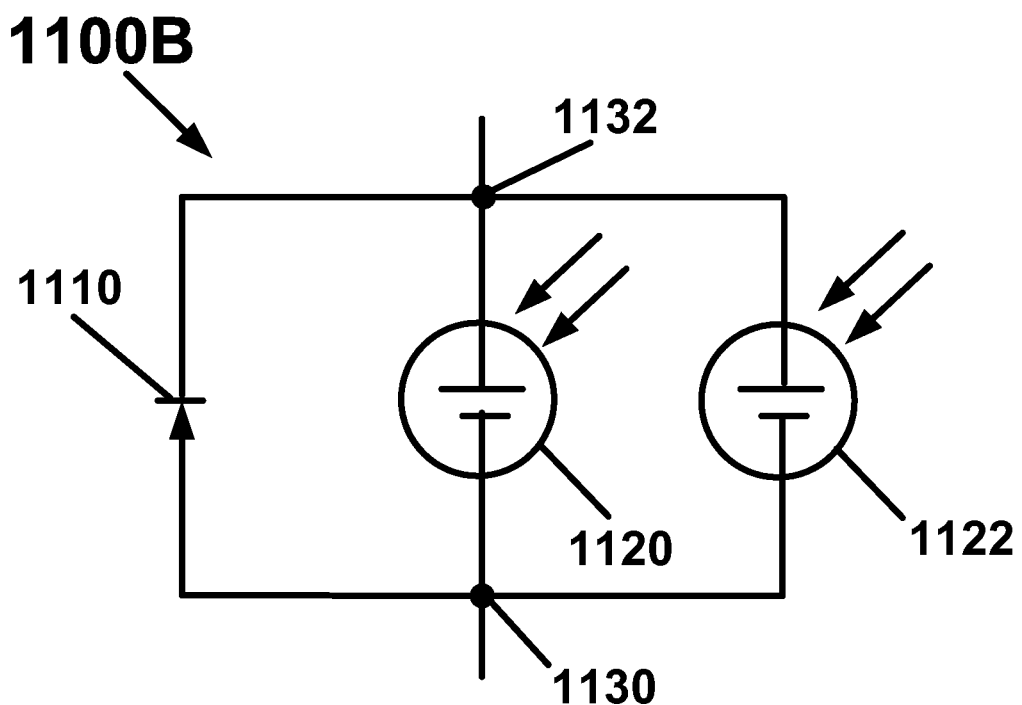
FIG. 11B is a schematic diagram of a diode used to by-pass current around a plurality of solar cells and electrically coupled in parallel with the plurality of solar cells that are electrically coupled in parallel, in accordance with an embodiment of the present invention.
Figure 11C:
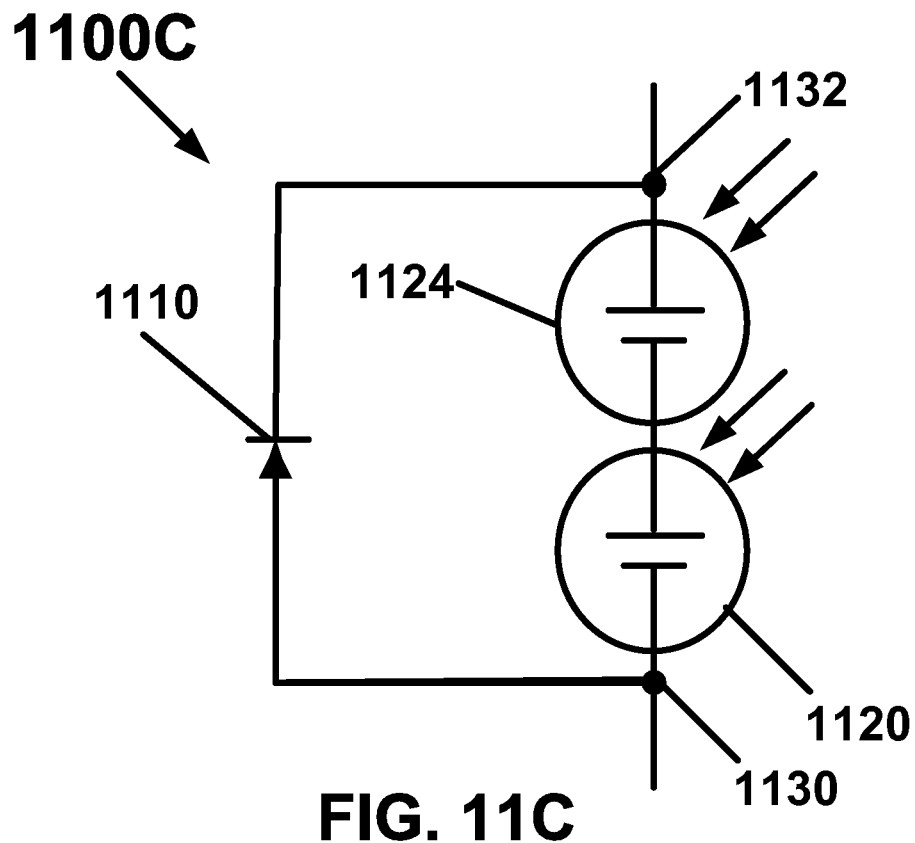
FIG. 11C is a schematic diagram of a diode used to by-pass current around a plurality of solar cells and electrically coupled in parallel with the plurality of solar cells that are electrically coupled in series, in accordance with an embodiment of the present invention.
Figure 11D:
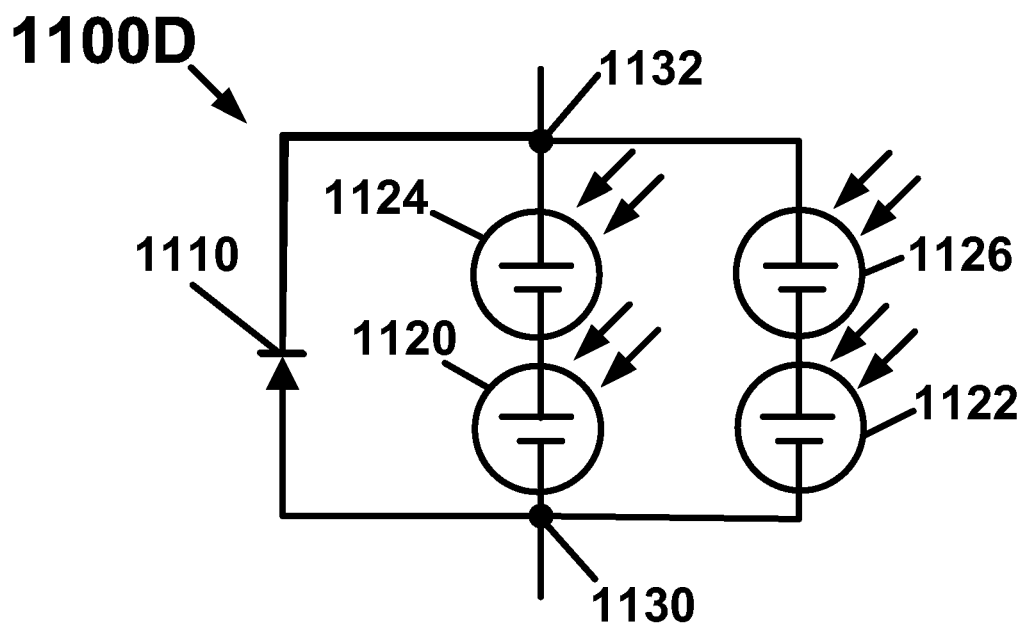
FIG. 11D is a schematic diagram of a diode used to by-pass current around a plurality of solar cells and electrically coupled in parallel with the plurality of solar cells that are electrically coupled in series and in parallel, in accordance with an embodiment of the present invention.

With reference now to FIGS. 11A-11D, several embodiments of the present invention are shown that illustrate the manner in which a diode may be electrically coupled with at least one or a plurality of solar cells. Within the spirit and scope of embodiments of the present invention, at least one or the plurality of solar cells may be disposed in the solar-cell sub-module, and the diode may be disposed in an in-laminate-diode sub-assembly of an in-laminate diode assembly. FIG. 11A shows a schematic diagram 1100A of a diode 1110 used to by-pass current around a solar cell 1120 and electrically coupled in parallel with one solar cell 1120. The diode 1110 is electrically coupled in parallel to the solar cell 1120 at a first terminal 1132 and at a second terminal 1130. To by-pass current around the solar cell 1120 in an event that the solar cell 1120 develops a high resistance to the passage of solar-cell module current, the diode 1110 is coupled to solar cell 1120 with reverse polarity to that of the solar cell 1120. FIG. 11B shows a schematic diagram 1100B of the diode 1110 used to by-pass current around a plurality of solar cells and electrically coupled in parallel with the plurality of solar cells that are electrically coupled in parallel. The diode 1110 is electrically coupled in parallel to the combination of solar cell 1120 and a parallel solar cell 1122. The diode 1110 is electrically coupled with the parallel combination of solar cells 1120 and 1122 at first terminal 1132 and at second terminal 1130. To by-pass current around the parallel combination of solar cells 1120 and 1122 in an event that at least one of the solar cells 1120 or 1122 develops a high resistance to the passage of solar-cell module current, the diode 1110 is coupled to the solar cells 1120 and 1122 with reverse polarity to both of the solar cells 1120 and 1122. FIG. 11C shows a schematic diagram 1100C of the diode 1110 used to by-pass current around a plurality of solar cells and electrically coupled in parallel with the plurality of solar cells 1120 and 1124 that are electrically coupled in series. The diode 1110 is electrically coupled in parallel to the combination of solar cell 1120 and solar cell 1124 coupled in series with solar cell 1120. The diode 1110 is electrically coupled with the series combination of solar cells 1120 and 1124 at first terminal 1132 and at second terminal 1130. To by-pass current around the series combination of solar cells 1120 and 1124 in an event that at least one of the solar cells 1120 or 1124 develops a high resistance to the passage of solar-cell module current, the diode 1110 is coupled to the solar cells 1120 and 1122 with reverse polarity to both of the solar cells 1120 and 1124. FIG. 11D shows a schematic diagram 1100D of a diode used to by-pass current around a plurality of solar cells and electrically coupled in parallel with the plurality of solar cells that are electrically coupled in series and in parallel. The diode 1110 is electrically coupled in parallel to the combination of solar cell 1120 and solar cell 1124 coupled in series with solar cell 1120 and the combination of solar cell 1122 and solar cell 1126 coupled in series with solar cell 1122. The diode 1110 is electrically coupled with the series/parallel combination of solar cells 1120, 1124, 1122 and 1126 at first terminal 1132 and at second terminal 1130. To by-pass current around the series/parallel combination of solar cells 1120, 1124, 1122 and 1126 in an event that at least one of the solar cells 1120, 1124, 1122 and 1126 develops a high resistance to the passage of solar-cell module current, the diode 1110 is coupled to the solar cells 1120, 1124, 1122 and 1126 with reverse polarity to the solar cells 1120, 1124, 1122 and 1126. In accordance with embodiments of the present invention, a solar-cell sub-module may be selected from the group consisting of one solar cell, a parallel combination of solar cells, a series combination of solar cells and a series/parallel combination of solar cells. Moreover, although embodiments of the present invention have been shown as just two solar cells electrically coupled in series, and just two parallel legs of a circuit of solar cells electrically coupled in parallel, embodiments of the present invention include pluralities of series coupled solar cells greater than two, and pluralities of parallel coupled solar cells or parallel coupled pluralities of series coupled solar cells greater than two. Therefore, embodiments of the present invention include a diode electrically coupled in parallel with any network that includes a configuration of interconnected solar cells, in which the diode serves to by-pass current around the network in an event the network, or alternatively a solar cell within the network, develops high resistance to the flow of current through the solar-cell module.

With further reference to FIG. 10, in accordance with embodiments of the present invention, the solar-cell module 1002 includes at least one pair of first and terminating busbars 1019*a* and 1019*b*, respectively, electrically coupled to a first end and a terminating end of the plurality 1010 of solar-cells 1012*a*-1017*a* and 1012*b*-1017*b*. The first busbar 1019*a* may be disposed on and electrically coupled to a back side of a first solar cell, for example, solar cell 1012*a*. The terminating busbar 1019*b* may be disposed proximately to and electrically coupled to a light-facing side of a terminating solar cell 1017*b*. The pair of first and terminating busbars, respectively, 1019*a* and 1019*b* is electrically coupled to the pair of external-connection mechanisms mounted to respective edge regions, respectively, for example, located at corners 1080 and 1082. Alternatively, the solar-cell module 1002 may also include other pairs of first and terminating busbars (not shown), which may be electrically coupled to a first end and a terminating end of the second plurality 1020 of solar-cells 1022*a*-1027*a* and 1022*b*-1027*b*, or the third plurality 1030 of solar-cells 1032*a*-1037*a* and 1032*b*-1037*b*. Other first busbars may be disposed on and electrically coupled to back sides of respective first solar cells 1022*a* and 1032*a*. Other terminating busbars may be disposed proximately to and electrically coupled to light-facing sides of respective terminating solar cells 1027*b* and 1037*b*. The other pairs of first and terminating busbars may also be electrically coupled to the pair of external-connection mechanisms mounted to respective edge regions, respectively, for example, located at corners 1080 and 1082. The first busbar 1019*a* and the other first busbars may be separate entities that may be separated by one or more gaps; and, the terminating busbar 1019*b* and the other terminating busbars may be separate entities that may be separated by a second set of one or more gaps. In an embodiment of the present invention, the first busbar 1019*a* may be electrically coupled together with the other first busbars and the terminating busbar 1019*b* may be electrically coupled together with the other terminating busbars such that pluralities 1010, 1020 and 1030 of solar cells are electrically coupled in parallel. However, as shown in FIG. 10, there are no other busbars besides first busbar and terminating busbars 1019*a* and 1019*b*; only a single first busbar 1019*a* and a single terminating busbars 1019*b* electrically couple the pluralities 1010, 1020 and 1030 of solar cells in parallel.

With further reference to FIG. 10, in accordance with embodiments of the present invention, the solar-cell module 1002 may further include an integrated busbar-solar-cell-current collector as described above in Section I and shown in FIGS. 6A and 6B. The integrated busbar-solar-cell-current collector 690 includes the terminating busbar 680, identified with the terminating busbar 1019*b* of solar-cell module 1002, and the integrated solar-cell, current collector 670. The integrated solar-cell, current collector 670 includes the plurality of integrated pairs 670*a*&*b*, 670*c*&*d*, 670*e*&*f*, 670*g*&*h*, and 670*l*&*m* and 670*i* of electrically conductive, electrically parallel trace portions 670*a*-*m*. The plurality of integrated pairs 670*a*&*b*, 670*c*&*c*, 670*e*&*f*, 670*g*&*h*, 670*i* and 670*l*&*m* of electrically conductive, electrically parallel trace portions 670*a*-*m* is configured both to collect current from the terminating solar cell 660, identified with solar cell 1017*b*, and to interconnect electrically to the terminating busbar 680. The plurality of integrated pairs 670*a*&*b*, 670*c*&*c*, 670*e*&*f*, 670*g*&*h*, 670*i* and 670*l*&*m* of electrically conductive, electrically parallel trace portions 670*a*-*m* is configured such that solar-cell efficiency is substantially undiminished in an event that any one electrically conductive, electrically parallel trace portion, for example, 670*h*, of the plurality of integrated pairs 670*a*&*b*, 670*c*&*c*, 670*e*&*f*, 670*g*&*h*, 670*i* and 670*l*&*m* of electrically conductive, electrically parallel trace portions 670*a*-*m* is conductively impaired. The terminating busbar 680 may be disposed above, or below, and coupled electrically to extended portions, for example, extended portions 670*x* and 670*y*, of the plurality of integrated pairs 670*a*&*b*, 670*c*&*c*, 670*e*&*f*, 670*g*&*h*, 670*i* and 670*l*&*m* of electrically conductive, electrically parallel trace portions 670*a*-*m* configured such that the terminating busbar 680 is configured to reduce shadowing of the terminating solar cell 660. The extended portions 670*x* and 670*y* of the plurality of integrated pairs of electrically conductive, electrically parallel trace portions 670*a*&*b*, 670*c*&*c*, 670*e*&*f*, 670*g*&*h*, 670*i* and 670*l*&*m* allow the terminating busbar 680 to fold under the back side 668 of the terminating solar cell 660, identified with the terminating solar cell 1017*b* of solar-cell module 1002. Therefore, in accordance with embodiments of the present invention, the terminating busbar 680, identified with the terminating busbar 1019*b* of solar-cell module 1002, may be folded under the back side 668 of the terminating solar cell 660, identified with the terminating solar cell 1017*b* of solar-cell module 1002. Consequently, but without limitation to the folded-under configuration for the terminating busbar 680 described above, the solar-cell module 1002 may be arranged with a configuration to minimize wasted solar-collection space within the solar-cell module 1002 such that solar-cell-module efficiency is greater than solar-cell-module efficiency in the absence of such configuration, in accordance with embodiments of the present invention.

With further reference to FIG. 10, in accordance with embodiments of the present invention, the solar-cell module 1002 may further include an interconnect assembly 420 as described above in Section I and shown in FIGS. 4B and 4C. The solar-cell module 404, identified with solar-cell module 1002, includes the first solar cell 410, identified with solar cell 1012*a*, at least the second solar cell 430, identified with solar cell 1013*a*, and the interconnect assembly 420 disposed above the light-facing side 416 of the absorber layer of the first solar cell 410. The interconnect assembly 420 includes the trace including the plurality of electrically conductive portions 420*a*, 420*b*, 420*c*, 420*i* and 420*m*. The plurality of electrically conductive portions 420*a*, 420*b*, 420*c*, 420*i* and 420*m* is configured both to collect current from the first solar cell 410 and to interconnect electrically to the second solar cell 430. The plurality of electrically conductive portions 420*a*, 420*b*, 420*c*, 420*i* and 420*m* is configured such that solar-cell efficiency is substantially undiminished in an event that any one of the plurality of electrically conductive portions 420*a*, 420*b*, 420*c*, 420*i* and 420*m* is conductively impaired. In accordance with embodiments of the present invention, the plurality of electrically conductive portions 420*a*, 420*b*, 420*c*, 420*i* and 420*m* of the interconnect assembly 420 may be coupled electrically in series to form a single continuous electrically conductive line. In addition, the trace of the interconnect assembly 420 may be disposed in a serpentine pattern such that the interconnect assembly 420 is configured to collect current from the first solar cell 410 and to interconnect electrically to the second solar cell 430.

With further reference to FIG. 10, in accordance with embodiments of the present invention, the trace of the interconnect assembly 420 interconnecting the solar cells 1012*a* and 1013*a* of the solar-cell module 1002 is further described above in Section I and shown in FIGS. 5B and 5C. The trace 520 may further include an electrically conductive line including a conductive core 520A and at least one overlying layer 520B overlying the conductive core 520A. Alternatively, the trace 520 may include the electrically conductive line including the conductive core 520A including nickel, without the overlying layer 520B; or, the trace 520 may include the electrically conductive line including the conductive core 520A including material having greater conductivity than nickel and the overlying layer 520B including nickel.

With reference now to FIG. 12B, in accordance with embodiments of the present invention, a plan view 1200B of the solar-cell array 1252 including the plurality 1260 of solar-cell modules 1260*a*, 1260*b* and 1260*c* is shown. FIG. 12B shows the plurality 1260 of solar-cell modules 1260*a*, 1260*b* and 1260*c* combined with external-connection mechanisms mounted to respective edge regions and in-laminate-diode assemblies. For example, solar-cell module 1260*b* includes a first in-laminate-diode assembly 1270, a second in-laminate-diode assembly 1271 and a third in-laminate-diode assembly 1272; solar-cell module 1260*b* also includes a first busbar 1274 and a terminating busbar 1276 each electrically coupled with the first, second and third in-laminate-diode assemblies 1270, 1271 and 1272. The solar-cell module 1260*b* further includes a first external-connection mechanism 1280*b*, for example, a first junction box, mounted to a first edge region, for example, a first corner, of the protective structure and a second external-connection mechanism 1282*b*, for example, a second junction box, mounted to a second edge region, for example, a second corner, of the protective structure. The first external-connection mechanism 1280*b* mounted to a first respective edge region is configured to enable collection of current from the solar cells of the solar-cell module 1260*b* and to allow interconnection with at least one other external device, as shown here solar-cell module 1260*a*. Similarly, the second external-connection mechanism 1282*b* mounted to a second respective edge region is configured to enable collection of current from the solar-cell sub-modules of the solar-cell module 1260*b* and to allow interconnection with at least one other external device, as shown here solar-cell module 1260*c*. In embodiments of the present invention, the solar-cell module 1260*b* is coupled in series with the other solar-cell module 1260*a*, and also solar-cell module 1260*c*. However, in accordance with embodiments of the present invention, solar-cell modules may be interconnected in parallel or series/parallel combinations which are within the spirit and scope of the embodiments of the present invention.

With further reference to FIG. 12B, in accordance with embodiments of the present invention, solar-cell module 1260*a* also includes first external-connection mechanism 1280*a*, for example, a first junction box, mounted to a first edge region, for example, a first corner, of the protective structure of solar-cell module 1260*a* and a second external-connection mechanism 1282*a*, for example, a second junction box, mounted to a second edge region, for example, a second corner, of the protective structure of solar-cell module 1260*a*. Similarly, solar-cell module 1260*c* also includes a first external-connection mechanism 1280*c*, for example, a first junction box, mounted to a first edge region, for example, a first corner, of the protective structure of solar-cell module 1260*c* and a second external-connection mechanism 1282*c*, for example, a second junction box, mounted to a second edge region, for example, a second corner, of the protective structure of solar-cell module 1260*c*.

With further reference to FIG. 12B, in accordance with embodiments of the present invention, the external-connection mechanism 1280*b* mounted to its respective edge region of solar-cell module 1260*b* is disposed in a configuration opposite the external-connection mechanism 1282*b* mounted to its respective edge region of solar-cell module 1260*b* on a lateral side of the solar-cell module 1260*b*. This configuration, when applied to the plurality 1260 of all solar-cell modules 1260*a*, 1260*b* and 1260*c*, allows the two solar-cell modules 1260*a* and 1260*b* with external-connection mechanisms 1282*a* and 1280*b* mounted to respective edge regions to be disposed on respective lateral sides of the two solar-cell modules 1260*a* and 1260*b*. The solar-cell modules 1260*a* and 1260*b*, thus configured, may be intercoupled with interconnector 1284. Thus, the second external-connection mechanism 1282*a* of the first solar-cell module 1260*a* may be disposed proximately to the first external-connection mechanism 1280*b* of the second solar-cell module 1260*b*. Alternatively, the first external-connection mechanism 1280*c* of the third solar-cell module 1260*c* may be disposed proximately to the second the second external-connection mechanism 1282*b* of the second solar-cell module 1260*b*. Thus, in accordance with embodiments of the present invention, a first external-connection mechanism of a plurality of external-connection mechanisms of a solar-cell module is disposed proximate to a second external-connection mechanism of a second plurality of external-connection mechanisms of another solar-cell module. Moreover, in accordance with embodiments of the present invention, a first external-connection mechanism of a plurality of external-connection mechanisms of a solar-cell module, for example, the first external-connection mechanism 1280*c* of third solar-cell module 1260*c*, and a second external-connection mechanism of a plurality of external-connection mechanisms of a second solar-cell module, for example, the second external-connection mechanism 1282*b* of solar-cell module 1260*b*, are arranged on their respective solar-cell modules 1260*c* and 1260*b* to minimize a length of an interconnector 1288 between the first external-connection mechanism 1280*c* and the second external-connection mechanism 1282*b*. Thus, the solar-cell modules 1260*a*, 1260*b* and 1260*c* are intercoupled to form the solar-cell array 1252. Furthermore, in accordance with embodiments of the present invention, a first external-connection mechanism of a plurality of external-connection mechanisms of a solar-cell module may be selected from the group consisting of a wire, a connector, a lead, and a junction box. Also, an edge region may be selected from the group consisting of an edge of the solar-cell module and a corner of the solar-cell module, where two edges may meet.

With reference now to FIG. 12A, the embodiments of the present invention described for FIG. 12B are contrasted with another embodiment of the present invention that employs centrally-mounted junction boxes 1230*a*, 1230*b* and 1230*c*. FIG. 12A is a plan view 1200A of a solar-cell array 1202 including a plurality 1210 of solar-cell modules 1210*a*, 1210*b* and 1210*c* combined with centrally-mounted junction boxes 1230*a*, 1230*b* and 1230*c* and in-laminate-diode assemblies 1220, 1212 and 1222 (shown only for solar-cell module 1210*b*). Solar-cell module 1210*b* includes a first in-laminate-diode assembly 1220, a second in-laminate-diode assembly 1221 and a third in-laminate-diode assembly 1222. Solar-cell module 1210b also includes a first busbar 1224 and a terminating busbar 1226 each electrically coupled with the first, second and third in-laminate-diode assemblies 1220, 1221 and 1222. Because the junction box 1230b of solar-cell module 1210b is centrally mounted, centrally-mounted junction box 1230b requires additional wiring to collect current from the solar-cell module 1210b. For example, a first supplemental busbar 1228 is electrically coupled to the first busbar 1224; and a second supplemental busbar 1229 is electrically coupled to the terminating busbar 1226. Similarly, because the junction box 1230b of solar-cell module 1210b is centrally mounted, long interconnectors are required between solar-cell modules. For example, a first interconnector 1234 between centrally-mounted junction boxes 1230a and 1230b is required to interconnect solar-cell modules 1210a and 1210b; and, a second interconnector 1238 between centrally-mounted junction boxes 1230b and 1230c is required to interconnect solar-cell modules 1210b and 1210c. As shown in FIG. 12A, the first interconnector 1234 includes two portions 1234a and 1234b which attach respectively to centrally-mounted junction boxes 1230a and 1230b, and are provided with connectors joining the two portions together; and, the second interconnector 1238 includes two portions 1238a and 1238b which attach respectively to centrally-mounted junction boxes 1230b and 1230c, and are provided with connectors joining the two portions together. This arrangement is contrasted with the short interconnectors 1284 and 1288 shown in FIG. 12B. Thus, the interconnection arrangement shown in FIG. 12B is less costly, because it requires less wiring, and improves solar-cell array efficiency, because there is less parasitic series resistance than would obtain with the additional wiring shown in FIG. 12A.

With further reference to FIGS. 12A and 12B, another distinguishing feature of embodiments of the present invention of FIG. 12B is that the use of an in-laminate-diode assembly facilitates the use of a plurality of external-connection mechanisms mounted to a respective plurality of edge regions. For embodiments of the present invention of FIG. 12A having centrally mounted junction boxes, a single diode included in the junction box would typically be employed instead of the in-laminate-diode assemblies, as shown. To the inventors' knowledge, one of the reasons those skilled in the art have not considered using separate junction boxes is because of the difficulty in placing a diode within separated junction boxes to provide the by-pass protection discussed above. Thus, a distinguishing feature of embodiments of the present invention is the use of an in-laminate-diode assembly that allows the use of separate junction boxes without the necessity of including diodes within a junction box.

With reference now to FIG. 13, in accordance with embodiments of the present invention, a combined perspective-plan and expanded view 1300 of an in-laminate-diode sub-assembly 1302 with diode 1350 is shown at the top and right of the figure. Also, towards the bottom and left of FIG. 13, a perspective-plan view of a second in-laminate-diode sub-assembly 1304 in a more fully assembled state is shown. The in-laminate-diode assembly of a solar-cell module, for example, in-laminate-diode assembly 1050 of solar-cell module 1002 of FIG. 10, may include a plurality of in-laminate-diode sub-assemblies, for example, in-laminate-diode sub-assemblies 1050a and 1050b. Alternatively, an in-laminate-diode assembly may include at least one in-laminate-diode sub-assembly. The in-laminate-diode sub-assembly 1302, which may be identified with in-laminate-diode sub-assembly 1050b, includes the diode 1350. The in-laminate-diode sub-assembly also includes a first conductor 1320 electrically coupled to the diode 1350. The first conductor 1320 is configured to couple electrically with a first terminal, which may be electrically coupled to a back side, of a primary solar cell of the solar-cell sub-module. The in-laminate-diode sub-assembly 1302 also includes a second conductor 1330 electrically coupled to the diode 1350, the second conductor 1330 configured to couple electrically with a second terminal, which may be electrically coupled to a light-facing side, of a last solar cell of the solar-cell sub-module.

With further reference to FIG. 13, in accordance with embodiments of the present invention, the diode 1350 is disposed between the first conductor 1320 and the second conductor 1330. In the expanded view at the top and right of FIG. 13, the disposition of the diode 1350 between first and second conductors 1320 and 1330 is indicated by a double-headed arrow 1310. The diode 1350 is disposed between a first tab portion 1320a of first conductor 1320 and a second tab portion 1330a of second conductor 1330. In an embodiment of the present invention, the diode may be a simple chip diced from a silicon wafer having a pn junction, as may be the case for an initially homogenously doped wafer with a diffused or implanted dopant profile of opposite type from a dopant species used in growing a boule from which the wafer is sliced. At least one of the first and second conductors 1320 and 1330 may be configured as a heat sink to remove heat generated by the diode 1350, although a heat-dissipating function may be provided by separate components. Because first and second conductors 1320 and 1330 may have the dual function of both providing an electrical path for, and dissipating heat generated by, current that by-passes a solar-cell sub-module with high resistance, both first conductor 1320 and second conductor 1330 may have a large current-carrying and heat-dissipating portions 1320b and 1330b, respectively. Alternatively, the in-laminate-diode assembly may be made with separate components for the heat-spreading function and the current-carrying function. Therefore, the first and second conductors 1320 and 1330 may be configured to provide an electrical path for current that by-passes a solar-cell sub-module; and, separate heat sinks configured as separate components from the first and second conductors 1320 and 1330 may be provided to dissipate heat generated by current that by-passes a solar-cell sub-module. In addition, both first conductor 1320 and second conductor 1330 may have broad low-contact-resistance portions 1320c (not shown for second conductor 1330) for making electrical contact and electrically coupling with respective portions of solar cells, or other components, for example, busbars, in the solar-cell sub-module, which the in-laminate-diode sub-assembly protects. In addition, the in-laminate-diode sub-assembly 1302 includes an electrically-insulating-laminate strip 1340. The electrically-insulating-laminate strip 1340 may be disposed between a plurality of first and second terminals, which may be back sides, of solar cells of the solar-cell sub-module, and the first conductor 1320 and the second conductor 1330. In an embodiment of the present invention, the plurality of first and second terminals of solar cells may be exclusive of the back side of the primary, or first, solar cell of a solar-cell sub-module.

With further reference to FIG. 13, in accordance with embodiments of the present invention, the back side of a solar cell may provide electrical coupling to both the light-facing side of one solar cell in the solar-cell sub-module and the back side of an adjacent solar cell in an adjacent solar-cell sub-module as for the interconnect assembly described above for FIGS. 4A-4F. The first terminal may be electrically coupled to a positive terminal or a negative terminal of a solar cell in the solar-cell sub-module with which the diode is electrically coupled in parallel as described above for FIGS. 11A-11D. Similarly, the second terminal may be electrically coupled to a positive terminal or a negative terminal of a solar cell in the solar-cell sub-module with which the diode is electrically coupled in parallel, but the second terminal will be electrically coupled to the terminal of the solar cell having opposite polarity to that of the terminal of the solar cell to which the first terminal is electrically coupled. For example, if the first terminal is electrically coupled to a positive terminal of a solar cell, the second terminal will be electrically coupled to a negative terminal of a solar cell. However, the polarity of the diode will always be electrically coupled with opposite to the polarity of the solar cell terminals with which the first and second terminals are electrically coupled as described above for FIGS. 11A-11D. In an embodiment of the present invention, the back side of a solar cell corresponds to positive terminal of the solar cell, and the light-facing side corresponds to negative terminal of the solar cell, as for the CIGS solar cells described in FIGS. 1A-1B. However, it should be noted that nothing precludes the application of embodiments of the present invention to solar-cell modules where the back side of a solar cell corresponds to a negative terminal of the solar cell, and the light-facing side corresponds to a positive terminal of the solar cell, or alternatively where both the positive and negative terminals of the solar cell may be disposed on the same side of the solar cell, whether it may be a back side or a light-facing side, so that such embodiments of the present invention are within the spirit and scope of embodiments of the present invention.

With further reference to FIG. 13, in accordance with embodiments of the present invention, the in-laminate-diode sub-assembly 1302 further includes the electrically-insulating-laminate strip 1340 configured to allow access of at least one of the first and second conductors 1320 and 1330 to a solar cell of the plurality of solar cells of a solar-cell module, or solar-cell sub-module, for electrically coupling with the solar cell. For example, the electrically-insulating-laminate strip 1340 may include a continuous electrically-insulating-laminate strip with an access region 1342 through which the first conductor electrically couples with the back side of the primary solar cell. Alternatively, the electrically-insulating-laminate strip 1340 may include a plurality of separate electrically-insulating-laminate sub-strips separated by gaps corresponding with first and second terminals at which an in-laminate-diode sub-assembly makes contact with solar cells of the solar-cell sub-module. Therefore, the access region 1342 may be selected from the group consisting of a window, an opening, an aperture, a gap, and a discontinuity in the electrically-insulating-laminate strip 1340. As shown in FIG. 13, this also allows the second conductor 1330 to electrically couple with the light-facing side of the last solar cell of the solar-cell sub-module, because the light-facing side of the last solar cell of the solar-cell sub-module may be electrically coupled in common with the back side of the primary solar cell of an adjacent solar-cell sub-module through an interconnect assembly between the back side of the primary solar cell and the light-facing side of the last solar cell of adjacent solar-cell sub-modules (not shown).

With further reference to FIG. 13, in accordance with embodiments of the present invention, the in-laminate-diode sub-assembly 1302 further includes at least one of the first and second conductors 1320 and 1330 structured to enable a laminated electrical connection between at least one of the first and second conductors 1320 and 1330 and another component of the solar-cell module. Another component of the solar-cell module may be a first busbar, a terminating busbar and the terminal of a solar cell of a solar-cell sub-module. The laminated electrical connection does not require solder, welding, a conducting adhesive or any other material disposed between a first contacting surface of the first conductor 1320 and/or second conductor 1330 and a second contacting surface of the other component of the solar-cell module to which the first conductor 1320 and/or second conductor 1330 are electrically connected. The laminated electrical connection requires only that a mechanical pressure be applied to hold the first conductor 1320 and/or second conductor 1330 in intimate contact with the other component of the solar-cell module to which the first conductor 1320 and/or second conductor 1330 are electrically connected.

With further reference to FIG. 10 and FIG. 13, in accordance with embodiments of the present invention, the first conductor 1320 may further include a first electrically-conducting-laminate strip configured to couple electrically with a first terminal of an adjacent last solar cell, for example, solar cell 1017a, of a first adjacent solar-cell sub-module, for example, solar-cell sub-module 1010a, and electrically coupled with a first adjacent diode. In an embodiment of the present invention, the first terminal of the adjacent last solar cell of the first adjacent solar-cell sub-module may be a light-facing side of the adjacent last solar cell of the first adjacent solar-cell sub-module. Thus, the first electrically-conducting-laminate strip has the function of both the first conductor 1320 of in-laminate-diode sub-assembly 1302 and the second conductor of second in-laminate-diode sub-assembly 1304. As shown in FIG. 13, the first conductor 1320 of in-laminate-diode sub-assembly 1302 has portions 1320d, 1320e and 1320f that serve, respectively, as a broad low-contact-resistance portion 1320d, a large current-carrying and heat-dissipating portion 1320e and a second tab portion 1320f as a second conductor of second in-laminate-diode sub-assembly 1304. Alternatively, the second conductor of second in-laminate-diode sub-assembly 1304 may be separated from the first conductor 1320 of in-laminate-diode sub-assembly 1302 along dashed line 1352 to provide the functions of the broad low-contact-resistance portion 1320d, the large current-carrying and heat-dissipating portion 1320e and the second tab portion 1320f of the second conductor of second in-laminate-diode sub-assembly 1304. Similarly, in accordance with embodiments of the present invention, the second conductor 1330 may further include a second electrically-conducting-laminate strip configured to couple electrically with a second terminal of an adjacent primary solar cell, for example, solar cell 1012b, of a second adjacent solar-cell sub-module, for example, solar-cell sub-module 1010b, and electrically coupled with a second adjacent diode. In an embodiment of the present invention, the second terminal of the adjacent primary solar cell of the second adjacent solar-cell sub-module may be a back side of the adjacent primary solar cell of the second adjacent solar-cell sub-module. Alternatively, the first terminal and the second terminal may be configured as described in the preceding paragraphs, particularly as described for FIGS. 11A-11D.

With reference now to FIG. 14, FIG. 10 and FIG. 12, in accordance with embodiments of the present invention, a combined plan and perspective view 1400 of a lead 1422 at a cut corner 1418 of the back glass 1414 of a solar-cell module, for example, solar-cell module 1002, is shown. The lead 1422 is shown here as a folded-over lead, without limitation thereto for embodiments of the present invention. An external-connection mechanism of the solar-cell module is electrically coupled to the lead 1422 at an edge region, for example, the cut corner 1418, of the plurality of edge regions of the protective structure of the solar-cell module, for example, solar-cell module 1002. The lead 1422 is electrically coupled to the plurality of solar cells, for example, plurality 1010 of solar cells 1012*a*-1017*a* and 1012*b*-1017*b*. As described above, an external-connection mechanism of the solar-cell module may be selected from the group consisting of a wire, a connector, a lead, and a junction box, for example, external-connection mechanism 1282*b* as discussed here; and, an edge region may be selected from the group consisting of an edge of the solar-cell module and a corner of the solar-cell module, where two edges may meet, for example, cut corner 1418 as discussed here. The junction box, for example, external-connection mechanism 1282*b*, of the solar-cell module, for example, solar-cell module 1260*b*, may be electrically coupled to an interconnector, for example, interconnector 1288, through the lead 1422 at the cut corner 1418 of the back glass 1414 of the solar-cell module 1260*b*. The lead 1422 may be inter-coupled with appropriate lugs and internal wiring to an external terminal junction of the junction box, for example, external-connection mechanism 1282*b*, to provide this electrical coupling. The lead 1422 may be electrically coupled to the plurality of solar-cell sub-modules, for example, solar-cell sub-modules 1010*a*-1010*b*, through a busbar (not shown) to which it is electrically coupled. In embodiments of the present invention, the lead 1422 at the edge region, for example, cut corner 1418, of the plurality of edge regions of the protective structure, for example, back glass 1414, may include a copper lead.

With further reference to FIG. 14 and FIG. 10, in accordance with embodiments of the present invention, an edge 1424 of the lead 1422 at the edge region, for example, cut corner 1418, of the protective structure, for example, front glass 1410 or back glass 1414, is located at a distance 1428 at least three-eighths of an inch from a nearest externally accessible portion of the protective structure, for example, a joint 1426 between the external-connection mechanism (not shown) and the front glass 1410 or back glass 1414, proximate to the edge of the lead. For example, the edge 1424 of the lead at the cut corner 1418 of the front glass 1410 or back glass 1414 may be located no closer than the distance 1428 of three-eighths of an inch from the joint 1426 that an external-connection mechanism, for example, a junction box, makes with the protective structure, for example, front glass 1410 or back glass 1414. Alternatively, the edge region may be a set-off notch (not shown) at an edge, for example, edges 1090, 1092, 1094 and 1096 as shown in FIG. 10, of the protective structure, rather than the cut corner 1418, at which an external-connection mechanism, for example, a junction box might be disposed. It should be noted that the joint 1426 between the outer surface of the junction box and the front glass 1410 or back glass 1414 is the nearest externally accessible portion of the protective structure. The three-eighths of an inch distance 1428 between this joint 1426 and the edge 1424 of the lead 1422 would provide a safe distance against the intrusive migration of water along the interface between encapsulating adhesives used to attach the junction box to the front glass 1410 or back glass 1414 and potting compounds used in the junction box to electrically insulate the lead 1422. A distance shorter than the three-eighths of an inch distance 1428 might cause an electrical shock hazard for a potential difference above ground potential, greater than or equal to 600 volts, on the lead 1422. In addition, the lead 1422 at the edge region, for example, cut corner 1418, of the protective structure, for example, back glass 1414, may include a portion of a busbar (not shown) attached to the plurality of solar cells, for example, the plurality 1010 of solar cells 1012*a*-1017*a* and 1012*b*-1017*b*. As shown in FIG. 14, the front glass 1410 and the back glass 1414 that encapsulate the plurality of solar cells, for example, the plurality 1010 of solar cells 1012*a*-1017*a* and 1012*b*-1017*b*, provides a protective structure for the solar-cell module, for example, solar-cell module 1002 as shown in FIG. 10. In accordance with embodiments of the present invention, the lead 1422 at the edge region, for example, cut corner 1418, is sealed between the front glass 1410 of the protective structure and a bottom portion, for example, back glass 1414, of the protective structure with a first layer 1430 of polymeric sealing material and a second layer 1432 of polymeric sealing material. The first layer 1430 of polymeric sealing material is disposed between a lead-facing portion of the front glass 1410 and the lead 1422, and the second layer 1432 of polymeric sealing material is disposed between a lead-facing portion of the bottom portion of the protective structure and the lead 1422. In embodiments of the present invention, the polymeric sealing material may be a butyl-based sealing material. The bottom portion of the protective structure may be a back glass 1414 but without limitation thereto for embodiments of the present invention; for example, the bottom portion might be a non-transparent electrically insulating material other than glass. To the inventors' knowledge, the use of this double application of polymeric sealing material to seal a lead emerging from between the edges of the protective structure, for example, front glass 1410 and back glass 1414, of a solar-cell module has not been used prior to its use in embodiments of the present invention.

Figure 15A:
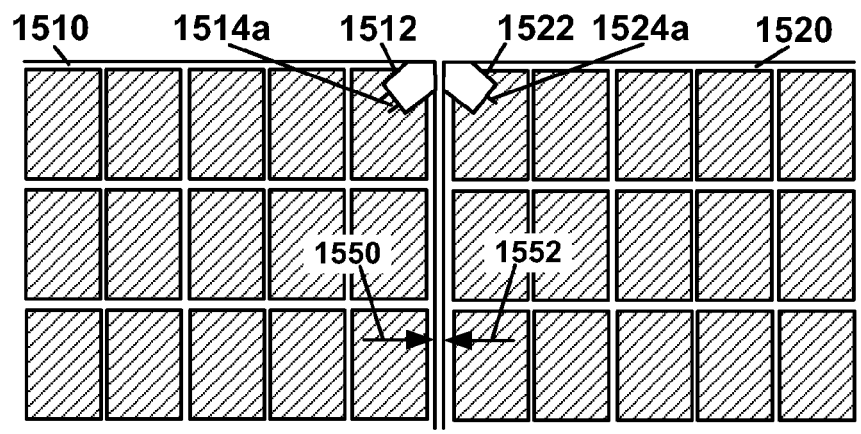
FIG. 15A is a plan view of a first junction box of a first solar-cell module with a female receptacle and a second junction box of a second solar-cell module with a male connector configured to allow interconnection with the first solar-cell module, in accordance with an embodiment of the present invention.
Figure 15B:
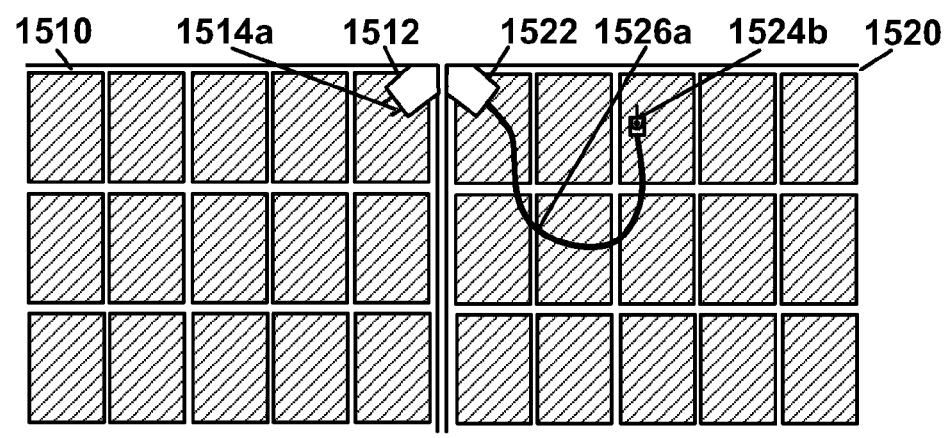
FIG. 15B is a plan view of an interconnector with a male connector integrally attached to the second junction box of the second solar-cell module and configured to allow interconnection with the first junction box with the female receptacle of the first solar-cell module, in accordance with an embodiment of the present invention.
Figure 15C:
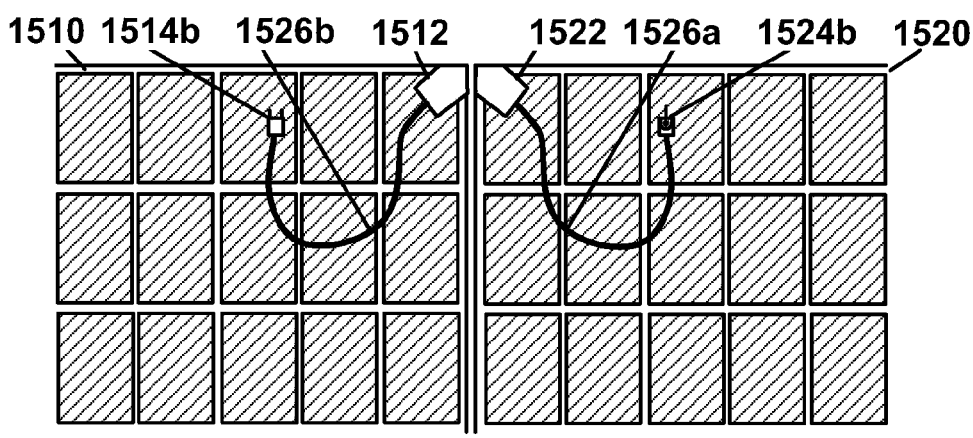
FIG. 15C is a plan view of an interconnector with a female receptacle integrally attached to the first junction box of the first solar-cell module, and of the interconnector with the male connector integrally attached to the second junction box of the second solar-cell module and configured to allow interconnection with the first junction box, in accordance with an embodiment of the present invention.

With reference now to FIGS. 15A, 15B and 15C, in accordance with embodiments of the present invention, various interconnection schemes for interconnecting solar-cell modules having a variety of external-connection mechanisms are shown. The external-connection mechanisms are selected from the group consisting of junction boxes with an integrally attached male connector or an integrally attached female receptacle, and junction boxes with integrally attached leads having an attached male connector or an attached female receptacle. The embodiments of the present invention described for FIGS. 15A, 15B and 15C are but representative of embodiments of the present invention and are provided without limitation thereto, as other embodiments of the present invention for interconnecting two solar-cell modules are also within the spirit and scope of embodiments of the present invention.

With reference now to FIG. 15A, in accordance with embodiments of the present invention, a plan view 1500A of a first junction box 1512 of a first solar-cell module 1510 with a female receptacle 1514*a* and a second junction box 1522 of a second solar-cell module 1520 with a male connector 1524*a* configured to allow interconnection with the first solar-cell module 1510 is shown. An interconnector (not shown) provided with the male connector at one end and a female receptacle at the other end may be used to interconnect first and second solar cell modules 1510 and 1520. Junction boxes 1512 and 1522 may be mounted on the respective corners of their respective solar-cell modules 1510 and 1520 with adhesives, and the internal wiring and connections with respective leads of their respective solar-cell modules 1510 and 1520 may be protected from the environment with suitable electrical potting compounds. In accordance with embodiments of the present invention, the separation between first and second solar-cell modules 1510 and 1520, indicated by a gap between arrows 1550 and 1552, may also be minimized so as to reduce the length of an interconnector (not shown) between first and second solar-cell modules 1510 and 1520. Minimizing the separation between solar-cell modules improves solar-cell array efficiency by reducing wasted solar-collection space over the foot-print of the solar-cell array, as well as reducing the parasitic series resistance associated with a long interconnector having to span a large separation between first and second solar-cell modules 1510 and 1520. Thus, in accordance with embodiments of the present invention, the solar-cell modules are arranged with a configuration to minimize wasted solar-collection space within the solar-cell array such that solar-cell-array efficiency is greater than solar-cell-array efficiency in the absence of the configuration.

With reference now to FIG. 15B, in accordance with embodiments of the present invention, a plan view 1500B of an interconnector 1526*a* with a male connector 1524*b* integrally attached to the second junction box 1522 of the second solar-cell module 1520 and configured to allow interconnection with the first junction box 1512 with the female receptacle 1514*a* of the first solar-cell module 1510 is shown. In accordance with embodiments of the present invention, the interconnector 1526*a* between the second junction box 1522 of the second solar-cell module 1520 and the first junction box 1512 of the first solar-cell module 1510 may be a flexible interconnector. The interconnector 1526*a* between the second junction box 1522 of the second solar-cell module 1520 and the first junction box 1512 of the first solar-cell module 1510 may also be a rigid interconnector. The interconnector 1526*a* may be integrally attached to the second junction box 1522 of the second solar-cell module 1520 and configured to allow interconnection with the first junction box 1512 of the first solar-cell module 1510 such that the interconnector 1526*a* has the male connector 1524*b* to interconnect to the female receptacle 1514*a* integrally attached to the first junction box 1512 of the first solar-cell module 1510.

With reference now to FIG. 15C, in accordance with embodiments of the present invention, a plan view 1500C of an interconnector 1526*b* with a female receptacle 1514*b* integrally attached to the first junction box 1512 of the first solar-cell module 1510, and of the interconnector 1526*a* with the male connector 1524*b* integrally attached to the second junction box 1522 of the second solar-cell module 1520 and configured to allow interconnection with the first junction box 1512 is shown. In accordance with embodiments of the present invention, the interconnector 1526*a* attached to the second junction box 1522 of the second solar-cell module 1520 may be a flexible interconnector. Similarly, the interconnector 1526*b* attached to the first junction box 1512 of the first solar-cell module 1510 may be a flexible interconnector. The interconnector 1526*a* attached to the second junction box 1522 of the second solar-cell module 1520 and the first junction box 1512 of the first solar-cell module 1510 may also be a rigid interconnector. Similarly, the interconnector 1526*b* attached to the first junction box 1512 of the first solar-cell module 1510 may be a rigid interconnector. The interconnectors 1526*a* and 1526*b* may be integrally attached to their respective junction boxes 1522 and 1512 and configured to allow interconnection of the first junction box 1512 of the first solar-cell module 1510 to the second junction box 1522 of the second solar-cell module 1520 through the interconnection of the male connector 1524*b* with the female receptacle 1514*b*.

Section III:
Physical Description of Embodiments of the Present Invention for an Electrically-Insulating-Laminate Strip that is Cut with a Cutting Pattern that Allows Folding Cut Portions of the Electrically-Insulating-Laminate Strip Over a Side Opposite to a Side of a Conductor that is Electrically Coupled with a Solar Cell of a Plurality of Solar Cells of a Solar-Cell Module With reference now to FIG. 16, in accordance with embodiments of the present invention, a combined perspective-plan and expanded view 1600 of an in-laminate-diode sub-assembly 1302 with diode 1350 is shown at the top and right of the figure. Also, towards the bottom and left of FIG. 16, a perspective-plan view of a second in-laminate-diode sub-assembly 1304 in a more fully assembled state is shown. The in-laminate-diode assembly of a solar-cell module, for example, in-laminate-diode assembly 1050 of solar-cell module 1002 of FIG. 10, may include a plurality of in-laminate-diode sub-assemblies, for example, in-laminate-diode sub-assemblies 1050*a* and 1050*b*. Alternatively, an in-laminate-diode assembly may include at least one in-laminate-diode sub-assembly. The in-laminate-diode sub-assembly 1302, which may be identified with in-laminate-diode sub-assembly 1050*b*, includes the diode 1350. The in-laminate-diode sub-assembly 1302 also includes a first conductor 1320 electrically coupled to the diode 1350. The first conductor 1320 is configured to couple electrically with a first terminal, which may be electrically coupled to a back side, of a primary solar cell of the solar-cell sub-module. The in-laminate-diode sub-assembly 1302 also includes a second conductor 1330 electrically coupled to the diode 1350, the second conductor 1330 configured to couple electrically with a second terminal, which may be electrically coupled to a light-facing side, of a last solar cell of the solar-cell sub-module.

With further reference to FIG. 16, in accordance with embodiments of the present invention, the diode 1350 is disposed between the first conductor 1320 and the second conductor 1330. In the expanded view at the top and right of FIG. 16, the disposition of the diode 1350 between first and second conductors 1320 and 1330 is indicated by a double-headed arrow 1310. The diode 1350 is disposed between a first tab portion 1320*a* of first conductor 1320 and a second tab portion 1330*a* of second conductor 1330. In an embodiment of the present invention, the diode 1350 may be a simple chip diced from a silicon wafer having a pn junction, as may be the case for an initially homogenously doped wafer with a diffused or implanted dopant profile of opposite type from a dopant species used in growing a boule from which the wafer is sliced. At least one of the first and second conductors 1320 and 1330 may be configured as a heat sink to remove heat generated by the diode 1350, although a heat-dissipating function may be provided by separate components. Because first and second conductors 1320 and 1330 may have the dual function of both providing an electrical path for, and dissipating heat generated by, current that by-passes a solar-cell sub-module with high resistance, both first conductor 1320 and second conductor 1330 may have large current-carrying and heat-dissipating portions 1320*b* and 1330*b*, respectively. Alternatively, the in-laminate-diode assembly 1302 may be made with separate components for the heat-spreading function and the current-carrying function. Therefore, the first and second conductors 1320 and 1330 may be configured to provide an electrical path for current that by-passes a solar-cell sub-module; and, separate heat sinks configured as separate components from the first and second conductors 1320 and 1330 may be provided to dissipate heat generated by current that by-passes a solar-cell sub-module. In addition, both first conductor 1320 and second conductor 1330 may have broad low-contact-resistance portions 1320*c* (not shown for second conductor 1330) for making electrical contact and electrically coupling with respective portions of solar cells, or other components, for example, busbars, in the solar-cell sub-module, which the in-laminate-diode sub-assembly 1302 protects. In addition, the in-laminate-diode sub-assembly 1302 includes an electrically-insulating-laminate strip 1340. The electrically-insulating-laminate strip 1340 may be disposed between a plurality of first and second terminals, which may be back sides, of solar cells of the solar-cell sub-module, and the first conductor 1320 and the second conductor 1330. In an embodiment of the present invention, the plurality of first and second terminals of solar cells may be exclusive of the back side of the primary, or first, solar cell of a solar-cell sub-module.

With further reference to FIG. 16, in accordance with embodiments of the present invention, the back side of a solar cell may provide electrical coupling to both the light-facing side of one solar cell in the solar-cell sub-module and the back side of an adjacent solar cell in an adjacent solar-cell sub-module as for the interconnect assembly 420 described above for FIGS. 4A-4F. The first terminal may be electrically coupled to a positive terminal or a negative terminal of a solar cell in the solar-cell sub-module with which the diode 1350 is electrically coupled in parallel as described above for FIGS. 11A-11D. Similarly, the second terminal may be electrically coupled to a positive terminal or a negative terminal of a solar cell in the solar-cell sub-module with which the diode 1350 is electrically coupled in parallel, but the second terminal will be electrically coupled to the terminal of the solar cell having opposite polarity to that of the terminal of the solar cell to which the first terminal is electrically coupled. For example, if the first terminal is electrically coupled to a positive terminal of a solar cell, the second terminal will be electrically coupled to a negative terminal of a solar cell. However, the polarity of the diode 1350 will always be electrically coupled with opposite to the polarity of the solar cell terminals with which the first and second terminals are electrically coupled as described above for FIGS. 11A-11D. In an embodiment of the present invention, the back side of a solar cell corresponds to a positive terminal of the solar cell, and the light-facing side corresponds to a negative terminal of the solar cell, as for the CIGS solar cells described in FIGS. 1A-1B. However, it should be noted that nothing precludes the application of embodiments of the present invention to solar-cell modules where the back side of a solar cell corresponds to a negative terminal of the solar cell, and the light-facing side corresponds to a positive terminal of the solar cell, or alternatively where both the positive and negative terminals of the solar cell may be disposed on the same side of the solar cell, whether it may be a back side or a light-facing side, so that such embodiments of the present invention are within the spirit and scope of embodiments of the present invention.

With further reference to FIG. 16, in accordance with embodiments of the present invention, the in-laminate-diode sub-assembly 1302 further includes an electrically-insulating-laminate strip 1640 configured to allow access of at least one of the first and second conductors 1320 and 1330 to a solar cell of the plurality of solar cells of a solar-cell module, or solar-cell sub-module, for electrically coupling with the solar cell. The electrically-insulating-laminate strip 1640 may include a strip of electrically-insulating material configured to allow access of a conductor, for example, first conductor 1320, to an electrical device for electrically coupling with an electrical device, for example, a solar cell. In accordance with embodiments of the present invention, the electrical device may include a solar cell. The electrically-insulating-laminate strip 1640 may be configured with a cutting pattern 1646 that allows folding cut portions 1642 of the electrically-insulating-laminate strip 1640 over a side opposite to a side of the conductor, for example, first conductor 1320, that is electrically coupled with the electrical device. For example, the electrically-insulating-laminate strip 1640 may include a continuous electrically-insulating-laminate strip with an access region, identified with the cut portions 1642, through which the first conductor 1320 electrically couples with the back side of the primary solar cell. As shown in FIG. 16, the arrows associated with the low-contact-resistance portions 1320c and 1320d of first conductor 1320, which make electrical contact and electrically couple with respective portions of solar cells, or other components, of a solar-cell sub-module, indicate that the low-contact-resistance portions 1320c and 1320d of first conductor 1320 are disposed below the cut portions 1642 and are hidden from view in FIG. 16. The access region, identified with the cut portions 1642, of the electrically-insulating-laminate strip 1640 may be configured with the cutting pattern 1646 that allows folding cut portions 1642 of the electrically-insulating-laminate strip 1640 over a side opposite to a side of a conductor, for example, first or second conductors 1320 or 1330, that is electrically coupled with a solar cell of the plurality of solar cells of the solar-cell sub-module and solar-cell module. As shown in FIG. 16, this also allows the second conductor 1330 to electrically couple with the light-facing side of the last solar cell of the solar-cell sub-module, because the light-facing side of the last solar cell of the solar-cell sub-module may be electrically coupled in common with the back side of the primary solar cell of an adjacent solar-cell sub-module through an interconnect assembly, for example, interconnect assembly 420, between the back side of the primary solar cell and the light-facing side of the last solar cell of adjacent solar-cell sub-modules (not shown).

With reference now to FIG. 17A, in accordance with embodiments of the present invention, a plan view 1700A of the electrically-insulating-laminate strip 1640 is shown. FIG. 17A shows a detail of the arrangement of an example cutting pattern, cutting pattern 1646, an "H-cut," in the electrically-insulating-laminate strip 1640 configured to allow access of the conductor, for example, first or second conductors 1320 or 1330, to a solar cell of a plurality of solar cells of the solar-cell sub-module and solar-cell module. The term, "H-cut", is a term of art coined by the inventors to picturesquely describe the appearance of the example cutting pattern, cutting pattern 1646, shown in FIG. 17A. As used herein, certain terms of art coined by the inventors are used only as an aid for the description of certain embodiments of the present invention, but such terms of art are not to be construed as limiting embodiments of the present invention, as embodiments of the present invention broader than such picturesque terms of art may suggest also lie within the spirit and scope of embodiments of the present invention.

With further reference to FIG. 16 and FIG. 17A, the example cutting pattern, cutting pattern 1646, may include separate cuts: a first cut 1646a, a second cut 1646b and a third cut 1646c. As shown in FIGS. 16 and 17A, the first cut 1646a corresponds to dashed line AE, the second cut 1646b corresponds to dashed line CD, and the third cut 1646c corresponds to dashed line BF. The cut portions 1642 may include a first cut portion 1642a and a second cut portion 1642b. As shown in FIGS. 16 and 17A, the first cut portion 1642a corresponds to rectangle ABDC, and the second cut portion 1642b corresponds to rectangle CDFE. The first cut portion 1642a may be folded back along a first fold 1650 corresponding to line AB and the second cut portion 1642b may be folded back along a second fold 1654 corresponding to line EF to allow access of the conductor, for example, first or second conductors 1320 or 1330, to the solar cell. The first cut portion 1642a may also be folded back down along the first fold 1650 onto the conductor, for example, first or second conductors 1320 or 1330, and the second cut portion 1642b may be folded back down along the second fold 1654 onto the conductor, for example, first or second conductors 1320 or 1330, that is coupled with the solar cell. The electrically-insulating-laminate strip 1640 may be configured with the example cutting pattern, cutting pattern 1646, to maintain an essentially constant combined thickness of the electrically-insulating-laminate strip 1640 and the conductor, for example, first or second conductors 1320 or 1330, that is electrically coupled with the electrical device, for example, a solar cell, over a length of the conductor, for example, first or second conductors 1320 or 1330. The electrically-insulating-laminate strip 1640 improves performance of a solar-cell module, for example, solar-cell module 1002, by eliminating voids that might develop between the in-laminate-diode sub-assembly 1302 incorporating the electrically-insulating-laminate strip 1640 upon encapsulating the in-laminate-diode sub-assembly 1302 in the protective structures of the solar-cell module, for example, solar-cell module 1002. Voids associated with non-uniformities in the combined thickness of an electrically-insulating-laminate strip and a conductor can serve to nucleate delaminations in the laminated structures of a solar-cell module as a result of exposure to thermal cycling in the operating environment of a solar-cell module. Therefore, embodiments of the present invention are useful for improving the resistance of a solar-cell module to the deleterious effects of thermal cycling. Embodiments of the present invention are not limited to just the example cutting pattern, cutting pattern 1646, as shown in FIG. 16, but other cutting patterns providing the function of allowing the folding of cut portions 1642 of the electrically-insulating-laminate strip 1640 over a side opposite to a side of a conductor, for example, first conductor 1320, that is electrically coupled with a solar cell are also within the spirit and scope of embodiments of the present invention.

With reference now to FIG. 17B, in accordance with embodiments of the present invention, a plan view 1700B of an electrically-insulating-laminate strip 1740 is shown. FIG. 17A shows a detail of the arrangement of an alternative example cutting pattern 1746, a "Z-cut," in the electrically-insulating-laminate strip 1740 configured to allow access of the conductor, for example, first or second conductors 1320 or 1330, to a solar cell of a plurality of solar cells of the solar-cell sub-module and solar-cell module, for example, solar-cell module 1002. The term, "Z-cut", is a term of art coined by the inventors to picturesquely describe the appearance of the alternative example cutting pattern 1746 shown in FIG. 17B. The alternative example cutting pattern 1746 may include separate cuts: a first cut 1746a, a second cut 1746b and a third cut 1746c. As shown in FIG. 17B, the first cut 1746a corresponds to dashed line AE, the second cut 1746b corresponds to dashed line EB, and the third cut 1746c corresponds to dashed line BF. The cut portions 1742 may include a first cut portion 1742a and a second cut portion 1742b. As shown in FIG. 17B, the first cut portion 1742a corresponds to triangle ABE, and the second cut portion 1742b corresponds to triangle EBF. The first cut portion 1742a may be folded back along a first fold 1750 corresponding to line AB and the second cut portion 1742b may be folded back along a second fold 1754 corresponding to line EF to allow access of the conductor, for example, first or second conductors 1320 or 1330, to the solar cell. The first cut portion 1742a may also be folded back down along the first fold 1750 onto the conductor, for example, first or second conductors 1320 or 1330, and the second cut portion 1742b may be folded back down along the second fold 1754 onto the conductor, for example, first or second conductors 1320 or 1330, that is coupled with the solar cell. The electrically-insulating-laminate strip 1740 may be configured with the alternative example cutting pattern 1746 to maintain an essentially constant combined thickness of the electrically-insulating-laminate strip 1740 and the conductor, for example, first or second conductors 1320 or 1330, that is electrically coupled with the electrical device, for example, a solar cell, over a length of the conductor, for example, first or second conductors 1320 or 1330.

With further reference to FIG. 16, in accordance with embodiments of the present invention, the electrically-insulating-laminate strip 1640 may further include a layer of adhesive on both an electrical-device-facing side and a side opposite the electrical-device-facing side of the electrically-insulating-laminate strip 1640. Since, in accordance with embodiments of the present invention, the electrical device may include a solar cell, the electrical-device-facing side may be a solar-cell-facing side. The adhesive may include a hot-melt material that upon heating fuses the electrically-insulating-laminate strip 1640 to components with which the electrically-insulating-laminate strip 1640 makes contact. Therefore, the electrically-insulating-laminate strip 1640 including the adhesive may serve to bond component parts of the solar cell module together. For example, the adhesive of electrically-insulating-laminate strip 1640 may bond the in-laminate-diode assembly 1050 of solar-cell module 1002 of FIG. 10, including the plurality of in-laminate-diode sub-assemblies, for example, in-laminate-diode sub-assemblies 1050a and 1050b, to solar cells within the solar cell module 1002. In particular, the adhesive of electrically-insulating-laminate strip 1640 may bond conductors, for example, first and second conductors 1320 and 1330, of the in-laminate-diode sub-assembly 1302 to the solar cells within the solar cell module 1002 along with components, for example, diode 1350, of the in-laminate-diode sub-assembly 1302 attached to the conductors, for example, first and second conductors 1320 and 1330.

With further reference to FIG. 16, in accordance with embodiments of the present invention, the in-laminate-diode sub-assembly 1302 further includes at least one of the first and second conductors 1320 and 1330 structured to enable a laminated electrical connection between at least one of the first and second conductors 1320 and 1330 and another component of the solar-cell module. Another component of the solar-cell module may be a first busbar, a terminating busbar and the terminal of a solar cell of a solar-cell sub-module of the solar-cell module, for example, solar-cell module 1002. The laminated electrical connection does not require solder, welding, a conducting adhesive or any other material disposed between a first contacting surface of the first conductor 1320 and/or second conductor 1330 and a second contacting surface of the other component of the solar-cell module to which the first conductor 1320 and/or second conductor 1330 are electrically connected. The laminated electrical connection requires only that a mechanical pressure be applied to hold the first conductor 1320 and/or second conductor 1330 in intimate contact with the other component of the solar-cell module to which the first conductor 1320 and/or second conductor 1330 are electrically connected.

With further reference to FIG. 10 and FIG. 16, in accordance with embodiments of the present invention, the first conductor 1320 may further include a first electrically-conducting-laminate strip configured to couple electrically with a first terminal of an adjacent last solar cell, for example, solar cell 1017a, of a first adjacent solar-cell sub-module, for example, solar-cell sub-module 1010a, and electrically coupled with a first adjacent diode, for example, diode 1350. In an embodiment of the present invention, the first terminal of the adjacent last solar cell of the first adjacent solar-cell sub-module may be a light-facing side of the adjacent last solar cell of the first adjacent solar-cell sub-module. Thus, the first electrically-conducting-laminate strip has the function of both the first conductor 1320 of in-laminate-diode sub-assembly 1302 and the second conductor of second in-laminate-diode sub-assembly 1304. As shown in FIG. 16, the first conductor 1320 of in-laminate-diode sub-assembly 1302 has portions 1320*d*, 1320*e* and 1320*f* that serve, respectively, as a broad low-contact-resistance portion 1320*d*, a large current-carrying and heat-dissipating portion 1320*e* and a second tab portion 1320*f* as a second conductor of second in-laminate-diode sub-assembly 1304. Alternatively, the second conductor of second in-laminate-diode sub-assembly 1304 may be separated from the first conductor 1320 of in-laminate-diode sub-assembly 1302 along dashed line 1352 to provide the functions of the broad low-contact-resistance portion 1320*d*, the large current-carrying and heat-dissipating portion 1320*e* and the second tab portion 1320*f* of the second conductor of second in-laminate-diode sub-assembly 1304. Similarly, in accordance with embodiments of the present invention, the second conductor 1330 may further include a second electrically-conducting-laminate strip configured to couple electrically with a second terminal of an adjacent primary solar cell, for example, solar cell 1012*b*, of a second adjacent solar-cell sub-module, for example, solar-cell sub-module 1010*b*, and electrically coupled with a second adjacent diode, for example, diode 1655. In an embodiment of the present invention, the second terminal of the adjacent primary solar cell of the second adjacent solar-cell sub-module may be a back side of the adjacent primary solar cell of the second adjacent solar-cell sub-module. Alternatively, the first terminal and the second terminal may be configured as described in the preceding paragraphs, particularly as described for FIGS. 11A-11D.

With further reference to FIG. 10 and FIG. 16, in accordance with embodiments of the present invention, the solar-cell module 1002 includes a plurality 1010 of solar-cells, for example, solar cells 1012*a*-1017*a* and 1012*b*-1017*b*, electrically coupled together, and an in-laminate-diode assembly 1050 electrically coupled with the plurality 1010 of solar cells, for example, solar cells 1012*a*-1017*a* and 1012*b*-1017*b*. The in-laminate-diode assembly 1050 is configured to prevent power loss. The in-laminate-diode assembly 1050 further includes at least one in-laminate-diode sub-assembly 1050*a*, identified with in-laminate-diode sub-assembly 1302 of FIGS. 13 and 16. The in-laminate-diode sub-assembly 1302 may include the diode 1350, the first conductor 1320 electrically coupled to the diode 1350, the second conductor 1330 electrically coupled to the diode 1350, and the electrically-insulating-laminate strip 1640 configured to allow access of at least one of the first and second conductors 1320 and 1330 to a solar cell of the plurality 1010 of solar cells, for example, solar cells 1012*a*-1017*a* and 1012*b*-1017*b* for electrically coupling with the solar cell. The electrically-insulating-laminate strip 1640 is configured with the cutting pattern 1646 that allows folding cut portions 1642 of the electrically-insulating-laminate strip 1640 over a side opposite to a side of at least one of the first and second conductors 1320 and 1330 that is electrically coupled with the solar cell. The electrically-insulating-laminate strip 1640 of the solar-cell module 1002 is configured with the cutting pattern 1646 to maintain an essentially constant combined thickness of the electrically-insulating-laminate strip 1640 and at least one of the first and second conductors 1320 and 1330 that is electrically coupled with the solar cell over a length of the in-laminate-diode sub-assembly 1302 exclusive of a diode-attaching portion of the in-laminate-diode sub-assembly 1302. Also, described above, the electrically-insulating-laminate strip 1640 may further include a layer of adhesive on both a solar-cell-facing side and a side opposite the solar-cell-facing side of the electrically-insulating-laminate strip 1640.

Figure 18A:
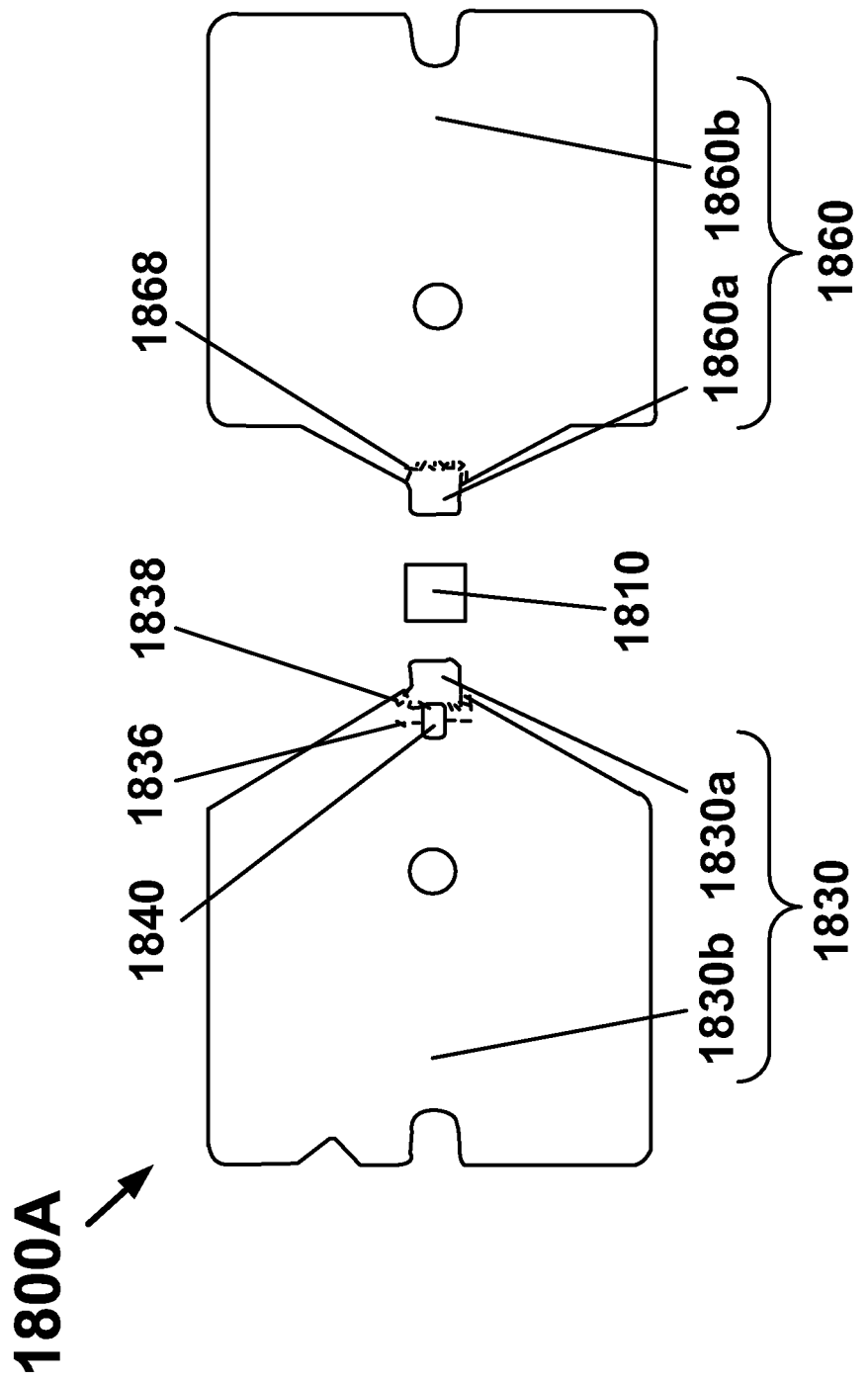
FIG. 18A is a combined plan and expanded view of a combined diode, lead assembly incorporating two expansion joints showing component parts of the assembly: a diode, a first conductor and a second conductor, viewing details of the diode-facing sides of the first and second conductors, in accordance with an embodiment of the present invention.

Section IV:
Sub-Section A: Physical Description of Embodiments of the Present Invention for a Combined Diode, Lead Assembly Incorporating an Expansion Joint With reference now to FIG. 18A, in accordance with embodiments of the present invention, a combined plan and expanded view 1800A of a combined diode, lead assembly 1802 (see FIG. 18B) incorporating two expansion joints is shown. FIG. 18A illustrates component parts of the combined diode, lead assembly 1802: a diode 1810, a first conductor 1830 and a second conductor 1860. For the view shown in FIG. 18A, the details of the diode-facing sides of the first and second conductors 1830 and 1860 are shown. The combined diode, lead assembly 1802 incorporating two expansion joints includes the diode 1810 having a first diode terminal 1814 (see FIG. 18C) and a second diode terminal 1818 (see FIG. 18C), the first conductor 1830 including a first terminal 1830*a* and a second terminal 1830*b* and the second conductor 1860 including a first terminal 1860*a* and a second terminal 1860*b*. The first terminal 1830*a* of the first conductor 1830 is electrically coupled to the diode 1810 at the first diode terminal 1814. The second terminal 1830*b* of the first conductor 1830 is configured as a first expansion joint; the first expansion joint is configured to electrically couple to a first interconnecting-conductor 1850 and is configured to reduce a stress applied to the diode 1810 by the first conductor 1830. The first terminal 1860*a* of the second conductor 1860 is electrically coupled to the diode 1810 at the second diode terminal 1818. The second terminal 1860*b* of the second conductor 1860 is configured as a second expansion joint; the second expansion joint is configured to electrically couple to a second interconnecting-conductor 1870 and is configured to reduce a stress applied to the diode 1810 by the second conductor 1860. The first and second expansion joints are configured to protect the diode 1810 from application of a stress to the diode 1810 by the first conductor 1830 and by the second conductor 1860 sufficient to impair the electrical performance of the diode 1810, for example, as from application of a stress to the diode 1810 by the first conductor 1830 and by the second conductor 1860 sufficient to fracture the diode 1810.

Stresses that may impair the electrical performance of the diode 1810 may have many sources. For example, a bending moment and a compressive stress on a diode may be induced by forces attending lamination of an in-laminate-diode assembly that may be sufficient to fracture a diode, because die-attachment strips attached to a diode may not lie in the same plane. Also, shear forces applied to a diode may be induced by a mismatch in the coefficient of thermal expansion between a silicon diode and long die-attachment strips made primarily of copper that may be sufficient to fracture a diode. Even if a diode is not fractured by the stresses, the stresses may be sufficient to cause delamination at the diode attachment resulting in hot spots that can lead to diode failure. In addition, dislocations can be generated in the silicon die of a diode by stress, and dislocations are well known to adversely affect semiconductor junctions leading to anomalous diode performance and even failure. Embodiments of the present invention, which are subsequently described, mitigate such deleterious stresses impairing diode electrical performance, lifetime and reliability.

With further reference to FIG. 18A, in accordance with embodiments of the present invention, the first expansion joint of the first conductor 1830 includes a first planar strip portion. The first planar strip portion has a first planar surface 1832 (see FIGS. 18C and 18D) and a second planar surface 1834 (see FIGS. 18C and 18D) substantially parallel to the first planar surface 1832. As used herein with respect to planar surfaces of a planar strip portion "substantially parallel" means that a first planar surface follows the contours of a second planar surface at about a fixed distance of separation within the mechanical tolerances that can be achieved by a manufacturing process, such as a rolling process used to produce a planar strip. The first terminal 1830*a* of the first conductor 1830 includes a pocket portion configured to electrically couple to the diode 1810 at the first diode terminal 1814. The pocket portion is offset from at least one of the first and second planar surfaces 1832 and 1834 to produce first and second surfaces 1833 and 1835 of the first terminal 1830*a*. The first and second surfaces 1833 and 1835 of the first terminal 1830*a* are continuations of the first and second planar surfaces 1832 and 1834 of the second terminal 1830*b* being displaced by the formation of the pocket portion of the first conductor 1830. The pocket portion may be provided by a fabrication process that produces a tab portion at a location of the first terminal 1830*a* on the first conductor 1830 and stamps the tab portion of the first conductor 1830 to produce a pocket portion so that the pocket portion is offset from at least one of the first planar surface 1832 and the second planar surface 1834 of the first conductor 1830. A bent edge 1836 of the pocket portion formed by stamping the tab portion may have a C-shaped contour when viewed as shown in FIG. 18A.

With further reference to FIG. 18A, in accordance with embodiments of the present invention, the first expansion joint of the second conductor 1860 similarly includes a second planar strip portion. The second planar strip portion has a first planar surface 1862 (see FIGS. 18C and 18E) and a second planar surface 1864 (see FIGS. 18C and 18E) substantially parallel to the first planar surface 1862. The first terminal 1860*a* of the second conductor 1860 includes a tab portion configured to electrically couple to the diode 1810 at the second diode terminal 1818. The first terminal 1860*a* at the tab portion has first and second surfaces 1863 and 1865. The first and second surfaces 1863 and 1865 of the first terminal 1860*a* of the second conductor 1860 are respective extensions of the first and second planar surfaces 1862 and 1864 into the tab portion of the second conductor 1860. At a location of the first terminal 1860*a* on the second conductor 1860, the tab portion may be produced by a fabrication process, such as punching a planar strip portion to form a tab portion at one end of the second planar strip portion.

With further reference to FIG. 18A, in accordance with embodiments of the present invention, the first conductor 1830 and the second conductor 1860 are shown in a view with the diode-facing surfaces presented to illustrate the location of features on these surfaces with respect to placement of the diode 1810. The first conductor 1830 is shown with first surface 1833 of the first terminal 1830*a* and the first planar surfaces 1832 of the second terminal 1830*b* presented in the view of FIG. 18A. The second conductor 1860 is shown with second surface 1865 of the first terminal 1860*a* and the second planar surface 1864 of the second terminal 1860*b* presented in the view of FIG. 18A. The first terminal 1830*a* of the first conductor 1830 includes an alignment hole 1840 configured to accept an alignment pin 1844 (see FIG. 18C) for aligning the diode 1810 within the pocket portion of the first terminal 1830*a* of the first conductor 1830 in forming a joint between the diode 1810 and the first terminal 1830*a* of the first conductor 1830. Embodiments of the present invention include without limitation thereto a joint between the diode 1810 and the first terminal 1830*a* of the first conductor 1830 that may include a solder joint, and a joint between the diode 1810 and the first terminal 1860*a* of the second conductor 1860 that may include a solder joint. The first terminal 1830*a* of the first conductor 1830 includes a first recessed portion 1838 configured to control an outflow of solder from within a first solder joint 1880 (see FIG. 18C) formed between the first diode terminal 1814 of the diode 1810 and the first terminal 1830*a* of the first conductor 1830. The first terminal 1860*a* of the second conductor 1860 includes a second recessed portion 1868 configured to control an outflow of solder from within the first solder joint 1880 (see FIG. 18C) formed between the second diode terminal 1818 of the diode 1810 and the first terminal 1860*a* of the second conductor 1860.

Figure 18B:
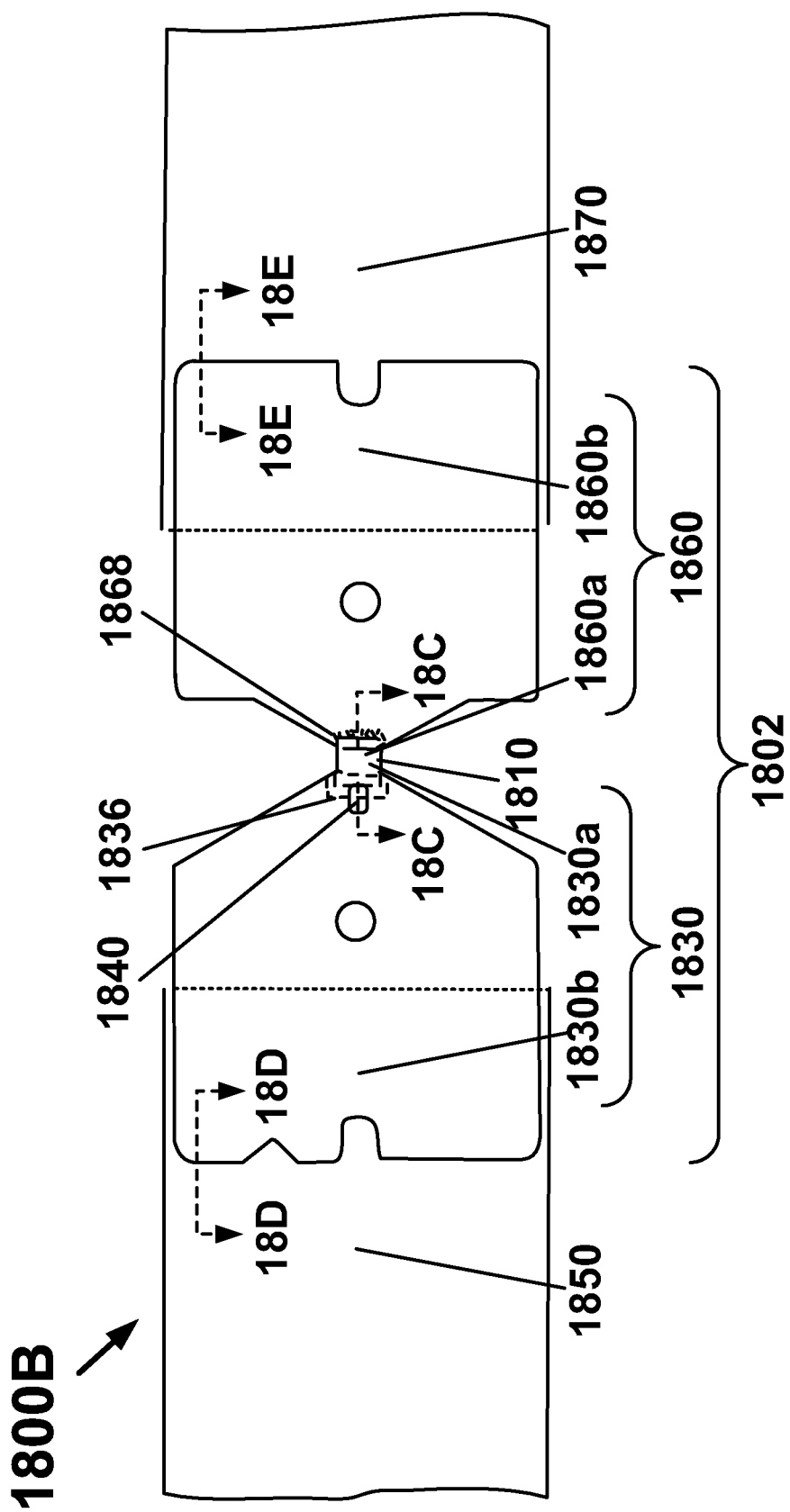
FIG. 18B is a plan view of an example combined diode, lead assembly incorporating two expansion joints, a "bow-tie" assembly, showing an example arrangement of the two expansion joints for electrically coupling to two respective interconnecting-conductors, in accordance with an embodiment of the present invention.

With reference now to FIG. 18B, in accordance with embodiments of the present invention, a plan view 1800B of an example combined diode, lead assembly, for example, combined diode, lead assembly 1802, incorporating two expansion joints, a "bow-tie" assembly, is shown. The term, "bow-tie" assembly, is a term of art coined by the inventors to picturesquely describe the appearance of the combined diode, lead assembly 1802 incorporating two expansion joints. FIG. 18B illustrates an example arrangement of the two expansion joints for electrically coupling to two respective interconnecting-conductors 1850 and 1870. FIG. 18B shows the component parts of the "bow-tie" assembly, combined diode, lead assembly 1802, incorporating two expansion joints: the diode 1810, the first conductor 1830 and the second conductor 1860, in the as-assembled state with the diode 1810 disposed between the first conductor 1830 and the second conductor 1860. The first conductor 1830 is shown as viewed from the second surface 1835 of the first terminal 1830*a* that is the opposite side to the diode-facing side of the first terminal 1830*a*. Thus, the first recessed portion 1838 is not shown, as the first recessed portion 1838 is disposed facing the diode 1810. However, the alignment hole 1840 configured to accept the alignment pin 1844 (see FIG. 18C) for aligning the diode 1810 within the pocket portion of the first terminal 1830*a* of the first conductor 1830 remains visible as the alignment hole 1840 extends all the way through the first conductor 1830. The second conductor 1860 is also shown as viewed from the second surface 1865 of the first terminal 1860*a* that is the diode-facing side of the first terminal 1860*a*. Consequently, the second recessed portion 1868 is visible in the view shown in FIG. 18B because the second recessed portion 1868 is disposed on the second surface 1865 of the first terminal 1860*a* of the second conductor 1860 that is the diode-facing side of the first terminal 1860*a* of the second conductor 1860.

With further reference to FIG. 18B, in accordance with embodiments of the present invention, the second terminal 1830*b* of the first conductor 1830, configured as the first expansion joint, is configured to provide a sliding contact in communication with the first interconnecting-conductor 1850. The first expansion joint of the first conductor 1830 includes a first planar strip portion. The first planar strip portion has the first planar surface 1832 and the second planar surface 1834 substantially parallel to the first planar surface 1832 of the first planar strip portion. At least one of the first and second planar surfaces 1832 and 1834 of the first planar strip portion may be configured to provide a sliding contact in communication with the first interconnecting-conductor 1850. The second terminal 1860*b* of the second conductor 1860, configured as the second expansion joint, is configured to provide a sliding contact in communication with the second interconnecting-conductor 1870. The second expansion joint of the second conductor 1860 includes a second planar strip portion. The second planar strip portion has the first planar surface 1862 and the second planar surface 1864 substantially parallel to the first planar surface 1862 of the second planar strip portion. At least one of the first and second planar surfaces 1862 and 1864 of the second planar strip portion may be configured to provide a sliding contact in communication with the second interconnecting-conductor 1870. As shown in FIG. 18B, the first planar surface 1832 of the first planar strip portion of the second terminal 1830b is disposed on, and faces, the first interconnecting-conductor 1850; and, the first planar surface 1862 of the second planar strip portion of the second terminal 1860b of the second conductor 1860 is disposed on, and faces, the second interconnecting-conductor 1870. However, although as shown in FIG. 18B, the second terminal 1830b is disposed on top of the first interconnecting-conductor 1850 and the second terminal 1860b of the second conductor 1860 is disposed on top of the second interconnecting-conductor 1870, embodiments of the present invention do not preclude the second terminal 1830b being disposed below the first interconnecting-conductor 1850 or the second terminal 1860b of the second conductor 1860 being disposed below the second interconnecting-conductor 1870, both being within the spirit and scope of embodiments of the present invention. For the particular arrangement of the second terminal 1830b on the first interconnecting-conductor 1850 and the second terminal 1860b of the second conductor 1860 on the second interconnecting-conductor 1870 shown in FIG. 18B, line 18C-18C of FIG. 18B shows a location of a first cutting plane for a cross-sectional, elevation view shown in FIG. 18C; line 18D-18D of FIG. 18B shows a location of a second cutting plane for a cross-sectional, elevation view shown in FIG. 18D; and, line 18E-18E of FIG. 18B shows a location of a third cutting plane for a cross-sectional, elevation view shown in FIG. 18E, which are next described.

Figure 18C:
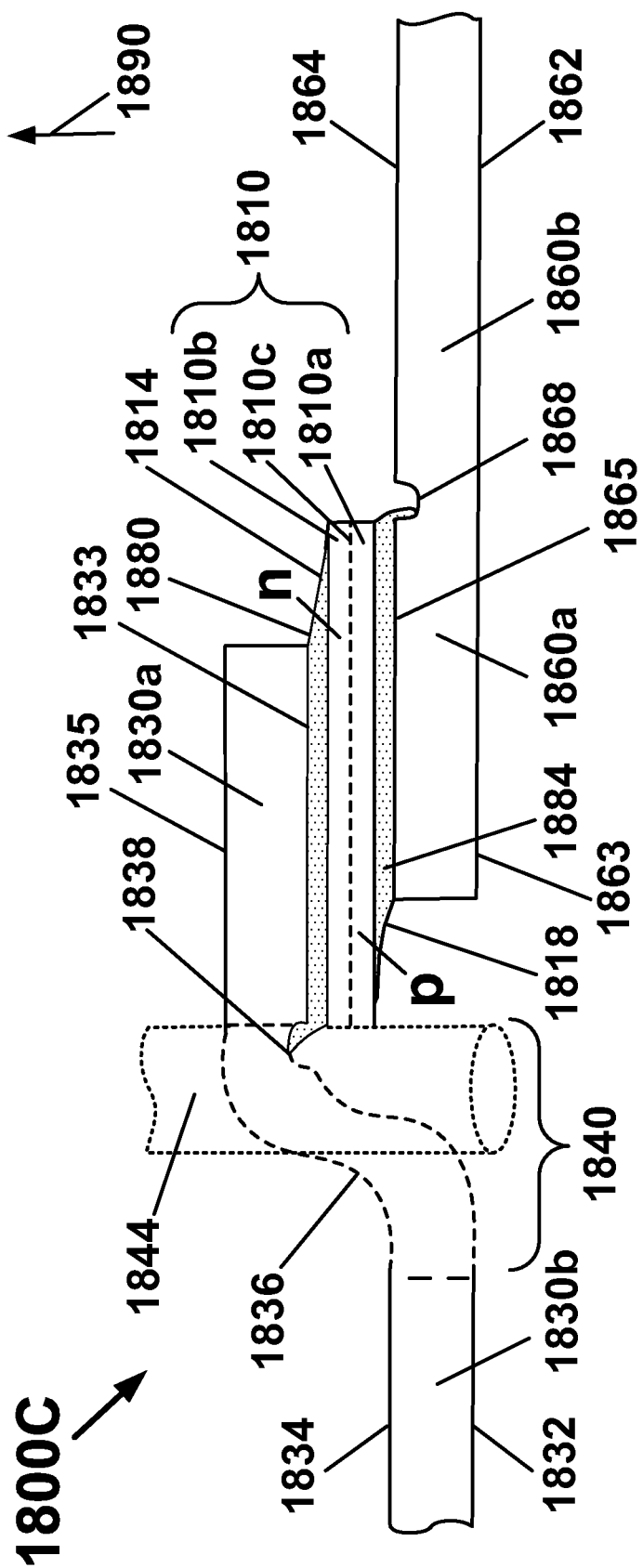
FIG. 18C is a cross-sectional, elevation view of an example diode attachment within the combined diode, lead assembly incorporating two expansion joints of FIG. 18B, in accordance with an embodiment of the present invention.

With reference now to FIG. 18C, in accordance with embodiments of the present invention, a cross-sectional, elevation view 1800C of an example diode attachment within the combined diode, lead assembly 1802 incorporating two expansion joints is shown. The diode 1810 includes a p-type portion 1810a, an n-type portion 1810b and a pn junction 1810c formed between the p-type portion 1810a and the n-type portion 1810b. The diode 1810 may be fabricated from a monolithic die of a single semiconductor material, for example, silicon, in which case the pn junction 1810c is a pn homojunction. However, diodes fabricated from two different semiconductor materials used for respective p-type portion 1810a and n-type portion 1810b with an associated a pn heterojunction are also within the spirit and scope of embodiments of the present invention. The first terminal 1830a of the first conductor 1830 includes a pocket portion electrically coupled to the diode 1810 at the first diode terminal 1814. The diode attachment may include the first solder joint 1880 between the first surface 1833 of the first terminal 1830a configured as a diode-facing side of the pocket portion and the first diode terminal 1814 which may be located at an electrical-contact surface to a cathode of the diode 1810, as shown in FIG. 18C. Therefore, the inventors devised the term, "cathode strip", as a term of art coined to picturesquely describe the function of first conductor 1830 that includes the pocket portion electrically coupled to the cathode, n-type portion 1810b, of the diode 1810. However, embodiments of the present invention are not to be construed as being limited to a pocket portion in the "cathode strip."

With further reference to FIG. 18C, in accordance with embodiments of the present invention, the first terminal 1860a of the second conductor 1860 includes a tab portion electrically coupled to the diode 1810 at the second diode terminal 1818. The diode attachment may include a second solder joint 1884 between the second surface 1864 of the first terminal 1860a of the second conductor 1860 configured as a diode-facing side of the tab portion and the second diode terminal 1818 located at an electrical-contact surface to a anode of the diode 1810. Therefore, the inventors devised the term, "anode strip", as a term of art coined to picturesquely describe the function of second conductor 1860 that includes the tab portion electrically coupled to the anode, p-type portion 1810a, of the diode 1810. However, embodiments of the present invention are not to be construed as being limited to a tab portion in the "anode strip."

With further reference to FIG. 18C, in accordance with embodiments of the present invention, the polarity of the diode attachment is designed such that an in-laminate-diode sub-assembly includes at least one diode, for example, diode 1810, configured to by-pass current flow around at least one solar cell to prevent power loss, configured as described above in the discussion of FIGS. 11A-11D. Therefore, the opposite configuration of the diode attachment (not shown in FIG. 18C), in which the first solder joint 1880 is formed between the first surface 1833 of the first terminal 1830a and a diode terminal located at an electrical-contact surface to an anode of the diode 1810, that provides the function of by-passing current flow around at least one solar cell to prevent power loss is also within the spirit and scope of embodiments of the present invention. Similarly, the opposite configuration of the diode attachment (not shown in FIG. 18C), in which the second solder joint 1884 is formed between the second surface 1865 of the first terminal 1860a of the second conductor 1860 and a diode terminal located at an electrical-contact surface to a cathode of the diode 1810, that provides the function of by-passing current flow around at least one solar cell to prevent power loss is also within the spirit and scope of embodiments of the present invention.

With further reference to FIG. 18C, in accordance with embodiments of the present invention, the pocket portion is offset from at least one of the first and second planar surfaces 1832 and 1834, as indicated by the bent edge 1836 of the pocket portion shown in cross-section along the cutting plane corresponding to the line 18C-18C of FIG. 18B. The first and second surfaces 1833 and 1835 of the first terminal 1830a at the pocket portion are shown as continuations of the first and second planar surfaces 1832 and 1834 of the second terminal 1830b into the pocket portion of the first conductor 1830. The pocket portion is configured to reduce a bending load applied to the diode 1810 by the first conductor 1830. The first terminal 1860a of the second conductor 1860 at the tab portion has first and second surfaces 1863 and 1865. The first and second surfaces 1863 and 1865 of the first terminal 1860a of the second conductor 1860 are shown as respective extensions of the first and second planar surfaces 1862 and 1864 of the second terminal 1860b of the second conductor 1860 into the tab portion of the second conductor 1860. The tab portion is configured to reduce a bending load applied to the diode 1810 by the second conductor 1860. The pocket portion of the first conductor 1830 and the tab portion of the second conductor 1860 are designed to bring a majority of the first conductor 1830 into the same plane as the second conductor 1860; this design causes lamination forces to be planar to the body of the diode 1810, also herein referred to, without limitation thereto, by the term of art "die," without any bending loads imposed on the die, or bending moments that force deflection at the die.

With further reference to FIG. 18C, in accordance with embodiments of the present invention, the first terminal 1830a of the first conductor 1830 includes the first recessed portion 1838 configured to control an outflow of solder from within the first solder joint 1880 formed between the first diode terminal 1814 of the diode 1810 and the first terminal 1830a of the first conductor 1830. Also, as shown in FIG. 18C, the first terminal 1860a of the second conductor 1860 includes the second recessed portion 1868 configured to control an outflow of solder from within the second solder joint 1884 formed between the second diode terminal 1818 of the diode 1810 and the first terminal 1860a of the second conductor 1860. The term, "moat", is a term of art coined by the inventors to picturesquely describe the appearance and function of both the first recessed portion 1838 and the second recessed portion 1868. The function of the "moat" is to provide an alternative path for the flow and capture of solder during the die-attachment operation used to fabricate the example diode attachment shown in FIG. 18C. The "moats," first recessed portion 1838 and second recessed portion 1868, prevent the flow of solder up the sides of the diode 1810 through the utilization of capillary forces exerted by the sidewalls of the moats on the molten solder during soldering of the body of the diode 1810, the die, to the first terminal 1830a of the first conductor 1830 and the first terminal 1860a of the second conductor 1860. Thus, the "moats," first recessed portion 1838 and second recessed portion 1868, prevent solder shorting out an exposed pn junction on the side-walls of the diode 1810. The "moats," first recessed portion 1838 and second recessed portion 1868, may be fabricated by laser scribing the first surface 1833 of the first terminal 1830a at the pocket portion of the first conductor 1830 and the second surface 1865 of the first terminal 1860a of the second conductor 1860 at the tab portion of the second conductor 1860. The laser scribing pattern of the "moats," first recessed portion 1838 and second recessed portion 1868, is such that the laser-scribing pattern outlines the periphery of the die placement just outside the location of the die placement on the respective pocket portion of the first conductor 1830 and tab portion of the second conductor 1860 that attach to the body of the diode 1810, the die. However, laser scribing need not be employed to fabricate the "moats" as other equivalent methods of providing the first recessed portion 1838 and the second recessed portion 1868 lie within the spirit and scope of embodiments of the present invention.

With further reference to FIG. 18C, in accordance with embodiments of the present invention, the example diode attachment of the combined diode, lead assembly 1802 incorporating two expansion joints is fabricated by soldering the first terminal 1830a of the first conductor 1830 to the first diode terminal 1814 and soldering the first terminal 1860a of the second conductor 1860 to the second diode terminal 1818. Soldering the first terminal 1830a of the first conductor 1830 to the first diode terminal 1814 includes assembly operations that are next described. Although FIG. 18C is presented with an orientation consistent with FIGS. 18A and 18B, for purposes of the following discussion, it may be useful to imagine the orientation of the figure inverted from that shown, or upside-down; the arrow 1890 shows a direction of the force of gravity for purposes of describing one manner of fabricating the combined diode, lead assembly 1802 and is not to be construed as limiting embodiments of the present invention to the direction of the force of gravity so oriented, in particular, for operation of the combined diode, lead assembly 1802. A basket of a soldering jig (not shown) engages the first terminal 1830a of the first conductor 1830 (from above). A first solder slug (not shown) is placed on the first terminal 1830a of the first conductor 1830. The first solder slug may be selected from the group consisting of a solder perform, which may be circular, and a solder paste. The diode 1810 is placed on the first solder slug with the first diode terminal 1814 facing the first solder slug. The diode 1810 is aligned in the basket with the alignment pin 1844 (inserted from above), which is shown with dotted lines to indicate that the alignment pin 1844 is only required during soldering of the combined diode, lead assembly 1802 and is not present during normal use of the combined diode, lead assembly 1802. As shown in FIG. 18C, the first terminal 1830a of the first conductor 1830 includes the alignment hole 1840, shown by the dashed lines passing through the bent edge 1836 of the pocket portion, configured to accept the alignment pin 1844 for aligning the diode 1810 within the pocket portion of the first terminal 1830a of the first conductor 1830 in forming a joint between the diode 1810 and the first terminal 1830a of the first conductor 1830. Heat sufficient to melt the first solder slug between the first terminal 1830a of the first conductor 1830 and the first diode terminal 1814 is applied. The heat may be applied by a variety of means, for example, by use of an incident laser beam, by passing a current through first and second conductors 1830 and 1860 in contact with the diode 1810, or by use of a soldering iron. To improve wetting of the first terminal 1830a of the first conductor 1830 by the molten solder, the first conductor 1830 may include copper strip, Cu, plated with tin, Sn, or nickel, Ni. The first solder slug, the first terminal 1830a of the first conductor 1830 and the first diode terminal 1814 are cooled to form the first solder joint 1880 between the first terminal 1830a of the first conductor 1830 and the first diode terminal 1814 of the diode 1810.

With further reference to FIG. 18C, in accordance with embodiments of the present invention, soldering the first terminal 1860a of the second conductor 1860 to the second diode terminal 1818 includes the following. The diode 1810 is aligned in the basket (not shown) with the alignment pin 1844. In general, this alignment operation is the same as the alignment operation described above for forming the first solder joint 1880, because heating the solder for both the first solder joint 1880 and the second solder joint 1884 is most efficiently accomplished in a single operation. A second solder slug (not shown) is placed on the second diode terminal 1818. The second solder slug may be selected from the group consisting of a solder perform, which may be circular, and a solder paste. The first terminal 1860a of the second conductor 1860 is engaged with the basket. The first terminal 1860a of the second conductor 1860 is placed on the second solder slug. Heat sufficient to melt the second solder slug between the first terminal 1860a of the second conductor 1860 and the second diode terminal 1818 is applied. To improve wetting of the first terminal 1860a of the second conductor 1860 by the molten solder, the second conductor 1860 may similarly include copper strip, Cu, plated with tin, Sn, or nickel, Ni. The second solder slug, the first terminal 1860a of the second conductor 1860 and the second diode terminal 1818 are cooled to form the second solder joint 1884 between the first terminal 1860a of the second conductor 1860 and the second diode terminal 1818 of the diode 1810. Similarly, cooling the solder for both the first solder joint 1880 and the second solder joint 1884 is most efficiently accomplished in a single operation. Embodiments of the present invention are not limited to soldering the first terminal 1830a of the first conductor 1830 to the first diode terminal 1814 or to soldering the first terminal 1860a of the second conductor 1860 to the second diode terminal 1818 as discussed above, rather other ways of fabricating the combined diode, lead assembly 1802 incorporating two expansion joints also lie within the spirit and scope of embodiments of the present invention.

Figure 18D:
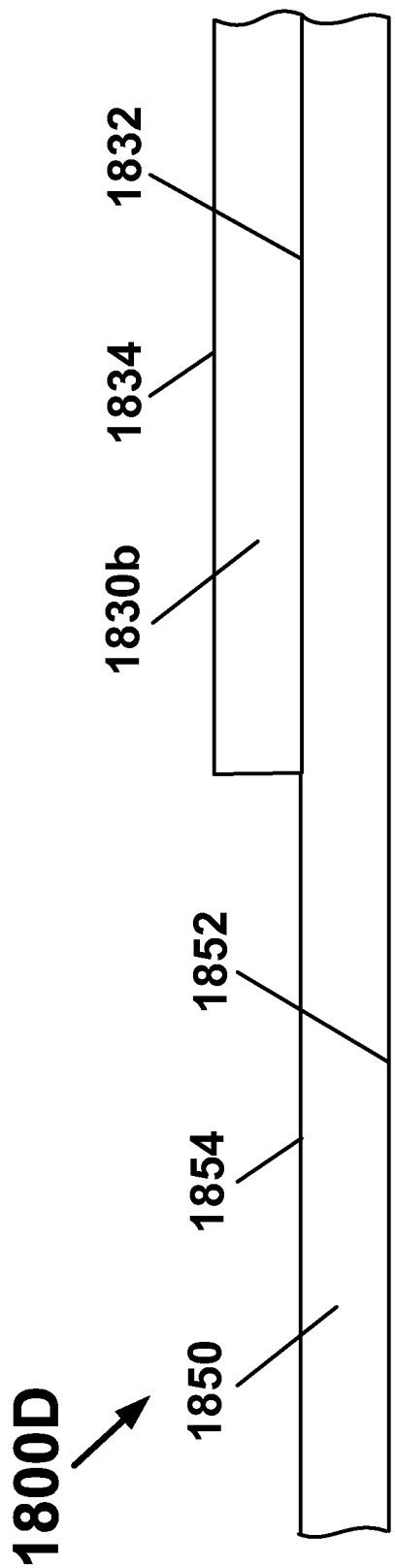
FIG. 18D is a cross-sectional, elevation view of an example sliding contact between a first expansion joint of the combined diode, lead assembly incorporating two expansion joints of FIG. 18B and a first interconnecting-conductor, in accordance with an embodiment of the present invention.

With reference now to FIG. 18D, in accordance with embodiments of the present invention, a cross-sectional, elevation view 1800D of an example sliding contact between a first expansion joint of the combined diode, lead assembly 1802 incorporating two expansion joints and the first interconnecting-conductor 1850 is shown in cross-section along the cutting plane corresponding to the line 18D-18D of FIG. 18B. The second terminal 1830b of the first conductor 1830 is configured as a first expansion joint. The first expansion joint is configured to electrically couple to the first interconnecting-conductor 1850 and is configured to reduce a stress applied to the diode 1810 by the first conductor 1830. The first expansion joint of the first conductor 1830 further includes a first planar strip portion. The first planar strip portion has the first planar surface 1832 and the second planar surface 1834 substantially parallel to the first planar surface 1832. At least one of the first and second planar surfaces 1832 and 1834 of the first planar strip portion is configured to provide a sliding contact in communication with the first interconnecting-conductor 1850. The first interconnecting-conductor 1850 may include a first planar strip that has a first planar surface 1852 and a second planar surface 1854 substantially parallel to the first planar surface 1852. The first expansion joint is configured to provide a sliding contact in communication with the first interconnecting-conductor 1850. As shown in FIG. 18D, the first planar surface 1832 of the first expansion joint of the second terminal 1830b of the first conductor 1830 may slide over the second planar surface 1854 of a first planar strip of the first interconnecting-conductor 1850. In an embodiment of the present invention, the first expansion joint may be configured as a portion of a first lap joint, as shown in FIG. 18D.

Figure 18E:
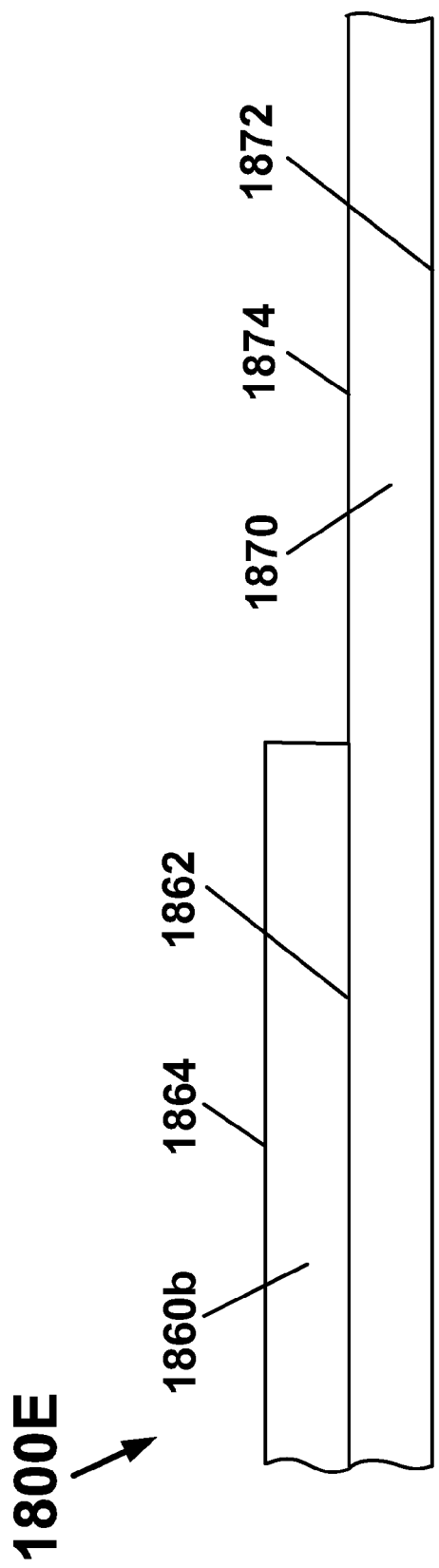
FIG. 18E is a cross-sectional, elevation view of an example sliding contact between a second expansion joint of the combined diode, lead assembly incorporating two expansion joints of FIG. 18B and a second interconnecting-conductor, in accordance with an embodiment of the present invention.

With reference now to FIG. 18E, in accordance with embodiments of the present invention, a cross-sectional, elevation view 1800E of an example sliding contact between a second expansion joint of the combined diode, lead assembly 1802 incorporating two expansion joints and the second interconnecting-conductor 1870 is shown in cross-section along the cutting plane corresponding to the line 18E-18E of FIG. 18B. The second terminal 1860b of the second conductor 1860 is configured as a second expansion joint. The second expansion joint is configured to electrically couple to the second interconnecting-conductor 1870 and is configured to reduce a stress applied to the diode 1810 by the second conductor 1860. The second expansion joint of the second conductor 1860 further includes a second planar strip portion. The second planar strip portion has the first planar surface 1862 and the second planar surface 1864 substantially parallel to the first planar surface 1862. At least one of the first and second planar surfaces 1862 and 1864 of the second planar strip portion is configured to provide a sliding contact in communication with the second interconnecting-conductor 1870. The second interconnecting-conductor 1870 may include a second planar strip that has a first planar surface 1872 and a second planar surface 1874 substantially parallel to the first planar surface 1872. The second expansion joint is configured to provide a sliding contact in communication with the second interconnecting-conductor 1870. As shown in FIG. 18D, the first planar surface 1862 of the second expansion joint of the second terminal 1860b of the second conductor 1860 may slide over the second planar surface 1874 of a second planar strip of the second interconnecting-conductor 1870. In an embodiment of the present invention, the second expansion joint may be configured as a portion of a second lap joint, as shown in FIG. 18E.

With further reference to FIGS. 18D and 18E, in accordance with embodiments of the present invention, the first expansion joint may be configured to protect the diode 1810 from application of a stress to the diode 1810 by the first conductor 1830 sufficient to impair the electrical performance of the diode 1810, for example, as from application of a stress to the diode 1810 by the first conductor 1830 sufficient to fracture the diode 1810. Similarly, the second expansion joint is configured to protect the diode 1810 from application of a stress to the diode 1810 by the second conductor 1860 sufficient to impair the electrical performance of the diode 1810, for example, as from application of a stress to the diode 1810 by the second conductor 1860 sufficient to fracture the diode 1810. The combined diode, lead assembly 1802 incorporating two expansion joints mitigates forces generated by thermal expansion of the copper conductors in an in-laminate-diode assembly including one long chain of diodes, as shown in FIGS. 10, 12A, 12B and 13, because a plurality of shorter combined diode, lead assemblies allows for accommodation of thermally generated strains by the sliding contact across the interface between the expansion joints of the combined diode, lead assemblies and the interconnecting-conductors (see FIG. 20). In contrast with the an in-laminate-diode assembly including one long chain of diodes, as shown in FIGS. 10, 12A, 12B and 13, the combined diode, lead assemblies incorporating two expansion joints are connected by copper interconnecting-conductors longer than the combined diode, lead assemblies laminated upon them that allow for electrical and thermal contact, but decouple forces due to thermal expansion of the copper interconnecting-conductors from the combined diode, lead assemblies (see FIG. 20). Consequently, shear forces otherwise present across a diode in an in-laminate-diode assembly including one long chain of diodes, as shown in FIGS. 10, 12A, 12B and 13, are reduced improving the performance and reliability of the diodes in the combined diode, lead assemblies. In particular, resistance to fracture of the diodes in the combined diode, lead assemblies is improved.

Figure 19A:
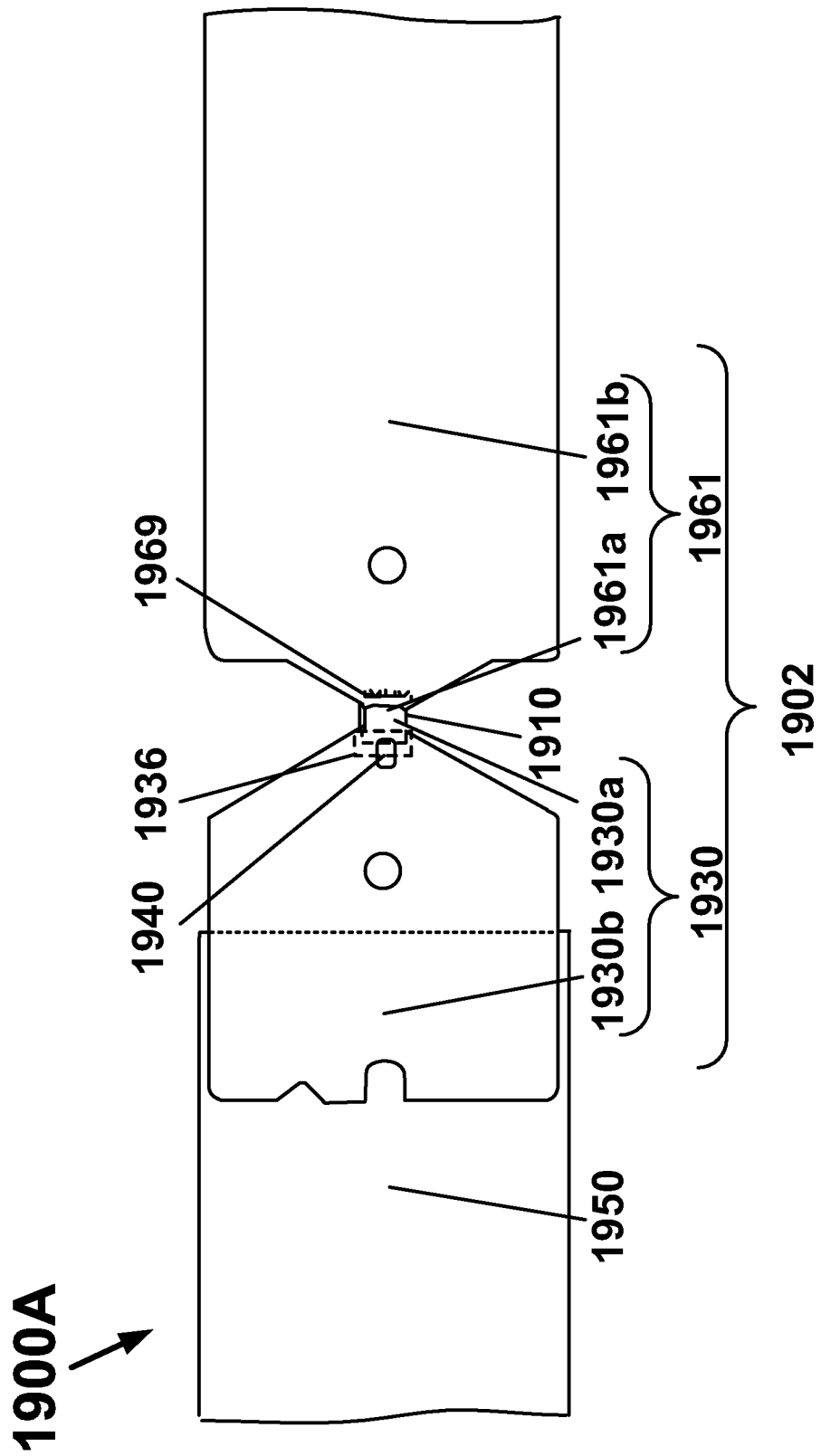
FIG. 19A is a plan view of a combined electrical device, lead assembly incorporating an expansion joint showing one example arrangement utilizing an expansion joint of a conductor for electrically coupling to an interconnecting-conductor, in accordance with an embodiment of the present invention.

With reference now to FIG. 19A, in accordance with embodiments of the present invention, a plan view 1900A of a combined electrical device, lead assembly 1902 incorporating an expansion joint is shown. FIG. 19A illustrates one example arrangement utilizing an expansion joint of a conductor 1930 for electrically coupling to an interconnecting-conductor 1950. A combined diode, lead assembly incorporating an expansion joint is one example of the combined electrical device, lead assembly 1902 incorporating an expansion joint, in which case the electrical device 1910 is a diode. Embodiments of the present invention shown in FIG. 19A are for a two terminal device such as a diode. However, in general, for embodiments of the present invention, an electrical device may be a multi-terminal electrical device, for example, an electrical device with more than two terminals, and in particular an electrical device selected from the group consisting of a semiconductor device, a diode, a transistor, a battery, an inverter and a DC-to-DC converter. The combined electrical device, lead assembly 1902 includes an electrical device 1910, for example, a diode, and a plurality of conductors 1930 and 1961 electrically coupled to the electrical device 1910. At least one conductor 1930, similar to first conductor 1830 of FIG. 18B, of the plurality of conductors 1930 and 1961 includes a first terminal 1930a, similar to the first terminal 1830a of the first conductor 1830 of FIG. 18B. The first terminal 1930a of the conductor 1930 is electrically coupled to the electrical device 1910. The conductor 1930 also includes a second terminal 1930b. The second terminal 1930b of the conductor 1930 is configured as an expansion joint. The expansion joint is configured to electrically couple to the interconnecting-conductor 1950 and configured to reduce a stress applied to the electrical device 1910, for example, a diode, by the conductor 1930.

With further reference to FIG. 19A, in accordance with embodiments of the present invention, the expansion joint is configured to protect the electrical device 1910, for example, a diode, from application of a stress to the electrical device 1910 by the conductor 1930 sufficient to impair the electrical performance of the electrical device 1910, in particular, for example, as from application of a stress to the electrical device 1910 by the conductor 1930 sufficient to fracture the electrical device 1910, for example, a diode. The expansion joint may be configured to provide a sliding contact in communication with the interconnecting-conductor 1950 and may be configured as a portion of a lap joint, similar to the lap joint of FIG. 18D previously described.

With further reference to FIG. 19A, in accordance with embodiments of the present invention, the expansion joint of the conductor 1930, similar to first conductor 1830 of FIG. 18B, includes a planar strip portion. The planar strip portion has a first planar surface, similar to first planar surface 1832 of FIGS. 18C and 18D, and a second planar surface, similar to second planar surface 1834 of FIGS. 18C and 18D, substantially parallel to the first planar surface. At least one of the first and second planar surfaces is configured to provide a sliding contact in communication with the interconnecting-conductor 1950. The first terminal 1930a of the conductor 1930 further includes a pocket portion electrically coupled to the electrical device 1910, for example, a diode. The pocket portion is offset from at least one of the first and second planar surfaces. The pocket portion, similar to the pocket portion of FIG. 18C previously described, is configured to reduce a bending load applied to the electrical device 1910, for example, a diode, by the conductor 1930. A bent edge 1936 of the pocket portion formed by stamping the tab portion may have a C-shaped contour when viewed as shown in FIG. 19A. The first terminal 1930a of the conductor 1930 further includes an alignment hole 1940 configured to accept an alignment pin for aligning the electrical device 1910, for example, a diode, within the pocket portion of the first terminal 1930a of the conductor 1930 in forming a joint between the electrical device 1910 and the first terminal 1930a of the conductor 1930. The combined electrical device, lead assembly 1902 incorporating an expansion joint also includes a solder joint, similar to the first solder joint 1880 of FIG. 18C, between a terminal of the electrical device 1910, similar to the first diode terminal 1814 of the diode 1810 of FIG. 18C, and the first terminal 1930a of the conductor 1930. The first terminal 1930a of the conductor 1930 includes a recessed portion (not shown), similar to the first recessed portion 1838 of FIG. 18A, configured to control an outflow of solder from within a solder joint, similar to the first solder joint 1880 of FIG. 18C, formed between a terminal of the electrical device 1910, similar to the first diode terminal 1814 of the diode 1810 FIG. 18C, and the first terminal 1930a of the conductor 1930.

With further reference to FIG. 19A, in accordance with embodiments of the present invention, a conductor 1961 without an expansion joint is shown. The conductor 1961 without an expansion joint includes a first terminal 1961a and a second terminal 1961b. The first terminal 1961a of the conductor 1961 is electrically coupled to the electrical device 1910, for example, a diode. The first terminal 1961a of the conductor 1961 further includes a tab portion electrically coupled to the electrical device 1910, for example, a diode. The tab portion is configured to reduce a bending load applied to the electrical device 1910, for example, a diode, by the conductor 1961. The first terminal 1961a of the conductor 1961 includes a recessed portion 1969 configured to control an outflow of solder from within a solder joint formed between a terminal of the electrical device 1910, similar to the second diode terminal 1818 of the diode 1810 FIG. 18C, and the first terminal 1961a of the conductor 1961. The second terminal 1961b of the conductor 1961 is not configured as an expansion joint. However, the second terminal 1961b of the conductor 1961 may be configured as an interconnecting-conductor, similar to the first interconnecting-conductor 1850 configured to provide a stationary contact in communication with the sliding contact of the expansion joint shown in FIG. 18D, of a second terminal of a first conductor of an adjacent combined electrical device, lead assembly incorporating an expansion joint (not shown). The second terminal 1961b of the conductor 1961 may be configured as a bottom portion of a lap joint, similar to the first interconnecting-conductor 1850 shown in FIG. 18D.

With further reference to FIG. 19A, in accordance with embodiments of the present invention, the combined electrical device, lead assembly 1902 incorporating an expansion joint includes a lead incorporating an expansion joint. The lead incorporating an expansion joint includes the conductor 1930. The conductor 1930 includes the first terminal 1930a and the second terminal 1930b. The first terminal 1930a of the conductor 1930 may be configured to electrically couple to the electrical device 1910. Embodiments of the present invention shown in FIG. 19A are for a two terminal device such as a diode. However, in general, for embodiments of the present invention, an electrical device may be a multi-terminal electrical device, for example, an electrical device with more than two terminals, and in particular an electrical device selected from the group consisting of a semiconductor device, a diode, a transistor, a battery, an inverter and a DC-to-DC converter. The second terminal 1930b of the conductor 1930 is configured as an expansion joint. The expansion joint of the lead incorporating an expansion joint is configured to electrically couple to the interconnecting-conductor 1950 and configured to reduce a stress applied to the electrical device 1910 by the conductor 1930. The expansion joint of the lead incorporating an expansion joint is configured to protect the electrical device 1910 from application of a stress to the electrical device 1910 by the conductor 1930 sufficient to fracture the electrical device 1910.

Similar to the description given above of the combined electrical device, lead assembly 1902 incorporating an expansion joint of FIG. 19A, the expansion joint of the lead incorporating an expansion joint is configured to provide a sliding contact in communication with the interconnecting-conductor 1950. Also, the expansion joint of the lead incorporating an expansion joint is configured as a portion of a lap joint. The expansion joint of the conductor 1930 of the lead incorporating an expansion joint includes a planar strip portion. The planar strip portion has a first planar surface and a second planar surface substantially parallel to the first planar surface. At least one of the first and second planar surfaces is configured to provide a sliding contact in communication with the interconnecting-conductor 1950. Alternatively, a solar-cell module may include at least one busbar, or the solar-cell module may include at least one interconnect assembly; and, the busbar of the solar-cell module may be configured as the interconnecting-conductor, or the interconnect assembly of the solar-cell module may be configured as the interconnecting-conductor, respectively. The first terminal 1930a of the conductor 1930 may include a pocket portion configured to accept and to electrically couple to the electrical device 1910. As described above for FIG. 19A, the pocket portion may be offset from at least one of the first and second planar surfaces and may be configured to reduce a bending load applied to the electrical device 1910 by the conductor 1930. The first terminal 1930a of the conductor 1930 of the lead incorporating an expansion joint includes an alignment hole configured to accept an alignment pin for aligning the electrical device 1910 within the pocket portion of the first terminal 1930a of the conductor 1930 in forming a joint between the electrical device 1910 and the first terminal 1930a of the conductor

1930. The first terminal 1930a of the conductor 1930 of the lead incorporating an expansion joint includes a recessed portion configured to control an outflow of solder from within a solder joint formed between a terminal of the electrical device 1910 and the first terminal 1930a of the conductor 1930.

Figure 19B:
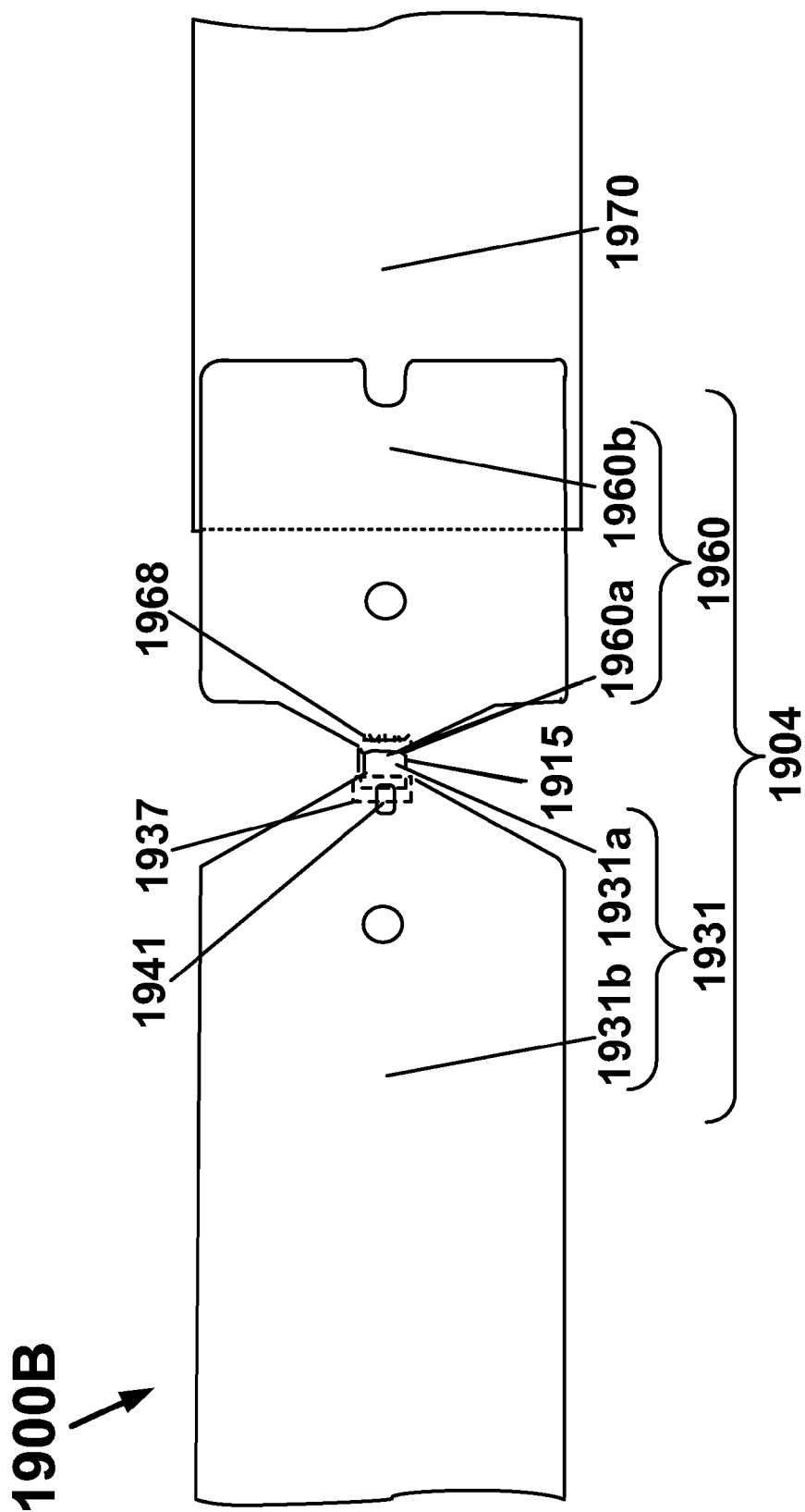
FIG. 19B is a plan view of a combined electrical device, lead assembly incorporating an expansion joint showing an alternative example arrangement utilizing an expansion joint of a conductor for electrically coupling to an interconnecting-conductor, in accordance with an embodiment of the present invention.

With reference now to FIG. 19B, in accordance with embodiments of the present invention, a plan view 1900B of a combined electrical device, lead assembly 1904 incorporating an expansion joint is shown. FIG. 19B illustrates another example arrangement utilizing an expansion joint of the conductor 1960 for electrically coupling to an interconnecting-conductor 1970. A combined diode, lead assembly incorporating an expansion joint is one example of the combined electrical device, lead assembly 1904 incorporating an expansion joint, in which case the electrical device 1915 is a diode. Embodiments of the present invention shown in FIG. 19B are for a two terminal device such as a diode. However, in general, for embodiments of the present invention, an electrical device may be a multi-terminal electrical device, for example, an electrical device with more than two terminals, and in particular an electrical device selected from the group consisting of a semiconductor device, a diode, a transistor, a battery, an inverter and a DC-to-DC converter. The combined electrical device, lead assembly 1904 includes an electrical device 1915, for example, a diode, and a plurality of conductors 1931 and 1960 electrically coupled to the electrical device 1915, for example, a diode. At least one conductor, similar to second conductor 1860 of FIG. 18B, of the plurality of conductors 1931 and 1960 includes a first terminal 1960a, similar to the first terminal 1860a of the second conductor 1860 of FIG. 18B. The first terminal 1960a of the conductor 1960 is electrically coupled to the electrical device 1915, for example, a diode. The conductor 1960 also includes a second terminal 1960b. The second terminal 1960b of the conductor 1960 is configured as an expansion joint. The expansion joint is configured to electrically couple to the interconnecting-conductor 1970 and configured to reduce a stress applied to the electrical device 1915, for example, a diode, by the conductor 1960. The expansion joint is configured to protect the electrical device 1915, for example, a diode, from application of a stress to the electrical device 1915 by the conductor 1960 sufficient to impair the electrical performance of the electrical device 1915, in particular, from application of a stress to the electrical device 1915 by the conductor 1960 sufficient to fracture the electrical device 1915, for example, a diode. The expansion joint may be configured to provide a sliding contact in communication with the interconnecting-conductor 1970 and may be configured as a portion of a lap joint, similar to the lap joint of FIG. 18E previously described.

With further reference to FIG. 19B, in accordance with embodiments of the present invention, the expansion joint of the conductor 1960, similar to second conductor 1860 of FIG. 18B, includes a planar strip portion. The planar strip portion has a first planar surface, similar to first planar surface 1862 of FIGS. 18C and 18E, and a second planar surface, similar to second planar surface 1864 of FIGS. 18C and 18E, substantially parallel to the first planar surface. At least one of the first and second planar surfaces is configured to provide a sliding contact in communication with the interconnecting-conductor 1970. The first terminal 1960a of the conductor 1960 further includes a tab portion electrically coupled to the electrical device 1915, for example, a diode. The tab portion is configured to reduce a bending load applied to the electrical device 1915, for example, a diode, by the conductor 1960. The first terminal 1960a of the conductor 1960 includes a recessed portion 1968, similar to the second recessed portion 1868 of FIG. 18A, configured to control an outflow of solder from within a solder joint, similar to the second solder joint 1884 of FIG. 18C, formed between a terminal of the electrical device 1915, similar to the second diode terminal 1818 of the diode 1810 FIG. 18C, and the first terminal 1960a of the conductor 1960. The combined electrical device, lead assembly 1904 incorporating an expansion joint also includes a solder joint, similar to the second solder joint 1884 of FIG. 18C, between a terminal of the electrical device 1915, similar to the second diode terminal 1818 of the diode 1810 FIG. 18C, and the first terminal 1960a of the conductor 1960.

With further reference to FIG. 19B, in accordance with embodiments of the present invention, a conductor 1931 without an expansion joint is shown. The conductor 1931 without an expansion joint includes a first terminal 1931a and a second terminal 1931b. The first terminal 1931a of the conductor 1931 is electrically coupled to the electrical device 1915, for example, a diode. The second terminal 1931b of the conductor 1931 is not configured as an expansion joint. However, the second terminal 1931b of the conductor 1931 may be configured as an interconnecting-conductor, similar to the second interconnecting-conductor 1870 configured to provide a stationary contact in communication with the sliding contact of the expansion joint shown in FIG. 18E, of a second terminal of a first conductor of an adjacent combined electrical device, lead assembly incorporating an expansion joint (not shown). The second terminal 1931b of the conductor 1931 may be configured as a bottom portion of a lap joint, similar to the second interconnecting-conductor 1870 shown in FIG. 18E. The first terminal 1931a of the conductor 1931 further includes a pocket portion electrically coupled to the electrical device 1915, for example, a diode. The pocket portion is offset from at least one of the first and second planar surfaces. The pocket portion, similar to the pocket portion described previously of FIG. 18C. is configured to reduce a bending load applied to the electrical device 1915, for example, a diode, by the conductor 1931A bent edge 1937 of the pocket portion formed by stamping the tab portion may have a C-shaped contour when viewed as shown in FIG. 19B. The first terminal 1931a of the conductor 1931 further includes an alignment hole 1941 configured to accept an alignment pin for aligning the electrical device 1915, for example, a diode, within the pocket portion of the first terminal 1931a of the conductor 1931 in forming a joint between the electrical device 1915 and the first terminal 1931a of the conductor 1931.

With further reference to FIG. 19B, in accordance with embodiments of the present invention, the combined electrical device, lead assembly 1904 incorporating an expansion joint includes a lead incorporating an expansion joint. The lead incorporating an expansion joint includes the conductor 1960. The conductor 1960 includes the first terminal 1960a and the second terminal 1960b. The first terminal 1960a of the conductor 1960 may be configured to electrically couple to the electrical device 1915. Embodiments of the present invention shown in FIG. 19B are for a two terminal device such as a diode. However, in general, for embodiments of the present invention, an electrical device may be a multi-terminal electrical device, for example, an electrical device with more than two terminals, and in particular an electrical device selected from the group consisting of a semiconductor device, a diode, a transistor, a battery, an inverter and a DC-to-DC converter. The second terminal 1960b of the conductor 1960 is configured as an expansion joint. The expansion joint of the lead incorporating an expansion joint is configured to electrically couple to the interconnecting-conductor 1970 and configured to reduce a stress applied to the electrical device 1915 by the conductor 1960. The first terminal 1960*a* of the conductor 1960 of the lead incorporating an expansion joint may include a tab portion configured to electrically couple to the electrical device 1915. As described above, the tab portion of the lead incorporating an expansion joint may be configured to reduce a bending load applied to the electrical device 1915 by the conductor 1960. Other embodiments of the present invention described above for the combined electrical device, lead assembly 1904 incorporating an expansion joint that read on a lead incorporating an expansion joint also describe without limitation embodiments of the present invention for a lead incorporating an expansion joint.

Figure 20:
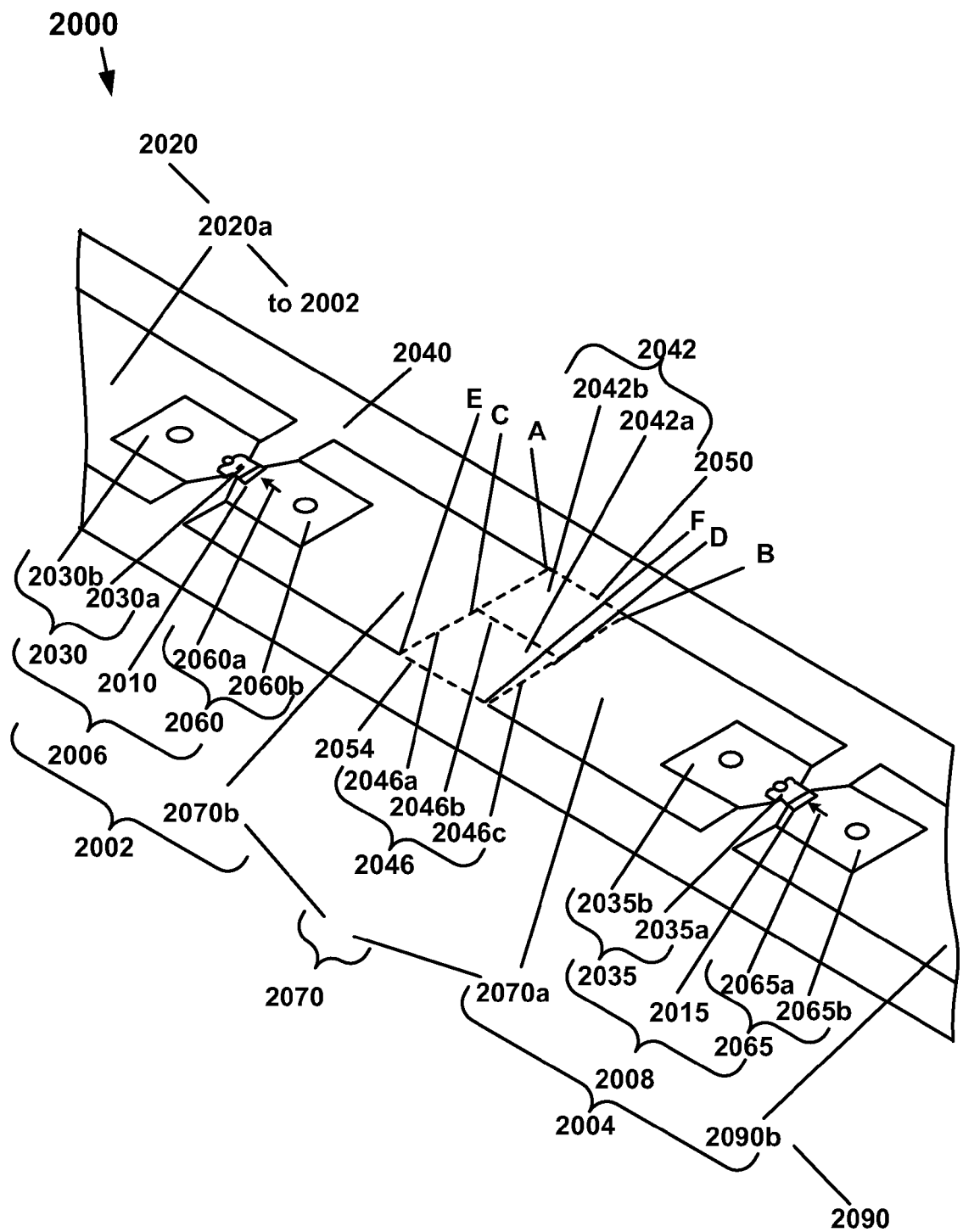
FIG. 20 is a perspective-plan view of example in-laminate-diode sub-assemblies including at least one combined diode, lead assembly incorporating at least one expansion joint showing an arrangement of an electrically-insulating-laminate strip that is cut with a cutting pattern that allows folding cut portions of the electrically-insulating-laminate strip over a side opposite to a side of an interconnecting-conductor that is electrically coupled with a solar cell of a plurality of solar cells of a solar-cell module, in accordance with an embodiment of the present invention.

With reference now to FIG. 20, in accordance with embodiments of the present invention, a perspective-plan view 2000 of example in-laminate-diode sub-assemblies, for example, in-laminate-diode sub-assemblies 2002 and 2004, including at least one combined diode, lead assembly, for example, combined diode, lead assembly 2006, or combined diode, lead assembly 2008, incorporating at least one expansion joint is shown. FIG. 20 illustrates an arrangement of an electrically-insulating-laminate strip 2040 that is cut with a cutting pattern 2046 that allows folding cut portions of the electrically-insulating-laminate strip 2040 over a side opposite to a side of an interconnecting-conductor 2070 that is electrically coupled with a solar cell of a plurality of solar cells of a solar-cell module (not shown in FIG. 20), for example, solar-cell module 1002 of FIG. 10. For elements not shown in FIG. 20, reference may be made to FIGS. 10, 11 and 13. The solar-cell module, for example, solar-cell module 1002, includes a plurality of solar-cells (not shown), for example, plurality 1010 of solar cells 1012*a*-1017*a* and 1012*b*-1017*b*, electrically coupled together. The solar-cell module, for example, solar-cell module 1002, also includes an in-laminate-diode assembly (not shown in FIG. 20), for example, in-laminate-diode assembly 1050, that is electrically coupled with the plurality of solar cells, for example, plurality 1010 of solar cells 1012*a*-1017*a* and 1012*b*-1017*b*. The in-laminate-diode assembly, for example, in-laminate-diode assembly 1050, is configured to prevent power loss.

With further reference to FIG. 20, in accordance with embodiments of the present invention, the in-laminate-diode assembly, for example, in-laminate-diode assembly 1050, includes at least one in-laminate-diode sub-assembly 2002, where it is understood for purposes of the discussion of FIG. 20 that the in-laminate-diode sub-assembly 2002 is substituted for an in-laminate-diode sub-assembly of the plurality of in-laminate-diode sub-assemblies previously described. The in-laminate-diode assembly, for example, in-laminate-diode assembly 1050, may also include a plurality of in-laminate-diode sub-assemblies, for example, at least two in-laminate-diode sub-assemblies, in-laminate-diode sub-assembly 2002 and in-laminate-diode sub-assembly 2004, where only a portion of the in-laminate-diode assembly is shown in FIG. 20. The in-laminate-diode sub-assembly 2002 includes a combined diode, lead assembly 2006 incorporating an expansion joint, a first interconnecting-conductor portion 2020*a* and a second interconnecting-conductor portion 2070*b*. The in-laminate-diode sub-assembly 2004 includes a combined diode, lead assembly 2008 incorporating an expansion joint, a first interconnecting-conductor portion 2070*a* and a second interconnecting-conductor portion 2090*b*. The complete interconnecting-conductor 2070 and portions 2020*a* and 2090*b* of two other interconnecting-conductors, respectively, interconnecting-conductor 2020 and interconnecting-conductor 2090, are shown in FIG. 20. Interconnecting-conductor 2070 includes the first interconnecting-conductor portion 2070*a* and the second interconnecting-conductor portion 2070*b*. Embodiments of the present invention in which the interconnecting-conductor may be severed into separate conductors as for embodiments of the present invention described earlier in FIGS. 13 and 16 also lie within the spirit and scope of embodiments of the present invention. Interconnecting-conductor 2020 includes the first interconnecting-conductor portion 2020*a*; a second interconnecting-conductor portion of interconnecting-conductor 2020 is not shown in FIG. 20 but lies within the spirit and scope of embodiments of the present invention. Interconnecting-conductor 2090 includes the second interconnecting-conductor portion 2090*b*; a first interconnecting-conductor portion of interconnecting-conductor 2090 is also not shown in FIG. 20 but lies within the spirit and scope of embodiments of the present invention.

With further reference to FIG. 20, in accordance with embodiments of the present invention, the combined diode, lead assembly 2006 incorporating an expansion joint includes a diode 2010 and a plurality of a first conductor 2030 and a second conductor 2060 electrically coupled to the diode 2010. The polarity of the diode attachment is designed such that the in-laminate-diode sub-assembly 2002 includes at least one diode, for example, diode 2010, configured to by-pass current flow around at least one solar cell to prevent power loss, configured as described above in the discussion of FIGS. 11A-11D. At least one conductor, for example, first conductor 2030, of the plurality includes a first terminal 2030*a* and a second terminal 2030*b*. The first terminal 2030*a* of the conductor, for example, first conductor 2030, is electrically coupled to the diode 2010. The second terminal 2030*b* of the conductor, for example, first conductor 2030, is configured as an expansion joint. The expansion joint is electrically coupled to the interconnecting-conductor 2020 and configured to reduce a stress applied to the diode 2010 by the conductor, for example, first conductor 2030. The expansion joint is configured to protect the diode 2010 from application of a stress to the diode 2010 by the conductor, for example, first conductor 2030, sufficient to impair the electrical performance of the diode 2010, for example, as from application of a stress to the diode 2010 by the conductor, for example, first conductor 2030, sufficient to fracture the diode 2010. The expansion joint is configured to provide a sliding contact in communication with the interconnecting-conductor 2020. The expansion joint is configured as a portion of a lap joint, similar to the lap joint of FIG. 18D described previously, for example, a lap joint between the interconnecting-conductor 2020 and the second terminal 2030*b* of the conductor, for example, first conductor 2030.

With further reference to FIG. 20, in accordance with embodiments of the present invention, the conductor, for example, first conductor 2030, includes a planar strip portion. The planar strip portion has a first planar surface and a second planar surface substantially parallel to the first planar surface. At least one of the first and second planar surfaces is configured to provide a sliding contact in communication with the interconnecting-conductor 2020. The first terminal 2030*a* of the conductor, for example, first conductor 2030, further includes a pocket portion electrically coupled to the diode 2010. The pocket portion is offset from at least one of the first and second planar surfaces. The pocket portion is configured to reduce a bending load applied to the diode 2010 by the conductor, for example, first conductor 2030. The first terminal of the conductor, for example, first conductor 2030, includes an alignment hole configured to accept an alignment pin for aligning the diode 2010 within the pocket portion of the first terminal 2030*a* of the conductor, for example, first conductor 2030, in forming a joint between the diode 2010 and the first terminal 2030*a* of the conductor, for example, first conductor 2030. The first terminal 2030*a* of the conductor, for example, first conductor 2030, may include a recessed portion configured to control an outflow of solder from within a solder joint formed between a terminal of the diode 2010 and the first terminal 2030*a* of the conductor, for example, first conductor 2030. Embodiments of the present invention described in this paragraph are similar to embodiments of the present invention described above for FIGS. 18A-18D.

With further reference to FIG. 20, in accordance with embodiments of the present invention, at least one conductor, for example, second conductor 2060, of the plurality includes a first terminal 2060*a* and a second terminal 2060*b*. The arrow associated with the first terminal 2060*a* in FIG. 20 indicates that the first terminal 2060*a* is disposed below the diode 2010 and is hidden from view in FIG. 20. The first terminal 2060*a* of the conductor, for example, second conductor 2060, is electrically coupled to the diode 2010. The second terminal 2060*b* of the conductor, for example, second conductor 2060, is configured as an expansion joint. The expansion joint is electrically coupled to the interconnecting-conductor 2070 and configured to reduce a stress applied to the diode 2010 by the conductor, for example, second conductor 2060. The expansion joint is configured to protect the diode 2010 from application of a stress to the diode 2010 by the conductor, for example, second conductor 2060, sufficient to impair the electrical performance of the diode 2010, for example, as from application of a stress to the diode 2010 by the conductor, for example, second conductor 2060, sufficient to fracture the diode 2010. The expansion joint is configured to provide a sliding contact in communication with the interconnecting-conductor 2070. The expansion joint is configured as a portion of a lap joint, similar to the lap joint of FIG. 18E described previously, for example, a lap joint between the interconnecting-conductor 2070 and the second terminal 2060*b* of conductor, for example, second conductor 2060. At least one of the first conductor 2030, the second conductor 2060 and an interconnecting-conductor portion of the interconnecting-conductor, for example, first interconnecting-conductor portion 2020*a* of the interconnecting-conductor 2020, or second interconnecting-conductor portion 2070*b* of the interconnecting-conductor 2070, of the in-laminate-diode sub-assembly 2002 is configured as a heat sink to remove heat generated by the diode 2010.

With further reference to FIG. 20, in accordance with embodiments of the present invention, the first terminal 2060*a* of the conductor, for example, second conductor 2060, includes a tab portion electrically coupled to the diode 2010. The tab portion is configured to reduce a bending load applied to the diode 2010 by the conductor, for example, second conductor 2060. The first terminal 2060*a* of the conductor, for example, second conductor 2060, may include a recessed portion configured to control an outflow of solder from within a solder joint formed between a terminal of the diode 2010 and the first terminal 2060*a* of the conductor, for example, second conductor 2060. Embodiments of the present invention described in this paragraph are similar to embodiments of the present invention described above for FIGS. 18A-18C.

With further reference to FIG. 20, in accordance with embodiments of the present invention, the combined diode, lead assembly 2008 incorporating an expansion joint includes a diode 2015 and a plurality of a first conductor 2035 and a second conductor 2065 electrically coupled to the diode 2015. The polarity of the diode attachment is designed such that the in-laminate-diode sub-assembly 2004 includes at least one diode, for example, diode 2015, configured to by-pass current flow around at least one solar cell to prevent power loss, configured as described above in the discussion of FIGS. 11A-11D. At least one conductor, for example, first conductor 2035, of the plurality includes a first terminal 2035*a* and a second terminal 2035*b*. The first terminal 2035*a* of the conductor, for example, first conductor 2035, is electrically coupled to the diode 2015. The second terminal 2035*b* of the conductor, for example, first conductor 2035, is configured as an expansion joint. The expansion joint is electrically coupled to the interconnecting-conductor 2070 and configured to reduce a stress applied to the diode 2015 by the conductor, for example, first conductor 2035. The expansion joint is configured to protect the diode 2015 from application of a stress to the diode 2015 by the conductor, for example, first conductor 2035, sufficient to impair the electrical performance of the diode 2015, for example, as from application of a stress to the diode 2015 by the first conductor 2035 sufficient to fracture the diode 2015. The expansion joint is configured to provide a sliding contact in communication with the interconnecting-conductor 2070. The expansion joint is configured as a portion of a lap joint, similar to the lap joint of FIG. 18D described previously, for example, a lap joint between the interconnecting-conductor 2070 and the second terminal 2035*b* of the conductor, for example, first conductor 2035.

With further reference to FIG. 20, in accordance with embodiments of the present invention, the conductor, for example, first conductor 2035, includes a planar strip portion. The planar strip portion has a first planar surface and a second planar surface substantially parallel to the first planar surface. At least one of the first and second planar surfaces is configured to provide a sliding contact in communication with the interconnecting-conductor 2070. The first terminal 2035*a* of the conductor, for example, first conductor 2035, further includes a pocket portion electrically coupled to the diode 2015. The pocket portion is offset from at least one of the first and second planar surfaces. The pocket portion is configured to reduce a bending load applied to the diode 2015 by the conductor, for example, first conductor 2035. The first terminal of the conductor, for example, first conductor 2035, includes an alignment hole configured to accept an alignment pin for aligning the diode 2015 within the pocket portion of the first terminal 2035*a* of the conductor, for example, first conductor 2035, in forming a joint between the diode 2015 and the first terminal 2035*a* of the conductor, for example, first conductor 2035. The first terminal 2035*a* of the conductor, for example, first conductor 2035, may include a recessed portion configured to control an outflow of solder from within a solder joint formed between a terminal of the diode 2015 and a first terminal 2065*a* of the conductor, for example, first conductor 2035. Embodiments of the present invention described in this paragraph are similar to embodiments of the present invention described above for FIGS. 18A-18D.

With further reference to FIG. 20, in accordance with embodiments of the present invention, at least one conductor, for example, second conductor 2065, of the plurality includes the first terminal 2065*a* and a second terminal 2065*b*. The arrow associated with the first terminal 2065*a* in FIG. 20 indicates that the first terminal 2065*a* is disposed below the diode 2015 and is hidden from view in FIG. 20. The first terminal 2065*a* of the conductor, for example, second conductor 2065, is electrically coupled to the diode 2015. The second terminal 2065*b* of the conductor, for example, second conductor 2065, is configured as an expansion joint. The expansion joint is electrically coupled to the interconnecting-conductor 2090 and configured to reduce a stress applied to the diode 2015 by the conductor, for example, second conductor 2065, The expansion joint is configured to protect the diode 2015 from application of a stress to the diode 2015 by the conductor, for example, second conductor 2065, sufficient to impair the electrical performance of the diode 2015, for example, as from application of a stress to the diode 2015 by the conductor, for example, second conductor 2065, sufficient to fracture the diode 2015. The expansion joint is configured to provide a sliding contact in communication with the interconnecting-conductor 2090. The expansion joint is configured as a portion of a lap joint, similar to the lap joint of FIG. 18E described previously, for example, a lap joint between the interconnecting-conductor 2090 and the second terminal 2065b of conductor, for example, second conductor 2065. At least one of the first conductor 2035, the second conductor 2065 and an interconnecting-conductor portion of the interconnecting-conductor, for example, first interconnecting-conductor portion 2070a of the interconnecting-conductor 2070 or second interconnecting-conductor portion 2090b of the interconnecting-conductor 2090, of the in-laminate-diode sub-assembly 2004 is configured as a heat sink to remove heat generated by the diode 2015.

With further reference to FIG. 20, in accordance with embodiments of the present invention, the first terminal 2065a of the conductor, for example, second conductor 2065, includes a tab portion electrically coupled to the diode 2015. The tab portion is configured to reduce a bending load applied to the diode 2015 by the conductor, for example, second conductor 2065. The first terminal 2065a of the conductor, for example, second conductor 2065, may include a recessed portion configured to control an outflow of solder from within a solder joint formed between a terminal of the diode 2015 and the first terminal 2065a of the conductor, for example, second conductor 2065. Embodiments of the present invention described in this paragraph are similar to embodiments of the present invention described above for FIGS. 18A-18C.

With further reference to FIG. 20, in accordance with embodiments of the present invention, the in-laminate-diode sub-assembly 2002 includes the electrically-insulating-laminate strip 2040 configured to allow access of at least one of the first conductor 2030, the second conductor 2060 and the interconnecting-conductor 2070 to a solar cell of the plurality of solar cells for electrically coupling with the solar cell. The electrically-insulating-laminate strip 2040 may be configured with the cutting pattern 2046 that allows folding cut portions 2042 of the electrically-insulating-laminate strip 2040 over a side opposite to a side of at least one of the first conductor 2030, the second conductor 2060 and the interconnecting-conductor 2070 that electrically couples with the solar cell. For example, the electrically-insulating-laminate strip 2040 may include a continuous electrically-insulating-laminate strip with an access region, identified with the cut portions 2042, through which the interconnecting-conductor 2070 electrically couples with the back side of the primary solar cell. The access region, identified with the cut portions 2042, of the electrically-insulating-laminate strip 2040 may be configured with the cutting pattern 2046 that allows folding cut portions 2042 of the electrically-insulating-laminate strip 2040 over a side opposite to a side of a conductor, for example, the interconnecting-conductor 2070, that is electrically coupled with a solar cell of the plurality of solar cells of the solar-cell sub-module and solar-cell module, for example, solar-cell module 1002. As shown in FIG. 20, this also allows the interconnecting-conductor 2070 to electrically couple with the light-facing side of the last solar cell of the solar-cell sub-module, because the light-facing side of the last solar cell of the solar-cell sub-module may be electrically coupled in common with the back side of the primary solar cell of an adjacent solar-cell sub-module through an interconnect assembly, for example, interconnect assembly 420 of FIGS. 4A-4F, between the back side of the primary solar cell and the light-facing side of the last solar cell of adjacent solar-cell sub-modules (not shown in FIG. 20).

With further reference to FIG. 20, in accordance with embodiments of the present invention, the arrangement of an example cutting pattern, cutting pattern 2046, an "H-cut," in the electrically-insulating-laminate strip 2040 configured to allow access of at least one of the first conductor 2030, the second conductor 2060 and the interconnecting-conductor 2070 to a solar cell of a plurality of solar cells of the solar-cell sub-module and solar-cell module, for example, solar-cell module 1002, is shown. The term, "H-cut", is a term of art coined by the inventors previously described above in the discussion of FIG. 17A. The cutting pattern 2046 may include separate cuts: a first cut 2046a, a second cut 2046b and a third cut 2046c. As shown in FIG. 20, the first cut 2046a corresponds to dashed line AE, the second cut 2046b corresponds to dashed line CD, and the third cut 2046c corresponds to dashed line BF. The cut portions 2042 may include a first cut portion 2042a and a second cut portion 2042b. As shown in FIG. 20, the first cut portion 2042a corresponds to rectangle ABDC, and the second cut portion 2042b corresponds to rectangle CDFE. The first cut portion 2042a may be folded back along a first fold 2050 corresponding to line AB and the second cut portion 2042b may be folded back along a second fold 2054 corresponding to line EF to allow access of interconnecting-conductor 2070 to the solar cell. The first cut portion 2042a may also be folded back down along the first fold 2050 onto interconnecting-conductor 2070, and the second cut portion 2042b may be folded back down along the second fold 2054 onto interconnecting-conductor 2070 that is coupled with the solar cell. The electrically-insulating-laminate strip 2040 may be configured with the cutting pattern 2046 to maintain an essentially constant combined thickness of the electrically-insulating-laminate strip 2040 and at least one of the first conductor 2030, the second conductor 2060 and the interconnecting-conductor 2070 that is electrically coupled with a solar cell, over a length of the in-laminate-diode sub-assembly 2002 exclusive of a diode-attaching portion of the in-laminate-diode sub-assembly 2002. In an alternative embodiment of the present invention, the electrically-insulating-laminate strip 2040 is configured with the cutting pattern 2046 to maintain an essentially constant combined thickness of the electrically-insulating-laminate strip 2040 and the interconnecting-conductor 2070 over a length of the interconnecting-conductor 2070 exclusive of a location of the combined diode, lead assembly, for example, the combined diode, lead assembly 2006, or the combined diode, lead assembly 2008, incorporating the expansion joint of the in-laminate-diode sub-assembly, for example, the in-laminate-diode sub-assembly 2002, or the in-laminate-diode sub-assembly 2004, respectively.

The electrically-insulating-laminate strip 2040 improves performance of a solar-cell module, for example, solar-cell module 1002, by eliminating voids that might develop between the in-laminate-diode sub-assembly 2002 incorporating the electrically-insulating-laminate strip 2040 upon encapsulating the in-laminate-diode sub-assembly 2002, in the protective structures of the solar-cell module, for example, solar-cell module 1002. Voids associated with non-uniformities in the combined thickness of an electrically-insulating-laminate strip and a conductor can serve to nucleate delaminations in the laminated structures of a solar-cell module as a result of exposure to thermal cycling in the operating environment of a solar-cell module. Therefore, embodiments of the present invention are useful for improving the resistance of a solar-cell module to the deleterious effects of thermal cycling. Embodiments of the present invention are not limited to just the cutting pattern 2046 as shown in FIG. 20, but other cutting patterns, such as described above in the discussion of FIG. 17B, which provide the function of allowing the folding of cut portions 2042 of the electrically-insulating-laminate strip 2040 over a side opposite to a side of at least one of the first conductor 2030, the second conductor 2060 and the interconnecting-conductor 2070 that is electrically coupled with a solar cell, are also within the spirit and scope of embodiments of the present invention.

With further reference to FIG. 20, in accordance with embodiments of the present invention, the electrically-insulating-laminate strip 2040 may further include a layer of adhesive on both a solar-cell-facing side and a side opposite the solar-cell-facing side of the electrically-insulating-laminate strip 2040. The adhesive may include a hot-melt material that upon heating fuses the electrically-insulating-laminate strip 2040 to components with which the electrically-insulating-laminate strip 2040 makes contact. Therefore, the electrically-insulating-laminate strip 2040 including the adhesive may serve to bond component parts of the solar cell module 1002 together. For example, the adhesive of electrically-insulating-laminate strip 2040 may bond the in-laminate-diode assembly 1050 of solar-cell module 1002 of FIG. 10, including the plurality of in-laminate-diode sub-assemblies 2002 and 2004 to solar cells within the solar cell module 1002. In particular, the adhesive of electrically-insulating-laminate strip 2040 may bond conductors, for example, first and second conductors 2030 and 2060 and interconnecting-conductors 2020 and 2070, of the in-laminate-diode sub-assembly 2002 to the solar cells within the solar cell module 1002 along with components, for example, diode 2010, of the in-laminate-diode sub-assembly 2002 attached to the conductors, for example, first and second conductors 2030 and 2060 and interconnecting-conductors 2020 and 2070.

With further reference to FIG. 20, in accordance with embodiments of the present invention, the in-laminate-diode sub-assembly 2002 further includes at least one of the first conductor 2030, the second conductor 2060 and the interconnecting-conductor 2070 structured to enable a laminated electrical connection between at least one of the first conductor 2030, the second conductor 2060 and the interconnecting-conductor 2070 and another component of the solar-cell module 1002. Another component of the solar-cell module 1002 may be without limitation a first busbar, a terminating busbar and the terminal of a solar cell of a solar-cell module of the solar-cell module 1002. The laminated electrical connection does not require solder, welding, a conducting adhesive or any other material disposed between a first contacting surface of the first conductor 2030, the second conductor 2060 and/or the interconnecting-conductor 2070 and a second contacting surface of the other component of the solar-cell module 1002 to which the first conductor 2030, the second conductor 2060 and/or the interconnecting-conductor 2070 are electrically connected. The laminated electrical connection requires only that a mechanical pressure be applied to hold the first conductor 2030, the second conductor 2060 and/or the interconnecting-conductor 2070 in intimate contact with the other component of the solar-cell module 1002 to which the first conductor 2030, the second conductor 2060 and/or the interconnecting-conductor 2070 are electrically connected.

Sub-Section B: Physical Description of Embodiments of the Present Invention for an Alternative in-Laminate-Diode Assembly Including a Combined Diode, Lead Assembly Incorporating an Expansion Joint With reference now to FIG. 21A-21D, in accordance with embodiments of the present invention, a combined perspective-plan and expanded view 2100A of a portion of an alternative example in-laminate-diode assembly 2101 is shown. Components of in-laminate-diode assembly 2101 are described below and further described or shown in FIGS. 21B-21D; the subsequent description for FIG. 21A also serves for components of in-laminate-diode assembly 2101 shown in FIGS. 21B-21D. FIG. 21A shows an arrangement of component parts of in-laminate-diode sub-assemblies, for example, in-laminate-diode sub-assembly 2102, included in the in-laminate-diode assembly 2101. An in-laminate-diode sub-assembly, for example, in-laminate-diode sub-assembly 2102, includes a combined diode, lead assembly, for example, one of combined diode, lead assemblies 2122, 2124, 2126, or 2128, incorporating at least one expansion joint. The in-laminate-diode assembly 2101 also includes a first electrically-insulating-laminate strip 2140 including a plurality of via-hole cutouts 2141, 2142, 2144, 2146 and 2148 such that each via-hole cutout, for example, a via-hole cutout of the group of via-hole cutouts 2141, 2142, 2144, 2146 and 2148, is configured to allow access for electrically coupling to a solar cell, for example, solar cell 1012a (not shown in FIGS. 21A-21D), of a plurality of solar cells of a solar-cell module, for example, plurality 1010 of solar cells 1012a-1017a and 1012b-1017b of solar-cell module 1002 (not shown in FIGS. 21A-21D). In addition, the alternative example in-laminate-diode assembly includes a second electrically-insulating-laminate strip 2150 including a plurality of complementary cutouts 2152, 2154, 2156 and 2158 congruent with the shapes of gap regions, for example, gap region 2188, lying between via-hole cutouts 2141, 2142, 2144, 2146 and 2148 of the first electrically-insulating-laminate strip 2140.

For embodiments of the present invention, FIGS. 21A-21D are by way of illustration and not limitation; in particular, the pluralities of components shown and described are not to be construed to limit embodiments of the present invention only to such pluralities shown. For elements not shown in FIGS. 21A-21D, reference may be made to FIGS. 10 and 11. The solar-cell module, for example, solar-cell module 1002, includes a plurality of solar-cells (not shown in FIGS. 21A-21D), for example, plurality 1010 of solar cells 1012a-1017a and 1012b-1017b, electrically coupled together. The solar-cell module, for example, solar-cell module 1002, also includes an in-laminate-diode assembly, for example, in-laminate-diode assembly 1050, which may be identified with the in-laminate-diode assembly 2101 of FIGS. 21A-21D, that is electrically coupled with the plurality of solar cells, for example, plurality 1010 of solar cells 1012a-1017a and 1012b-1017b. The in-laminate-diode assembly, for example, in-laminate-diode assembly 1050, which may be identified with the in-laminate-diode assembly 2101 of FIGS. 21A-21D, is configured to prevent power loss.

With further reference to FIG. 21A, in accordance with embodiments of the present invention, the alternative example in-laminate-diode assembly 2101, which may be identified with in-laminate-diode assembly 1050, includes at least one in-laminate-diode sub-assembly 2102, where it is understood for purposes of the discussion of FIG. 21A that the in-laminate-diode sub-assembly 2102 is substituted for an in-laminate-diode sub-assembly of the plurality of in-laminate-diode sub-assemblies previously described. The in-laminate-diode assembly 2101, which may be identified with in-laminate-diode assembly 1050, may include a plurality of in-laminate-diode sub-assemblies, one example of which is in-laminate-diode sub-assembly 2102 shown in FIG. 21A. In-laminate-diode sub-assembly 2102 of the plurality of in-laminate-diode sub-assemblies included in in-laminate-diode assembly 2101 includes at least one combined diode, lead assembly 2122, incorporating at least one expansion joint. As shown in FIG. 21A, the combined diode, lead assemblies 2122, 2124, 2126 and 2128 are shown as incorporating two expansion joints by way of illustration and not limitation, similar to the combined diode, lead assembly 1802 incorporating two expansion joints of FIGS. 18A-18E described previously. The in-laminate-diode sub-assembly 2102 includes a combined diode, lead assembly 2122 incorporating an expansion joint, a first interconnecting-conductor portion 2174a and a second interconnecting-conductor portion 2172b. Four interconnecting-conductors 2172, 2174, 2176 and 2178 are shown in FIGS. 21A-21D by way of illustration and not limitation. Interconnecting-conductor 2172 includes the first interconnecting-conductor portion 2172a and the second interconnecting-conductor portion 2172b; interconnecting-conductor 2174 includes the first interconnecting-conductor portion 2174a and the second interconnecting-conductor portion 2174b; interconnecting-conductor 2176 includes the first interconnecting-conductor portion 2176a and the second interconnecting-conductor portion 2176b; and, interconnecting-conductor 2178 includes the first interconnecting-conductor portion 2178a and the second interconnecting-conductor portion 2178b.

With further reference to FIG. 21A, in accordance with embodiments of the present invention, the following description of the combined diode, lead assembly 2122 incorporating an expansion joint serves also to describe the similar function and similar arrangement of similar sub-components of the plurality of combined diode, lead assemblies 2122, 2124, 2126 and 2128 included in the in-laminate-diode sub-assemblies of in-laminate-diode assembly 2101. The combined diode, lead assembly 2122 incorporating an expansion joint includes a diode 2112 and a plurality of a first conductor 2132 and a second conductor 2162 electrically coupled to the diode 2112. The polarity of the diode attachment is designed such that the in-laminate-diode sub-assembly 2102 includes at least one diode, for example, diode 2112, configured to by-pass current flow around at least one solar cell to prevent power loss, configured as described above in the discussion of FIGS. 11A-11D. At least one conductor, for example, first conductor 2132, of the plurality of the first conductor 2132 and the second conductor 2162 includes a first terminal 2132a and a second terminal 2132b. The first terminal 2132a of the conductor, for example, first conductor 2132, is electrically coupled to the diode 2112. The second terminal 2132b of the conductor, for example, first conductor 2132, is configured as an expansion joint. The expansion joint is electrically coupled to the interconnecting-conductor 2174 and configured to reduce a stress applied to the diode 2112 by the conductor, for example, first conductor 2132. The expansion joint is configured to protect the diode 2112 from application of a stress to the diode 2112 by the conductor, for example, first conductor 2132, sufficient to impair the electrical performance of the diode 2112, for example, as from application of a stress to the diode 2112 by the conductor, for example, first conductor 2132, sufficient to fracture the diode 2112. The expansion joint is configured to provide a sliding contact in communication with the interconnecting-conductor 2174. The expansion joint is configured as a portion of a lap joint, similar to the lap joint of FIG. 18D described previously, for example, a lap joint between the interconnecting-conductor 2174 and the second terminal 2132b of the conductor, for example, first conductor 2132.

With further reference to FIG. 21A, in accordance with embodiments of the present invention, the conductor, for example, first conductor 2132, includes a planar strip portion. The planar strip portion has a first planar surface and a second planar surface substantially parallel to the first planar surface. At least one of the first and second planar surfaces is configured to provide a sliding contact in communication with the interconnecting-conductor 2174. The first terminal 2132a of the conductor, for example, first conductor 2132, further includes a pocket portion electrically coupled to the diode 2112. The pocket portion is offset from at least one of the first and second planar surfaces. The pocket portion is configured to reduce a bending load applied to the diode 2112 by the conductor, for example, first conductor 2132. The first terminal of the conductor, for example, first conductor 2132, includes an alignment hole configured to accept an alignment pin for aligning the diode 2112 within the pocket portion of the first terminal 2132a of the conductor, for example, first conductor 2132, in forming a joint between the diode 2112 and the first terminal 2132a of the conductor, for example, first conductor 2132. The first terminal 2132a of the conductor, for example, first conductor 2132, may include a recessed portion configured to control an outflow of solder from within a solder joint formed between a terminal of the diode 2112 and the first terminal 2132a of the conductor, for example, first conductor 2132. Embodiments of the present invention described in this paragraph are similar to embodiments of the present invention described above for FIGS. 18A-18D.

With further reference to FIG. 21A, in accordance with embodiments of the present invention, at least one conductor, for example, second conductor 2162, of the plurality of the first conductor 2132 and the second conductor 2162 includes a first terminal 2162a and a second terminal 2162b. The arrow associated with the first terminal 2162a in FIG. 21A indicates that the first terminal 2162a is disposed below the diode 2112 and is hidden from view in FIG. 21A. The first terminal 2162a of the conductor, for example, second conductor 2162, is electrically coupled to the diode 2112. The second terminal 2162b of the conductor, for example, second conductor 2162, is configured as an expansion joint. The expansion joint is electrically coupled to the interconnecting-conductor 2172 and configured to reduce a stress applied to the diode 2112 by the conductor, for example, second conductor 2162, The expansion joint is configured to protect the diode 2112 from application of a stress to the diode 2112 by the conductor, for example, second conductor 2162, sufficient to impair the electrical performance of the diode 2112, for example, as from application of a stress to the diode 2112 by the conductor, for example, second conductor 2162, sufficient to fracture the diode 2112. The expansion joint is configured to provide a sliding contact in communication with the interconnecting-conductor 2172. The expansion joint is configured as a portion of a lap joint, similar to the lap joint of FIG. 18E described previously, for example, a lap joint between the interconnecting-conductor 2172 and the second terminal 2162b of the conductor, for example, second conductor 2162. At least one of the first conductor 2132, the second conductor 2162 and an interconnecting-conductor portion of the interconnecting-conductor, for example, first interconnecting-conductor portion 2174a of the interconnecting-conductor 2174, or second interconnecting-conductor portion 2172b of the interconnecting-conductor 2172, of the in-laminate-diode sub-assembly 2102 is configured as a heat sink to remove heat generated by the diode 2112.

With further reference to FIG. 21A, in accordance with embodiments of the present invention, the first terminal 2162a of the conductor, for example, second conductor 2162, includes a tab portion electrically coupled to the diode 2112. The tab portion is configured to reduce a bending load applied to the diode 2112 by the conductor, for example, second conductor 2162. The first terminal 2162a of the conductor, for example, second conductor 2162, may include a recessed portion configured to control an outflow of solder from within a solder joint formed between a terminal of the diode 2112 and the first terminal 2162*a* of the conductor, for example, second conductor 2162. Embodiments of the present invention described in this paragraph are similar to embodiments of the present invention described above for FIGS. 18A-18C.

With further reference to FIG. 21A, in accordance with embodiments of the present invention, the in-laminate-diode assembly 2101 also includes the first electrically-insulating-laminate strip 2140 including the plurality of via-hole cutouts, for example, via-hole cutouts 2141, 2142, 2144, 2146 and 2148, and the second electrically-insulating-laminate strip 2150 including the plurality of complementary cutouts, for example, complementary cutouts 2152, 2154, 2156 and 2158. For example, a via-hole cutout 2148 of the plurality of via-hole cutouts is configured to allow access of at least one of a first conductor 2138, and a second conductor 2168 to a solar cell, for example, solar cell 1012*a*, of a plurality of solar cells of a solar-cell module, for example, solar-cell module 1002, for electrically coupling with the solar cell, for example, solar cell 1012*a*, of a plurality of solar cells of the solar-cell module, for example, solar-cell module 1002. In this regard, a via hole cutout of the plurality of via-hole cutouts 2141, 2142, 2144, 2146 and 2148 is similar to the access regions of FIGS. 13, 16 and 20 described previously.

For example, the first electrically-insulating-laminate strip 2140 may include a continuous electrically-insulating-laminate strip with an access region, identified with the via-hole cutout 2148, through which the first conductor 2138 of the combined diode, lead assembly 2128 incorporating an expansion joint electrically couples with the back side of the primary solar cell, for example, solar cell 1012*a*. In accordance with an embodiment of the present invention, the first conductor 2138 of the combined diode, lead assembly 2128 incorporating an expansion joint may overlay the via-hole cutout 2148, as indicated by the dashed lines in FIG. 21A projecting down from the corners of the first conductor 2138 to the corresponding respective corners of the via-hole cutout 2148. Similarly, the first electrically-insulating-laminate strip 2140 may include a continuous electrically-insulating-laminate strip with another access region, identified with the via-hole cutout 2146, of a plurality of access regions through which the first conductor 2136 of the combined diode, lead assembly 2126 incorporating an expansion joint electrically couples with the back side of another primary solar cell, for example, solar cell 1012*b*. In accordance with an embodiment of the present invention, the first conductor 2136 of the combined diode, lead assembly 2126 incorporating an expansion joint may overlay the via-hole cutout 2146, as indicated by the dashed lines in FIG. 21A projecting down from the corners of the first conductor 2136 to the corresponding respective corners of the via-hole cutout 2146. As shown in FIG. 21A, this also allows the first conductor 2136 to electrically couple with the light-facing side of the last solar cell of the solar-cell sub-module, because the light-facing side of the last solar cell of the solar-cell sub-module may be electrically coupled in common with the back side of the primary solar cell of an adjacent solar-cell sub-module through an interconnect assembly, for example, interconnect assembly 420 of FIGS. 4A-4F, between the back side of the primary solar cell and the light-facing side of the last solar cell of adjacent solar-cell sub-modules (not shown in FIG. 21A).

With further reference to FIG. 21A, in accordance with embodiments of the present invention, a complementary cutout 2158 of the second plurality of complementary cutouts, for example, complementary cutouts 2152, 2154, 2156 and 2158, is configured such that the complementary cutout 2158 is disposed in the second electrically-insulating-laminate strip 2150 at a site located between a first via-hole cutout, for example, via-hole cutout 2146, and a second via-hole cutout, for example, via-hole cutout 2148, of the first electrically-insulating-laminate strip 2140 when the second electrically-insulating-laminate strip 2150 overlays the first electrically-insulating-laminate strip 2140. In accordance with an embodiment of the present invention, the complementary cutout 2158 of the second electrically-insulating-laminate strip 2150 may overlay the site located between the first via-hole cutout, for example, via-hole cutout 2146, and the second via-hole cutout, for example, via-hole cutout 2148, as indicated by the dashed lines in FIG. 21A projecting down from the corners of the complementary cutout 2158 to the corresponding respective corners of via-hole cutout 2146 and via-hole cutout 2148 of the first electrically-insulating-laminate strip 2140. The complementary cutout 2158 in the second electrically-insulating-laminate strip 2150 has a complementary shape to a first shape of the first via-hole cutout, for example, via-hole cutout 2146, and a second shape of the second via-hole cutout, for example, via-hole cutout 2148, of the first electrically-insulating-laminate strip 2140. The complementary shape of the complementary cutout is defined by a shape of a gap region, for example, gap region 2188, lying between the first via-hole cutout, for example, via-hole cutout 2146, and the second via-hole cutout, for example, via-hole cutout 2148, of the first electrically-insulating-laminate strip 2140. As indicated by the dashed lines between the via-hole cutout 2146 and via-hole cutout 2148, the complementary shape of the complementary cutout 2158 is substantially congruent with the shape of the gap region, for example, gap region 2188, lying between the first via-hole cutout, for example, via-hole cutout 2146, and the second via-hole cutout, for example, via-hole cutout 2148, of the first electrically-insulating-laminate strip 2140. As shown in FIG. 21A, the via-hole cutout 2148 of the plurality of via-hole cutouts 2141, 2142, 2144, 2146 and 2148 of the first electrically-insulating-laminate strip 2140 may have a substantially rectangular shape. Similarly, the complementary cutout 2158 of the plurality of complementary cutouts 2152, 2154, 2156 and 2158 of the second electrically-insulating-laminate strip 2150 may have a substantially rectangular shape. As used herein, the term "substantially rectangular shape" means that the shape is that of a rectangle within manufacturing tolerances for fabricating a rectangular shape.

With further reference to FIG. 21A, in accordance with embodiments of the present invention, a first via-hole cutout, for example, via-hole cutout 2146, of the plurality of via-hole cutouts 2141, 2142, 2144, 2146 and 2148 of the first electrically-insulating-laminate strip 2140 may have a first substantially rectangular shape, and the second via-hole cutout, for example, via-hole cutout 2148, of the plurality of via-hole cutouts 2141, 2142, 2144, 2146 and 2148 of the first electrically-insulating-laminate strip 2140 may have a second substantially rectangular shape. The first via-hole cutout, for example, via-hole cutout 2146, and the second via-hole cutout, for example, via-hole cutout 2148, of the plurality of via-hole cutouts 2141, 2142, 2144, 2146 and 2148 of the first electrically-insulating-laminate strip 2140 are separated by a gap region, for example, gap region 2188, which may have a third substantially rectangular shape. The complementary cutout 2158 of the plurality of complementary cutouts 2152, 2154, 2156 and 2158 of second electrically-insulating-laminate strip 2150 may have a fourth substantially rectangular shape substantially congruent with the third substantially rectangular shape of the gap region, for example, gap region 2188. As used herein, the term "substantially congruent" means that the shape and size of a complementary cutout is about the same, within manufacturing tolerances for fabricating the complementary cutout, as the shape and size of a gap region when the complementary cutout is superimposed on the gap region.

With further reference to FIG. 21A, in accordance with embodiments of the present invention, the in-laminate-diode assembly 2101 includes the first electrically-insulating-laminate strip 2140 including the plurality of via-hole cutouts 2141, 2142, 2144, 2146 and 2148 and the second electrically-insulating-laminate strip 2150 including the plurality of complementary cutouts 2152, 2154, 2156 and 2158. A via-hole cutout, for example, via-hole cutout 2142, of the plurality of via-hole cutouts 2141, 2142, 2144, 2146 and 2148 is configured to allow access of a first conductor, for example, first conductor 2132, to a solar cell, for example, solar cell 2012a, of the plurality of solar cells, for example, the plurality 1010 of solar cells 1012a-1017a and 1012b-1017b, for electrically coupling with the solar cell, for example, solar cell 2012a. A second conductor, for example, second conductor 2162, overlays the first electrically-insulating-laminate strip 2140. The in-laminate-diode assembly 2101 also includes a plurality of interconnecting-conductors 2172, 2174, 2176 and 2178. An interconnecting-conductor with which an expansion joint of a combined diode, lead assembly, for example, combined diode, lead assembly 2122, is electrically coupled includes at least one interconnecting-conductor of the plurality of interconnecting-conductors 2172, 2174, 2176 and 2178. The plurality of interconnecting-conductors 2172, 2174, 2176 and 2178 includes at least a first interconnecting-conductor, for example, interconnecting-conductor 2174, and a second interconnecting-conductor, for example, interconnecting-conductor 2172. The first interconnecting-conductor, for example, interconnecting-conductor 2174, has at least a first interconnecting-conductor portion, for example, first interconnecting-conductor portion 2174a. The second interconnecting-conductor, for example, interconnecting-conductor 2172, has at least a second interconnecting-conductor portion, for example, second interconnecting-conductor portion 2172b. The first interconnecting-conductor portion of the first interconnecting-conductor, for example, first interconnecting-conductor portion 2174a of interconnecting-conductor 2172, overlays and electrically couples with the first conductor, for example, first conductor 2132, and the second interconnecting-conductor portion of the second interconnecting-conductor, for example, second interconnecting-conductor portion 2172b of interconnecting-conductor 2172, overlays and electrically couples with the second conductor, for example, second conductor 2162.

With further reference to FIG. 21A, in accordance with embodiments of the present invention, the second electrically-insulating-laminate strip 2150 overlays the plurality of interconnecting-conductors 2172, 2174, 2176 and 2178. A complementary cutout, for example, complementary cutout 2152, of the plurality of complementary cutouts 2152, 2154, 2156 and 2158 is configured to maintain a first combined thickness, for example, first combined thickness 2190 shown in FIG. 21E, of the first electrically-insulating-laminate strip 2140, the second interconnecting-conductor portion of the second interconnecting-conductor, for example, second interconnecting-conductor portion 2172b of interconnecting-conductor 2172, and the second conductor, for example, the second conductor 2162, about equal to a second combined thickness, for example, first combined thickness 2192 shown in FIG. 21F, of the second electrically-insulating-laminate strip 2150, the first interconnecting-conductor portion of the first interconnecting-conductor, for example, first interconnecting-conductor portion 2174a of interconnecting-conductor 2172, and the first conductor, for example, the first conductor 2132, as is shown in more detail in FIGS. 21D-21F.

With further reference to FIG. 21A, in accordance with embodiments of the present invention, the alternative example in-laminate-diode assembly 2101 includes the following example in-laminate-diode-assembly components: the first electrically-insulating-laminate strip 2140 including a plurality of via-hole cutouts 2141, 2142, 2144, 2146 and 2148, the second electrically-insulating-laminate strip 2150 including a plurality of complementary cutouts 2152, 2154, 2156 and 2158, a plurality of in-laminate-diode sub-assemblies, of which one example in-laminate-diode sub-assembly 2102 is shown in FIG. 21A, including both a plurality of combined diode, lead assemblies 2122, 2124, 2126 and 2128 and a plurality of interconnecting-conductors 2172, 2174, 2176 and 2178. As is subsequently described, these example in-laminate-diode-assembly components of the in-laminate-diode assembly 2101 and their corresponding sub-components may be assembled to provide an in-laminate-diode assembly 2101 suitable for use in electrically coupling to a plurality of solar cells of a solar-cell module, for example, by way of illustration and not limitation thereto, the plurality 1010 of solar cells 1012a-1017a and 1012b-1017b of the solar-cell module 1002.

With further reference to FIG. 21A, in accordance with embodiments of the present invention, sub-components of the plurality of in-laminate-diode sub-assemblies include combined diode, lead assemblies 2122, 2124, 2126, or 2128. For example, in-laminate-diode sub-assembly 2102 includes the combined diode, lead assembly 2122 incorporating an expansion joint, the first interconnecting-conductor portion 2174a and the second interconnecting-conductor portion 2172b. Similarly, the in-laminate-diode sub-assembly that includes the combined diode, lead assembly 2124 incorporating an expansion joint includes the first interconnecting-conductor portion 2176a and the second interconnecting-conductor portion 2174b; the in-laminate-diode sub-assembly that includes the combined diode, lead assembly 2126 incorporating an expansion joint includes the first interconnecting-conductor portion 2178a and the second interconnecting-conductor portion 2176b; and, the in-laminate-diode sub-assembly that includes the combined diode, lead assembly 2128 incorporating an expansion joint includes the second interconnecting-conductor portion 2178b and may include a first interconnecting-conductor portion (not shown in FIG. 21A). Also, the combined diode, lead assembly 2122 incorporating an expansion joint includes a diode 2112 and a plurality of a first conductor 2132 and a second conductor 2162 electrically coupled to the diode 2112, as described above. Similarly, the combined diode, lead assembly 2124 incorporating an expansion joint includes a diode 2114 and a plurality of a first conductor 2134 and a second conductor 2164 electrically coupled to the diode 2114; the combined diode, lead assembly 2126 incorporating an expansion joint includes a diode 2116 and a plurality of a first conductor 2136 and a second conductor 2166 electrically coupled to the diode 2116; and, the combined diode, lead assembly 2128 incorporating an expansion joint includes a diode 2118 and a plurality of the first conductor 2138 and the second conductor 2168 electrically coupled to the diode 2118.

With further reference to FIG. 21A, in accordance with embodiments of the present invention, the combined diode, lead assemblies 2124, 2126 and 2128 each also include sub-components, for example without limitation thereto, a first terminal and a second terminal of a first conductor, and a first terminal and a second terminal of a second conductor, similar to the sub-components, the first terminal 2132a and the second terminal 2132b of the first conductor 2132, and the first terminal 2162a and the second terminal 2162b of the second conductor 2162, that function in a similar manner to the sub-components 2132a, 2132b, 2162a and 2162b as described above for combined diode, lead assembly 2122. For example, for combined diode, lead assembly 2122, the first terminal 2132a of the conductor, for example, first conductor 2132, is electrically coupled to the diode 2112, and the second terminal 2132b of the conductor, for example, first conductor 2132, is configured as an expansion joint. Similarly, for combined diode, lead assemblies 2124, 2126 and 2128, the first terminal of the conductor, for example, first conductor 2134, is electrically coupled to the diode 2114, and the second terminal of the conductor, for example, first conductor 2134, is configured as an expansion joint; the first terminal of the conductor, for example, first conductor 2136, is electrically coupled to the diode 2116, and the second terminal of the conductor, for example, first conductor 2136, is configured as an expansion joint; and the first terminal of the conductor, for example, first conductor 2138, is electrically coupled to the diode 2118, and the second terminal of the conductor, for example, first conductor 2138, is configured as an expansion joint. Also, for example, for combined diode, lead assembly 2122, the first terminal 2162a of the conductor, for example, second conductor 2162, is electrically coupled to the diode 2112, and the second terminal 2162b of the conductor, for example, second conductor 2162, is configured as an expansion joint. Similarly, for combined diode, lead assemblies 2124, 2126 and 2128, the first terminal of the conductor, for example, second conductor 2164, is electrically coupled to the diode 2114, and the second terminal of the conductor, for example, second conductor 2164, is configured as an expansion joint; the first terminal of the conductor, for example, second conductor 2166, is electrically coupled to the diode 2116, and the second terminal of the conductor, for example, second conductor 2166, is configured as an expansion joint; and the first terminal of the conductor, for example, second conductor 2168, is electrically coupled to the diode 2118, and the second terminal of the conductor, for example, second conductor 2168, is configured as an expansion joint.

Figure 21B:
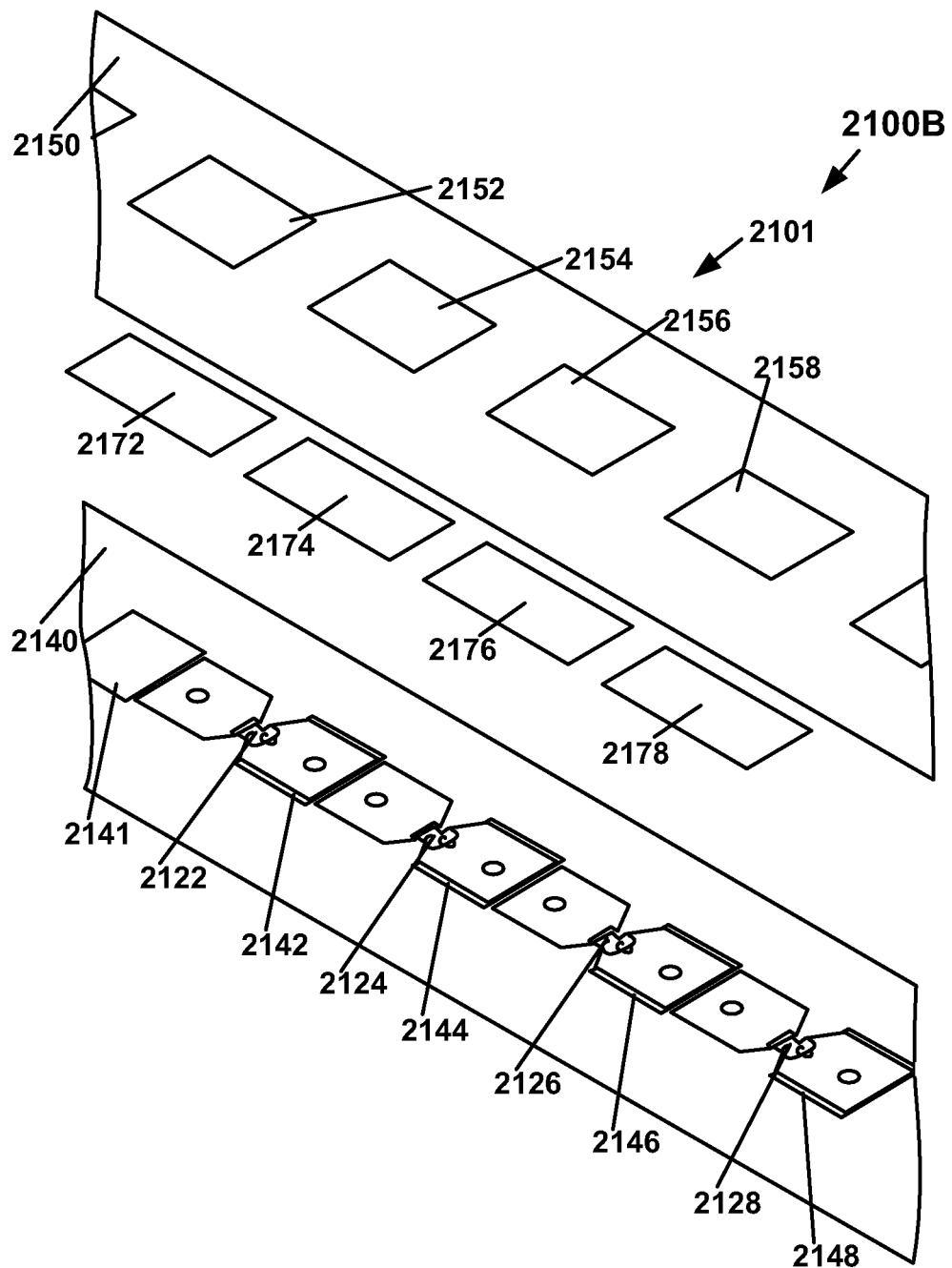
FIG. 21B is a perspective-plan and expanded view of the alternative example in-laminate-diode assembly of FIG. 21A showing the disposition of a plurality of combined diode, lead assemblies incorporating at least one expansion joint on the plurality of via-hole cutouts of the first electrically-insulating-laminate strip configured to allow access for electrically coupling to a solar cell of a plurality of solar cells of a solar-cell module, in accordance with an embodiment of the present invention.

With reference now to FIG. 21B and further reference to FIG. 21A, in accordance with embodiments of the present invention, FIG. 21B shows a perspective-plan and expanded view 2100B of the alternative example in-laminate-diode assembly 2101 of FIG. 21A. FIG. 21B illustrates the disposition of a plurality of combined diode, lead assemblies 2122, 2124, 2126 and 2128 on the plurality of via-hole cutouts 2141, 2142, 2144, 2146 and 2148 of the first electrically-insulating-laminate strip 2140 configured to allow access for electrically coupling to a plurality of solar cells of a solar-cell module, for example by way of illustration and not limitation, plurality 1010 of solar cells 1012a-1017a and 1012b-1017b of solar-cell module 1002 (not shown in FIGS. 21A-21D). The plurality of combined diode, lead assemblies 2122, 2124, 2126 and 2128 is arranged such that the plurality of respective conductors, for example, first conductors 2132, 2134, 2136 and 2138, is electrically coupled to the plurality of solar-cells (not shown in FIGS. 21A and 21B) through the plurality of via-hole cutouts 2141, 2142, 2144, 2146 and 2148 in the first electrically-insulating-laminate strip 2140. The plurality of via-hole cutouts 2141, 2142, 2144, 2146 and 2148 of the first electrically-insulating-laminate strip 2140 are configured such that each via-hole cutout, for example, a via-hole cutout of the group of via-hole cutouts 2141, 2142, 2144, 2146 and 2148, may allow access for electrically coupling to a solar cell, for example by way of illustration and not limitation, solar cell 1012a (not shown in FIGS. 21A-21D), of a plurality of solar cells of a solar-cell module, for example, plurality 1010 of solar cells 1012a-1017a and 1012b-1017b of solar-cell module 1002 (not shown in FIGS. 21A-21D).

Moreover, the polarity of the diode attachments of each diode of the plurality of diodes 2112, 2114, 2116 and 2118 is designed such that each in-laminate-diode sub-assembly of the plurality in-laminate-diode sub-assemblies of in-laminate-diode assembly 2101 includes at least one diode in each of the plurality of combined diode, lead assemblies 2122, 2124, 2126 and 2128, for example, respective diodes 2112, 2114, 2116 and 2118, configured to by-pass current flow around at least one solar cell to prevent power loss; the diode of the plurality of diodes 2112, 2114, 2116 and 2118 may be configured as described above in the discussion of FIGS. 11A-11D. A diode of the plurality of diodes 2112, 2114, 2116 and 2118 may be configured to by-pass current flow around at least one solar cell, but may also be configured to by-pass current flow around a plurality of solar cells depending upon how many solar cells are included in a solar-cell sub-module that a combined diode, lead assembly may bridge as described above in the discussion of FIGS. 11A-11D. In further configuring a diode of the plurality of diodes 2112, 2114, 2116 and 2118 to by-pass current flow around at least one solar cell, or around a plurality of solar cells of a solar-cell sub-module, embodiments of the present invention further include that the plurality of combined diode, lead assemblies 2122, 2124, 2126 and 2128 bridge respective solar-cell sub-modules of a solar-cell module, for example, solar-cell module 1002, as next described.

Figure 21C:
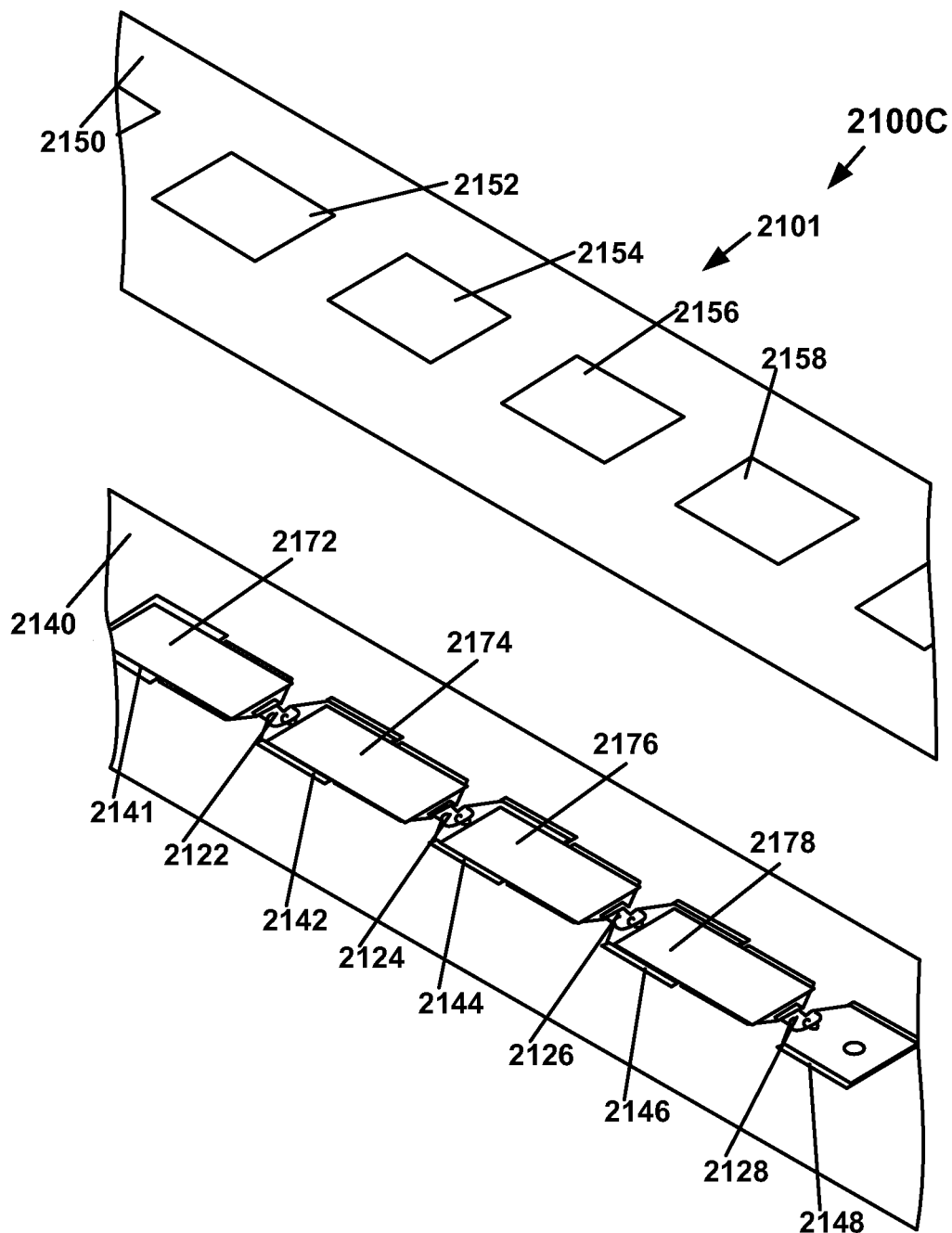
FIG. 21C is a perspective-plan and expanded view of the alternative example in-laminate-diode assembly of FIGS. 21A and 21B showing the disposition of a plurality of interconnecting-conductors on a plurality of combined diode, lead assemblies over a plurality of via-hole cutouts of the first electrically-insulating-laminate strip, in accordance with an embodiment of the present invention.

With reference now to FIG. 21C and further reference to FIGS. 21A and 21B, in accordance with embodiments of the present invention, a perspective-plan and expanded view 2100C of the alternative example in-laminate-diode assembly 2101 of FIGS. 21A and 21B is shown. FIG. 21C illustrates the disposition of a plurality of interconnecting-conductors 2172, 2174, 2176 and 2178 on a plurality of combined diode, lead assemblies 2122, 2124, 2126 and 2128 over a plurality of via-hole cutouts 2141, 2142, 2144, 2146 and 2148 of the first electrically-insulating-laminate strip 2140. As shown in FIG. 21A, the description of the arrangement of an interconnecting-conductor, for example, interconnecting-conductor 2178, also similarly describes the arrangement of the plurality of interconnecting-conductors 2172, 2174, 2176 and 2178. The arrangement of the interconnecting-conductor 2178 on first conductor 2136 of the combined diode, lead assembly 2126 and on second conductor 2168 of the combined diode, lead assembly 2128 is configured to allow combined diode, lead assembly 2128 to bridge a solar-cell sub-module of a solar-cell module, for example, solar-cell module 1002, as described above in the discussion of FIGS. 11A-11D. As shown in FIG. 21A, interconnecting-conductor 2178 is disposed to overlay and to couple electrically with first conductor 2136 of the combined diode, lead assembly 2126 and second conductor 2168 of the combined diode, lead assembly 2128, as indicated by the dashed lines in FIG. 21A projecting down from the corners of the interconnecting-conductor 2178 to the corresponding respective corners of first conductor 2136 of the combined diode, lead assembly 2126 and second conductor 2168 of the combined diode, lead assembly 2128. Similarly, for interconnecting-conductors 2174 and 2176, interconnecting-conductor 2174 is disposed to overlay and to couple electrically with first conductor 2132 of the combined diode, lead assembly 2122 and second conductor 2164 of the combined diode, lead assembly 2124; and, interconnecting-conductor 2176 is disposed to overlay and to couple electrically with first conductor 2134 of the combined diode, lead assembly 2124 and second conductor 2166 of the combined diode, lead assembly 2126. For interconnecting-conductor 2172, a alternative arrangement, a first termination configuration, is shown, which is suitable for a first terminating end of an in-laminate-diode assembly, for example, in-laminate-diode assembly 2101; the first termination configuration includes interconnecting-conductor 2172 disposed to overlay and to couple electrically with second conductor 2162 of the combined diode, lead assembly 2122 and a solar cell through via-hole cutout 2141. A second termination configuration is also shown, which is suitable for a second terminating end of an in-laminate-diode assembly, for example, in-laminate-diode assembly 2101; the second termination configuration includes first conductor 2138 of the combined diode, lead assembly 2128 disposed to overlay and to couple electrically with a solar cell through via-hole cutout 2148. Thus, the plurality of interconnecting-conductors 2172, 2174, 2176 and 2178 interconnect the plurality of combined diode, lead assemblies 2122, 2124, 2126 and 2128 such that the plurality of combined diode, lead assemblies 2122, 2124, 2126 and 2128 bridge the solar cells within respective solar-cell sub-modules spanning respective pairs of via-hole cutouts, via-hole-cutout pair 2141 and 2142, via-hole-cutout pair 2142 and 2144, via-hole-cutout pair 2144 and 2146, and via-hole-cutout pair 2146 and 2148 of the plurality of via-hole cutouts 2141, 2142, 2144, 2146 and 2148 in the first electrically-insulating-laminate strip 2140.

With further reference to FIGS. 21A-21C, in accordance with embodiments of the present invention, the in-laminate-diode assembly 2101 includes the first electrically-insulating-laminate strip 2140 including the plurality of via-hole cutouts 2141, 2142, 2144, 2146 and 2148 and the second electrically-insulating-laminate strip 2150 including the plurality of complementary cutouts 2152, 2154, 2156 and 2158. A via-hole cutout of the plurality of via-hole cutouts 2141, 2142, 2144, 2146 and 2148 is configured to allow access of a first conductor, for example, a first conductor of the plurality of first conductors 2132, 2134, 2136 and 2138, to a solar cell, for example, solar cell 2012a, of the plurality of solar cells, for example, the plurality 1010 of solar cells 1012a-1017a and 1012b-1017b, for electrically coupling with the solar cell, for example, solar cell 2012a. A second conductor, for example, a second conductor of the plurality of second conductors 2162, 2164, 2166 and 2168, overlays the first electrically-insulating-laminate strip 2140. The in-laminate-diode assembly 2101 also includes a plurality of interconnecting-conductors 2172, 2174, 2176 and 2178. An interconnecting-conductor with which an expansion joint of a combined diode, lead assembly, for example, a combined diode, lead assembly of the plurality of combined diode, lead assemblies 2122, 2124, 2126 and 2128, is electrically coupled includes at least one interconnecting-conductor of the plurality of inter-connecting-conductors 2172, 2174, 2176 and 2178. The plurality of interconnecting-conductors 2172, 2174, 2176 and 2178 includes at least a first interconnecting-conductor, and a second interconnecting-conductor, for example, an adjacent pair (not all shown in FIGS. 21A-21C) of interconnecting-conductors electrically coupled with respectively a first conductor and a second conductor of a combined diode, lead assembly of the plurality of combined diode, lead assemblies 2122, 2124, 2126 and 2128. The first interconnecting-conductor, for example, one interconnecting-conductor of the plurality of interconnecting-conductors 2172, 2174, 2176 and 2178, has at least a first interconnecting-conductor portion, for example, a first interconnecting-conductor portion of the plurality of first interconnecting-conductor portions 2172a, 2174a, 2176a and 2178a. The second interconnecting-conductor, for example, one interconnecting-conductor of the plurality of interconnecting-conductors 2172, 2174, 2176 and 2178, has at least a second interconnecting-conductor portion, for example, a second interconnecting-conductor portion of the plurality of second interconnecting-conductor portions 2172b, 2174b, 2176b and 2178b. Thus, as shown in FIGS. 21A-21C without limitation thereto, an interconnecting-conductor of the plurality of interconnecting-conductors 2174, 2176 and 2178 may be both a first interconnecting-conductor if electrically coupled respectively with a first conductor of the plurality of first conductors 2132, 2134 and 2136, and a second interconnecting-conductor if electrically coupled respectively with a second conductor of the plurality of second conductors 2164, 2166 and 2168, excepting a case where an interconnecting-conductor, for example, interconnecting-conductor 2172, is part of a first termination configuration as described above. The first interconnecting-conductor portion of the first interconnecting-conductor, for example, a first interconnecting-conductor portion of the plurality of first interconnecting-conductor portions 2174a, 2176a and 2178a, overlays and electrically couples with the first conductor, for example, a respective first conductor of the plurality of first conductors 2132, 2134 and 2136. The second interconnecting-conductor portion of the second interconnecting-conductor, for example, a second interconnecting-conductor portion of the plurality of second interconnecting-conductor portions 2172b, 2174b, 2176b and 2178b, overlays and electrically couples with the second conductor, for example, a respective second conductor of the plurality of second conductors 2162, 2164, 2166 and 2168.

Figure 21D:
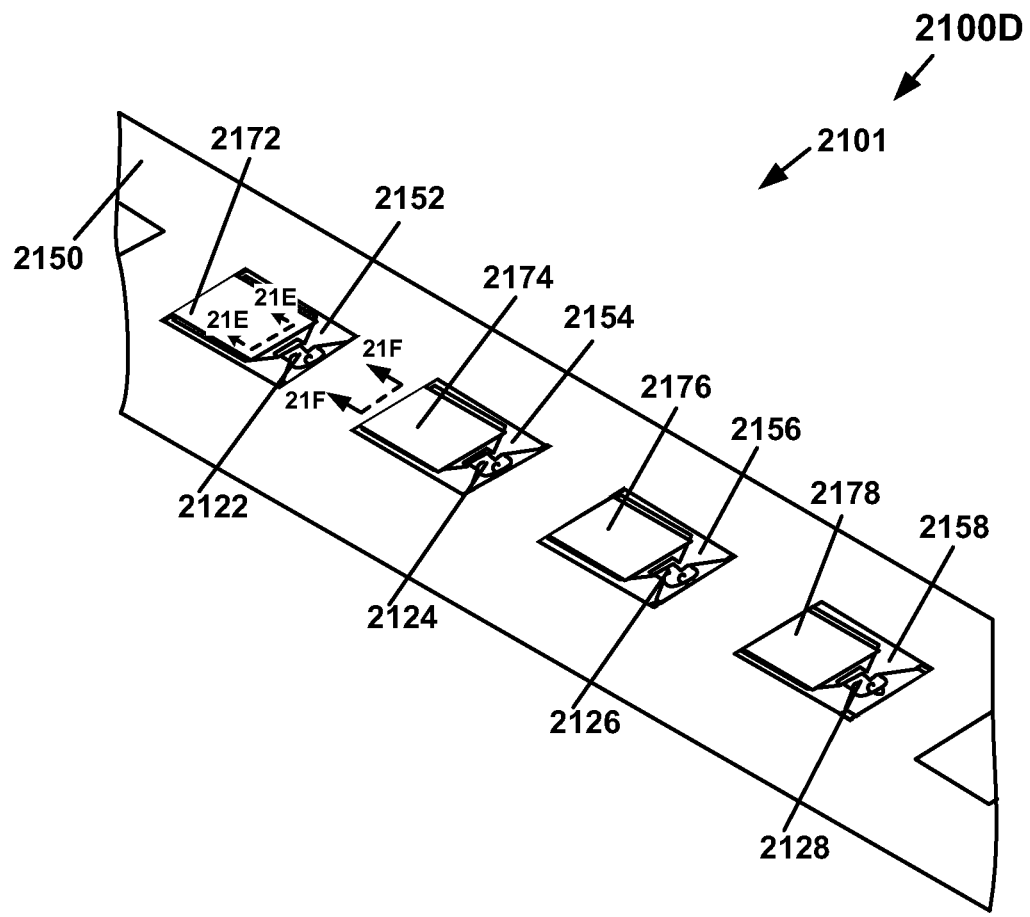
FIG. 21D is a perspective-plan view of the alternative example in-laminate-diode assembly of FIG. 21A-21C showing a portion of a fully assembled in-laminate-diode assembly, and the disposition of a plurality of complementary cutouts in the second electrically-insulating-laminate strip congruent with the shapes of gap regions lying between via-hole cutouts of the first electrically-insulating-laminate strip on the plurality of interconnecting-conductors disposed on the plurality of combined diode, lead assemblies, in accordance with an embodiment of the present invention.

With reference now to FIG. 21D and further reference to FIGS. 21A-21C, in accordance with embodiments of the present invention, a perspective-plan view 2100D of the alternative example in-laminate-diode assembly 2101 of FIG. 21A-21C is shown. FIG. 21D illustrates a portion of a fully assembled in-laminate-diode assembly 2101, and the disposition of a plurality of complementary cutouts 2152, 2154, 2156 and 2158 in the second electrically-insulating-laminate strip 2150 on the plurality of interconnecting-conductors 2172, 2174, 2176 and 2178 disposed on the plurality of combined diode, lead assemblies 2122, 2124, 2126 and 2128. Similar to the complementary cutout 2158 described previously for FIG. 21A, the plurality of complementary cutouts 2152, 2154, 2156 and 2158 are congruent with the shapes of gap regions, for example, gap region 2188, lying between the via-hole cutouts 2141, 2142, 2144, 2146 and 2148 of the first electrically-insulating-laminate strip 2140. As shown in FIG. 2D, the second electrically-insulating-laminate strip 2150 overlays the plurality of interconnecting-conductors 2172, 2174, 2176 and 2178. For the arrangement of an interconnecting-conductor of the plurality of interconnecting-conductors 2172, 2174, 2176 and 2178 disposed on a combined diode, lead assembly of the plurality of combined diode, lead assemblies 2122, 2124, 2126 and 2128 with respect to the first electrically-insulating-laminate strip 2140 shown in FIGS. 21A-21D, line 21E-21E of FIG. 21D shows a location of a first cutting plane for a cross-sectional, elevation view shown in FIG. 21E. For the arrangement of an interconnecting-conductor of the plurality of interconnecting-conductors 2172, 2174, 2176 and 2178 disposed on a combined diode, lead assembly of the plurality of combined diode, lead assemblies 2122, 2124, 2126 and 2128 with respect to the second electrically-insulating-laminate strip 2150 shown in FIGS. 21A-21D, line 21F-21F of FIG. 21D shows a location of a second cutting plane for a cross-sectional, elevation view shown in FIG. 21F, which is next described.

Figure 21E:
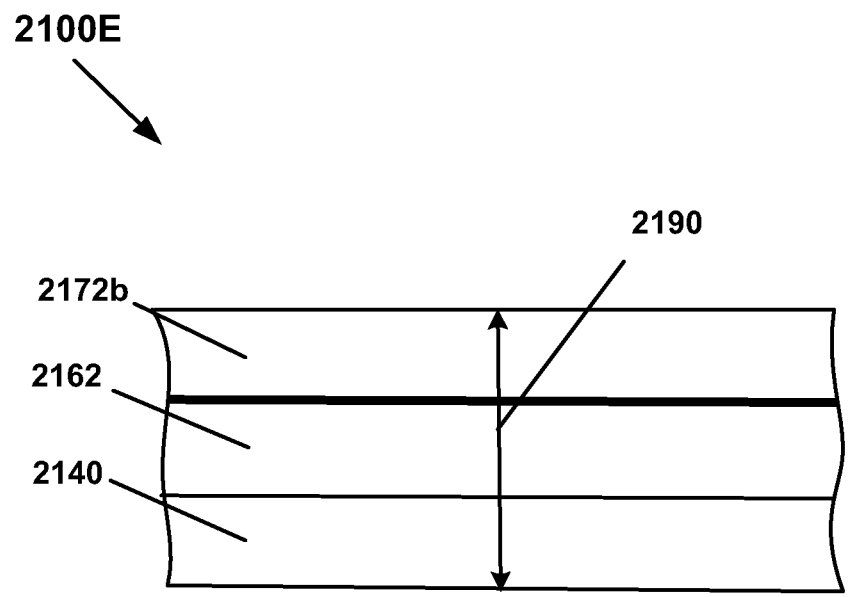
FIG. 21E is a cross-sectional, elevation view of the arrangement of an interconnecting-conductor disposed on a combined diode, lead assembly with respect to a first electrically-insulating-laminate strip shown in FIGS. 21A-21D, in accordance with an embodiment of the present invention.
Figure 21F:
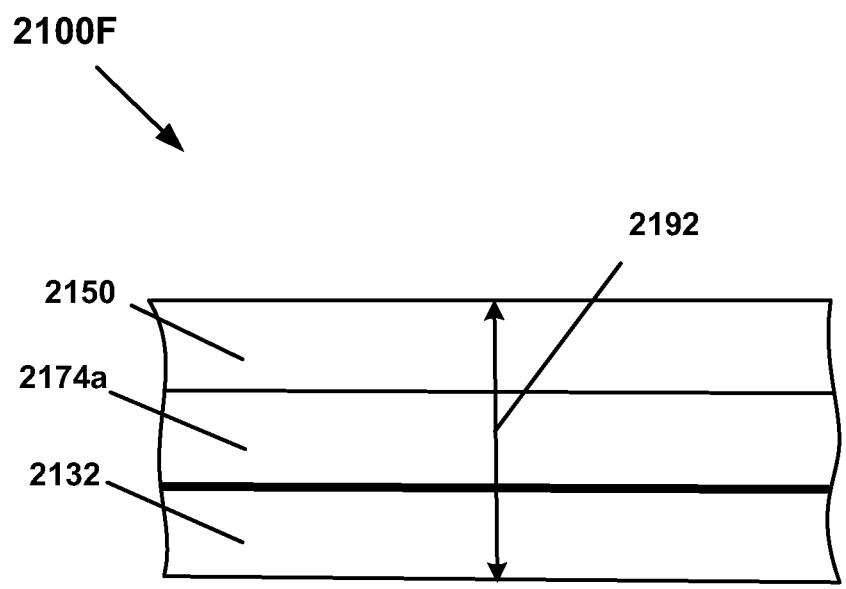
FIG. 21F is a cross-sectional, elevation view of the arrangement of an interconnecting-conductor disposed on a combined diode, lead assembly with respect to a second electrically-insulating-laminate strip shown in FIGS. 21A-21D, in accordance with an embodiment of the present invention.

With reference now to FIGS. 21E and 21F and further reference to FIGS. 21A-21D, in accordance with embodiments of the present invention, the arrangement of an interconnecting-conductor disposed on a combined diode, lead assembly with respect to the first electrically-insulating-laminate strip 2140 shown in FIGS. 21A-21D is shown in a cross-sectional, elevation view 2100E along the cutting plane corresponding to the line 21E-21E of FIG. 21D; and, the arrangement of an interconnecting-conductor disposed on a combined diode, lead assembly with respect to the second electrically-insulating-laminate strip 2150 shown in FIGS. 21A-21D is shown in a cross-sectional, elevation view 2100F along the cutting plane corresponding to the line 21F-21F of FIG. 21D. A complementary cutout of the plurality of complementary cutouts 2152, 2154, 2156 and 2158 is configured to maintain a first combined thickness, for example, first combined thickness 2190, of the first electrically-insulating-laminate strip 2140, a second interconnecting-conductor portion of a second interconnecting-conductor, for example, a second interconnecting-conductor portion of the plurality of second interconnecting-conductor portions 2172b, 2174b, 2176b and 2178b, as illustrated by second interconnecting-conductor portion 2172b of interconnecting-conductor 2172, and a second conductor, for example, a respective second conductor of the plurality of second conductors 2162, 2164, 2166 and 2168, for example, second conductor 2162, about equal to a second combined thickness, for example, second combined thickness 2192, of the second electrically-insulating-laminate strip 2150, a first interconnecting-conductor portion of a first interconnecting-conductor, for example, a first interconnecting-conductor portion of the plurality of first interconnecting-conductor portions 2174a, 2176a and 2178a, as illustrated by first interconnecting-conductor portion 2174a of interconnecting-conductor 2174, and a first conductor, for example, a respective first conductor of the plurality of first conductors 2132, 2134 and 2136, for example, first conductor 2132. Since the first electrically-insulating-laminate strip 2140 may include a layer of adhesive on both a solar-cell-facing side and a side opposite the solar-cell-facing side of the first electrically-insulating-laminate strip 2140, the first combined thickness may also include a contribution from the thicknesses of the adhesive layers of first electrically-insulating-laminate strip 2140. Similarly, since the second electrically-insulating-laminate strip 2150 may include a layer of adhesive on both a solar-cell-facing side and a side opposite the solar-cell-facing side of the second electrically-insulating-laminate strip 2150, the second combined thickness may also include a contribution from the thicknesses of the adhesive layers of second electrically-insulating-laminate strip 2150.

With further reference to FIGS. 20, 21A-21D, 10 and 4B, in accordance with embodiments of the present invention, the solar-cell module 1002, which includes the in-laminate-diode assembly that includes the in-laminate-diode sub-assembly 2002, includes a first solar cell, for example, solar cell 1012a, at least a second solar cell, for example, second solar cell 1013a, and an interconnect assembly, which may be identified with the interconnect assembly 420, disposed above a light-facing side of an absorber layer of the first solar cell, for example, solar cell 1012a. The interconnect assembly, which may be identified with the interconnect assembly 420, includes a trace including a plurality of electrically conductive portions. The plurality of electrically conductive portions is configured both to collect current from the first solar cell, for example, solar cell 1012a, and to interconnect electrically to the second solar cell, for example, second solar cell 1013a. The plurality of electrically conductive portions is configured such that solar-cell efficiency is substantially undiminished in an event that any one of the plurality of electrically conductive portions is conductively impaired. As shown in FIG. 4B, the plurality of electrically conductive portions of the interconnect assembly 420 is connected electrically in series to form a single continuous electrically conductive line. Also, as shown in FIG. 4B, the trace of the interconnect assembly 420 is disposed in a serpentine pattern such that the interconnect assembly 420 is configured to collect current from the first solar cell, for example, solar cell 1012a, and to interconnect electrically to the second solar cell, for example, second solar cell 1013a.

Sub-Section C: Description of Embodiments of the Present Invention for a Method for Fabricating a Combined Diode, Lead Assembly Incorporating an Expansion Joint With reference now to FIG. 22, in accordance with embodiments of the present invention, a flow chart 2200 illustrates an embodiment of the present invention for a method for fabricating a combined diode, lead assembly incorporating an expansion joint. At 2210, a diode having a first diode terminal and a second diode terminal is provided. At 2220, a first conductor having a first terminal and a second terminal is provided such that the first terminal of the first conductor is for electrically coupling to the diode at the first diode terminal and the second terminal of the first conductor is configured as a first expansion joint. At 2230, a second conductor having a first terminal and a second terminal is provided such that the first terminal of the second conductor is for electrically coupling to the diode at the second diode terminal. At 2240, the first terminal of the first conductor is soldered to the first diode terminal. At 2250, the first terminal of the second conductor is soldered to the second diode terminal.

In an embodiment of the present invention, the method may also include providing the second terminal of the second conductor configured as a second expansion joint. In addition, the method includes providing the first terminal of the first conductor with a pocket portion. Moreover, providing the first terminal of the first conductor with a pocket portion may include producing a tab portion at a location of the first terminal on the first conductor, and stamping the tab portion of the first conductor to produce a pocket portion, the pocket portion offset from at least one of a first and a second planar surface of the first conductor. The method also includes producing a tab portion at a location of the first terminal on the second conductor.

With reference now to FIG. 23, in accordance with embodiments of the present invention, a flow chart 2300 illustrates an embodiment of the present invention for soldering the first terminal of the first conductor to the first diode terminal in the method for fabricating a combined diode, lead assembly incorporating an expansion joint. At 2310, a basket is engaged with the first terminal of the first conductor. At 2320, a first solder slug is placed on the first terminal of the first conductor. The first solder slug may be selected from the group consisting of a solder perform and a solder paste. At 2330, the diode is placed on the first solder slug with the first diode terminal facing the first solder slug. At 2340, the diode is aligned in the basket with an alignment pin. At 2350, heat is applied sufficient to melt the first solder slug between the first terminal of the first conductor and the first diode terminal. At 2360, the first solder slug, the first terminal of the first conductor and the first diode terminal are cooled to form a first solder joint between the first terminal of the first conductor and the first diode terminal of the diode.

With reference now to FIG. 24, in accordance with embodiments of the present invention, a flow chart 2400 illustrates an embodiment of the present invention for soldering the first terminal of the second conductor to the second diode terminal in the method for fabricating a combined diode, lead assembly incorporating an expansion joint. At 2410, the diode is aligned in a basket with an alignment pin. At 2420, a second solder slug is placed on the second diode terminal. The first solder slug may be selected from the group consisting of a solder perform and a solder paste. At 2430, the first terminal of the second conductor is engaged with the basket. At 2440, the first terminal of the second conductor is placed on the second solder slug. At 2450, heat is applied sufficient to melt the second solder slug between the first terminal of the second conductor and the second diode terminal. At 2460, the second solder slug, the first terminal of the second conductor and the second diode terminal are cooled to form a second solder joint between the first terminal of the second conductor and the second diode terminal of the diode.

Sub-Section D: Physical Description of Embodiments of the Present Invention for a Solar-Cell Module Including Alternative Interconnecting-Conductors and a Combined Diode, Lead Assembly Incorporating Two Expansion Joints With reference now to FIG. 25A, in accordance with embodiments of the present invention, a plan view 2500A of solar-cell module 2501 is shown. The solar-cell module 2501 includes busbars, for example, busbars 2510 and 2514, configured as interconnecting-conductors and a combined diode, lead assembly, for example, combined diode, lead assembly 2530, incorporating two expansion joints. The solar-cell module 2501 includes a plurality of solar-cells electrically coupled together which may be disposed in a plurality of solar-cell sub-modules. The solar-cell module 2501 includes at least one solar-cell sub-module; but, as shown in FIG. 25A, solar-cell module 2501 includes, without limitation, at least solar-cell sub-modules 2501*a* and 2501*b*. Solar-cell sub-module 2501*a* includes a first group 2502 of solar cells 2502*a*, 2502*b* and 2502*c* and a second group 2504 of solar cells 2504*a*, 2504*b* and 2504*c*. The vertical striations on the solar cells shown in FIGS. 25A and 25B are indicative of interconnect assemblies used to interconnect solar cells of a solar-cell module, or sub-module, as described above for FIGS. 4A-4F, 5A-5C and 6A-6B. Solar-cell sub-module 2501*a* also includes a busbar 2512 that electrically couples the first group 2502 of solar cells 2502*a*, 2502*b* and 2502*c* with the second group 2504 of solar cells 2504*a*, 2504*b* and 2504*c*. The first group 2502, the second group 2504 and the busbar 2512 may be configured in a "U-shaped" arrangement so that the flow of electrical current flows down the first group 2502 as indicated by arrow 2520, flows through the busbar 2512 and flows up the second group 2504 as indicated by arrow 2522. As used herein with respect to FIGS. 25A and 25B, the terms "up" and "down" with respect to current flow are not meant to be limiting, but are chosen to aid in the discussion of FIGS. 25A and 25B so that embodiments of the present invention are not limited by the terms "up" and "down."

With further reference to FIG. 25A, in accordance with embodiments of the present invention, solar-cell sub-module 2501*b* similarly includes a first group 2506 of solar cells 2506*a*, 2506*b* and 2506*c* and a second group 2508 of solar cells 2508*a*, 2508*b* and 2508*c*. Solar-cell sub-module 2501*b* similarly includes a busbar 2516 that electrically couples the first group 2506 of solar cells 2506*a*, 2506*b* and 2506*c* with the second group 2508 of solar cells 2508*a*, 2508*b* and 2508*c*. The first group 2506, the second group 2508 and the busbar 2516 may be configured in a "U-shaped" arrangement so that the flow of electrical current flows down the first group 2506 as indicated by arrow 2524, flows through the busbar 2516 and flows up the second group 2508 as indicated by arrow 2526. As shown in FIG. 25A, the "U-shaped" arrangement includes six solar cells connected in a chain; but, the "U-shaped" arrangement is not limited to just six solar cells, because embodiments of the present invention are not limited to six solar cells as fewer or more than six solar cells are within the spirit and scope of embodiments of the present invention. The "U-shaped" arrangement of solar cells provides additional flexibility in selection of a form factor, or two-dimensional footprint, for design of a solar-cell module. Electrical interconnection of the solar-cell sub-modules 2501*a* and 2501*b* is provided by busbar 2514. Similarly, busbars 2510 and 2518 may provide electrical interconnection of the solar-cell sub-modules 2501*a* and 2501*b* with other solar-cell modules (not shown) that may be included in the solar-cell module 2501. In an embodiment of the present invention, the busbars 2510, 2514 and 2518 may be included as components of an in-laminate-diode assembly, in which the busbars 2510, 2514 and 2518 may be included as components of in-laminate-diode sub-assemblies included in the in-laminate-diode assembly, as next described.

With further reference to FIG. 25A, in accordance with embodiments of the present invention, the solar-cell module 2501 also includes an in-laminate-diode assembly electrically coupled with the plurality of solar cells 2502*a-c*, 2504*a-c*, 2506*a-c* and 2508*a-c*. The in-laminate-diode assembly is configured to prevent power loss, which may result from shading of a solar cell and other causes, as previously described. The in-laminate-diode assembly may further include at least one in-laminate-diode sub-assembly. The in-laminate-diode sub-assembly may further include a combined diode, lead assembly, for example, combined diode, lead assembly 2530, incorporating two expansion joints. In the following discussion of FIGS. 25A and 25B, it is useful to make reference to FIGS. 18A-18E, which is referred to illustrate in greater detail features common to both the combined diode, lead assembly 1802 of FIGS. 18A-18E and the combined diode, lead assemblies shown in FIGS. 25A and 25B. The combined diode, lead assembly 2530 includes a diode, similar to diode 1810. The diode has a first diode terminal and a second diode terminal, similar to first diode terminal 1814 and second diode terminal 1818. The combined diode, lead assembly 2530 further includes a first conductor 2532. The first conductor 2532 includes a first terminal 2532*a*. The first terminal 2532*a* of the first conductor 2532 is electrically coupled to the diode, similar to diode 1810, at the first diode terminal, similar to first diode terminal 1814. The first conductor 2532 includes a second terminal 2532*b*. The second terminal 2532*b* of the first conductor 2532 is configured as a first expansion joint. The first expansion joint is configured to electrically couple to a first interconnecting-conductor, which is configured to reduce a stress applied to the diode, similar to diode 1810. As described above, the solar-cell module 2501 includes at least one busbar, for example, at least one of busbars 2510, 2512, 2514, 2516 and 2518. As shown in FIG. 25A, busbar 2510 of the solar-cell module 2501 provides a first busbar configured as the first interconnecting-conductor, similar to first interconnecting-conductor 1850. As shown in FIG. 25A, without limitation thereto, a portion of busbar 2510 included in the in-laminate-diode sub-assembly that includes combined diode, lead assembly 2530 may interconnect with an adjacent in-laminate-diode sub-assembly (not shown), if additional solar-cell sub-modules are included in the solar-cell module 2501. Thus, the in-laminate-diode sub-assembly associated with the solar-cell sub-module 2501*a* may further include, without limitation thereto, the portion of the busbar 2510 electrically coupled with the interconnect assembly of solar cell 2502*a*.

With further reference to FIG. 25A, in accordance with embodiments of the present invention, the combined diode, lead assembly 2530 further includes a second conductor 2534. The second conductor 2534 includes a first terminal 2534a (not shown) indicated by an arrow, similar to first terminal 1860a. The first terminal 2534a of the second conductor 2534 is electrically coupled to the diode, similar to diode 1810, at the second diode terminal, similar to second diode terminal 1818. The second conductor 2534 also includes a second terminal 2534b. The second terminal 2534b of the second conductor 2534 is configured as a second expansion joint. The second expansion joint is configured to electrically couple to a second interconnecting-conductor, which is also configured to reduce a stress applied to the diode, similar to diode 1810. Busbar 2514 of the solar-cell module 2501 provides a second busbar configured as the second interconnecting-conductor, similar to second interconnecting-conductor 1870. As shown in FIG. 25A, without limitation thereto, a portion of busbar 2514 included in the in-laminate-diode sub-assembly that includes combined diode, lead assembly 2530 interconnects with the adjacent in-laminate-diode sub-assembly that includes combined diode, lead assembly 2540. Thus, the in-laminate-diode sub-assembly associated with the solar-cell sub-module 2501a may further include, without limitation thereto, the portion of the busbar 2514 electrically coupled with the interconnect assembly of solar cell 2504a. The in-laminate-diode sub-assembly may further include an electrically-insulating-laminate pad 2536 which prevents shorting of the combined diode, lead assembly 2530 at the edges of the busbars 2510 and 2514.

With further reference to FIG. 25A, in accordance with embodiments of the present invention, the in-laminate-diode assembly may include at least another in-laminate-diode sub-assembly. As shown in FIG. 25A, the other in-laminate-diode sub-assembly includes another combined diode, lead assembly, for example, combined diode, lead assembly 2540, incorporating two expansion joints. The combined diode, lead assembly 2540 includes a diode, similar to diode 1810. The diode has a first diode terminal and a second diode terminal, similar to first diode terminal 1814 and second diode terminal 1818. The combined diode, lead assembly 2540 further includes a first conductor 2542. The first conductor 2542 includes a first terminal 2542a. The first terminal 2542a of the first conductor 2542 is electrically coupled to the diode, similar to diode 1810, at the first diode terminal, similar to first diode terminal 1814. The first conductor 2542 includes a second terminal 2542b. The second terminal 2542b of the first conductor 2542 is configured as a first expansion joint. The first expansion joint is configured to electrically couple to a first interconnecting-conductor, which is configured to reduce a stress applied to the diode, similar to diode 1810. As shown in FIG. 25A, busbar 2514 of the solar-cell module 2501 also provides a first busbar configured as the first interconnecting-conductor, similar to first interconnecting-conductor 1850. As shown in FIG. 25A, without limitation thereto, a portion of busbar 2514 included in the in-laminate-diode sub-assembly that includes combined diode, lead assembly 2540 may interconnect with the adjacent in-laminate-diode sub-assembly that includes combined diode, lead assembly 2530. Thus, the in-laminate-diode sub-assembly associated with the solar-cell sub-module 2501b may further include, without limitation thereto, the portion of the busbar 2514 electrically coupled with the interconnect assembly of solar cell 2506a. Busbar 2514 serves a dual function, because a portion of busbar 2514 electrically coupled and in contact with the second conductor 2534 of combined diode, lead assembly 2530 provides the second busbar configured as the second interconnecting-conductor to combined diode, lead assembly 2530 and a portion of busbar 2514 electrically coupled and in contact with the first conductor 2542 of combined diode, lead assembly 2540 provides the first busbar configured as the first interconnecting-conductor to combined diode, lead assembly 2540. Busbars 2510 and 2518 may also serve similar dual functions as both first and second busbars if additional solar-cell sub-modules are present in solar-cell module 2501.

With further reference to FIG. 25A, in accordance with embodiments of the present invention, the combined diode, lead assembly 2540 further includes a second conductor 2544. The second conductor 2544 includes a first terminal 2544a (not shown) indicated by an arrow, similar to first terminal 1860a. The first terminal 2544a of the second conductor 2544 is electrically coupled to the diode, similar to diode 1810, at the second diode terminal, similar to second diode terminal 1818. The second conductor 2544 also includes a second terminal 2544b. The second terminal 2544b of the second conductor 2544 is configured as a second expansion joint. The second expansion joint is configured to electrically couple to a second interconnecting-conductor, which is also configured to reduce a stress applied to the diode, similar to diode 1810. Busbar 2518 of the solar-cell module 2501 provides a second busbar configured as the second interconnecting-conductor, similar to second interconnecting-conductor 1870. As shown in FIG. 25A, without limitation thereto, a portion of busbar 2518 included in the in-laminate-diode sub-assembly that includes combined diode, lead assembly 2540 may interconnect with an adjacent in-laminate-diode sub-assembly (not shown), if additional solar-cell sub-modules are included in the solar-cell module 2501. Thus, the in-laminate-diode sub-assembly associated with the solar-cell sub-module 2501b may further include, without limitation thereto, the portion of the busbar 2518 electrically coupled with the interconnect assembly of solar cell 2508a. The in-laminate-diode sub-assembly may further include an electrically-insulating-laminate pad 2546 which prevents shorting of the combined diode, lead assembly 2540 at the edges of the busbars 2514 and 2518.

As is next described in the discussion of FIG. 25B, alternative embodiments of present invention also include a first interconnect assembly between solar cells configured as the first interconnecting-conductor and a second interconnect assembly between solar cells configured as the second interconnecting-conductor. However, embodiments of the present invention are not limited to a busbar configured as an interconnecting-conductor between combined diode, lead assemblies, or an interconnect assembly between solar cells configured as an interconnecting-conductor, as the use of an electrically conductive laminate, for example, similar to interconnecting-conductor 2070 of FIG. 20, is also within the spirit and scope of embodiments of the present invention. Thus, the interconnecting-conductor may be selected from members of the group consisting of a busbar, an interconnect assembly and an electrically conductive laminate strip, for example, similar to interconnecting-conductor 2070 of FIG. 20. As used herein in the discussion of FIGS. 25A and 25B, the term "interconnect assembly" may be selected from the members of the group consisting of an interconnect assembly between solar cells, for example, similar to interconnect assembly 420 of FIGS. 4A-4F as described above, and an integrated solar-cell, current collector between a solar cell and a busbar, for example, similar to integrated solar-cell, current collector 670 of integrated busbar-solar-cell-current collector 690 of FIGS. 6A and 6B as described above.

With reference now to FIG. 25B, in accordance with embodiments of the present invention, a plan view 2500B of solar-cell module 2551 is shown. The solar-cell module 2551 includes busbars, for example, busbars 2560 and 2564, configured as interconnecting-conductors and a combined diode, lead assembly, for example, combined diode, lead assembly 2580, incorporating two expansion joints. The solar-cell module 2551 includes a plurality of solar-cells electrically coupled together which may be disposed in a plurality of solar-cell sub-modules. The solar-cell module 2551 includes at least one solar-cell sub-module; but, as shown in FIG. 25A, solar-cell module 2551 includes, without limitation, at least solar-cell sub-modules 2551a and 2551b. Solar-cell sub-module 2551a includes a first group 2552 of solar cells 2552a, 2552b and 2552c and a second group 2554 of solar cells 2554a, 2554b and 2554c. Solar-cell sub-module 2551a also includes a busbar 2562 that electrically couples the first group 2552 of solar cells 2552a, 2552b and 2552c with the second group 2554 of solar cells 2554a, 2554b and 2554c. The first group 2552, the second group 2554 and the busbar 2562 may be configured in a "U-shaped" arrangement so that the flow of electrical current flows down the first group 2552 as indicated by arrow 2570, flows through the busbar 2562 and flows up the second group 2554 as indicated by arrow 2572.

With further reference to FIG. 25B, in accordance with embodiments of the present invention, solar-cell sub-module 2551b similarly includes a first group 2556 of solar cells 2556a, 2556b and 2556c and a second group 2558 of solar cells 2558a, 2558b and 2558c. Solar-cell sub-module 2551b similarly includes a busbar 2566 that electrically couples the first group 2556 of solar cells 2556a, 2556b and 2556c with the second group 2558 of solar cells 2558a, 2558b and 2558c. The first group 2556, the second group 2558 and a busbar 2566 may be configured in a "U-shaped" arrangement so that the flow of electrical current flows down the first group 2556 as indicated by arrow 2574, flows through the busbar 2566 and flows up the second group 2558 as indicated by arrow 2576. Electrical interconnection of the solar-cell sub-modules 2551a and 2551b is provided by busbar 2564. Similarly, busbars 2560 and 2568 may provide electrical interconnection of the solar-cell sub-modules 2551a and 2551b with other solar-cell modules (not shown) that may be included in the solar-cell module 2551. In an embodiment of the present invention, the busbars 2560, 2562, 2564, 2566 and 2568 are included as components of the solar-cell module 2551.

With further reference to FIG. 25B, in accordance with embodiments of the present invention, the solar-cell module 2551 also includes an in-laminate-diode assembly electrically coupled with the plurality of solar cells 2552a-c, 2554a-c, 2556a-c and 2558a-c. The in-laminate-diode assembly is configured to prevent power loss, which may result from shading of a solar cell and other causes, as previously described. The in-laminate-diode assembly may further include at least one in-laminate-diode sub-assembly. The in-laminate-diode sub-assembly may further include a combined diode, lead assembly, for example, combined diode, lead assembly 2580, incorporating two expansion joints. The combined diode, lead assembly 2580 includes a diode, similar to diode 1810. The diode has a first diode terminal and a second diode terminal, similar to first diode terminal 1814 and second diode terminal 1818. The combined diode, lead assembly 2580 further includes a first conductor 2582. The first conductor 2582 includes a first terminal 2582a. The first terminal 2582a of the first conductor 2582 is electrically coupled to the diode, similar to diode 1810, at the first diode terminal, similar to first diode terminal 1814. The first conductor 2582 also includes a second terminal 2582b. The second terminal 2582b of the first conductor 2582 is configured as a first expansion joint. The first expansion joint is configured to electrically couple to a first interconnecting-conductor, which is configured to reduce a stress applied to the diode, similar to diode 1810. Solar cells of the solar-cell module 2551 are interconnected with one another by interconnect assemblies, as described above. As shown in FIG. 25B, the interconnect assembly of solar cell 2552a provides a first interconnect assembly configured as the first interconnecting-conductor, similar to first interconnecting-conductor 1850. As shown in FIG. 25B, without limitation thereto, some of the function of the first interconnecting-conductor is also provided by busbar 2560, which is connected electrically in series with the interconnect assembly of solar cell 2552a and may interconnect with an adjacent interconnect assembly (not shown) if additional solar-cell sub-modules are included in the solar-cell module 2551. Thus, the in-laminate-diode sub-assembly associated with the solar-cell sub-module 2551a may further include, without limitation thereto, the interconnect assembly of solar cell 2552a and the portion of the busbar 2560 electrically coupled with the interconnect assembly of solar cell 2552a.

With further reference to FIG. 25B, in accordance with embodiments of the present invention, the combined diode, lead assembly 2580 further includes a second conductor 2584. The second conductor 2584 includes a first terminal 2584a (not shown) indicated by an arrow, similar to first terminal 1860a. The first terminal 2584a of the second conductor 2584 is electrically coupled to the diode, similar to diode 1810, at the second diode terminal, similar to second diode terminal 1818. The second conductor 2584 also includes a second terminal 2584b. The second terminal 2584b of the second conductor 2584 is configured as a second expansion joint. The second expansion joint is configured to electrically couple to a second interconnecting-conductor, which is also configured to reduce a stress applied to the diode, similar to diode 1810. As shown in FIG. 25B, the interconnect assembly of solar cell 2554a provides a second interconnect assembly configured as the second interconnecting-conductor, similar to second interconnecting-conductor 1870. As shown in FIG. 25B, without limitation thereto, some of the function of the second interconnecting-conductor is also provided by busbar 2564, which is connected electrically in series with the interconnect assembly of solar cell 2554a and interconnects with the adjacent interconnect assembly 2556a. Thus, the in-laminate-diode sub-assembly associated with the solar-cell sub-module 2551a may further include, without limitation thereto, the interconnect assembly of solar cell 2554a and the portion of the busbar 2564 electrically coupled with the interconnect assembly of solar cell 2552a. The in-laminate-diode sub-assembly may further include an electrically-insulating-laminate pad 2586 which prevents shorting of the combined diode, lead assembly 2580 at the edges of the solar cells 2552a and 2554a.

With further reference to FIG. 25B, in accordance with embodiments of the present invention, the in-laminate-diode assembly may include at least another in-laminate-diode sub-assembly. As shown in FIG. 25B, the other in-laminate-diode sub-assembly includes another combined diode, lead assembly, for example, combined diode, lead assembly 2590, incorporating two expansion joints. The combined diode, lead assembly 2590 includes a diode, similar to diode 1810. The diode has a first diode terminal and a second diode terminal, similar to first diode terminal 1814 and second diode terminal 1818. The combined diode, lead assembly 2590 further includes a first conductor 2592. The first conductor 2592 includes a first terminal 2592*a*. The first terminal 2592*a* of the first conductor 2592 is electrically coupled to the diode, similar to diode 1810, at the first diode terminal, similar to first diode terminal 1814. The first conductor 2592 includes a second terminal 2592*b*. The second terminal 2592*b* of the first conductor 2592 is configured as a first expansion joint. The first expansion joint is configured to electrically couple to a first interconnecting-conductor, which is configured to reduce a stress applied to the diode, similar to diode 1810. As shown in FIG. 25B, the interconnect assembly of solar cell 2556*a* provides a first interconnect assembly configured as the first interconnecting-conductor, similar to first interconnecting-conductor 1850. As shown in FIG. 25B, without limitation thereto, some of the function of the first interconnecting-conductor is also provided by busbar 2564, which is connected electrically in series with the interconnect assembly of solar cell 2556*a* and interconnects with the adjacent interconnect assembly 2554*a*. Thus, the in-laminate-diode sub-assembly associated with the solar-cell sub-module 2551*b* may further include, without limitation thereto, the interconnect assembly of solar cell 2556*a* and the portion of the busbar 2564 electrically coupled with the interconnect assembly of solar cell 2556*a*. Busbar 2564 serves a dual function, because a portion of busbar 2564 electrically coupled and in contact with the interconnect assembly of solar cell 2554*a* electrically coupled with combined diode, lead assembly 2580 provides some of the function of the second interconnecting-conductor to combined diode, lead assembly 2580 and a portion of busbar 2564 electrically coupled and in contact with the interconnect assembly of solar cell 2556*a* electrically coupled with combined diode, lead assembly 2590 provides some of the function of the first interconnecting-conductor to combined diode, lead assembly 2590. Busbars 2560 and 2568 may also serve similar dual functions if additional solar-cell sub-modules are present in solar-cell module 2551.

With further reference to FIG. 25B, in accordance with embodiments of the present invention, the combined diode, lead assembly 2590 further includes a second conductor 2594. The second conductor 2594 includes a first terminal 2594*a* (not shown) indicated by an arrow, similar to first terminal 1860*a*. The first terminal 2594*a* of the second conductor 2594 is electrically coupled to the diode, similar to diode 1810, at the second diode terminal, similar to second diode terminal 1818. The second conductor 2594 also includes a second terminal 2594*b*. The second terminal 2594*b* of the second conductor 2594 is configured as a second expansion joint. The second expansion joint is configured to electrically couple to a second interconnecting-conductor, which is also configured to reduce a stress applied to the diode, similar to diode 1810. As shown in FIG. 25B, the interconnect assembly of solar cell 2558*a* provides a second interconnect assembly configured as the second interconnecting-conductor, similar to second interconnecting-conductor 1870. As shown in FIG. 25B, without limitation thereto, some of the function of the second interconnecting-conductor is also provided by busbar 2568, which is connected electrically in series with the interconnect assembly of solar cell 2558*a* and may interconnect with an adjacent interconnect assembly (not shown) if additional solar-cell sub-modules are included in the solar-cell module 2551. Thus, the in-laminate-diode sub-assembly associated with the solar-cell sub-module 2551*b* may further include, without limitation thereto, the interconnect assembly of solar cell 2558*a* and the portion of the busbar 2568 electrically coupled with the interconnect assembly of solar cell 2558*a*. The in-laminate-diode sub-assembly may further include an electrically-insulating-laminate pad 2596 which prevents shorting of the combined diode, lead assembly 2590 at the edges of the solar cells 2556*a* and 2558*a*.

With further reference to FIGS. 25A and 25B and as previously described for FIGS. 18A-18E, in accordance with embodiments of the present invention, the first and second expansion joints, for example, second terminal 2532*b* of first conductor 2532 and second terminal 2534*b* of second conductor 2534 of the combined diode, lead assembly 2530, respectively, or second terminal 2582*b* of first conductor 2582 and second terminal 2584*b* of second conductor 2584 of the combined diode, lead assembly 2580, respectively, are configured to protect the diode, similar to diode 1810, from application of a stress to the diode sufficient to fracture the diode. In the absence of expansion joints designed to relieve stress, such fracture stress might be exerted on the diode by conductors attached to the diode at the diode's die-attachment surfaces, as previously described in the discussion of FIGS. 18A-18E. The first expansion joint, for example, second terminal 2532*b* of first conductor 2532, or second terminal 2582*b* of first conductor 2582, is configured to provide a sliding contact in communication with the first interconnecting-conductor, for example, busbar 2510 of solar cell module 2501, or the interconnect assembly of solar cell 2552*a* of solar-cell module 2551, respectively. The second expansion joint, for example, second terminal 2534*b* of second conductor 2534, or second terminal 2584*b* of second conductor 2584, is configured to provide a sliding contact in communication with the second interconnecting-conductor, for example, busbar 2514 of solar cell module 2501, or the interconnect assembly of solar cell 2554*a* of solar-cell module 2551, respectively. The first expansion joint, for example, second terminal 2532*b* of first conductor 2532, or second terminal 2582*b* of first conductor 2582, is configured as a portion of a first lap joint, similar to the first lap joint shown in FIG. 18D. The second expansion joint, for example, second terminal 2534*b* of second conductor 2534, or second terminal 2584*b* of second conductor 2584, is configured as a portion of a second lap joint, similar to the second lap joint shown in FIG. 18E.

With further reference to FIGS. 25A and 25B and as previously described for FIGS. 18A-18E, in accordance with embodiments of the present invention, the first expansion joint of the first conductor, for example, second terminal 2532*b* of first conductor 2532, or second terminal 2582*b* of first conductor 2582, further includes a first planar strip portion; the first planar strip portion has a first planar surface and a second planar surface substantially parallel to the first planar surface, similar to the first planar strip portion shown in FIG. 18D; at least one of the first and second planar surfaces of the first planar strip portion, similar to the first planar strip portion shown in FIG. 18D, is configured to provide a sliding contact in communication with the first interconnecting-conductor, for example, busbar 2510 of solar cell module 2501, or the interconnect assembly of solar cell 2552*a* of solar-cell module 2551, respectively. The first terminal of the first conductor, for example, first terminal 2532*a* of first conductor 2532, or first terminal 2582*a* of first conductor 2582, further includes a pocket portion electrically coupled to the diode, similar to diode 1810, at the first diode terminal, similar to first diode terminal 1814; the pocket portion is offset from at least one of the first and second planar surfaces, similar to the first and second planar surfaces 1832 and 1834 of the first planar strip portion shown in FIG. 18D. The pocket portion is configured to reduce a bending load applied to the diode, similar to diode 1810. The first terminal of the first conductor, for example, first terminal 2532*a* of first conductor 2532, or first terminal 2582a of first conductor 2582, further includes an alignment hole, similar to alignment hole 1840, that is configured to accept an alignment pin, similar to alignment pin 1844, for aligning the diode, similar to diode 1810, within the pocket portion of the first terminal of the first conductor in forming a joint between the diode and the first terminal of the first conductor. The first terminal of the first conductor, for example, first terminal 2532a of first conductor 2532, or first terminal 2582a of first conductor 2582, further includes a first recessed portion, similar to first recessed portion 1838, configured to control an outflow of solder from within a first solder joint, similar to first solder joint 1880, formed between the first diode terminal, similar to first diode terminal 1814, of the diode, similar to diode 1810, and the first terminal of the first conductor, for example, first terminal 2532a of first conductor 2532, or first terminal 2582a of first conductor 2582.

With further reference to FIGS. 25A and 25B and as previously described for FIGS. 18A-18E, in accordance with embodiments of the present invention, the second expansion joint of the second conductor, for example, second terminal 2534b of second conductor 2534, or second terminal 2584b of second conductor 2584, further includes a second planar strip portion; the second planar strip portion has a first planar surface and a second planar surface substantially parallel to the first planar surface, similar to the first planar strip portion shown in FIG. 18E; at least one of the first and second planar surfaces of the second planar strip portion, similar to the first planar strip portion shown in FIG. 18E, is configured to provide a sliding contact in communication with the second interconnecting-conductor, for example, busbar 2514 of solar cell module 2501, or the interconnect assembly of solar cell 2554a of solar-cell module 2551, respectively. The first terminal of the second conductor, for example, first terminal 2534a of second conductor 2534, or first terminal 2584a of second conductor 2584, further includes a tab portion electrically coupled to the diode, similar to diode 1810, at the second diode terminal, similar to second diode terminal 1818. The tab portion is configured to reduce a bending load applied to the diode, similar to diode 1810, as previously described for FIGS. 18A-18E. The first terminal of the second conductor, for example, first terminal 2534a of second conductor 2534, or first terminal 2584a of second conductor 2584, further includes a second recessed portion, similar to second recessed portion 1868, configured to control an outflow of solder from within a second solder joint, similar to second solder joint 1884, formed between the second diode terminal, similar to second diode terminal 1818, of the diode, similar to diode 1810, and the first terminal of the second conductor, for example, first terminal 2534a of second conductor 2534, or first terminal 2584a of second conductor 2584.

Sub-Section E: Physical Description of Embodiments of the Present Invention for a Solar-Cell Module Including a Combined Diode, Lead Assembly Incorporating an Expansion Joint and an Integrated Interconnection-Conductor With reference now to FIG. 26A, in accordance with embodiments of the present invention, a plan view 2600A of an example arrangement of a combined diode, lead assembly 2610 incorporating an expansion joint and an integrated interconnecting-conductor is shown. The combined diode, lead assembly 2610 incorporating an expansion joint and an integrated interconnecting-conductor is utilized in the solar-cell module 2601 shown in FIG. 26D. For purposes of the following discussion of FIGS. 26A-26D, reference will be made to FIGS. 19A and 19B, which illustrate in greater detail features that are shown in FIG. 19A, but not shown in FIG. 26B, that are common to both the combined diode, lead assembly 1902 of FIG. 19A and a combined diode, lead assembly 2630 of FIG. 26B, as well as features that are shown in FIG. 19B, but not shown in FIG. 26A, that are common to both the combined diode, lead assembly 1904 of FIG. 19B and the combined diode, lead assembly 2610 of FIG. 26A. Reference also will be made to FIG. 18C-18E for other details not shown in FIGS. 19A and 19B and FIGS. 26A-26D. Because of the elongated form of the integrated interconnecting-conductors of the combined diode, lead assemblies of FIGS. 26A and 26B, the inventors have coined the term of art "extended bow-tie" to figuratively describe the appearance and function of the combined diode, lead assemblies incorporating an expansion joint and an integrated interconnecting-conductor of FIGS. 26A and 26B. Thus, the term of art "extended bow-tie" may also be used for embodiments of the present invention appearing in FIGS. 19A and 19B previously described.

Figure 26A:
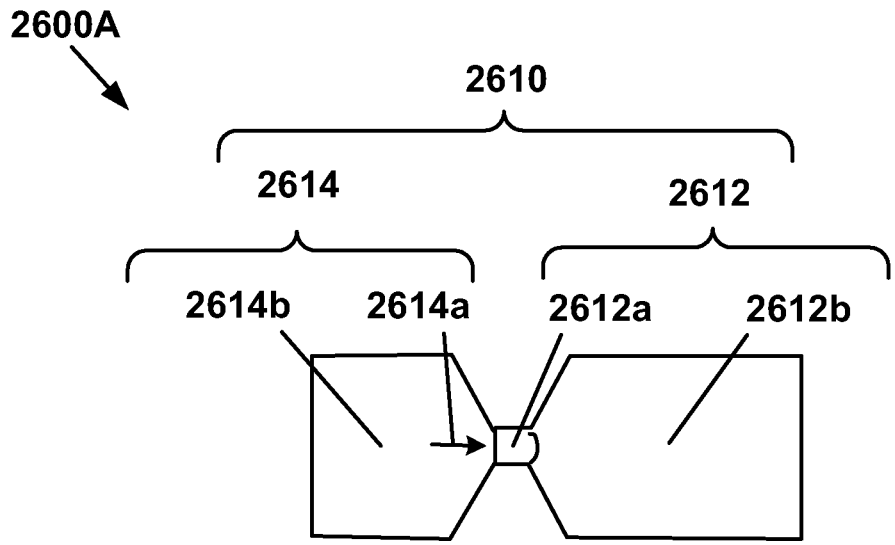
FIG. 26A is a plan view of one example arrangement of a combined diode, lead assembly incorporating an expansion joint and an integrated interconnecting-conductor that is utilized in the solar-cell module shown in FIG. 26D, in accordance with an embodiment of the present invention.

With further reference to FIG. 26A, in accordance with embodiments of the present invention, the combined diode, lead assembly 2610 includes a diode, similar to electrical device 1915. The diode, similar to diode 1810 of FIG. 18C, has a first diode terminal and a second diode terminal, similar to first diode terminal 1814 and second diode terminal 1818, respectively, of FIG. 18C. The combined diode, lead assembly 2610 further includes a first conductor 2612, similar to conductor 1931. The first conductor 2612 includes a first terminal 2612a, similar to first terminal 1931a of the conductor 1931. The first terminal 2612a of the first conductor 2612 is electrically coupled to the diode, similar to electrical device 1915, at the first diode terminal, similar to first diode terminal 1814. The first conductor 2612 includes a second terminal 2612b, similar to second terminal 1931b of the conductor 1931. The second terminal 2612b of the first conductor 2612 is configured as the integrated interconnecting-conductor. The integrated interconnecting-conductor, the second terminal 2612b of the first conductor 2612, is configured as an interconnecting-conductor, similar to the interconnecting-conductor 1970 configured to provide a stationary contact in communication with the sliding contact of the expansion joint shown in FIG. 19B, of a second terminal of a second conductor of an adjacent combined diode, lead assembly, for example, second terminal 2620b of second conductor 2620 of combined diode, lead assembly 2616 shown in FIG. 26D. The integrated interconnecting-conductor, the second terminal 2612b of the first conductor 2612, may be configured as a bottom portion of a lap joint, similar to the second interconnecting-conductor 1870 shown in FIG. 18E, and as shown in FIG. 26D. The first terminal 2612a of the first conductor 2612 further includes a first recessed portion, similar to first recessed portion 1838, that is configured to control an outflow of solder from within a first solder joint, similar to first solder joint 1880, formed between the first diode terminal, similar to first diode terminal 1814, of the diode, similar to diode 1810, and the first terminal 2612a of the first conductor 2612.

With further reference to FIG. 26A, in accordance with embodiments of the present invention, the combined diode, lead assembly 2610 further includes a second conductor 2614. The second conductor 2614 includes a first terminal 2614a (not shown) indicated by an arrow, similar to first terminal 1960a of the second conductor 1960. The first terminal 2614a of the second conductor 2614 is electrically coupled to the diode, similar to electrical device 1915, at the second diode terminal, similar to second diode terminal 1818. The second conductor 2614 also includes a second terminal 2614b. The second terminal 2614b of the second conductor 2614 is configured as an expansion joint. The expansion joint is configured to electrically couple to an interconnecting-conductor, which is also configured to reduce a stress applied to the diode, similar to electrical device 1915. As shown in FIG. 26D, the interconnecting-conductor includes, without limitation thereto, the integrated interconnecting-conductor, second terminal 2606b of first conductor 2606, of the adjacent combined diode, lead assembly 2604. Moreover, the interconnecting-conductor may be selected from members of the group consisting of the integrated interconnecting-conductor, a busbar, an interconnect assembly and an electrically conductive laminate strip, for example, similar to interconnecting-conductor 2070 of FIG. 20. As used herein in the discussion of FIGS. 26A-26D, the term "interconnect assembly" refers to members that may be selected from members of the group consisting of an interconnect assembly between solar cells, for example, similar to interconnect assembly 420 of FIGS. 4A-4F as described above, and an integrated solar-cell, current collector between a solar cell and a busbar, for example, similar to integrated solar-cell, current collector 670 of integrated busbar-solar-cell-current collector 690 of FIGS. 6A and 6B as described above. In addition, the first terminal 2614a of the second conductor 2614 further includes a second recessed portion, similar to second recessed portion 1868, that is configured to control an outflow of solder from within a second solder joint, similar to second solder joint 1884, formed between the second diode terminal, similar to second diode terminal 1818, of the diode, similar to diode 1810, and the first terminal 2614a of the second conductor 2614.

With further reference to FIG. 26A, in accordance with embodiments of the present invention, the expansion joint, the second terminal 2614b of the second conductor 2614, is configured to provide a sliding contact in communication with the interconnecting-conductor, for example, the integrated interconnecting-conductor, second terminal 2606b of first conductor 2606, of adjacent combined diode, lead assembly 2604 of the solar-cell module 2601 of FIG. 26D. The expansion joint, the second terminal 2614b of the second conductor 2614, is configured as a portion of a lap joint, similar to the second lap joint shown in FIG. 18E. The expansion joint of the second conductor 2614, the second terminal 2614b of the second conductor 2614, further includes a second planar strip portion, similar to the second planar strip portion shown in FIG. 18E; the second planar strip portion has a first planar surface, similar to first planar surface 1862, and a second planar surface, similar to second planar surface 1864, substantially parallel to the first planar surface, similar to the first planar surface 1862 shown in FIG. 18E; at least one of the first and second planar surfaces of the first planar strip portion is configured to provide a sliding contact in communication with the interconnecting-conductor, for example, the integrated interconnecting-conductor of adjacent combined diode, lead assembly 2604 of the solar-cell module 2601. The second terminal 2612b of the first conductor 2612 further includes a first planar strip portion, similar to the first planar strip portion shown in FIG. 18D; the first planar strip portion also has a first planar surface, similar to first planar surface 1832, and a second planar surface, similar to second planar surface 1834, substantially parallel to the first planar surface, similar to the first planar surface 1832 shown in FIG. 18D. The first terminal 2612a of the first conductor 2612 further includes a pocket portion electrically coupled to the diode, similar to diode 1810, at the first diode terminal, similar to first diode terminal 1814. The pocket portion is offset from at least one of the first and second planar surfaces of the second terminal 2612b of the first conductor 2612. The pocket portion is configured to reduce a bending load applied to the diode, similar to diode 1810. The first terminal 2612a of the first conductor 2612 further includes an alignment hole, similar to alignment hole 1941, configured to accept an alignment pin, similar to alignment pin 1844, for aligning the diode, similar to electrical device 1915, within the pocket portion of the first terminal 2612a of the first conductor 2612 in forming a joint between the diode, similar to electrical device 1915, and the first terminal 2612a of the first conductor 2612. The first terminal 2614a of the second conductor 2614 further includes a tab portion electrically coupled to the diode, similar to diode 1810, at the second diode terminal, similar to second diode terminal 1818; the tab portion is configured to reduce a bending load applied to the diode, similar to diode 1810.

Figure 26B:
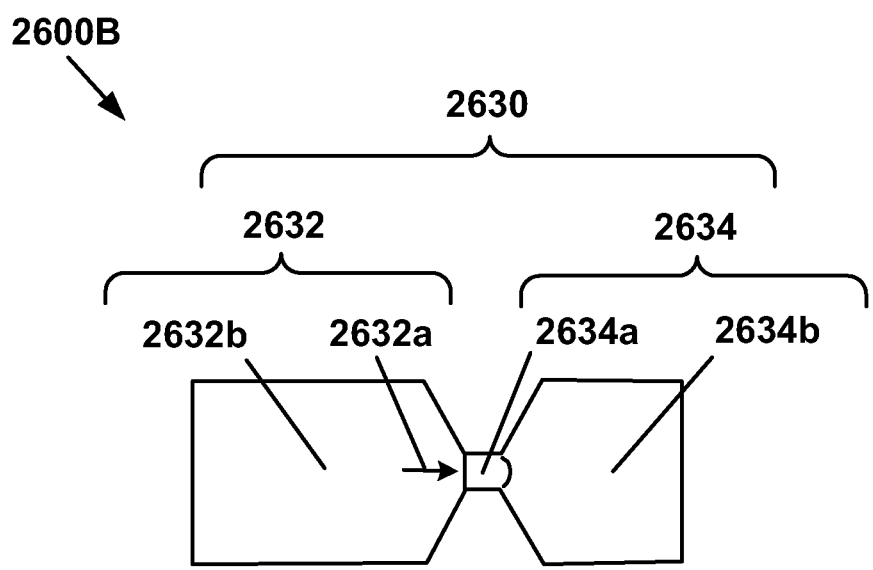
FIG. 26B is a plan view of an alternative example arrangement of a combined diode, lead assembly incorporating an expansion joint and an integrated interconnecting-conductor that may be utilized in the solar-cell module shown in FIG. 26D, in accordance with an embodiment of the present invention.

With reference now to FIG. 26B, in accordance with embodiments of the present invention, a plan view 2600B of an alternative example arrangement of the combined diode, lead assembly 2630 incorporating an expansion joint and an integrated interconnecting-conductor is shown. In the alternative, the combined diode, lead assembly 2630 incorporating an expansion joint and an integrated interconnecting-conductor may be utilized in a solar-cell module, similar to solar-cell module 2601. The combined diode, lead assembly 2630 includes a diode, similar to electrical device 1910. The diode, similar to diode 1810 of FIG. 18C, has a first diode terminal and a second diode terminal, similar to second diode terminal 1818 and first diode terminal 1814, respectively, of FIG. 18C. The combined diode, lead assembly 2630 further includes a first conductor 2632, similar to conductor 1961. The first conductor 2632 includes a first terminal 2632a (not shown) indicated by an arrow, similar to first terminal 1961a of the conductor 1961. The first terminal 2632a of the first conductor 2632 is electrically coupled to the diode, similar to electrical device 1910, at the first diode terminal, similar to second diode terminal 1818. The first conductor 2632 includes a second terminal 2632b, similar to second terminal 1961b of the conductor 1961. The second terminal 2632b of the first conductor 2632 is configured as the integrated interconnecting-conductor. The integrated interconnecting-conductor, the second terminal 2632b of the first conductor 2632, is configured as an interconnecting-conductor, similar to the interconnecting-conductor 1950 configured to provide a stationary contact in communication with the sliding contact of the expansion joint shown in FIG. 19A, of a second terminal of a second conductor of an adjacent combined diode, lead assembly of a solar-cell module, similar to solar-cell module 2601. The integrated interconnecting-conductor, the second terminal 2632b of the first conductor 2632, may be configured as a bottom portion of a lap joint, similar to the first interconnecting-conductor 1850 shown in FIG. 18D. The first terminal 2632a of the first conductor 2632 further includes a first recessed portion, similar to second recessed portion 1868, that is configured to control an outflow of solder from within a first solder joint, similar to second solder joint 1884, formed between the first diode terminal, similar to second diode terminal 1818, of the diode, similar to diode 1810, and the first terminal 2632a of the first conductor 2632.

With further reference to FIG. 26B, in accordance with embodiments of the present invention, the combined diode, lead assembly 2630 further includes a second conductor 2634. The second conductor 2634 includes a first terminal 2634a, similar to first terminal 1930a of the conductor 1930. The first terminal 2634a of the second conductor 2634 is electrically coupled to the diode, similar to electrical device 1910, at the second diode terminal, similar to first diode terminal 1814. The second conductor 2634 also includes a second terminal 2634b. The second terminal 2634b of the second conductor 2634 is configured as an expansion joint. The expansion joint is configured to electrically couple to an interconnecting-conductor, which is also configured to reduce a stress applied to the diode, similar to electrical device 1910. The interconnecting-conductor may include, without limitation thereto, an integrated interconnecting-conductor of an adjacent combined diode, lead assembly of a solar-cell module, similar to solar-cell module 2601. Moreover, the interconnecting-conductor may be selected from members of the group consisting of the integrated interconnecting-conductor, a busbar, an interconnect assembly and an electrically conductive laminate strip, for example, similar to interconnecting-conductor 2070 of FIG. 20. In addition, the first terminal 2634*a* of the second conductor 2634 further includes a second recessed portion, similar to first recessed portion 1838, that is configured to control an outflow of solder from within a second solder joint, similar to first solder joint 1880, formed between the second diode terminal, similar to first diode terminal 1814, of the diode, similar to diode 1810, and the first terminal 2634*a* of the second conductor 2634.

With further reference to FIG. 26B, in accordance with embodiments of the present invention, the expansion joint, the second terminal 2634*b* of the second conductor 2634, is configured to provide a sliding contact in communication with the interconnecting-conductor, for example, an integrated interconnecting-conductor of an adjacent combined diode, lead assembly. The expansion joint, the second terminal 2634*b* of the second conductor 2634, is configured as a portion of a lap joint, similar to the first lap joint shown in FIG. 18D. The expansion joint of the second conductor 2634, the second terminal 2634*b* of the second conductor 2634, further includes a second planar strip portion, similar to the first planar strip portion shown in FIG. 18D; the second planar strip portion has a first planar surface, similar to first planar surface 1832, and a second planar surface, similar to second planar surface 1834, substantially parallel to the first planar surface, similar to the first planar surface 1832 shown in FIG. 18D; at least one of the first and second planar surfaces of the first planar strip portion is configured to provide a sliding contact in communication with the interconnecting-conductor, for example, an integrated interconnecting-conductor of adjacent combined diode, lead assembly. The second terminal 2632*b* of the first conductor 2632 further includes a first planar strip portion, similar to the second planar strip portion shown in FIG. 18E; the first planar strip portion also has a first planar surface, similar to first planar surface 1872, and a second planar surface, similar to second planar surface 1874, substantially parallel to the first planar surface, similar to the first planar surface 1872 shown in FIG. 18E. The first terminal 2634*a* of the second conductor 2634 further includes a pocket portion electrically coupled to the diode, similar to diode 1810, at the second diode terminal, similar to first diode terminal 1814. The pocket portion is offset from at least one of the first and second planar surfaces of the second terminal 2634*b* of the second conductor 2634. The pocket portion is configured to reduce a bending load applied to the diode, similar to diode 1810. The first terminal 2634*a* of the second conductor 2634 further includes an alignment hole, similar to alignment hole 1940, configured to accept an alignment pin, similar to alignment pin 1844, for aligning the diode, similar to electrical device 1910, within the pocket portion of the first terminal 2634*a* of the second conductor 2634 in forming a joint between the diode, similar to electrical device 1910, and the first terminal 2634*a* of the second conductor 2634. The first terminal 2632*a* of the first conductor 2632 further includes a tab portion electrically coupled to the diode, similar to diode 1810, at the first diode terminal, similar to second diode terminal 1818; the tab portion is configured to reduce a bending load applied to the diode, similar to diode 1810.

Figure 26C:
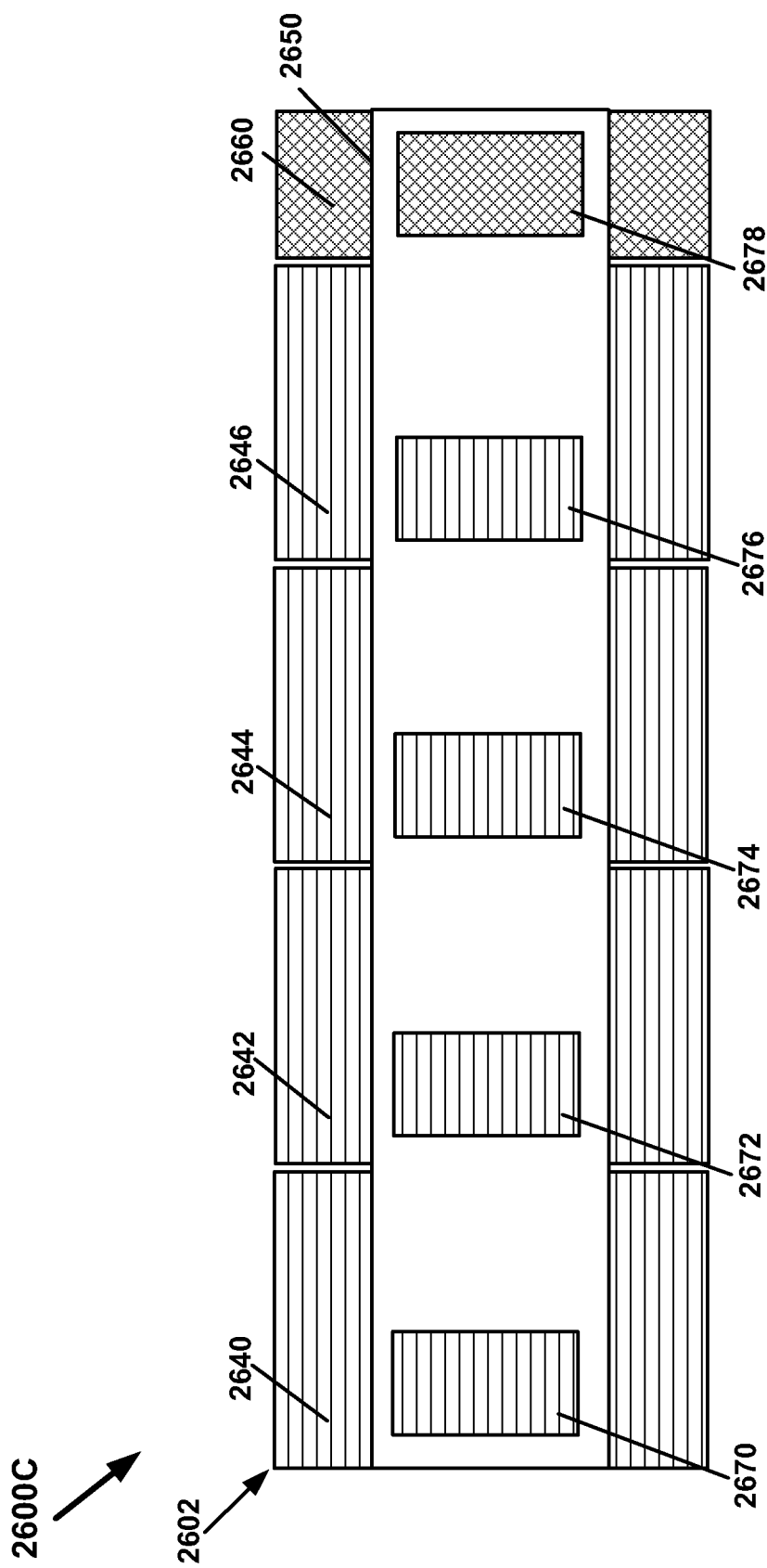
FIG. 26C is a plan view of the solar-cell module shown in FIG. 26D in a partially assembled state detailing the arrangement of at least one access region in an electrically-insulating-laminate strip through which a conductor of a combined diode, lead assembly incorporating an expansion joint and an integrated interconnecting-conductor electrically couples with the back side of at least one solar cell in the solar-cell module shown in FIG. 26D, in accordance with an embodiment of the present invention.
Figure 26D:
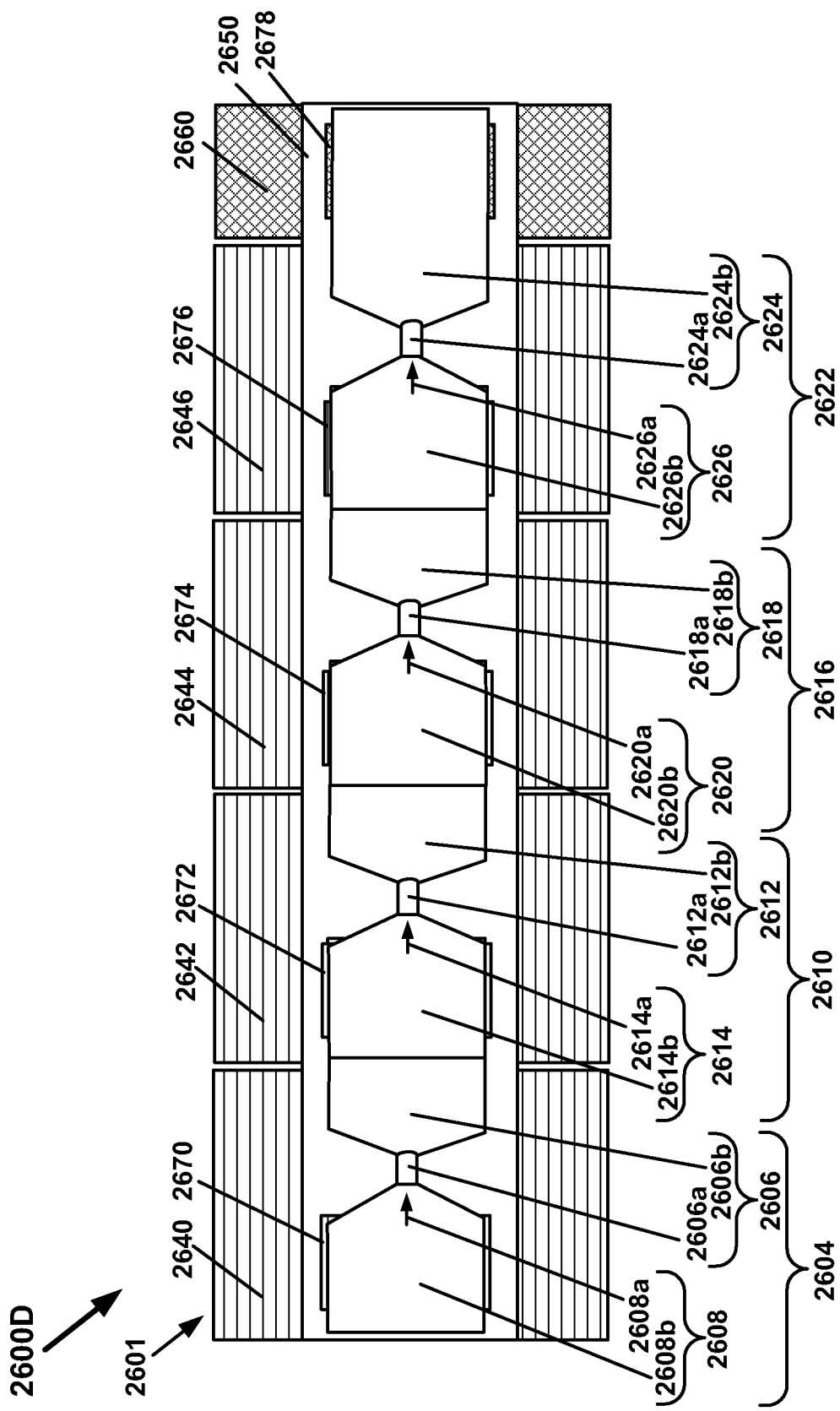
FIG. 26D is a plan view of a solar-cell module including a combined diode, lead assembly incorporating an expansion joint and an integrated interconnecting-conductor, in accordance with an embodiment of the present invention.

With reference now to FIG. 26C, in accordance with embodiments of the present invention, a plan view 2600C of the solar-cell module 2601 shown in FIG. 26D is shown in a partially assembled state. The plan view 2600C of the partially-assembled solar-cell module 2602 details the arrangement of an access region, for example, one of the access regions 2670, 2672, 2674, 2676 and 2678, in an electrically-insulating-laminate strip 2650. Through one of the access regions 2670, 2672, 2674 and 2676, a conductor of a combined diode, lead assembly, for example, combined diode, lead assembly 2610, or combined diode, lead assembly 2630, may electrically couple with the back side of at least one solar cell, for example, one of the solar cells 2640, 2642, 2644 and 2646, in the solar-cell module 2601 shown in FIG. 26D. For example, as shown in FIG. 26D, the combined diode, lead assembly 2610 electrically couples through access region 2672 with solar cell 2642; and, the combined diode, lead assembly 2610 electrically couples through access region 2674 with solar cell 2644. The electrically-insulating-laminate strip 2650 prevents formation of a short-circuit path for current flow around the diode of a combined diode, lead assembly, for example, one of the combined diode, lead assemblies 2604, 2610, 2616 and 2622 configured in the solar-cell module 2601, which is next described with FIG. 26D.

With reference now to FIG. 26D, in accordance with embodiments of the present invention, a plan view 2600D of the solar-cell module 2601 is shown. The solar-cell module 2601 includes a plurality of solar-cells, for example, solar cells 2640, 2642, 2644 and 2646, without limitation thereto, electrically coupled together. The solar-cell module 2601 also includes an in-laminate-diode assembly electrically coupled with the plurality of solar cells 2640, 2642, 2644 and 2646. The in-laminate-diode assembly is configured to prevent power loss. The in-laminate-diode assembly further includes at least a first in-laminate-diode sub-assembly. The first in-laminate-diode sub-assembly includes at least a first combined diode, lead assembly, for example, one of combined diode, lead assemblies 2604, 2610 and 2616, without limitation thereto, incorporating an expansion joint and an integrated interconnecting-conductor. To facilitate the description of embodiments of the present invention related to FIG. 26D, the first combined diode, lead assembly may be identified with combined diode, lead assembly 2610 of FIG. 26A described above. Embodiments of the present invention applying to the combined diode, lead assembly 2610 of FIG. 26A described above are incorporated within the environment of the solar-cell module 2601. The first combined diode, lead assembly may also be identified with combined diode, lead assembly 2630 of FIG. 26B described above. Embodiments of the present invention applying to the combined diode, lead assembly 2630 of FIG. 26B described above may similarly be incorporated within the environment of a solar-cell module, similar to solar-cell module 2601.

With further reference to FIG. 26D, in accordance with embodiments of the present invention, a plurality of solar cells 2640, 2642, 2644 and 2646 are interconnected with interconnect assemblies as previously described for interconnect assembly 420 of FIGS. 4A-4F. The interconnect assemblies interconnecting the solar cells 2640, 2642, 2644 and 2646 are indicated by the horizontal striations across the solar cells of FIGS. 26C and 26D. Disposed on the plurality of solar cells 2640, 2642, 2644 and 2646 is an in-laminate-diode assembly including, without limitation thereto, a plurality of interconnected in-laminate-diode sub-assemblies and the electrically-insulating-laminate strip 2650. An in-laminate-diode sub-assembly includes at least one combined diode, lead assembly, for example, the combined diode, lead assembly 2610, which includes a single diode, but may include one or more diodes as previously described for FIGS. 11A-11D. As shown in FIG. 26D, combined diode, lead assembly 2604 electrically couples with the solar cells 2640 and 2642; a second terminal 2608b of a second conductor 2608 of combined diode, lead assembly 2604 is configured as an expansion joint disposed on and electrically coupled with a back side of solar cell 2640 through access region 2670 of the electrically-insulating-laminate strip 2650; and, a second terminal 2606b of a first conductor 2606 of combined diode, lead assembly 2604 electrically couples with a back side of solar cell 2642 through access region 2672 of the electrically-insulating-laminate strip 2650. The second terminal 2608b of the second conductor 2608 of combined diode, lead assembly 2604 is configured as an expansion joint, and the second terminal 2606b of the first conductor 2606 of combined diode, lead assembly 2604 is configured as an integrated interconnecting-conductor. The first terminal 2608a of the second conductor 2608 of combined diode, lead assembly 2604 is configured as a tab portion (not shown, but indicated by the arrow) electrically coupled to a diode (not shown) of combined diode, lead assembly 2604; and, the first terminal 2606a of the first conductor 2606 of combined diode, lead assembly 2604 is configured as an a pocket portion electrically coupled to the diode. As shown in FIG. 26D, the in-laminate-diode sub-assembly including combined diode, lead assembly 2604 bridges a solar-cell sub-module including just a single solar cell 2640. However, embodiments of the present invention embrace solar-cell sub-modules with more than a single solar cell included in the solar-cell sub-module, as previously described. As shown in FIG. 26D, combined diode, lead assembly 2604 electrically couples with a primary solar cell, solar cell 2640, of the solar-cell module 2601 by direct contact of the expansion joint of combined diode, lead assembly 2604 with the interconnect assembly on the back side of the solar cell 2640. As used herein for the discussion of FIGS. 26A-26D, the term of art "primary solar cell" refers to the first solar cell in a solar-cell module; and, the term of art "terminal solar cell" refers to the last solar cell in a solar-cell module.

With further reference to FIG. 26D, in accordance with embodiments of the present invention, combined diode, lead assembly 2610 electrically couples with the solar cells 2642 and 2644; the second terminal 2614b of the second conductor 2614 of combined diode, lead assembly 2610 is configured as an expansion joint disposed on and electrically coupled with second terminal 2606b of the first conductor 2606 of combined diode, lead assembly 2604, which is configured as an integrated interconnecting-conductor in a lap joint. The second terminal 2606b of the first conductor 2606 of combined diode, lead assembly 2604 electrically couples with a back side of solar cell 2642 through access region 2672 of the electrically-insulating-laminate strip 2650. Thus, the second terminal 2614b of the second conductor 2614 of combined diode, lead assembly 2610 is electrically coupled with the solar cell 2642 through the second terminal 2606b of the first conductor 2606 of combined diode, lead assembly 2614. The second terminal 2612b of the first conductor 2612 of combined diode, lead assembly 2610 electrically couples with a back side of solar cell 2644 through access region 2674 of the electrically-insulating-laminate strip 2650. The second terminal 2614b of the second conductor 2614 of combined diode, lead assembly 2610 is configured as an expansion joint; and, the second terminal 2612b of the first conductor 2612 of combined diode, lead assembly 2610 is configured as an integrated interconnecting-conductor. The first terminal 2614a of the second conductor 2614 of combined diode, lead assembly 2610 is configured as a tab portion (not shown, but indicated by the arrow) electrically coupled to a diode (not shown) of combined diode, lead assembly 2610; and, the first terminal 2612a of the first conductor 2612 of combined diode, lead assembly 2610 is configured as an a pocket portion electrically coupled to the diode. As shown in FIG. 26D, the combined diode, lead assemblies 2604, 2610, 2616 and 2622 are essentially identically replicated units with component parts arranged as described above in the description of combined diode, lead assembly 2610. However, embodiments of the present invention are not limited to configurations of identically replicated combined diode, lead assemblies as shown in FIG. 26D, as other combinations of other combined diode, lead assemblies previously described with, or without, the combined diode, lead assembly of FIG. 26A in a solar-cell module are also within the spirit and scope of embodiments of the present invention.

With further reference to FIG. 26D, in accordance with embodiments of the present invention, combined diode, lead assembly 2616 electrically couples with the solar cells 2644 and 2646; a second terminal 2620b of a second conductor 2620 of combined diode, lead assembly 2616 is configured as an expansion joint disposed on and electrically coupled with second terminal 2612b of the first conductor 2612 of combined diode, lead assembly 2610 configured as an integrated interconnecting-conductor in a lap joint. The second terminal 2612b of the first conductor 2612 of combined diode, lead assembly 2610 electrically couples with a back side of solar cell 2644 through access region 2674 of the electrically-insulating-laminate strip 2650. Thus, the second terminal 2620b of the second conductor 2620 of combined diode, lead assembly 2616 is electrically coupled with the solar cell 2644 through the second terminal 2612b of the first conductor 2612 of combined diode, lead assembly 2610. The second terminal 2618b of a first conductor 2618 of combined diode, lead assembly 2616 electrically couples with a back side of solar cell 2646 through access region 2676 of the electrically-insulating-laminate strip 2650. The second terminal 2620b of the second conductor 2620 of combined diode, lead assembly 2616 is configured as an expansion joint; and, the second terminal 2618b of the first conductor 2618 of combined diode, lead assembly 2616 is configured as an integrated interconnecting-conductor. A first terminal 2620a of the second conductor 2620 of combined diode, lead assembly 2616 is configured as a tab portion (not shown, but indicated by the arrow) electrically coupled to a diode (not shown) of combined diode, lead assembly 2616; and, a first terminal 2618a of the first conductor 2618 of combined diode, lead assembly 2616 is configured as an a pocket portion electrically coupled to the diode.

With further reference to FIG. 26D, in accordance with embodiments of the present invention, combined diode, lead assembly 2622 electrically couples with the solar cells 2646 and busbar 2660; a second terminal 2626b of a second conductor 2626 of combined diode, lead assembly 2622 is configured as an expansion joint disposed on and electrically coupled with second terminal 2618b of the first conductor 2618 of combined diode, lead assembly 2616 configured as an integrated interconnecting-conductor in a lap joint. The second terminal 2618b of the first conductor 2618 of combined diode, lead assembly 2616 electrically couples with a back side of solar cell 2646 through access region 2676 of the electrically-insulating-laminate strip 2650. Thus, the second terminal 2626b of the second conductor 2626 of combined diode, lead assembly 2622 is electrically coupled with the solar cell 2646 through the second terminal 2618b of the first conductor 2618 of combined diode, lead assembly 2616. A second terminal 2624b of a first conductor 2624 of combined diode, lead assembly 2622 electrically couples with the busbar 2660 through access region 2678 of the electrically-insulating-laminate strip 2650. The second terminal 2626b of the second conductor 2626 of combined diode, lead assembly 2622 is configured as an expansion joint; and, the second terminal 2624b of the first conductor 2624 of combined diode, lead assembly 2622 is configured as an integrated interconnecting-conductor. A first terminal 2626a of the second conductor 2626 of combined diode, lead assembly 2622 is configured as a tab portion (not shown, but indicated by the arrow) electrically coupled to a diode (not shown) of combined diode, lead assembly 2622; and, a first terminal 2624a of the first conductor 2624 of combined diode, lead assembly 2622 is configured as an a pocket portion electrically coupled to the diode. As shown in FIG. 26D, combined diode, lead assembly 2622 electrically couples with a terminal solar cell, solar cell 2646, of the solar-cell module 2601, and directly contacts the busbar 2660 with the integrated interconnecting-conductor of combined diode, lead assembly 2622. Although not shown, the primary solar cell, solar cell 2640, of the solar cell module 2601 may be provided with a busbar (not shown). Alternatively, within the spirit and scope of embodiments of the present invention, the solar cell 2640 may be electrically coupled on the left-hand side of FIG. 26D with solar cells in a longer chain of solar cells and in-laminate-diode sub-assemblies (not shown) than just the four solar cells and four in-laminate-diode sub-assemblies shown in solar-cell module 2601.

With further reference to FIG. 26D, in accordance with embodiments of the present invention, the in-laminate-diode sub-assembly further includes a second combined diode, lead assembly incorporating at least one integrated interconnecting-conductor. The in-laminate-diode assembly includes at least a second in-laminate-diode sub-assembly. The second in-laminate-diode sub-assembly includes at least a second combined diode, lead assembly, for example, one of combined diode, lead assemblies 2610, 2616 and 2622, without limitation thereto, incorporating at least one expansion joint. To facilitate the description of embodiments of the present invention related to FIG. 26D, the second combined diode, lead assembly may be identified with combined diode, lead assembly 2616. From the discussion above, the following pairs of combined diode, lead assemblies stand in the relationship of a first combined diode, lead assembly to a second combined diode, lead assembly: combined diode, lead assembly 2604 to combined diode, lead assembly 2610; combined diode, lead assembly 2610 to combined diode, lead assembly 2616; and combined diode, lead assembly 2616 to combined diode, lead assembly 2622, respectively. The second combined diode, lead assembly, identified with combined diode, lead assembly 2616, includes the second conductor 2620. The second conductor 2620 includes the second terminal 2620b. As shown in FIG. 26D, the second terminal 2620b of the second conductor 2620 of the second combined diode, lead assembly 2616 is configured as an expansion joint of the second combined diode, lead assembly 2616. Embodiments of the present invention may encompass a second combined diode, lead assembly having more than one expansion joint (not shown). The integrated interconnecting-conductor of the first combined diode, lead assembly, identified with combined diode, lead assembly 2610, is configured to electrically couple to the expansion joint of the second conductor, identified with second terminal 2620b of the second conductor 2620, of the second combined diode, lead assembly 2616. The expansion joint of the second combined diode, lead assembly 2616 is configured to provide a sliding contact in communication with the integrated interconnecting-conductor of the first combined diode, lead assembly 2610. The expansion joint of the second combined diode, lead assembly 2616 is configured as a portion of a lap joint between the expansion joint of the second combined diode, lead assembly 2616 and the integrated interconnecting-conductor of the first combined diode, lead assembly 2610.

With further reference to FIG. 26D, in accordance with embodiments of the present invention, although the solar-cell module 2601 has been illustrated as configured with a plurality of combined diode, lead assemblies incorporating an expansion joint and an integrated interconnecting-conductor utilizing the arrangement of the combined diode, lead assembly of FIG. 26A described above, embodiments of the present invention also encompass within their scope a solar-cell module configured with a plurality of combined diode, lead assemblies incorporating an expansion joint and an integrated interconnecting-conductor utilizing the alternative arrangement of the combined diode, lead assembly of FIG. 26B described above.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A lead incorporating an expansion joint, said lead comprising:
  a conductor comprising:
    a first terminal, said first terminal of said conductor configured to electrically couple to an electrical device; and
    a second terminal, said second terminal of said conductor configured as said expansion joint, said expansion joint configured to electrically couple to an interconnecting-conductor and configured to reduce a stress applied to said electrical device, wherein said expansion joint is electrically connected to the interconnecting-conductor without requiring any other material disposed between them.

2. The lead incorporating the expansion joint of claim 1, wherein said expansion joint is configured to protect said electrical device from application of a stress to said electrical device sufficient to fracture said electrical device.

3. The lead incorporating the expansion joint of claim 1, wherein said expansion joint is configured to provide a sliding contact in communication with said interconnecting-conductor.

4. The lead incorporating the expansion joint of claim 1, wherein said expansion joint is configured as a portion of a lap joint.

5. The lead incorporating the expansion joint of claim 1, wherein said expansion joint of said conductor further comprises:
  a planar strip portion, said planar strip portion having a first planar surface and a second planar surface substantially parallel to said first planar surface;

wherein at least one of said first and second planar surfaces is configured to provide a sliding contact in communication with said interconnecting-conductor.

6. The lead incorporating the expansion joint of claim 5, wherein said first terminal of said conductor further comprises:
   a pocket portion configured to accept and to electrically couple to said electrical device, said pocket portion offset from at least one of said first and second planar surfaces;
   wherein said pocket portion is configured to reduce a bending load applied to said electrical device.

7. The lead incorporating the expansion joint of claim 1, wherein said first terminal of said conductor further comprises:
   a tab portion configured to electrically couple to said electrical device;
   wherein said tab portion is configured to reduce a bending load applied to said electrical device.

8. The lead incorporating the expansion joint of claim 1, wherein said first terminal of said conductor further comprises:
   a recessed portion configured to control an outflow of solder from within a solder joint formed between a terminal of said electrical device and said first terminal of said conductor.

9. A combined diode, lead assembly incorporating two expansion joints, said combined diode, lead assembly comprising:
   a diode having a first diode terminal and a second diode terminal;
   a first conductor comprising:
      a first terminal, said first terminal of said first conductor electrically coupled to said diode at said first diode terminal; and
      a second terminal, said second terminal of said first conductor configured as a first expansion joint, said first expansion joint comprising a non-fixed connection configured to electrically couple to a first interconnecting-conductor and configured to reduce a stress applied to said diode; and
   a second conductor comprising:
      a first terminal, said first terminal of said second conductor electrically coupled to said second diode terminal; and
      a second terminal, said second terminal of said second conductor configured as a second expansion joint, said second expansion joint configured to electrically couple to a second interconnecting-conductor and configured to reduce a stress applied to said diode, wherein said expansion joint is electrically connected to the interconnecting-conductor without requiring any other material disposed between them.

10. The combined diode, lead assembly incorporating the two expansion joints of claim 9 wherein said first and second expansion joints are configured to protect said diode from application of a stress to said diode sufficient to fracture said diode.

11. The combined diode, lead assembly incorporating the two expansion joints of claim 9 wherein said first expansion joint is configured to provide a sliding contact in communication with said first interconnecting-conductor, and wherein said second expansion joint is configured to provide a sliding contact in communication with said second interconnecting-conductor.

12. The combined diode, lead assembly incorporating the two expansion joints of claim 11 wherein said first expansion joint is configured as a portion of a first lap joint, and wherein said second expansion joint is configured as a portion of a second lap joint.

13. The combined diode, lead assembly incorporating the two expansion joints of claim 9 wherein said first expansion joint of said first conductor further comprises:
   a first planar strip portion, said first planar strip portion having a first planar surface and a second planar surface substantially parallel to said first planar surface;
   wherein at least one of said first and second planar surfaces of said first planar strip portion is configured to provide a sliding contact in communication with said first interconnecting-conductor.

14. The combined diode, lead assembly incorporating the two expansion joints of claim 13 wherein said first terminal of said first conductor further comprises:
   a pocket portion electrically coupled to said diode at said first diode terminal, said pocket portion offset from at least one of said first and second planar surfaces;
   wherein said pocket portion is configured to reduce a bending load applied to said diode.

15. The combined diode, lead assembly incorporating the two expansion joints of claim 9, wherein said second expansion joint of said second conductor further comprises:
   a second planar strip portion, said second planar strip portion having a first planar surface and a second planar surface substantially parallel to said first planar surface;
      wherein at least one of said first and second planar surfaces of said second planar strip portion is configured to provide a sliding contact in communication with said second interconnecting-conductor.

16. The combined diode, lead assembly incorporating the two expansion joints of claim 9, wherein said first terminal of said second conductor further comprises:
   a tab portion electrically coupled to said diode at said second diode terminal;
   wherein said tab portion is configured to reduce a bending load applied to said diode.

17. The combined diode, lead assembly incorporating the two expansion joints of claim 9, wherein said first terminal of said first conductor further comprises:
   a first recessed portion configured to control an outflow of solder from within a first solder joint formed between said first diode terminal of said diode and said first terminal of said first conductor.

18. The combined diode, lead assembly incorporating the two expansion joints of claim 9, wherein said first terminal of said second conductor further comprises:
   a second recessed portion configured to control an outflow of solder from within a second solder joint formed between said second diode terminal of said diode and said first terminal of said second conductor.

19. A combined electrical device, lead assembly incorporating an expansion joint, said combined electrical device, lead assembly comprising:
   an electrical device; and
   a plurality of leads coupled to said electrical device, at least one lead of said plurality of conductors as in claim 1.

20. The combined electrical device, lead assembly incorporating an expansion joint of claim 19, wherein said electrical device is selected from the group consisting of a semiconductor device, a diode, a transistor, a battery, an inverter and a DC-to-DC converter.

21. A solar-cell module comprising:
a plurality of solar-cells electrically coupled together; and
an in-laminate-diode assembly electrically coupled with said plurality of solar cells, said in-laminate-diode assembly configured to prevent power loss;
said in-laminate-diode assembly further comprising at least one in-laminate-diode sub-assembly, said in-laminate-diode sub-assembly comprising a combined diode, lead assembly incorporating an expansion joint, said combined diode, lead assembly incorporating said expansion joint comprising:
a diode; and
a plurality of a first lead and a second lead electrically coupled to said diode in which at least one lead of said plurality is as in claim 1 and wherein the electrical device is the diode;
and wherein the expansion joint is electrically coupled to the interconnecting-conductor.

22. The solar-cell module of claim 21, wherein said solar-cell module further comprises at least one busbar; and
wherein a busbar of said solar-cell module is configured as said interconnecting-conductor.

23. The solar-cell module of claim 21, wherein said solar-cell module further comprises at least one interconnect assembly; and
wherein an interconnect assembly of said solar-cell module is configured as said interconnecting-conductor.

24. The solar-cell module of claim 21, wherein at least one of said first conductor, said second conductor and an interconnecting-conductor portion of said interconnecting-conductor of said in-laminate-diode sub-assembly is configured as a heat sink to remove heat generated by said diode.

25. The solar-cell module of claim 21, wherein said in-laminate-diode sub-assembly further comprises an electrically-insulating-laminate strip configured to allow access of at least one of said first conductor, said second conductor and said interconnecting-conductor to a solar cell of said plurality of solar cells for electrically coupling with said solar cell.

26. The solar-cell module of claim 25, wherein said electrically-insulating-laminate strip is configured with a cutting pattern that allows folding cut portions of said electrically-insulating-laminate strip over a side opposite to a side of at least one of said first conductor, said second conductor and said interconnecting-conductor that electrically couples with said solar cell.

27. The solar-cell module of claim 25, wherein said electrically-insulating-laminate strip further comprises a layer of adhesive on both a solar-cell-facing side and a side opposite said solar-cell-facing side of said electrically-insulating-laminate strip.

28. The solar-cell module of claim 21, wherein said in-laminate-diode assembly further comprises:
a first electrically-insulating-laminate strip comprising a plurality of via-hole cutouts, a via-hole cutout of said plurality of via-hole cutouts configured to allow access of at least one of said first conductor and said second conductor to a solar cell of said plurality of solar cells for electrically coupling with said solar cell; and
a second electrically-insulating-laminate strip comprising a plurality of complementary cutouts, a complementary cutout of said second plurality of complementary cutouts configured such that said complementary cutout is disposed in said second electrically-insulating-laminate strip at a site located between a first via-hole cutout and a second via-hole cutout of said first electrically-insulating-laminate strip when said second electrically-insulating-laminate strip overlays said first electrically-insulating-laminate strip.

29. The solar-cell module of claim 28, wherein said complementary cutout in said second electrically-insulating-laminate strip has a complementary shape to a first shape of said first via-hole cutout and a second shape of said second via-hole cutout of said first electrically-insulating-laminate strip, said complementary shape of said complementary cutout defined by and substantially congruent with a shape of a gap region lying between said first via-hole cutout and said second via-hole cutout of said first electrically-insulating-laminate strip.

30. The solar-cell module of claim 29, wherein said first via-hole cutout of said plurality of via-hole cutouts of said first electrically-insulating-laminate strip has a first substantially rectangular shape, and said second via-hole cutout of said plurality of via-hole cutouts of said first electrically-insulating-laminate strip has a second substantially rectangular shape, wherein said first via-hole cutout and said second via-hole cutout of said plurality of via-hole cutouts of said first electrically-insulating-laminate strip are separated by a gap region having a third substantially rectangular shape; and
wherein said complementary cutout of said plurality of complementary cutouts of second electrically-insulating-laminate strip has a fourth substantially rectangular shape substantially congruent with said third substantially rectangular shape of said gap region.

31. The solar-cell module of claim 21, wherein said in-laminate-diode assembly further comprises:
a first electrically-insulating-laminate strip comprising a plurality of via-hole cutouts, a via-hole cutout of said plurality of via-hole cutouts configured to allow access of said first conductor to a solar cell of said plurality of solar cells for electrically coupling with said solar cell, said second conductor overlaying said first electrically-insulating-laminate strip; and
a plurality of interconnecting-conductors wherein said interconnecting-conductor comprises at least one interconnecting-conductor of said plurality of interconnecting-conductors, said plurality of interconnecting-conductors comprising at least a first interconnecting-conductor and a second interconnecting-conductor, said first interconnecting-conductor having at least a first interconnecting-conductor portion, said second interconnecting-conductor having at least a second interconnecting-conductor portion, said first interconnecting-conductor portion of said first interconnecting-conductor overlaying and electrically coupling with said first conductor, said second interconnecting-conductor portion of said second interconnecting-conductor overlaying and electrically coupling with said second conductor.

32. The solar-cell module of claim 31, wherein said in-laminate-diode assembly further comprises:
a second electrically-insulating-laminate strip overlaying said plurality of interconnecting-conductors, said second electrically-insulating-laminate strip comprising a plurality of complementary cutouts, a complementary cutout of said plurality of complementary cutouts configured to maintain a first combined thickness of said first electrically-insulating-laminate strip, said second interconnecting-conductor portion of said second interconnecting-conductor and said second conductor about equal to a second combined thickness of said second electrically-insulating-laminate strip, said first interconnecting-conductor portion of said first interconnecting-conductor and said first conductor.

33. The solar-cell module of claim 21, wherein said in-laminate-diode sub-assembly further comprises at least one of said first conductor, said second conductor and said interconnecting-conductor structured to enable a laminated electrical connection between at least one of respective said first conductor, said second conductor and said interconnecting-conductor and another component of said solar-cell module.

34. The solar-cell module of claim 21, wherein said in-laminate-diode sub-assembly comprises at least one diode configured to by-pass current flow around at least one solar cell to prevent power loss.

35. A combined diode, lead assembly incorporating an expansion joint and an integrated interconnecting-conductor, said combined diode, lead assembly comprising:
a diode having a first diode terminal and a second diode terminal;
a first conductor comprising:
a first terminal, said first terminal of said first conductor electrically coupled to said diode at said first diode terminal;
and
a second terminal, said second terminal of said first conductor configured as said integrated interconnecting-conductor; and
a second conductor comprising:
a first terminal, said first terminal of said second conductor electrically coupled to said diode at said second diode terminal; and
a second terminal, said second terminal of said second conductor configured as an expansion joint, said expansion joint configured to electrically couple to an interconnecting-conductor and configured to reduce a stress applied to said diode, wherein said expansion joint is electrically connected to the interconnecting-conductor without requiring any other material disposed between them.

36. The combined diode, lead assembly incorporating the expansion joint and an integrated interconnecting-conductor of claim 35, wherein said expansion joint is configured to provide a sliding contact in communication with said interconnecting-conductor.

37. The combined diode, lead assembly incorporating the expansion joint and an integrated interconnecting-conductor of claim 35, wherein said expansion joint is configured as a portion of a lap joint.

38. The combined diode, lead assembly incorporating the expansion joint and an integrated interconnecting-conductor of claim 35, wherein said expansion joint of said second conductor further comprises:
a second planar strip portion, said second planar strip portion having a first planar surface and a second planar surface substantially parallel to said first planar surface;
wherein at least one of said first and second planar surfaces of said second planar strip portion is configured to provide a sliding contact in communication with said interconnecting-conductor.

39. The combined diode, lead assembly incorporating the expansion joint and an integrated interconnecting-conductor of claim 38, wherein said first terminal of said second conductor further comprises:
a pocket portion electrically coupled to said diode at said second diode terminal, said pocket portion offset from at least one of said first and second planar surfaces;
wherein said pocket portion is configured to reduce a bending load applied to said diode.

40. The combined diode, lead assembly incorporating the expansion joint and an integrated interconnecting-conductor of claim 39, wherein said first terminal of said first conductor further comprises:
a tab portion electrically coupled to said diode at said first diode terminal;
wherein said tab portion is configured to reduce a bending load applied to said diode.

41. The combined diode, lead assembly incorporating the expansion joint and an integrated interconnecting-conductor of claim 40, wherein said first terminal of said first conductor further comprises:
a first planar strip portion, said first planar strip portion having a first planar surface and a second planar surface substantially parallel to said first planar surface; and
wherein said first terminal of said first conductor further comprises:
a pocket portion electrically coupled to said diode at said first diode terminal, said pocket portion offset from at least one of said first and second planar surfaces;
wherein said pocket portion is configured to reduce a bending load applied to said diode.

42. The combined diode, lead assembly incorporating the expansion joint and an integrated interconnecting-conductor of claim 41, wherein said first terminal of said second conductor further comprises:
a tab portion electrically coupled to said diode at said second diode terminal;
wherein said tab portion is configured to reduce a bending load applied to said diode.

43. The combined diode, lead assembly incorporating the expansion joint and an integrated interconnecting-conductor of claim 35, wherein said first terminal of said first conductor further comprises:
a first recessed portion configured to control an outflow of solder from within a first solder joint formed between said first diode terminal of said diode and said first terminal of said first conductor.

44. The combined diode, lead assembly incorporating the expansion joint and an integrated interconnecting-conductor of claim 35, wherein said first terminal of said second conductor further comprises:
a second recessed portion configured to control an outflow of solder from within a second solder joint formed between said second diode terminal of said diode and said first terminal of said second conductor.

45. A solar-cell module comprising:
a plurality of solar-cells electrically coupled together; and
an in-laminate-diode assembly electrically coupled with said plurality of solar cells, said in-laminate-diode assembly configured to prevent power loss;
said in-laminate-diode assembly further comprising at least a first in-laminate-diode sub-assembly, said first in-laminate-diode sub-assembly comprising at least the first combined diode, lead assembly incorporating the expansion joint and the integrated interconnecting-conductor as in claim 35.

46. The solar-cell module of claim 45, wherein said in-laminate-diode assembly further comprises a second in-laminate-diode sub-assembly, said second in-laminate-diode sub-assembly further comprising a second combined diode, lead assembly incorporating at least one expansion joint, said second combined diode, lead assembly comprising a second conductor comprising a second terminal, said second terminal of said second conductor of said second combined diode, lead assembly configured as an expansion joint of said second combined diode, lead assembly; and wherein said integrated interconnecting-conductor of said first combined diode, lead assembly is configured to electrically couple to said expansion joint of said second conductor of said second combined diode, lead assembly.

47. The solar-cell module of claim 46, wherein said expansion joint of said second combined diode, lead assembly is configured to provide a sliding contact in communication with said integrated interconnecting-conductor of said first combined diode, lead assembly.

48. The solar-cell module of claim 46, wherein said expansion joint of said second combined diode, lead assembly is configured as a portion of a lap joint between said expansion joint of said second combined diode, lead assembly and said integrated interconnecting-conductor of said first combined diode, lead assembly.

* * * * *